(12) United States Patent
Rostalski et al.

(10) Patent No.: US 11,650,510 B2
(45) Date of Patent: May 16, 2023

(54) PROJECTION OPTICAL UNIT FOR MICROLITHOGRAPHY AND METHOD FOR PRODUCING A STRUCTURED COMPONENT

(71) Applicant: Carl Zeiss SMT GmbH, Oberkochen (DE)

(72) Inventors: Hans-Juergen Rostalski, Oberkochen (DE); Holger Muenz, Aalen (DE); Christoph Menke, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/552,688

(22) Filed: Dec. 16, 2021

(65) Prior Publication Data

US 2022/0107570 A1    Apr. 7, 2022

Related U.S. Application Data

(63) Continuation of application No. PCT/EP2020/066866, filed on Jun. 18, 2020.

(30) Foreign Application Priority Data

Jun. 19, 2019    (DE) .......................... 102019208961.5

(51) Int. Cl.
G03F 7/20 (2006.01)
G02B 5/30 (2006.01)
G02B 17/06 (2006.01)

(52) U.S. Cl.
CPC ....... *G03F 7/70566* (2013.01); *G02B 5/3025* (2013.01); *G02B 17/0642* (2013.01); *G03F 7/7015* (2013.01)

(58) Field of Classification Search
CPC ..... A61L 2/18; A61L 2/00; A61L 2/22; A61L 2101/06; A61L 2202/11; A61L 2202/15;
(Continued)

(56) References Cited

U.S. PATENT DOCUMENTS 10,254,653 B2    4/2019 Rostalski
11,119,413 B2    9/2021 Ruoff et al.
(Continued)

FOREIGN PATENT DOCUMENTS

DE    102007012564 A1    9/2008
DE    102015221983 A1    5/2017
(Continued)

OTHER PUBLICATIONS

GPTO—Office Action for corresponding Appl No. DE 10 2019 208 961.5, dated Feb. 6, 2020.
(Continued)

*Primary Examiner* — Deoram Persaud
(74) *Attorney, Agent, or Firm* — Fish & Richardson P.C.

(57) ABSTRACT

A projection optical unit for microlithography includes a plurality of mirrors and has a numerical aperture having a value larger than 0.5. The plurality of mirrors includes at least three grazing incidence mirrors, which deflect a chief ray of a central object field point with an angle of incidence of greater than 45°. Different polarized light beams passing the projection optical unit are rotated in their polarization direction by different angles of rotation. The projection optical unit includes first and second groups of mirrors. The second group of mirrors includes the final two mirrors of the plurality of mirrors at the image side. A linear portion in the pupil dependence of the total geometrical polarization rotation of the projection optical unit is less than 20% of a linear portion in the pupil dependence of the geometrical polarization rotation of the second group of mirrors.

20 Claims, 16 Drawing Sheets

(58) Field of Classification Search
CPC ... C02F 1/461; E04H 1/1277; G02B 17/0642; G02B 17/0663; G02B 5/3025; G03F 7/7015; G03F 7/70233; G03F 7/7025; G03F 7/70566

See application file for complete search history.

(56) References Cited

U.S. PATENT DOCUMENTS

| | | | | |
|---|---|---|---|---|
| 2011/0122384 | A1* | 5/2011 | Mann | G03F 7/70233 |
| | | | | 355/77 |
| 2011/0122391 | A1 | 5/2011 | Totzeck | |
| 2014/0132942 | A1 | 5/2014 | Saenger et al. | |
| 2015/0160566 | A1 | 6/2015 | Saenger et al. | |
| 2016/0085061 | A1* | 3/2016 | Schwab | G02B 5/0891 |
| | | | | 359/350 |
| 2017/0248851 | A1* | 8/2017 | Endres | G03F 7/70075 |
| 2018/0088303 | A1 | 3/2018 | Schwab et al. | |
| 2018/0246410 | A1 | 8/2018 | Rostalski | |
| 2018/0252904 | A1* | 9/2018 | Wolf | G02B 17/0663 |
| 2019/0121107 | A1* | 4/2019 | Schwab | G02B 5/0891 |

FOREIGN PATENT DOCUMENTS

| | | |
|---|---|---|
| DE | 102017209162 A1 | 6/2018 |
| DE | 102017216893 A1 | 3/2019 |
| DE | 102019202759 A1 | 4/2019 |
| WO | WO2010006678 A1 | 1/2010 |
| WO | WO2011095209 A1 | 8/2011 |
| WO | WO2012034995 A2 | 3/2012 |
| WO | WO2015014753 A1 | 2/2015 |
| WO | WO 2019/057803 A1 | 3/2019 |

OTHER PUBLICATIONS

IPRP for corresponding PCT Appl. No. PCT/EP2020/066866, dated Dec. 21, 2021.

International Search Report and Written Opinion for corresponding PCT Appl. No. PCT/EP2020/066866, dated Nov. 11, 2020.

Tavrov et al.: "*Method to evaluate the geometrical spin-redirection phase for a nonplanar ray*", J. Opt. Soc. Am. A 16 (4) 1999, pp. 919-921).

\* cited by examiner

PROJECTION OPTICAL UNIT FOR MICROLITHOGRAPHY AND METHOD FOR PRODUCING A STRUCTURED COMPONENT

CROSS-REFERENCE TO RELATED APPLICATIONS

The present application is a continuation of, and claims benefit under 35 USC 120 to, international application PCT/EP2020/066866, filed Jun. 18, 2020, which claims benefit under 35 USC 119 of German Application No. 10 2019 208 961.5 filed on Jun. 19, 2019. The entire disclosure of these applications are incorporated by reference herein.

FIELD

The disclosure relates to a projection optical unit for microlithography and a method for producing a structured component.

BACKGROUND

Microlithographic projection exposure apparatuses are used for producing microstructured components, such as, for example, integrated circuits or LCDs. Such a projection exposure apparatus includes an illumination device (=illumination optical unit) and a projection lens (=projection optical unit). In the microlithography process, the image of a mask (=reticle) illuminated with the aid of the illumination device is projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

Various approaches are known for specifically setting or correcting the polarization distribution in the illumination device or in the projection lens in order to optimize the imaging contrast. For example, it is known, both in the illumination device and in the projection lens, to set a tangential polarization distribution for high-contrast imaging. "Tangential polarization" (or "TE polarization") is understood to mean a polarization distribution in which the planes of vibration of the electric field strength vectors of the individual linearly polarized light rays are oriented approximately perpendicularly to the radius directed toward the centre of the pupil. For example, in an imaging process with high aperture a preferred polarization distribution can be configured such that the diffraction orders are tangentially polarized in the wafer plane in order to avoid a loss of contrast due to the so-called vector-effect. The expression "vector effect", which occurs in imaging processes with high apertures, is used to describe the situation in which the vector of the electric field has, in the image region, different directions for different diffraction orders even if the polarization state is the same, which results from the fact that the p-polarized components (TM-components) of the vector of the electric field are no longer parallel to each other, so that imaging contrast depends on the polarization state.

An issue arising in operation of a microlithographic projection exposure apparatus is that due to different reasons optical retardations occur in the optical system, which may for example vary dependent on the location on a pupil plane and which may cause a contrast loss and an accompanying deterioration of the performance of the optical system. "Retardation" means the difference in optical path length for orthogonal polarization Eigenstates of the Jones pupil characterizing the optical system.

One of the possible reasons for such an undesired optical retardation occurring in the optical system is a geometric effect also referred to as "spin-redirection phase" or "Berry phase". The effect can be traced back to the fact that, in an optical system, the coordinate system for a given polarization state is rotated for skew light beams, i.e. beams which leave the meridional plane, from the entry area to the exit area of the optical system. As a result of this rotation of the coordinate system, a polarized beam is likewise rotated in its preferred polarization direction, even if there is no optical rotator in the system and also if there is no polarization rotation due to s/p-splitting or using a polarizer.

A quantitative value for the geometric rotation associated with a ray path in an optical system is obtained by projecting the k-vectors of the ray path onto the unit sphere of directions and calculating the solid angle enclosed by the contour (see Tavrov et al.: *"Method to evaluate the geometrical spin-redirection phase for a nonplanar ray"*, J. Opt. Soc. Am. A 16 (4) 1999, pp. 919-921). In general, the input and output ray of an imaging optical system are not parallel to each other and the contour is not closed. Whereas Tavrov implicitly links the input and output rays directly with a geodesic line on the direction sphere, it is generally more appropriate for an imaging system with parallel image and object plane and non-unity magnification to include the normal to the image plane as an additional point on the direction sphere, linking the input and output ray with two additional geodesics via the image normal. This definition will be used below, also for the evaluation of systems with small deviations from exact parallelism of image and object planes, and for the evaluation of ray paths in an optical subsystem including the image plane.

As a result of the afore-discussed polarization rotation, a preferred polarization distribution (e.g. tangential polarization) initially adjusted is not be maintained throughout the projection optical unit, with the consequence of a contrast loss and an accompanying deterioration of the performance of the optical system. The issue can be significant in optical systems with relatively high values of the numerical aperture (NA) due to increasing incidence angles of the light beams on the respective mirrors of the projection optical unit.

Reference is made only in an exemplary fashion to WO 2019/057803 A1.

SUMMARY

The present disclosure seeks to provide a projection optical unit for microlithography and a method for producing a structured component which reduce undesired contrast loss and accompanying deterioration of the performance of the optical system.

In an aspect, a projection optical unit for microlithography according to the disclosure includes a plurality of mirrors for guiding imaging light along an imaging beam path from an object field located in an object plane to an image field located in an image plane with a numerical aperture having a value larger than 0.5, wherein the plurality of mirrors include at least three mirrors for grazing incidence (GI mirrors), which deflect a chief ray of a central object field point with an angle of incidence of more than 45°, wherein different polarized light beams passing the projection optical unit in operation from the object field to the image field are rotated in their polarization direction by different angles of rotation due to a geometrical polarization rotation, wherein the projection optical unit includes a first group of mirrors and a second group of mirrors, the second group of mirrors consisting of the final two mirrors of the plurality of mirrors at the image side, wherein a linear portion in the pupil dependence of the total geometrical polarization rotation (|Z3A+Z3B|) of the projection optical unit is smaller than 20% of a linear portion in the pupil dependence of the geometrical polarization rotation (|Z3B|) of the second group of mirrors.

Further, the disclosure includes the concept of configuring a projection optical unit, in which due to a relatively high value of numerical aperture skew light beams leaving the meridional plane pass the optical system with comparatively large values of the incidence angles on the mirrors, in a specifically targeted manner such that a "first order portion" or "linear portion" increasing linearly from centre to edge of the exit pupil of the above-mentioned rotation of the polarization state occurring due to the geometric effect being referred to as "spin-redirection phase" or "Berry phase", is almost eliminated.

The disclosure furthermore involves the consideration that, while the specific design of the final two mirrors at the image side which are denoted here and in the following as "second group of mirrors (Mn–1, Mn)" or "part B" are basically predetermined (regarding position, orientation and curvature of the mirrors) by the desired optical requirements, for example regarding the numerical aperture (NA), design freedom is restricted to the remaining mirrors, which are denoted here and in the following as "first group of mirrors (M1 . . . Mn–2)" or "part A". Starting from this consideration, the disclosure includes the concept of configuring the first group of mirrors (M1 . . . Mn–2) (i.e. part A) in such a way (regarding position, orientation and curvature of the mirrors) that the resulting geometrical polarization rotation will substantially compensate for the geometrical polarization rotation in the second group of mirrors (Mn–1,Mn) (i.e. part B). In other words, "part A" in the projection optical unit is designed—regarding position, orientation and curvature of its mirrors—such that the resulting linear part in the pupil dependence of the geometrical polarization rotation Z3A is of substantial equal magnitude but of opposite sign compared to the resulting linear part in the pupil dependence of the geometrical polarization rotation Z3B in "part B", in the second group of mirrors (Mn–1,Mn).

In the context of the present disclosure, the order of geometrical polarization rotation can be conveniently defined by Zernike polynomials as a function of pupil coordinates x and y in the exit pupil. The first few Zernike polynomials are defined as $Z1=const.$, $Z2=y$, $Z3=x$, $Z4=2x^2+2y^2-1$, $z5=y^2-x2$, $Z6=2xy$, $Z7=(3x^2+3y^2-2)*x$, etc. Since Z4 and Z5 vanish for symmetry reasons, the at least partial elimination of the "first order portion" or "linear portion" (i.e. the Z3-term) as described above makes the Z6 term remain as dominating Zernike polynomial. The above mentioned linear portion in the pupil dependence of the geometrical polarization rotation for first group of mirrors M1 . . . Mn–2 (i.e. part A) will be Z3A and the linear portion in the pupil dependence of the geometrical polarization rotation for second group of mirrors (Mn–1, Mn) (i.e. part B) will be Z3B. Then the above criterion can be written as $|Z3A+Z3B|<0.2*|Z3B|$.

According to an embodiment a linear portion in the pupil dependence of the geometrical polarization rotation (|Z3A+Z3B|) of the total projection optical unit is smaller than 15%, for example smaller than 5%, of a linear portion in the pupil dependence of the geometrical polarization rotation (|Z3B|) of the second group of mirrors (Mn–1,Mn).

According to an embodiment, for all light beams imaging a centre of the object field to a centre of the image field, the angle of rotation is less than $35°*NA^{4.5}$. This criterion, involving a NA-dependent upper limit of the angle of rotation, considers the fact that with higher values of the numerical aperture (NA) the effect of geometrical polarization rotation principally increases due to larger incidence angles of the light beams on the respective mirrors of the projection optical unit.

In an aspect, the disclosure also relates to a projection optical unit for microlithography, including: a plurality of mirrors for guiding imaging light along an imaging beam path from an object field located in an object plane to an image field located in an image plane with a numerical aperture (NA) having a value larger than 0.5, wherein the plurality of mirrors include at least three mirrors for grazing incidence (GI mirrors), which deflect a chief ray of a central object field point with an angle of incidence of more than 45°, wherein different polarized light beams passing the projection optical unit in operation from the object field to the image field are rotated in their polarization direction by different angles of rotation due to a geometrical polarization rotation, wherein for all light beams imaging a centre of the object field to a centre of the image field, the angle of rotation is less than $35°*NA^{4.5}$.

According to an embodiment, for all light beams imaging a centre of the object field to a centre of the image field, the angle of rotation is less than $30°*NA^{4.5}$, for example less than $25°*NA^{4.5}$.

According to an embodiment, the image side numerical aperture (NA) has a value larger than 0.6, for example more than 0.7.

According to an embodiment, for all light beams imaging a centre of the object field to a centre of the image field, the angle of rotation is less than 7°, such as less than 5°, for example less than 3°.

According to an embodiment, an imaging beam path from a centre of the object field through a location of the pupil plane having relative pupil coordinates (–1,0) or (1,0) in the exit pupil, respectively (said location corresponding to an intersection point of the x-axis and the edge of the pupil), to a centre of the image field has a geometrical polarization rotation less than $5°*NA^{4.5}$.

According to an embodiment, the geometrical polarization rotation averaged over all imaging beam paths that lie in the pupil plane inside a dipole of 20% pupil fill ratio is less than $5°*NA^{4.5}$.

According to an embodiment, a circumferential distribution of the angle of rotation in the pupil plane of the projection optical unit exhibits at least four zero crossings of the angle of rotation.

With the afore-described embodiments, the disclosure is furthermore based on the consideration that a rotation of the polarization state (i.e. an amount by which a polarized beam is rotated in its preferred polarization direction) may be basically accepted (and does not lead to a deterioration of the performance of the optical system) as long as comparatively low values of polarization rotation are provided in those pupil regions which are actually optically used in the polarized illumination setting. Since typically used polarized illumination settings (such as dipole settings or quadrupole settings) may include comparatively small illumination poles at opposite outer regions of the illumination pupil plane, the afore-mentioned consideration means that comparatively higher values of polarization rotation may be accepted in regions not belonging to the illumination poles.

FIGS. 9A-9C show exemplary embodiments in which the desired polarized illumination setting is either a horizontal dipole illumination setting 910 with y-polarization (FIG. 9A), a vertical dipole illumination setting 920 with x-polarization (FIG. 9B) or a quadrupole illumination setting 930 (FIG. 9C) with quasi-tangential polarization distribution, i.e. with a polarization distribution in which the oscillation direction of the electric field vector runs at least approximately perpendicular to the radius directed at the optical system axis (which runs in the z-direction with respect to the plotted coordinate system).

Starting from the afore-mentioned consideration, the disclosure includes the concept of configuring a projection optical unit in which—due to a relatively high value of numerical aperture—skew light beams leaving the meridional plane pass the optical system with comparatively large values of the incidence angle on the mirrors, in a specifically targeted manner such that a "linear portion" (which may also be denoted as "first order portion") increasing linearly from centre to edge of the pupil plane of the above-mentioned rotation of the polarization state occurring due to the geometric effect being referred to as "spin-redirection phase" or "Berry phase" is almost eliminated.

By at least partial elimination of the afore-described linear portion of the polarization rotation, the disclosure specifically considers the fact that it is just this linear or first order portion of polarization rotation (i.e. the portion that increases linearly across the pupil) which can be harmful or detrimental to a maximum extent for typical polarized illumination settings such as dipole settings or quadrupole settings, since in such polarized illumination settings just those regions of the pupil which are situated at the outer edge of the pupil—and in which the angles of rotation of the polarization direction are relatively high—are optically used in operation of the projection optical unit.

As a further consequence of the (at least partial) elimination of the linear portion or first order portion of the above-mentioned rotation of the polarization state, only higher order portions of the geometrical rotation of the polarization state remain. Except for linear terms, the two lowest order terms are Z5 and Z6, Z5 being absent in the centre of the object field due to the symmetry of the system. After the elimination of linear terms, the dominance of Z6 is beneficial.

For typical illumination settings (such as dipole settings or quadrupole settings, see FIGS. 9A-9C) the amount of polarization rotation is small just in the regions of the illumination poles in the illumination pupil, while relatively higher values of the amount of polarization rotation existing in other regions of the illumination pupil can just be ignored since they are not optically used.

In other words, the disclosure includes the concept of at least partially eliminating a first order portion of geometrical polarization rotation (increasing linearly across the pupil) and thereby leaving only higher order portions of the rotation of polarization which can be favorable for typical polarized illumination settings by providing only relatively small rotation angles in the relevant illuminated (=optically used) pupil regions.

The above-described concept is not limited to the illumination settings shown in FIGS. 9A-9C. In other words, also for arbitrary other illumination settings the projection optical unit can be configured such that the amount of polarization rotation is small just in the optically used regions. Furthermore, the above-described concept is not limited to polarized illumination settings. In other words, also for non-polarized illumination settings an elimination or reduction of geometrical polarization rotation is basically desired and can be advantageously achieved according to the present disclosure.

In an aspect, the disclosure also relates to a projection optical unit for microlithography, including a plurality of mirrors for guiding imaging light along an imaging beam path from an object field located in an object plane creating an image field located in an image plane with a numerical aperture (NA) having a value larger than 0.5, wherein the plurality of mirrors include at least three mirrors for grazing incidence (GI mirrors), which deflect a chief ray of a central object field point with an angle of incidence of more than 45°, wherein different polarized light beams passing the projection optical unit in operation from the object field to the image field are rotated in their polarization direction due to a geometrical polarization rotation by different angles of rotation, wherein a circumferential distribution of the angle of rotation in the pupil plane of the projection optical unit exhibits at least four zero crossings of the value of the angle of rotation.

According to an embodiment, a circumferential distribution of the angle of rotation in the exit pupil of the projection optical unit exhibits a zero crossing within 30° of each of positive and negative x-axis.

According to an embodiment, a circumferential distribution of the angle of rotation in the exit pupil of the projection optical unit exhibits a zero crossing within 10° of each of positive and negative y-axis.

The disclosure furthermore relates to an optical system including an imaging optical unit as described above as well as an illumination optical unit for illuminating the illumination field, in which the object field is arranged.

The disclosure furthermore relates to a projection exposure apparatus including an optical system as described above and including a EUV light source for producing the imaging light.

In an aspect, the disclosure furthermore relates to method for producing a structured component, including the following method steps: providing a reticle and a wafer; projecting a structure on the reticle onto a light-sensitive layer of the wafer with the aid of the projection exposure apparatus as described above; and producing a structured component by producing a microstructure or nanostructure on the wafer.

Further embodiments of the disclosure can be gathered from the description and the claims.

BRIEF DESCRIPTION OF THE DRAWINGS

The disclosure will be explained in more detail below on the basis of exemplary embodiments depicted in the attached figures, in which.

DESCRIPTION OF EXEMPLARY EMBODIMENTS

Figure 1:
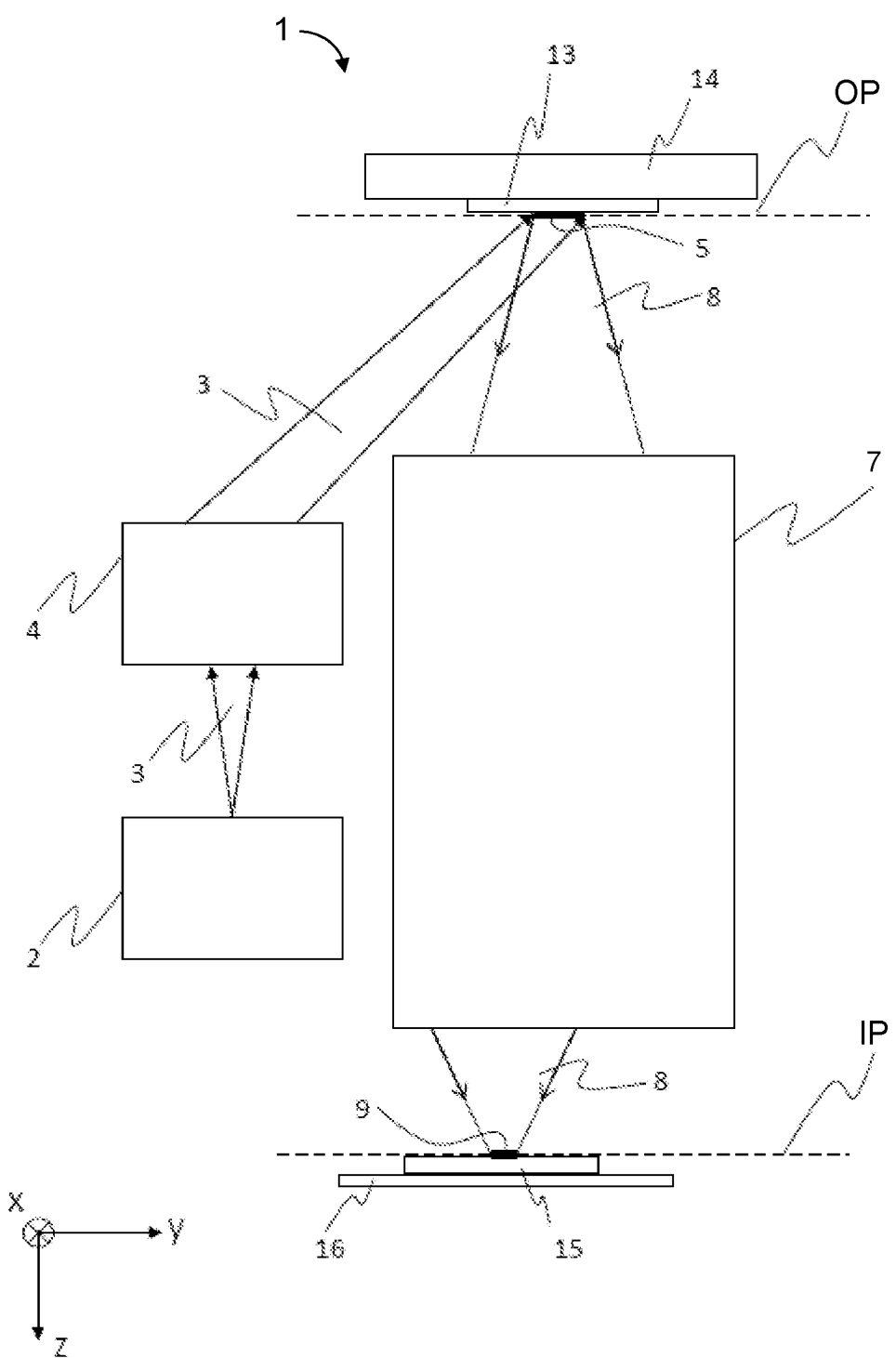
FIG. 1 shows a schematic illustration of a projection exposure apparatus for EUV microlithography.

A microlithographic projection exposure apparatus 1 according to FIG. 1 has a light source 2 for illumination light or imaging light 3. The light source 2 is an EUV light source, which produces light in a wavelength range of e.g. between 5 nm and 30 nm, such as between 5 nm and 15 nm. The light source 2 can be a plasma-based light source (laser-produced plasma (LPP), gas-discharge produced plasma (GDP)) or else a synchrotron-based light source, for example a free electron laser (FEL). For example, the light source 2 may be a light source with a wavelength of 13.5 nm or a light source with a wavelength of 6.9 nm. Other EUV wavelengths are also possible. In general, even arbitrary wavelengths are possible for the illumination light 3 guided in the projection exposure apparatus 1, for example visible wavelengths or else other wavelengths which may find use in micro-lithography (for example, DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 4 serves to guide the illumination light 3 from the light source 2 to an object field 5 in an object plane OP. Using a projection optical unit or imaging optical unit 7, the object field 5 is imaged into an image field 9 in an image plane IP with a predetermined reduction scale.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs towards the right, and the z-direction runs downward. In the projection optical unit 7, the object field 5 and the image field 9 may have a bent or curved embodiment and, for example, an embodiment shaped like a partial ring. A basic form of a marginal contour of the object field 5 or of the image field 9 has a corresponding bend. Alternatively, it is possible to embody the object field 5 and the image field 9 with a rectangular shape. The object field 5 and the image field 9 have an x/y-aspect ratio of greater than 1. Therefore, the object field 5 has a longer object field dimension in the x-direction and a shorter object field dimension in the y-direction.

In the embodiment of the projection optical unit 7 according to FIG. 1, the image plane IP is arranged parallel to the object plane OP. What is imaged in this case is a section of a reflection mask 13, also referred to as reticle, coinciding with the object field 5. The reticle 13 is carried by a reticle holder 14. The reticle holder 14 is displaced relative to the object field 5. The imaging by way of the projection optical unit 7 is implemented on the surface of a substrate in the form of a wafer 15, which is carried by a wafer holder 16. The wafer holder 16 is displaced relative to the image field 9.

FIG. 1 schematically illustrates, between the reticle 13 and the projection optical unit 7, a ray beam 8 of the illumination light 3 that enters into the projection optical unit 7 and, between the projection optical unit 7 and the wafer 15, a ray beam 8 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 13 and the wafer 15 are scanned in the y-direction during the operation of the projection exposure apparatus 1. A stepper type of the projection exposure apparatus 1, in which a stepwise displacement of the reticle 13 and of the wafer 15 in the y-direction is effected between individual exposures of the wafer 15, is also possible. These displacements are effected by an appropriate actuation of the respective displacement drives (not shown).

Figure 2A:
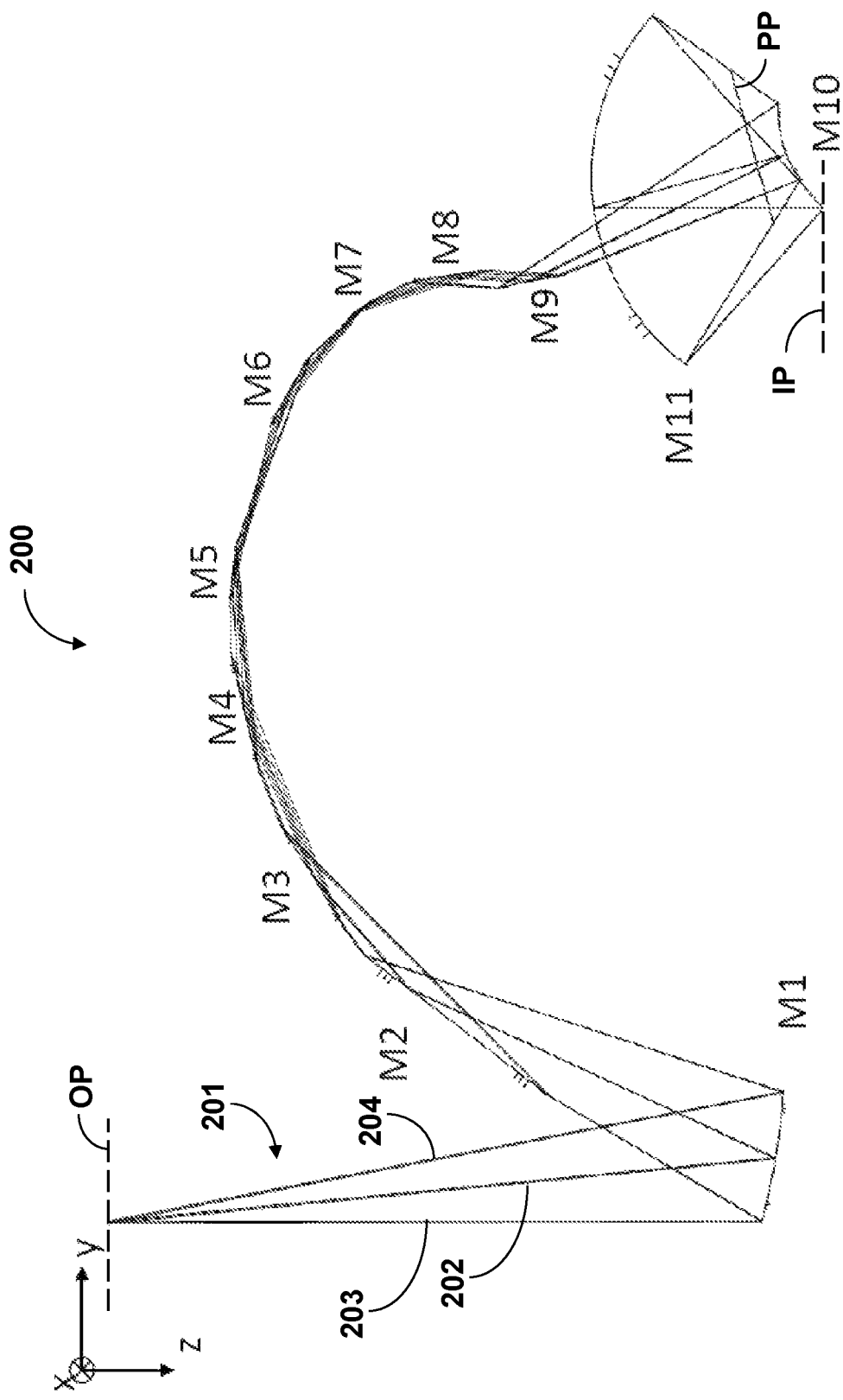
FIG. 2A shows a schematic side view of a projection optical unit being usable in the exposure apparatus according to FIG. 1, wherein mirror bodies are illustrated without holders and with zero thickness for the purpose of illustrating an imaging beam path between an object field and an image field.

FIG. 2A shows a projection optical unit 200 according to a first embodiment of the disclosure in a side view. The plane of the drawing of FIG. 2A is parallel to the y-z-plane corresponding to FIG. 1. The beam path of imaging light 201 includes a chief ray 202 of a central object field point and, as further individual rays 203 and 204, includes aperture or coma rays that delimit the edge of the beam path in the y-z-plane, which is also referred to as meridional plane. The extent of an imaging beam path of the imaging light 201 between the object field in the object plane OP and the image field in the image plane IP is illustrated. Furthermore, the rough position of a pupil plane PP is illustrated.

The projection optical unit 200 according to FIG. 2A has a total of eleven mirrors, which are numbered consecutively by "M1" to "M11" in the order of the beam path of the imaging light 201, proceeding from the object field. FIG. 2A illustrates, in a sectional view through the projection optical unit 200 the mirror bodies of the mirrors M1-M11. These mirror bodies carry mirror reflection surfaces used for reflecting the imaging light 201. Proceeding from the object field in the object plane OP, the chief rays 202 include an angle chief ray angle of 5.5° with a normal to the object plane OP. Other such chief ray angles in the range between 3° and 8°, for example, are also possible.

The projection optical unit 200 according to FIG. 2A has an image-side numerical aperture (NA) of 0.75. Other image-side numerical apertures in the range between 0.4 and 0.9, for example, are also possible.

In the case of the projection optical unit 200 according to FIG. 2A, the mirrors M1, M10 and M11 are embodied as NI (="normal incidence") mirrors, that is to say as mirrors on which the imaging light 201 is incident with an angle of incidence that is less than 45°. Overall, the projection optical unit 200 according to FIG. 2A thus has three NI-mirrors M1, M10 and M11.

The mirrors M2-M9 are GI (="grazing incidence") mirrors, that is to say mirrors onto which the illumination light 201 impinges with angles of incidence that are greater than 45°, such as greater than 60°. A typical angle of incidence of the individual rays 203, 204 of the imaging light 201 on the mirrors M2-M9 for grazing incidence may lie in the region of 80°. Overall, the projection optical unit 200 according to FIG. 2A has exactly eight mirrors M2-M9 for grazing incidence. The mirrors M2-M8 reflect the imaging light 201 such that the angles of reflection of the individual rays 15 on the respective mirrors M2-M8 add up. Thus—in addition to an effect of influencing the imaging properties of the projection optical unit 200—, the mirrors M2-M8 all have the same direction of the mirror deflection effect, and the deflection effect for the chief ray 202 adds up in each case for the mirrors M2-M8. These mirrors M2-M8 can also be denoted as "basic GI mirrors". The mirror M9 is arranged in such a way that its deflection effect acts in subtractive fashion for the chief ray 202 in relation to the deflection effect of the basic GI mirrors M2-M8. The projection optical unit 200 has exactly one such mirror M9 acting in subtractive fashion, which is the last GI mirror of the projection optical unit 200 in the imaging beam path upstream of the image field.

The mirrors M2-M9 for grazing incidence each have relatively large absolute values for the radius, that is to say they have a relatively small deviation from a planar surface. These mirrors M2-M9 for grazing incidence each have a comparatively weak refractive power, i.e., a lower beam-forming effect than a mirror which is concave or convex overall. The mirrors M2-M9 contribute to a specific imaging aberration correction and, for example, to a local imaging aberration correction. The mirrors M1-M11 carry a coating that optimizes the reflectivity of the mirrors M1-M11 for the imaging light 201. Here, this can be a single-layer ruthenium coating or a multilayer with, in each case, an uppermost layer made of, e.g., ruthenium. A coating including for example a layer of molybdenum or ruthenium can be used in the case of the GI mirrors M2-M9. The highly reflecting layers of mirrors M1, M10 and M11 for normal incidence can be configured as multiply layers, wherein successive layers can be manufactured from different materials. Alternating material layers can also be used. A typical multiply layer can have fifty bilayers, respectively made of a layer of molybdenum and a layer of silicon. These may contain additional separation layers made of e.g. carbon (C), boron carbide ($B_4C$) and can be terminated by a protective layer or a protective layer system toward the vacuum.

The mirrors of the projection optical unit 200 of FIG. 2A are embodied as free-form surfaces which cannot be described by a rotationally symmetric function, but by the following free-form surface equation:

$$Z = \frac{c_x x^2 + c_y y^2}{1 + \sqrt{1 - (1+k_x)(c_x x)^2 - (1+k_y)(c_y y)^2}} + C_1 x + C_2 y + C_3 x^2 +$$
$$C_4 xy + C_5 y^2 + C_6 x^3 + \ldots + C_9 y^3 + C_{10} x^4 + \ldots + C_{12} x^2 y^2 + \ldots +$$
$$C_{14} y^4 + C_{15} x^5 + \ldots + C_{20} y^5 + C_{21} x^6 + \ldots + C_{24} x^3 y^3 + \ldots + C_{27} y^6 + \ldots$$

Z is the sag of the free-form surface at the point x, y, with $x^2+y^2=r^2$. Here, r is the distance from the reference axis of the free-form surface equation (x=0, y=0). In the free-form surface equation (1), $C_1$, $C_2$, $C_3$ . . . denote the coefficients of the free-form surface series expansion in powers of x and y. In the case of a conical base area, $c_x$, $c_y$ are constants corresponding to the vertex curvature of a corresponding asphere. Thus, $c_x=1/Rx$ and $c_y=1/Ry$ applies. $k_x$ and $k_y$ each correspond to a conical constant of a corresponding asphere. Thus, equation (1) describes a biconical free-form surface.

The optical design data of the reflection surfaces of the mirrors M1-M11 in the projection optical unit 200 of FIG. 2A can be gathered from Tables 1-5. Table 1 provides several basic data of the design data of the projection optical unit 200. Table 2 indicates vertex point radii (Radius$_x$, Radius$_y$) and refractive power values (Power$_x$, Power$_y$) for the optical surfaces of the optical components. Negative radii values denote curves that are concave toward the incident illumination light at the intersection of the respective surface with the considered plane (x-z-plane, y-z-plane) that is spanned by a surface normal at the vertex point with the respective direction of curvature (x, y). The two radii Radius$_x$, Radius$_y$ may have explicitly different signs. The vertex points at each optical surface are defined as points of incidence of a guide ray which travels from an object field centre to the image field along a plane of symmetry x=0, i.e. the plane of the drawing of FIG. 2A (meridional plane). The refractive powers Power$_x$, Power$_y$ at the vertex points are defined as:

$$\text{Power}_x = -\frac{2 \cdot \cos(AOI)}{\text{Radius}_x}$$

$$\text{Power}_y = -\frac{2}{\text{Radius}_y \cdot \cos(AOI)}$$

Here, AOI denotes an angle of incidence of the guide ray with respect to the surface normal.

Table 3 indicates the Decentring (location and angle) of the respective mirror surface as well as of the object field, the aperture stop and the image field with respect to the surface normal on the object field in the object plane OP, the surface normal being in the centre of the object plane OP. Table 4 indicates the free form coefficients of the surfaces. Table 5 indicates the coordinates of the aperture stop edge.

As already discussed in the introductory part of the present application, an undesired optical retardation occurs in the projection optical unit 200 of FIG. 2A for skew light beams leaving the meridional plane and passing the projection optical unit from the entry area to the exit area due to geometric effect of "spin redirection phase" or "Berry phase", having the consequence that without appropriate counter-measures an initially adjusted polarization distribution (e.g. tangential polarization distribution) won't be maintained until the image plane or wafer plane, and a loss in contrast resulting in a deterioration of the optical performance of the projection exposure apparatus is achieved.

Figure 2B:
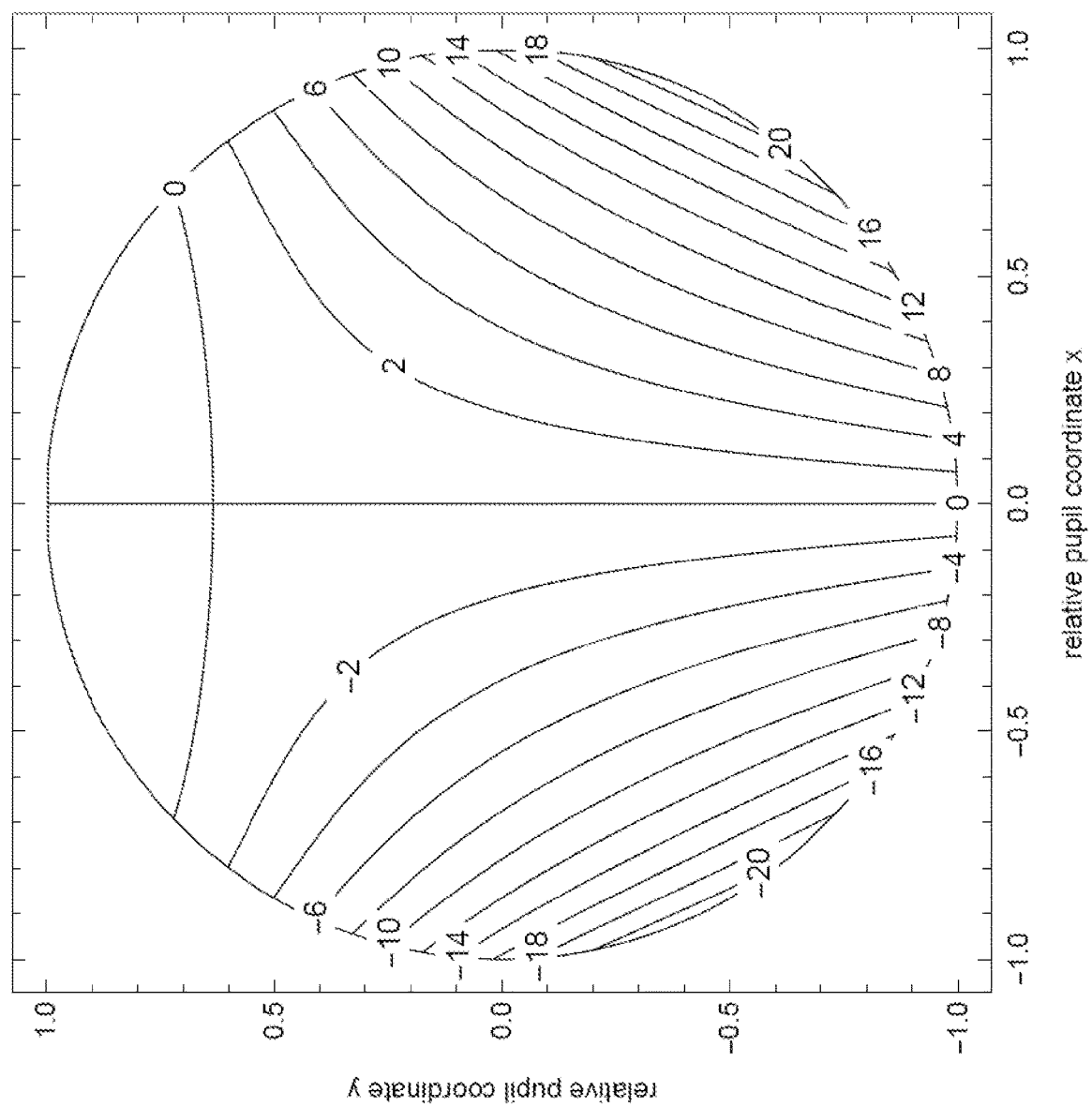
FIG. 2B shows the distribution of the angles of rotation of the polarization direction for polarized light passing the projection optical unit of FIG. 2A in dependence on relative pupil coordinates.

FIG. 2B represents a diagram showing values of the angle of rotation due to this geometrical polarization rotation across the exit pupil (defined as the image of the aperture stop at the image field side of the optical system) and in relative pupil coordinates obtained for the embodiment of FIG. 2A. For the relative pupil coordinate (1,0), an angle of rotation for this geometrical polarization rotation having value of 16.45° is obtained. Furthermore, a circumferential distribution of the angle of rotation in the pupil plane of the projection optical unit exhibits four zero crossings of the value of the angle of rotation.

Figure 3A:
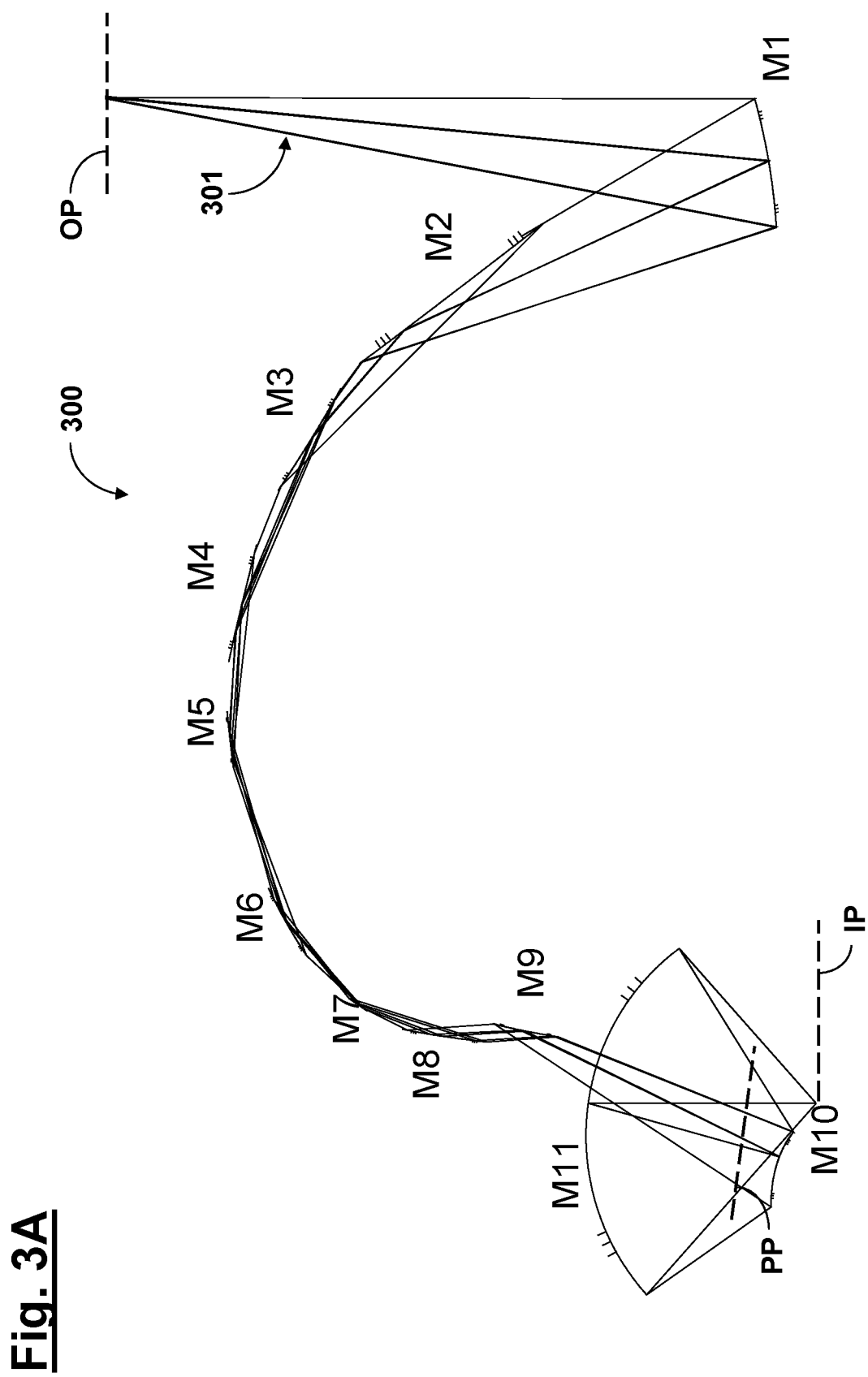
FIG. 3A shows a schematic side view of a further embodiment of a projection optical unit which is usable in the projection exposure apparatus according to FIG. 1.

FIG. 3A shows an embodiment of a projection optical unit 300 according to the disclosure which can be used instead of the projection optical unit 7 in the projection exposure apparatus 1 of FIG. 1. The principle design of the projection optical unit 300 is similar to projection optical unit 200 of FIG. 2A, for example regarding number of GI- or NI-mirrors, respectively. Components which correspond to those already explained above in relation to FIG. 2A are denoted by the same reference signs and are not discussed again in detail.

The optical design data of the reflection surfaces of the mirrors in the projection optical unit 300 of FIG. 3A can be gathered from Tables 6-10. The optical design data of the reflection surfaces of the mirrors M1-M11 in the projection optical unit 300 of FIG. 3A can be gathered from Tables 6-10. Table 6 provides several basic data of the design data of the projection optical unit 300. Table 7 indicates vertex point radii (Radius$_x$, Radius$_y$) and refractive power values (Power$_x$, Power$_y$) for the optical surfaces of the optical components. Table 8 indicates the Decentring (location and angle) of the respective mirror surface as well as of the object field, the aperture stop and the image field with respect to the surface normal on the object field in the object plane OP, the surface normal being in the centre of the object plane OP. Table 9 indicates the free form coefficients of the surfaces. Table 10 indicates the coordinates of the aperture stop edge.

Figure 3B:
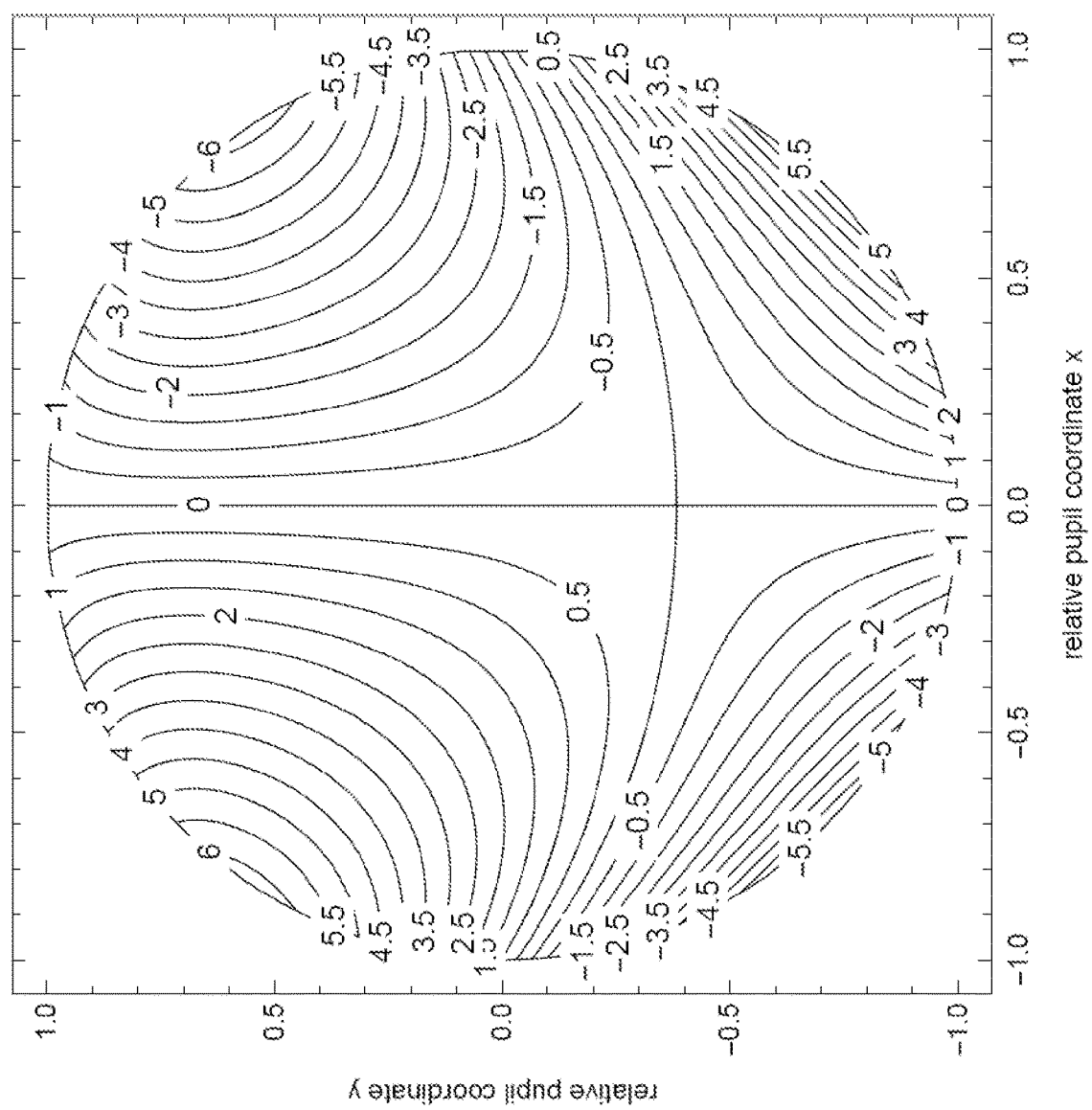
FIG. 3B shows the distribution of the angles of rotation due to geometrical polarization rotation for the embodiment of FIG. 3A.

FIG. 3B represents a diagram showing the distribution of the angle of rotation due to the geometrical polarization rotation from the entrance area to the exit area of the projection optical unit 300 according to the embodiment of FIG. 3A across the exit pupil and in relative pupil coordinates (said coordinates being 0 at the centre of the exit pupil and 1 at the outer edge of the exit pupil). For relative pupil coordinate (1,0), an angle of rotation having a value of 0.95° is achieved. Tables summarizing the respective values for the angle of rotation and also for the above-discussed criterion |Z3A+Z3B|<0.2*|Z3B| for all embodiments of the present disclosure are given at the end of specification as Tables 36 and 37, respectively.

Furthermore, a circumferential distribution of the angle of rotation in the pupil plane of the projection optical unit exhibits four zero crossings of the value of the angle of rotation. More specifically, a circumferential distribution of the angle of rotation in the pupil plane of the projection optical unit 300 exhibits a zero crossing on both positive and negative x-axis, respectively, and also a zero crossing on both positive and negative y-axis, respectively.

Figure 9A:
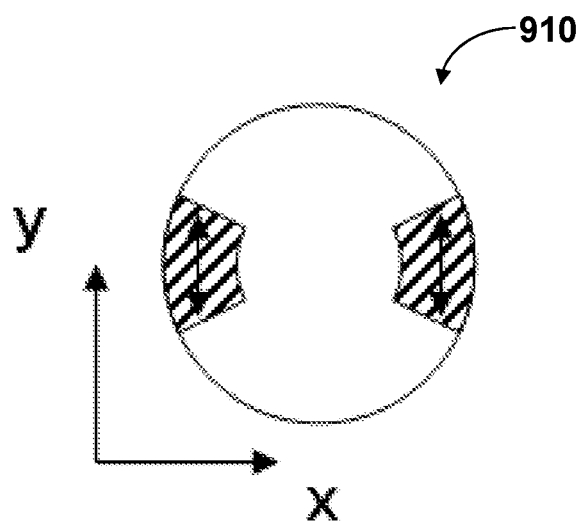
FIGS. 9A-9C show typical exemplary polarized illumination settings used in the projection exposure apparatus of FIG. 1.
Figure 9B:
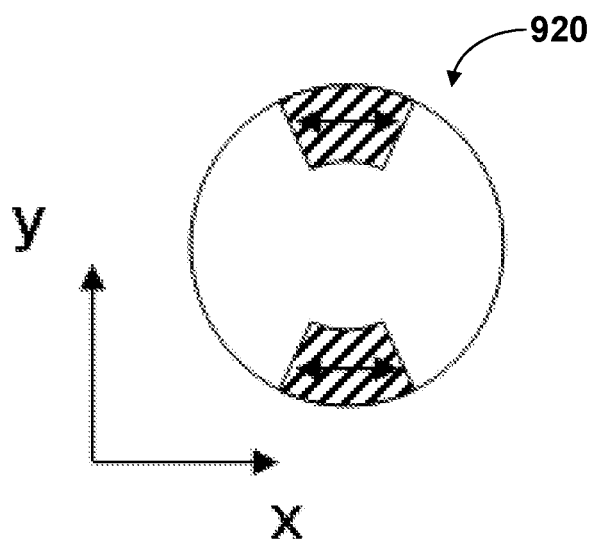
Figure 9C:
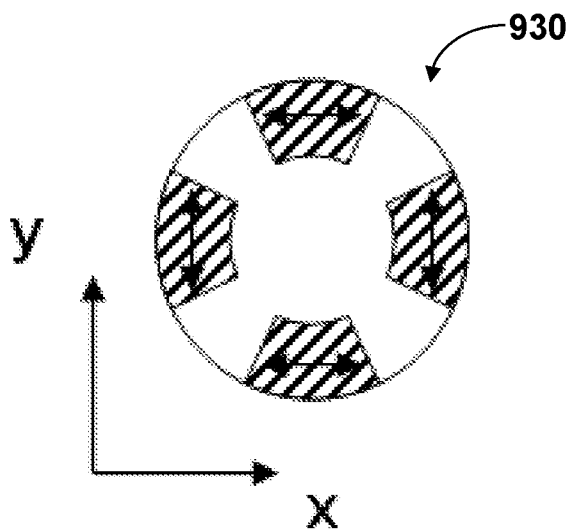

It can be gathered from the diagram of FIG. 3B that the value of the angle of rotation is low for relative pupil coordinates (−1,0) and (1,0), i.e. in "three o'clock-" and "nine o'clock" regions of the exit pupil, whereas relatively the higher values of the angle of rotation around 6° are obtained for other regions (namely 1:30 o'clock and 10:30 o'clock of the exit pupil). However, considering that typical polarized illumination settings used in the projection exposure apparatus of FIG. 1 look as schematically shown in FIG. 9A-9C, it can be seen that the achieved undesired polarization rotation is kept low just for the optically used region of the pupil (i.e. the illumination poles), while the relatively larger values of the angle of rotation obtained for the other regions of the pupil correspond to non-used regions and therefore have no negative impact on the optical performance of the system.

Figure 4A:
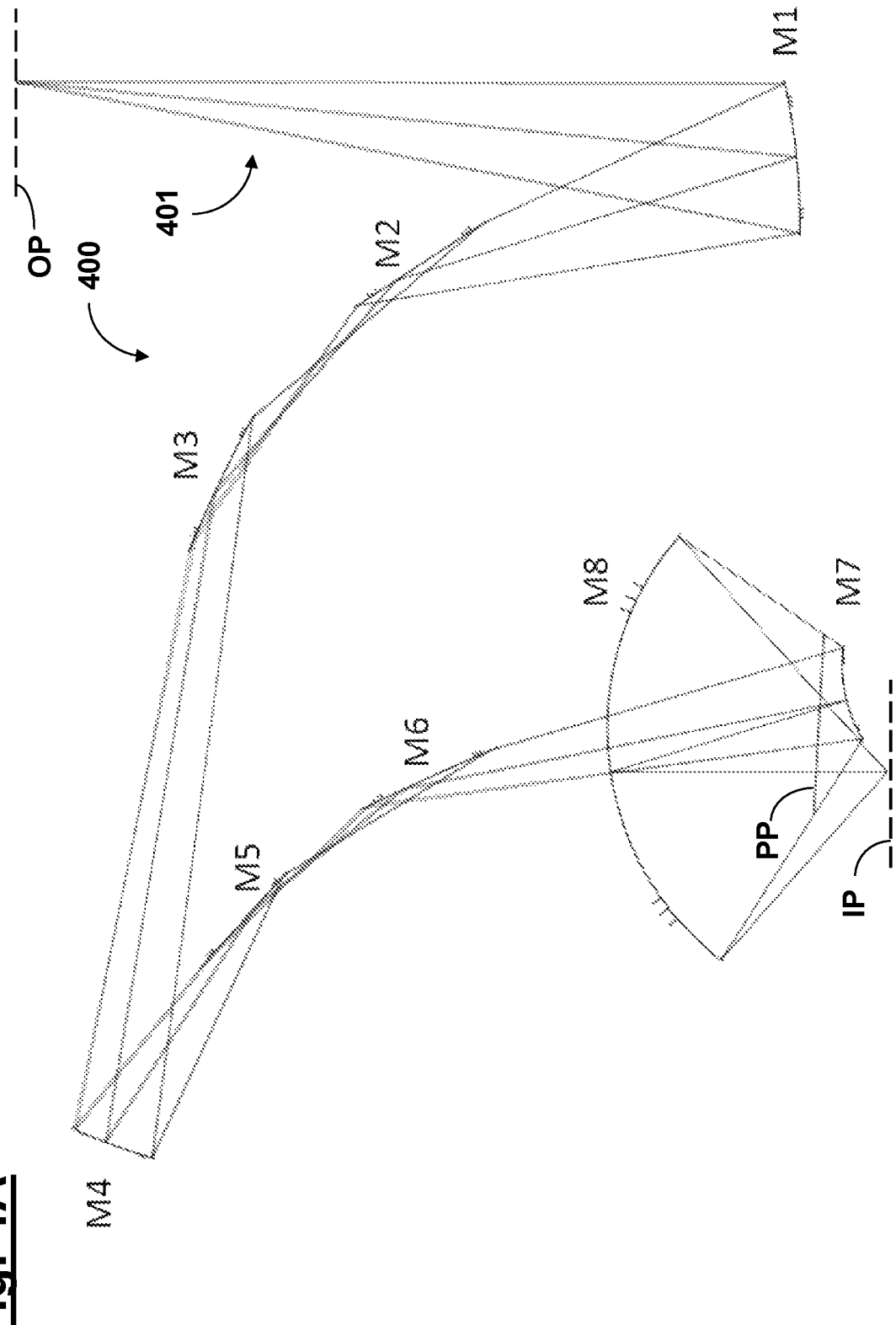
FIGS. 4A-8B show side views of further embodiments of a projection optical unit or respective distributions of the angles of rotation due to geometrical polarization rotation, respectively.

FIG. 4A shows a further embodiment of a projection optical unit 400 according to the disclosure which can be used instead of the projection optical unit 7 in the projection exposure apparatus 1 of FIG. 1. The optical design data of the reflection surfaces of the mirrors in the projection optical unit 400 of FIG. 4A can be gathered from Tables 11-15. Table 11 provides several basic data of the design data of the projection optical unit 400. Table 12 indicates vertex point radii (Radius$_x$, Radius$_y$) and refractive power values (Power$_x$, Power$_y$) for the optical surfaces of the optical components. Table 13 indicates the Decentring (location and angle) of the respective mirror surface as well as of the object field, the aperture stop and the image field with respect to the surface normal on the object field in the object plane OP, the surface normal being in the centre of the object plane OP. Table 14 indicates the free form coefficients of the surfaces. Table 15 indicates the coordinates of the aperture stop edge.

The projection optical unit 400 according to FIG. 4A has a total of eight mirrors, which are numbered consecutively by M1-M8 in the order of the beam path of the imaging light, proceeding from the object field. In the case of the projection optical unit 400 according to FIG. 4A, the mirrors M1, M4, M7 and M8 are embodied as normal incidence mirrors as defined above. Overall, the projection optical unit 400 according to FIG. 4A thus has four normal incidence mirrors M1, M4, M7 and M8. The mirrors M2, M3, M5 and M6 are mirrors for grazing incidence of the illumination light as defined above. A typical angle of incidence of the individual rays of the imaging light 401 on the mirrors for grazing incidence may lie in the region of 80°. Overall, the projection optical unit 400 according to FIG. 4A has exactly four mirrors M2, M3, M5 and M6 for grazing incidence.

Figure 4B:
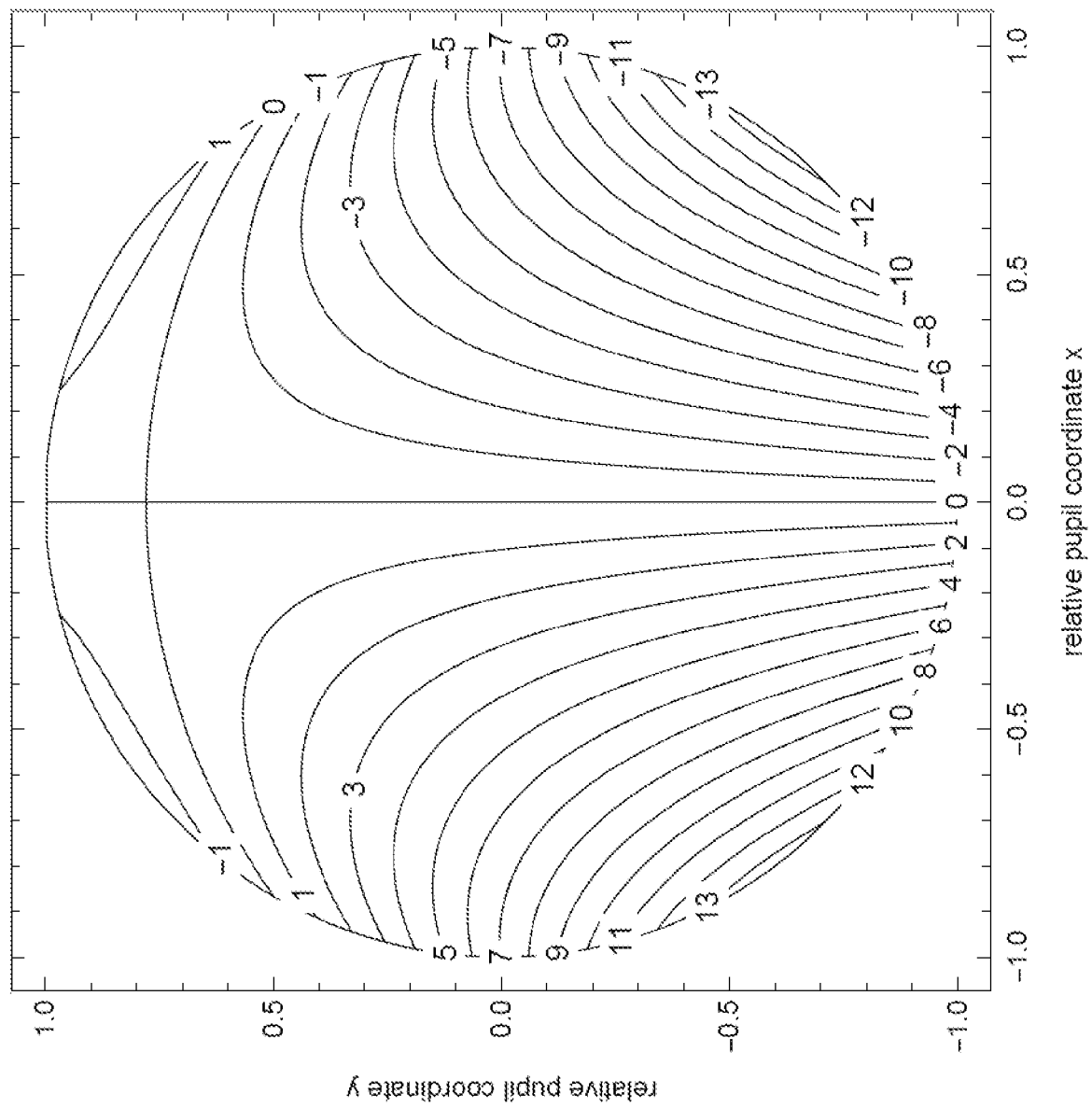

FIG. 4B represents a diagram showing the distribution of the angle of rotation due to the geometrical polarization rotation from the entrance area to the exit area of the projection optical unit 400 according to the embodiment of FIG. 4A across the exit pupil and in relative pupil coordinates (said coordinates being 0 at the centre of the exit pupil and 1 at the outer edge of the exit pupil). For relative pupil coordinate (1,0), an angle of rotation having a value of 7.03° is achieved. Furthermore, a circumferential distribution of the angle of rotation in the pupil plane of the projection optical unit exhibits four zero crossings of the value of the angle of rotation.

Figure 5A:
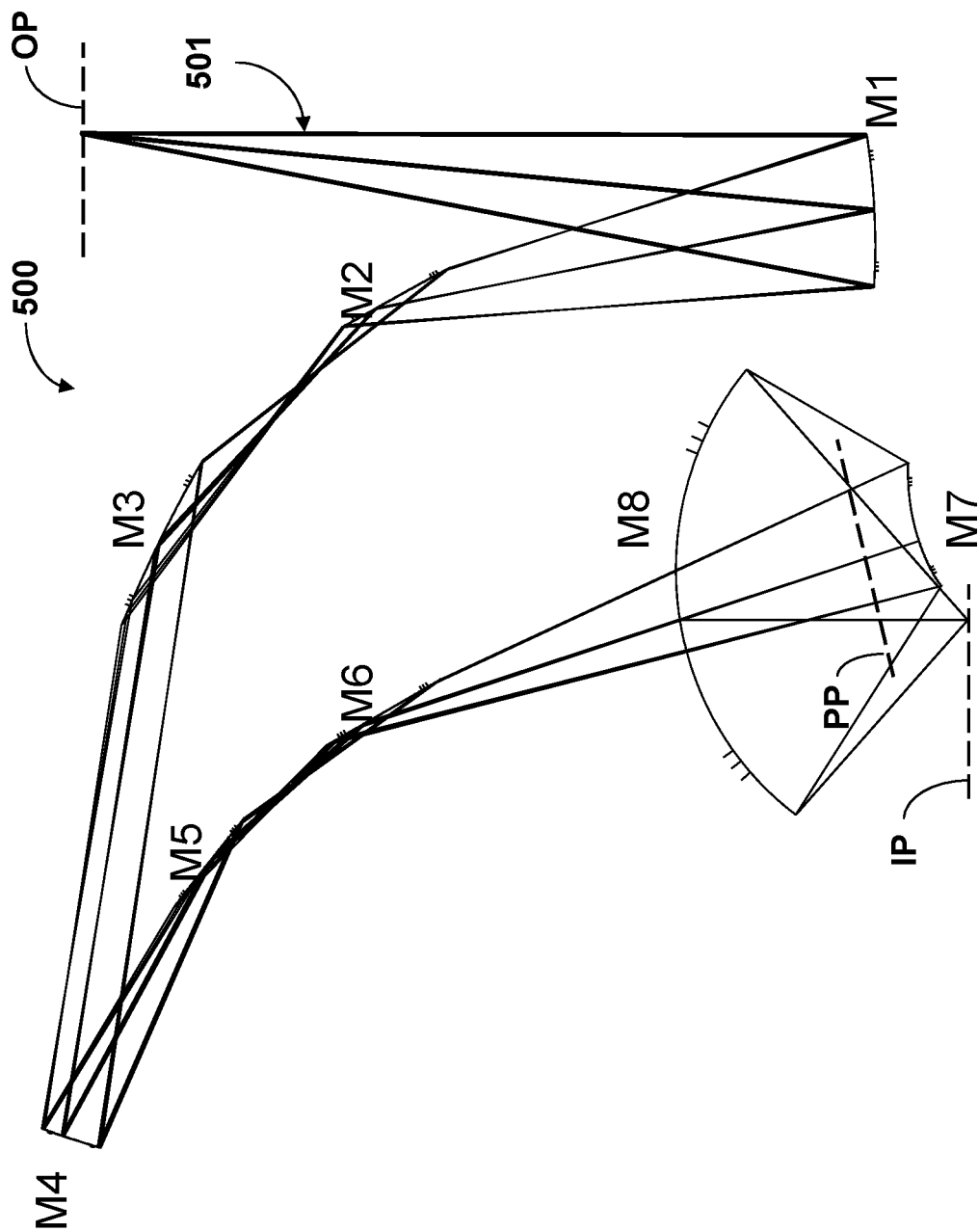

FIG. 5A shows a further embodiment of a projection optical unit 500 according to the disclosure which can be used instead of the projection optical unit 7 in the projection exposure apparatus 1 of FIG. 1. Components which correspond to those already explained above in relation to FIG. 4A are denoted by the same reference signs and are not discussed again in detail.

The principle design of the projection optical unit 500 is similar to projection optical unit 400 of FIG. 4A, for example regarding number of GI- or NI-mirrors, respectively. The optical design data of the reflection surfaces of the mirrors in the projection optical unit 500 of FIG. 5A can be gathered from Tables 16-20. Table 16 provides several basic data of the design data of the projection optical unit 500. Table 17 indicates vertex point radii (Radius$_x$, Radius$_y$) and refractive power values (Power$_x$, Power$_y$) for the optical surfaces of the optical components. Table 18 indicates the Decentring (location and angle) of the respective mirror surface as well as of the object field, the aperture stop and the image field with respect to the surface normal on the object field in the object plane OP, the surface normal being in the centre of the object plane. Table 19 indicates the free form coefficients of the surfaces. Table 20 indicates the coordinates of the aperture stop edge.

Figure 5B:
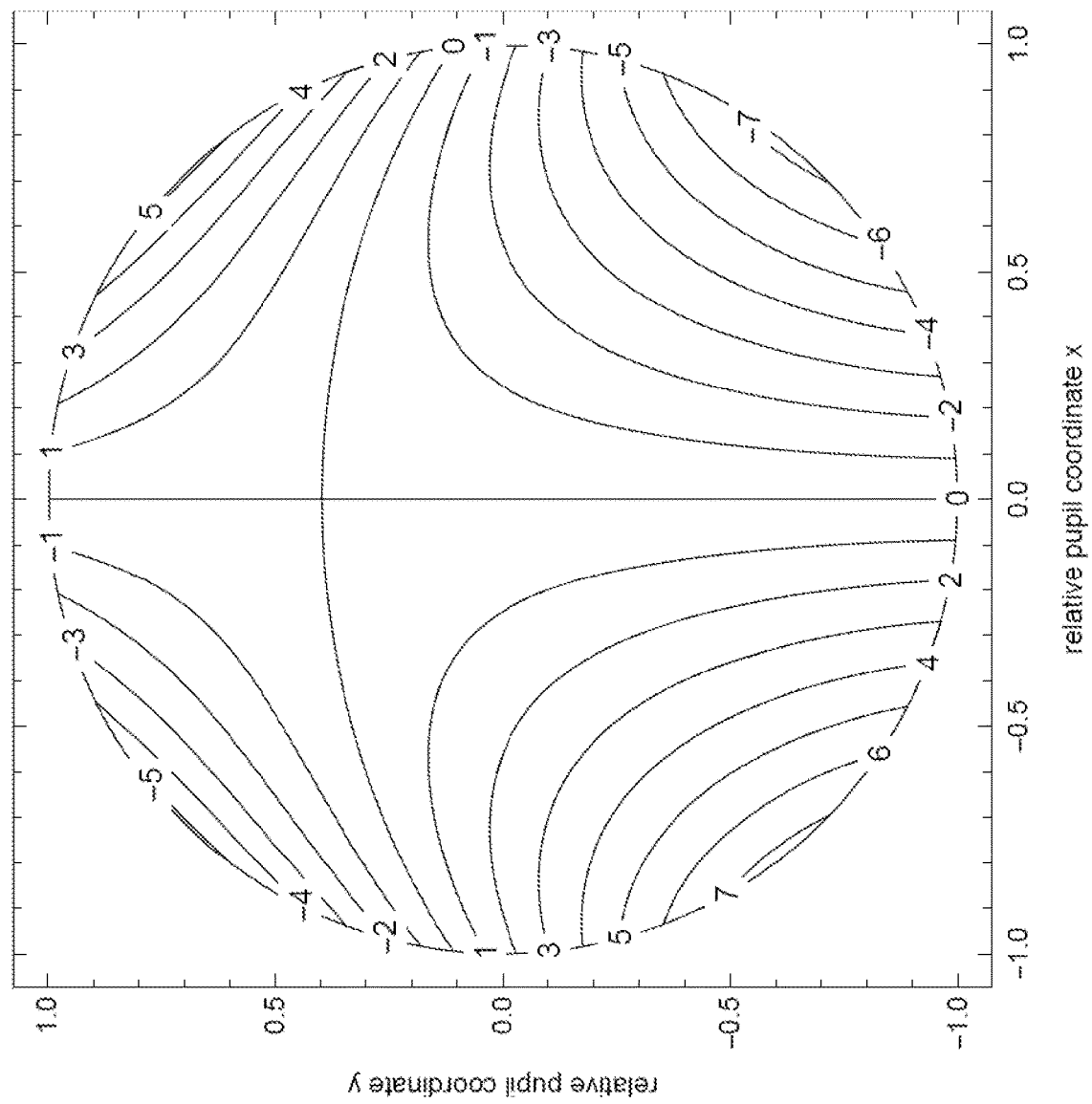

FIG. 5B represents a diagram showing the distribution of the angle of rotation due to the geometrical polarization rotation from the entrance area to the exit area of the projection optical unit 500 according to the embodiment of FIG. 5A across the exit pupil and in relative pupil coordinates (said coordinates being 0 at the centre of the exit pupil and 1 at the outer edge of the exit pupil). For relative pupil coordinate (1,0), an angle of rotation having a value of 1.55° is achieved. Furthermore, it can be gathered from the diagram of FIG. 5B that the value of the angle of rotation is low for relative pupil coordinates (−1,0) and (1,0), i.e. in "three o'clock-" and "nine o'clock-"regions of the exit pupil.

A circumferential distribution of the angle of rotation in the pupil plane of the projection optical unit exhibits four zero crossings of the value of the angle of rotation. More specifically, a circumferential distribution of the angle of rotation in the pupil plane of the projection optical unit 500 exhibits a zero crossing close to, i.e. within 10° on the circumference of both positive and negative x-axis, respectively, and also a zero crossing on both positive and negative y-axis, respectively.

Relatively the higher values of the angle of rotation around (4-6°) are obtained for other regions (namely 1:30 o'clock and 10:30 o'clock of the pupil). However, as already discussed above, considering that typical polarized illumination settings used in the projection exposure apparatus of FIG. 1 look as schematically shown in FIG. 9A-9C, it can be seen that the achieved undesired polarization rotation is kept low just for the optically used region of the pupil (i.e. the illumination poles), while the relatively larger values of the angle of rotation obtained for the other regions of the pupil correspond to non-used regions and therefore have no negative impact on the optical performance of the system.

Figure 6A:
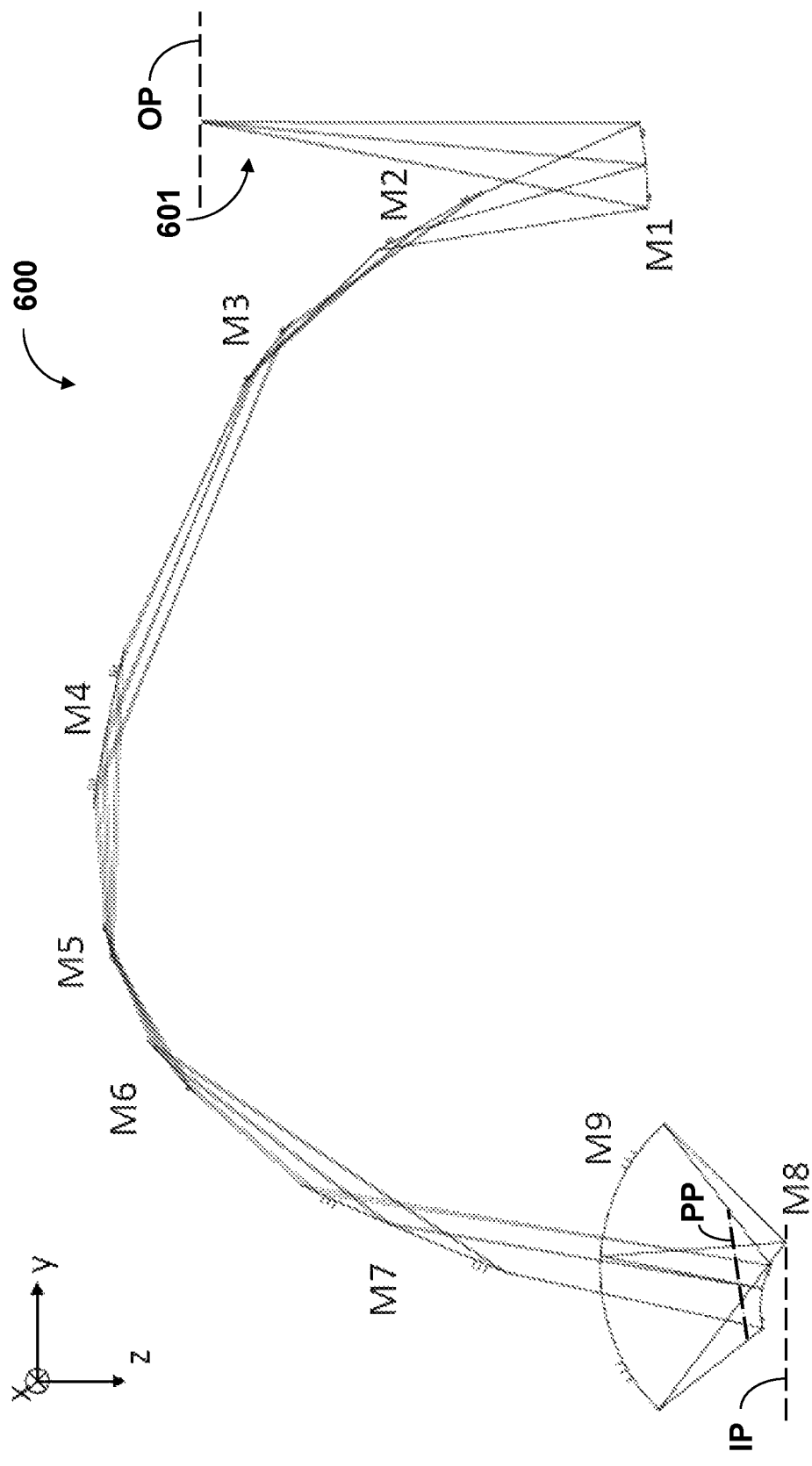

FIG. 6A shows a further embodiment of a projection optical unit 600. The optical design data of the reflection surfaces of the mirrors in the projection optical unit of FIG. 6A can be gathered from Tables 21-25. Table 21 provides several basic data of the design data of the projection optical unit 600. Table 22 indicates vertex point radii (Radius$_x$, Radius$_y$) and refractive power values (Power$_x$, Power$_y$) for the optical surfaces of the optical components. Table 23 indicates the Decentring (location and angle) of the respective mirror surface as well as of the object field, the aperture stop and the image field with respect to the surface normal on the object field in the object plane OP, the surface normal being in the centre of the object plane. Table 24 indicates the free form coefficients of the surfaces. Table 25 indicates the coordinates of the aperture stop edge.

The projection optical unit 600 according to FIG. 6A has a total of nine mirrors, which are numbered consecutively by M1 to M9 in the order of the beam path of the imaging light, proceeding from the object field. In the case of the projection optical unit according to FIG. 6A, the mirrors M1, M8 and M9 are embodied as normal incidence mirrors, that is to say as mirrors on which the imaging light 601 is incident with an angle of incidence that is less than 45°. Overall, the projection optical unit 600 according to FIG. 6A thus has three normal incidence mirrors M1, M8 and M9. The mirrors M2 to M7 are mirrors for grazing incidence of the illumination light as defined above. A typical angle of incidence of the individual rays of the imaging light 601 on the mirrors M2 to M7 for grazing incidence lies in the region of 80°. Overall, the projection optical unit 600 according to FIG. 6A has exactly six mirrors M2 to M7 for grazing incidence.

Figure 6B:
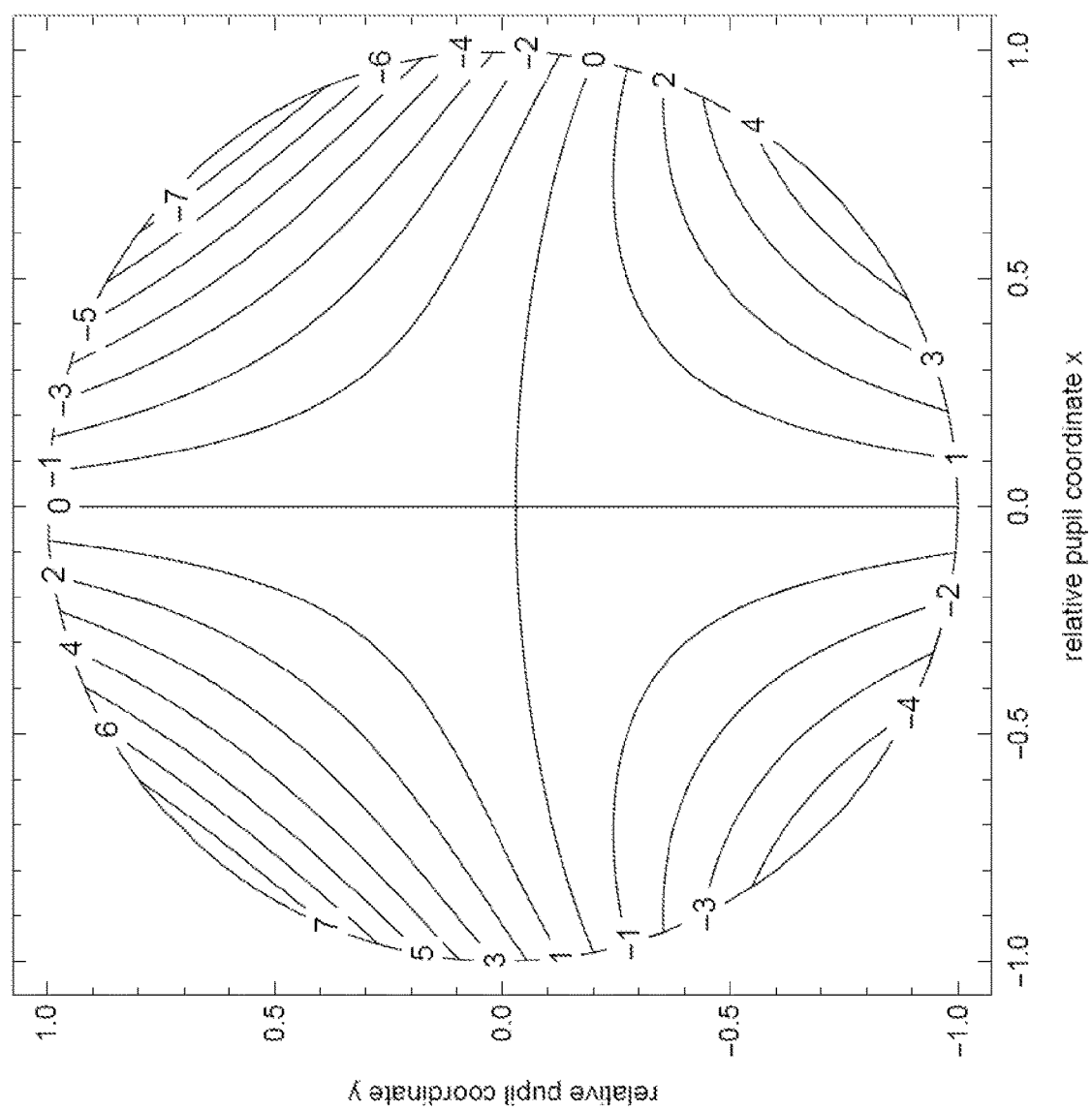

FIG. 6B represents a diagram showing the distribution of the angle of rotation due to the geometrical polarization rotation from the entrance area to the exit area of the projection optical unit 600 according to the embodiment of FIG. 6A across the exit pupil and in relative pupil coordinates (said coordinates being 0 at the centre of the exit pupil and 1 at the outer edge of the exit pupil). For relative pupil coordinate (1,0), an angle of rotation having a value of 2.76° is achieved.

Furthermore, a circumferential distribution of the angle of rotation in the pupil plane of the projection optical unit exhibits four zero crossings of the value of the angle of rotation. More specifically, a circumferential distribution of the angle of rotation in the pupil plane of the projection optical unit 600 exhibits a zero crossing within 30° of both positive and negative x-axis, respectively, and also a zero crossing within 10° of both positive and negative y-axis respectively.

Figure 7A:
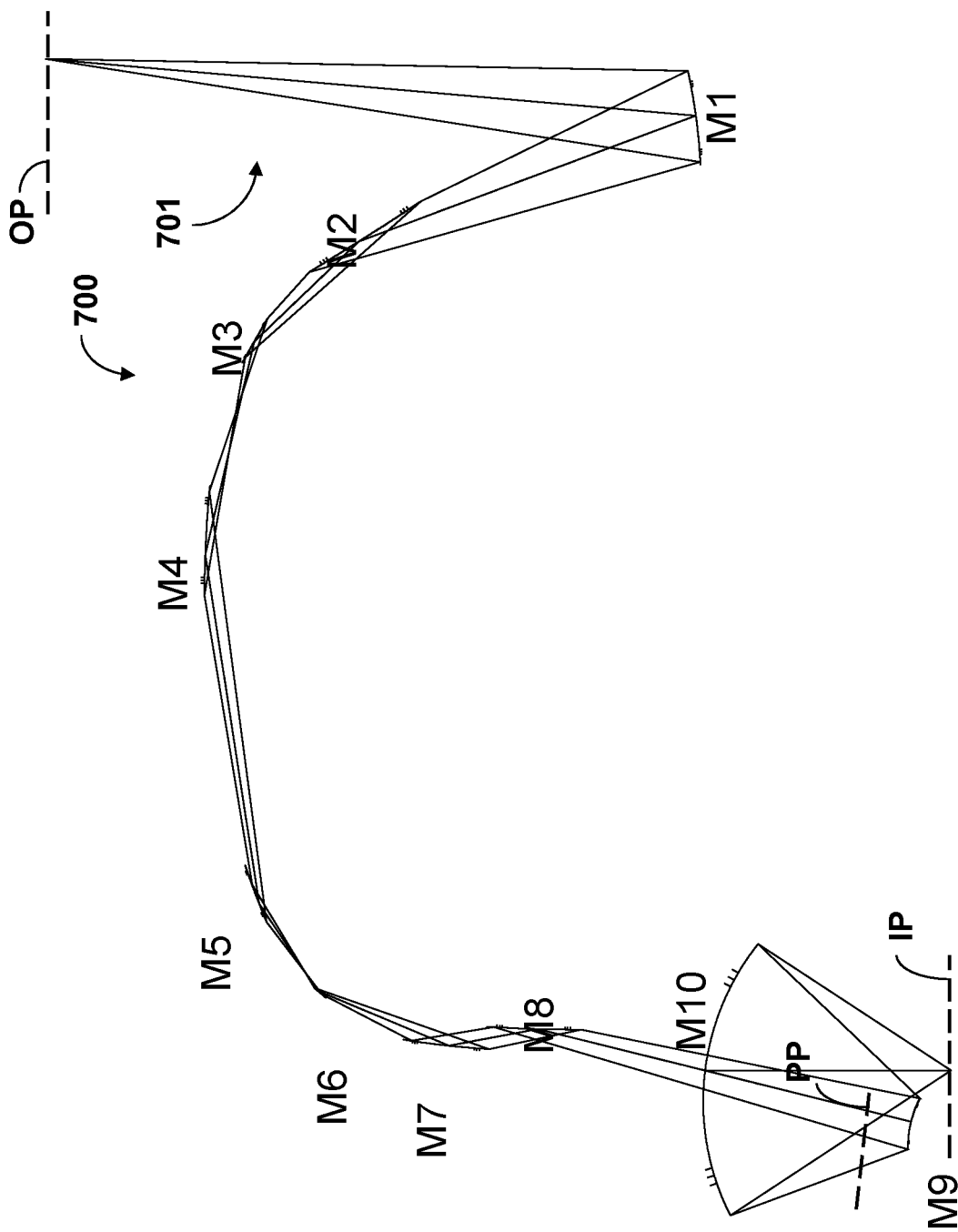

FIG. 7A shows a further embodiment of a projection optical unit 700. The optical design data of the reflection surfaces of the mirrors in the projection optical unit of FIG. 7A can be gathered from Tables 26-30. Table 26 provides several basic data of the design data of the projection optical unit 700. Table 27 indicates vertex point radii (Radius$_x$, Radius$_y$) and refractive power values (Power$_x$, Power$_y$) for the optical surfaces of the optical components. Table 28 indicates the Decentring (location and angle) of the respective mirror surface as well as of the object field, the aperture stop and the image field with respect to the surface normal on the object field in the object plane OP, the surface normal being in the centre of the object plane. Table 29 indicates the free form coefficients of the surfaces. Table 30 indicates the coordinates of the aperture stop edge.

In the case of the projection optical unit 700 according to FIG. 7A, the mirrors M1, M9 and M10 are embodied as NI-mirrors as defined above. Overall, the projection optical unit 700 according to FIG. 7A thus has three NI-mirrors M1, M9 and M10. The mirrors M2-M8 are GI-mirrors as defined above. Overall, the projection optical unit 700 according to FIG. 7A has exactly seven mirrors M2-M8 for grazing incidence.

Figure 7B:
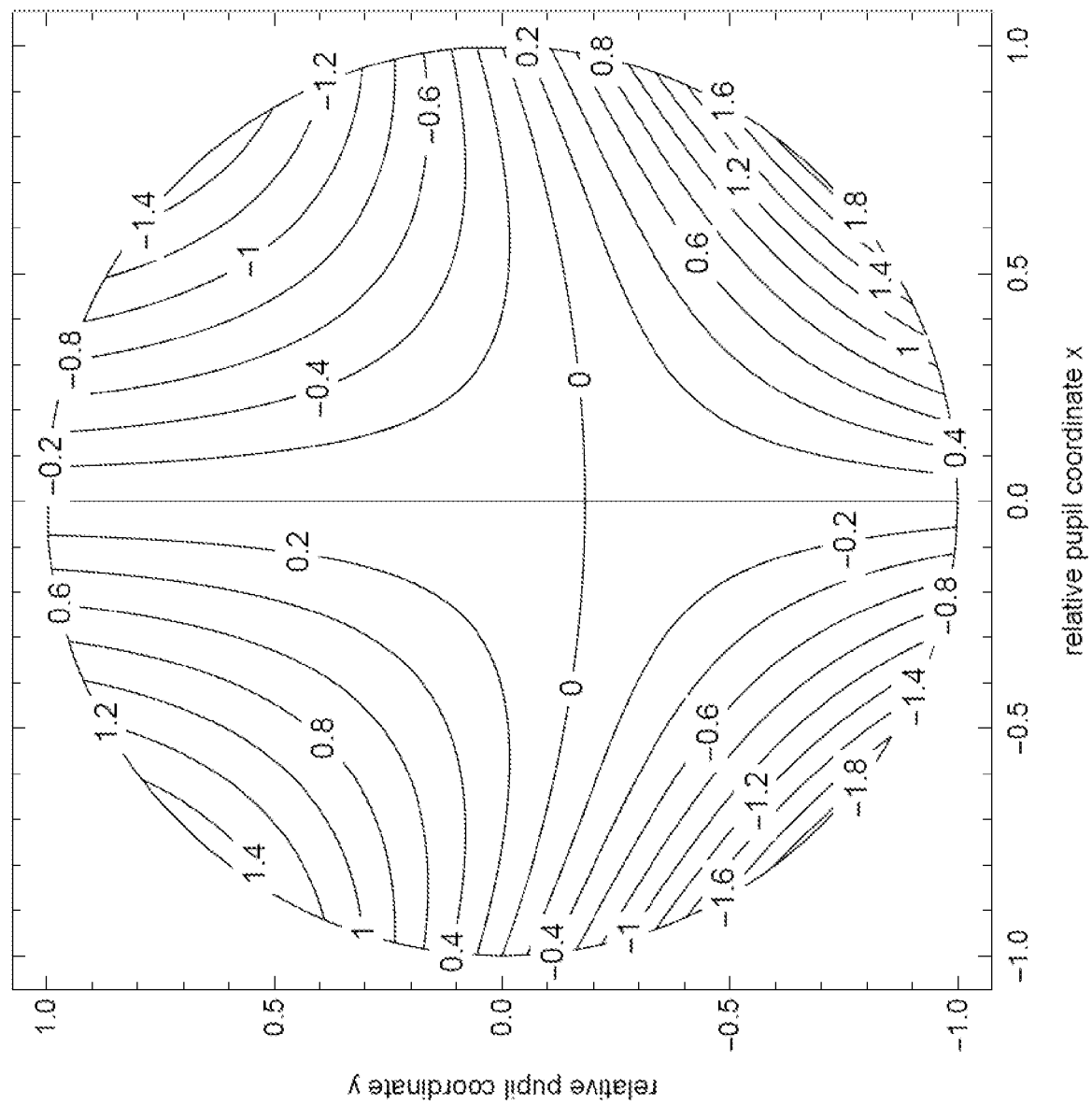

FIG. 7B represents a diagram showing the distribution of the angle of rotation due to the geometrical polarization rotation from the entrance area to the exit area of the projection optical unit 700 according to the embodiment of FIG. 7A across the exit pupil and in relative pupil coordinates (said coordinates being 0 at the centre of the exit pupil and 1 at the outer edge of the exit pupil). For relative pupil coordinate (1,0) an angle of rotation having a value of less than 0.01° is achieved. Furthermore, a circumferential distribution of the angle of rotation in the pupil plane of the projection optical unit exhibits four zero crossings of the value of the angle of rotation. More specifically, a circumferential distribution of the angle of rotation in the pupil plane of the projection optical unit 700 exhibits a zero crossing on both positive and negative x-axis within 30°, respectively, and also a zero crossing on both positive and negative y-axis within 10°, respectively.

Figure 8A:
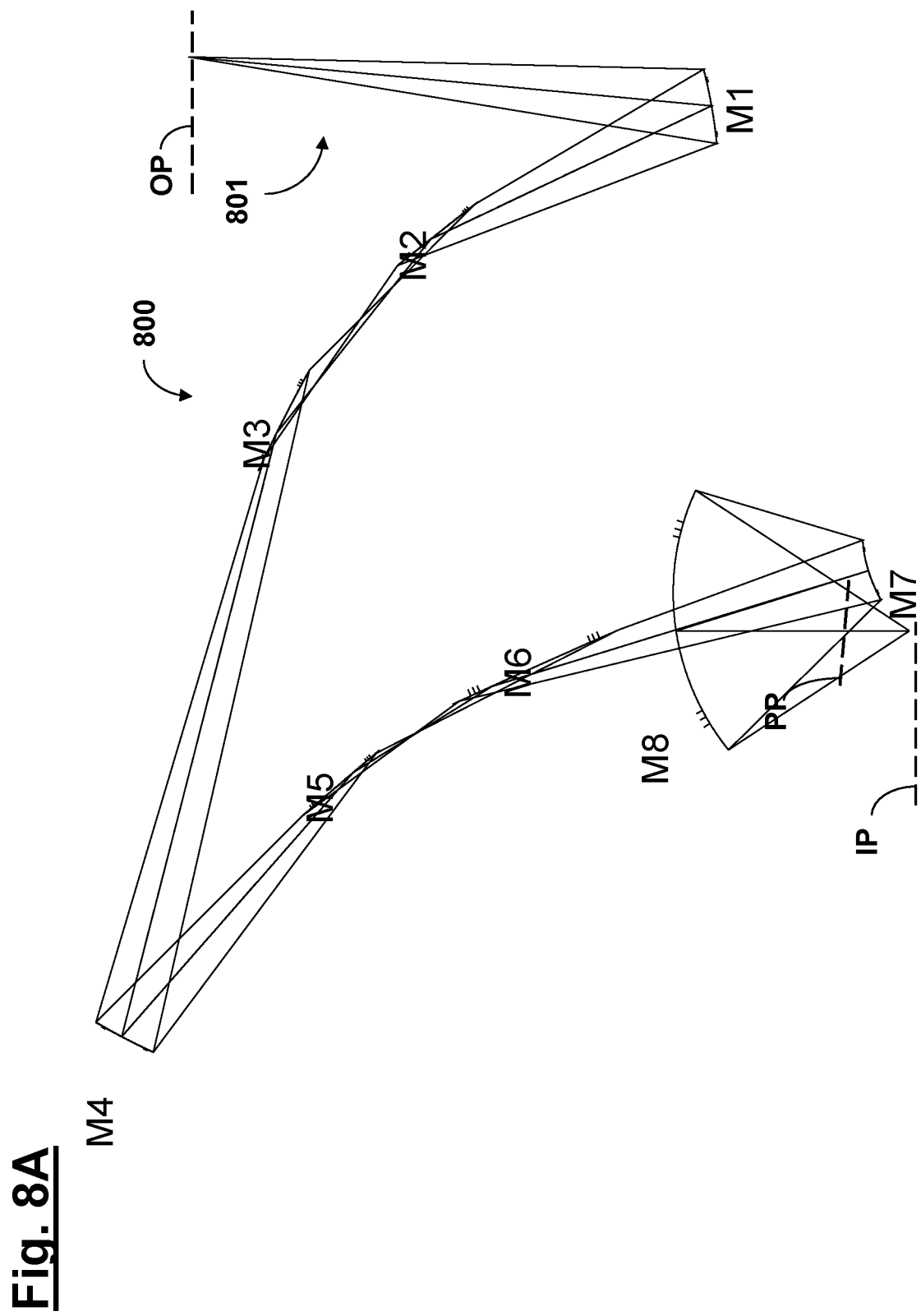

FIG. 8A shows a further embodiment of a projection optical unit 800. The optical design data of the reflection surfaces of the mirrors in the projection optical unit of FIG. 8A can be gathered from Tables 31-35. Table 31 provides several basic data of the design data of the projection optical unit 800. Table 32 indicates vertex point radii (Radius$_x$, Radius$_y$) and refractive power values (Power$_x$, Power$_y$) for the optical surfaces of the optical components. Table 33 indicates the Decentring (location and angle) of the respective mirror surface as well as of the object field, the aperture stop and the image field with respect to the surface normal on the object field in the object plane OP, the surface normal being in the centre of the object plane. Table 34 indicates the free form coefficients of the surfaces. Table 35 indicates the coordinates of the aperture stop edge.

The principle design of the projection optical unit 800 is similar to projection optical unit 400 of FIG. 4A or projection optical unit 500 of FIG. 5A, for example regarding number of GI- or NI-mirrors, respectively. However, the projection optical unit 800 has a numerical aperture of NA=0.55.

Figure 8B:
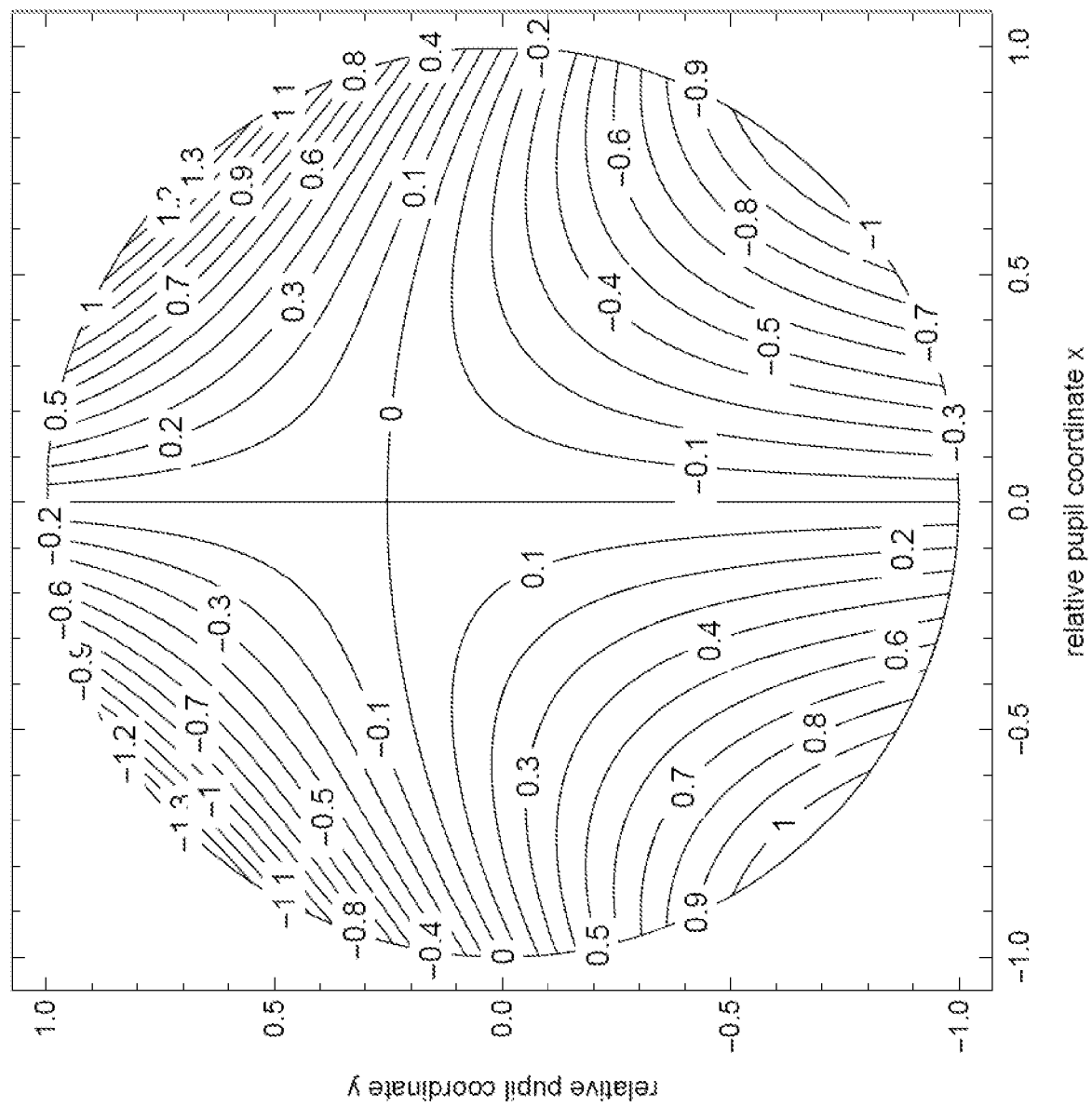

FIG. 8B represents a diagram showing the distribution of the angle of rotation due to the geometrical polarization rotation from the entrance area to the exit area of the projection optical unit 800 according to the embodiment of FIG. 8A across the exit pupil and in relative pupil coordinates (said coordinates being 0 at the centre of the exit pupil and 1 at the outer edge of the exit pupil). For relative pupil coordinate (1,0) an angle of rotation having a value of less than 0.01° is achieved. Furthermore, a circumferential distribution of the angle of rotation in the pupil plane of the projection optical unit exhibits four zero crossings of the value of the angle of rotation. More specifically, a circumferential distribution of the angle of rotation in the pupil plane of the projection optical unit 800 exhibits a zero crossing on both positive and negative x-axis, respectively, and also a zero crossing on both positive and negative y-axis, respectively.

TABLE 36

| projection optical unit | Whole System (="A + B") | | final two mirrors (="B") | | Ratio \|Z3A + Z3B\|/ |
|---|---|---|---|---|---|
| | \|Z3\| | \|Z6\| | \|Z3\| | \|Z6\| | \|Z3B\| |
| FIG. 2A | 12.59 | 8.71 | 16.42 | 7.62 | 0.766 |
| FIG. 3A | 1.98 | 5.30 | 17.72 | 5.36 | 0.112 |
| FIG. 4A | 8.46 | 6.68 | 12.90 | 5.72 | 0.655 |
| FIG. 5A | 2.57 | 5.69 | 14.75 | 5.21 | 0.174 |
| FIG. 6A | 1.53 | 5.73 | 13.28 | 5.28 | 0.116 |
| FIG. 7A | 0.13 | 1.63 | 8.43 | 1.94 | 0.015 |
| FIG. 8A | 0.16 | 1.14 | 9.78 | 0.99 | 0.016 |
| WO 2019/057803 A1 FIG. 3 | 11.96 | 4.51 | 8.27 | 2.81 | 1.445 |
| WO 2019/057803 A1 FIG. 5 | 19.06 | 5.22 | 8.16 | 2.19 | 2.337 |
| WO 2019/057803 A1 FIG. 4 | 5.95 | 1.47 | 6.99 | 1.84 | 0.852 |

As can be gathered from Table 36, the criterion |Z3A+Z3B|<0.2*|Z3B| is fulfilled for the embodiments of FIG. 3A, FIG. 5A, FIG. 6A, FIG. 7A and FIG. 8A. As already discussed before, this means that the resulting geometrical polarization rotation in the first part A (including first group of mirrors (M1 ... Mn−2)) will substantially compensate for the geometrical polarization rotation in the part B (including second group of mirrors (Mn−1, Mn)). Furthermore, even in the embodiments of FIG. 2A and FIG. 4A significant improvements regarding this compensation are achieved if compared with the prior art according to WO 2019/057803 A1.

TABLE 37

| projection optical unit | Absolute value of geometrical polarization rotation at relative pupil coordinates (−1, 0) | 35°*NA$^{4.5}$ |
|---|---|---|
| FIG. 2A | 16.45° | 9.59° |
| FIG. 3A | 0.95° | 9.59° |
| FIG. 4A | 7.03° | 9.59° |
| FIG. 5A | 1.55° | 9.59° |
| FIG. 6A | 2.76° | 9.59° |
| FIG. 7A | 0.00° | 2.38° |
| FIG. 8A | 0.00° | 2.38° |
| WO 2019/057803 A1 FIG. 3 | 13.09° | 2.38° |
| WO 2019/057803 A1 FIG. 4 | 6.28° | 2.38° |
| WO 2019/057803 A1 FIG. 5 | 18.34° | 2.38° |

Even though the disclosure has been described on the basis of specific embodiments, numerous variations and alternative embodiments are evident to the person skilled in the art, e.g. through combination and/or exchange of features of individual embodiments. Accordingly, it goes without saying for the person skilled in the art that such variations and alternative embodiments are concomitantly encompassed by the present disclosure, and the scope of the disclosure is restricted only within the meaning of the accompanying patent claims and the equivalents thereof.

Design Data for FIG. 2A

TABLE 1 for projection optical unit 200 of FIG. 2A:

| | |
|---|---|
| Numerical Aperture | 0.75 |
| Magnification in x-direction | 0.233 |
| Magnification in y-direction | 0.125 |
| Chief Ray angle | 5.50° |
| Wavelength | 13.5 nm |
| Image field size in x-direction | 26.0 mm |
| Image field size in y-direction | 1.0 mm |
| Average Wavefront-RMS | 8.57 mλ |

TABLE 2 for projection optical unit 200 of FIG. 2A:
Radii of Surfaces

| | Radius$_x$ [mm] | Power$_x$ [1/mm] | Radius$_y$ [mm] | Power$_y$ [1/mm] |
|---|---|---|---|---|
| M01 | −5865.81523622 | 0.00032883 | −2067.88312069 | 0.00093278 |
| M02 | −63374.79828420 | 0.00000395 | 21837.47821316 | −0.00001146 |
| M03 | −8366.11833895 | 0.00004865 | 4289.09824586 | −0.00009489 |
| M04 | −5869.08993915 | 0.00004517 | −12503.51063260 | 0.00002120 |
| M05 | −1600.48535592 | 0.00029099 | −3932.63888021 | 0.00011843 |
| M06 | −975.96408516 | 0.00047086 | −1810.95688936 | 0.00025376 |
| M07 | −1283.34039039 | 0.00021340 | 7378.23227667 | −0.00003712 |
| M08 | −5673.23901632 | 0.00009446 | −3258.25153471 | 0.00016447 |
| M09 | −4558.08819792 | 0.00014250 | 2055.71799723 | −0.00031595 |
| M10 | −12523.98260704 | 0.00013011 | 345.59408179 | −0.00471510 |
| M11 | −966.31588781 | 0.00205638 | −770.02679127 | 0.00258057 |

TABLE 3 for projection optical unit 200 of FIG. 2A:
Decentring (location, angle) of surfaces

| | Dx [mm] | Dy [mm] | Dz [mm] |
|---|---|---|---|
| Reticle | 0.000000000 | 0.000000000 | 0.000000000 |
| M01 | 0.000000000 | 206.342031983 | 2142.943936469 |
| M02 | 0.000000000 | 751.141443466 | 968.297457580 |
| M03 | 0.000000000 | 1108.062138516 | 663.676987878 |
| M04 | 0.000000000 | 1635.726818408 | 442.413885804 |
| M05 | 0.000000000 | 2111.326138465 | 406.569727272 |
| M06 | 0.000000000 | 2679.156490918 | 589.348742919 |
| M07 | 0.000000000 | 2934.877558834 | 814.689341392 |
| M08 | 0.000000000 | 3039.101069571 | 1089.907055701 |
| M09 | 0.000000000 | 3022.041362790 | 1355.258392494 |
| M10 | 0.000000000 | 3428.901782539 | 2177.702268715 |
| Stop | 0.000000000 | 3402.152487320 | 2082.218345511 |
| M11 | −0.000000000 | 3255.897127319 | 1560.147186330 |
| Wafer | 0.000000000 | 3255.896114501 | 2296.253294176 |

| | αx [°] | αy [°] | αz [°] |
|---|---|---|---|
| Reticle | 0.000000000 | 0.000000000 | 0.000000000 |
| M01 | 9.690902525 | 0.000000000 | 0.000000000 |
| M02 | −52.798949070 | 180.000000000 | 0.000000000 |
| M03 | 148.385382126 | 0.000000000 | 0.000000000 |
| M04 | −13.529777533 | 180.000000000 | 0.000000000 |
| M05 | 186.766417434 | 0.000000000 | 0.000000000 |
| M06 | 29.614629045 | 180.000000000 | 0.000000000 |
| M07 | 235.322492812 | 0.000000000 | 0.000000000 |
| M08 | 81.468563046 | 180.000000000 | 0.000000000 |
| M09 | 78.678541182 | 0.000000000 | 0.000000000 |
| M10 | −20.985690966 | 0.000000000 | 180.000000000 |
| Stop | 164.350076886 | −0.000000000 | −0.000000000 |
| M11 | 172.175077860 | −0.000000000 | 0.000000000 |
| Wafer | 0.000078834 | 0.000000000 | 180.000000000 |

TABLE 4 for projection optical unit 200 of FIG. 2a:
Free form coefficients of surfaces

| Coefficient | Formula | M01 | M02 | M03 |
|---|---|---|---|---|
| C7 | $x^2 y$ | −1.2467075401e−08 | −1.3348773466e−08 | 7.2872626293e−08 |
| C9 | $y^3$ | −2.6953264654e−08 | 5.4522752705e−08 | 2.6169253486e−08 |
| C10 | $x^4$ | −2.8831646046e−12 | 1.1120232774e−10 | 8.3530873147e−11 |
| C12 | $x^2 y^2$ | 8.7150874395e−11 | −4.0947377819e−11 | −6.8360178422e−11 |
| C14 | $y^4$ | −1.0666167107e−13 | 1.4339596189e−10 | −3.6577598249e−10 |
| C16 | $x^4 y$ | −2.7441641255e−14 | −5.3346116597e−14 | −3.0710710509e−13 |
| C18 | $x^2 y^3$ | −1.2726847989e−13 | −7.9668038501e−14 | −3.3418102422e−13 |
| C20 | $y^5$ | 3.4096328456e−14 | 3.7541752225e−13 | 3.4404548810e−13 |
| C21 | $x^6$ | 2.5253493969e−18 | 7.0684786785e−17 | −8.4079475057e−17 |
| C23 | $x^4 y^2$ | −4.9978048857e−18 | −1.4520801323e−16 | −1.3998707586e−16 |
| C25 | $x^2 y^4$ | 2.1956981883e−17 | −8.4757253555e−18 | 9.1295648997e−16 |
| C27 | $y^6$ | 6.1687302543e−16 | 1.0524429937e−15 | −1.8570296448e−16 |
| C29 | $x^6 y$ | 1.8197881520e−20 | −2.4040215447e−19 | −2.1766284207e−20 |
| C31 | $x^4 y^3$ | 2.1373260866e−19 | −5.2926133326e−19 | 2.2749446644e−18 |
| C33 | $x^2 y^5$ | −6.9752427252e−19 | 6.3832431855e−20 | −1.2828010170e−18 |
| C35 | $y^7$ | 3.8267458162e−20 | 2.9024294606e−18 | 1.0653505056e−18 |
| C36 | $x^8$ | −1.4480426797e−23 | −2.7727925287e−22 | −2.0063721628e−22 |
| C38 | $x^6 y^2$ | −1.4406031959e−22 | −2.3939935190e−22 | 1.1337619611e−21 |
| C40 | $x^4 y^4$ | 4.7370199633e−22 | −3.7474615537e−22 | −1.6921160199e−21 |
| C42 | $x^2 y^6$ | 1.7248831546e−22 | 2.9766960337e−22 | 1.0472902500e−20 |
| C44 | $y^8$ | −4.0532377358e−20 | 4.5184111748e−21 | 2.1987645795e−20 |
| C46 | $x^8 y$ | 1.8455150442e−25 | 5.1241278232e−24 | 2.7550084650e−25 |
| C48 | $x^6 y^3$ | 1.1327621011e−24 | 1.4806901695e−23 | −1.7730948982e−23 |
| C50 | $x^4 y^5$ | −3.3882508058e−26 | 1.6805001248e−23 | −4.9544283590e−23 |
| C52 | $x^2 y^7$ | −1.4219723243e−23 | −3.4237769863e−24 | 2.9346082042e−23 |
| C54 | $y^9$ | 1.4149924319e−23 | −8.4824871060e−24 | 1.3561832619e−22 |
| C55 | $x^{10}$ | 4.9751179229e−28 | 6.3407118335e−27 | 2.8338518017e−27 |
| C57 | $x^8 y^2$ | 4.7112576339e−27 | −6.9025162063e−27 | −1.2277211414e−27 |
| C59 | $x^6 y^4$ | −4.5961567305e−27 | 2.7190597791e−26 | −5.2905365082e−26 |
| C61 | $x^4 y^6$ | −5.5773662955e−26 | 5.2462314959e−26 | −2.5445274816e−25 |
| C63 | $x^2 y^8$ | 2.0082504680e−25 | −6.1081784301e−26 | −5.9730875595e−25 |
| C65 | $y^{10}$ | 2.2199203861e−24 | −4.8557028558e−26 | −2.3348782296e−24 |
| C67 | $x^{10} y$ | −3.7476656440e−30 | −7.6485672979e−29 | 1.4947673172e−29 |
| C69 | $x^8 y^3$ | −2.3612566194e−29 | −2.4774184419e−28 | 2.2980316977e−28 |
| C71 | $x^6 y^5$ | 2.2187607217e−29 | −3.8120053547e−28 | 1.3217596278e−27 |
| C73 | $x^4 y^7$ | 5.6100070166e−28 | −2.4974317927e−28 | 2.3177009413e−27 |
| C75 | $x^2 y^9$ | 2.0618081612e−27 | −2.6148149268e−28 | −5.5909056888e−27 |
| C77 | $y^{11}$ | −2.7963329316e−27 | 2.0179748939e−29 | −8.7279402890e−27 |
| C78 | $x^{12}$ | −7.4572827042e−33 | −4.4335237142e−32 | −1.9168206138e−33 |
| C80 | $x^{10} y^2$ | −8.5474716742e−32 | 1.4379898868e−31 | −4.2609800121e−32 |
| C82 | $x^8 y^4$ | −9.7649702863e−32 | −2.1619359366e−31 | 7.2298850863e−31 |
| C84 | $x^6 y^6$ | 1.0909533068e−30 | −1.4261848410e−30 | 5.5278484571e−30 |
| C86 | $x^4 y^8$ | 4.3562596563e−31 | −1.1108019099e−30 | 1.3375757200e−29 |
| C88 | $x^2 y^{10}$ | −1.8513248324e−29 | −2.6661306772e−32 | 2.8874205794e−29 |
| C90 | $y^{12}$ | −7.9907007621e−29 | 6.5273825658e−31 | 9.7434965821e−29 |
| C92 | $x^{12} y$ | 4.6491819082e−35 | 6.2946912638e−34 | −1.8258273973e−34 |
| C94 | $x^{10} y^3$ | 3.2696788977e−34 | 2.3921661224e−33 | −1.9530306250e−33 |
| C96 | $x^8 y^5$ | 3.2943984047e−35 | 4.8919543389e−33 | −1.6350292078e−32 |
| C98 | $x^6 y^7$ | −8.5405894077e−33 | 3.6166305683e−33 | −5.6396440055e−32 |
| C100 | $x^4 y^9$ | −4.0709966516e−32 | 2.1558509865e−33 | −4.6125475690e−32 |
| C102 | $x^2 y^{11}$ | −1.0107878822e−31 | 2.5105814333e−33 | 3.2773437248e−31 |
| C104 | $y^{13}$ | 1.2064533186e−31 | 2.2238147891e−33 | 3.2764546096e−31 |
| C105 | $x^{14}$ | 6.3869752879e−38 | 1.9267680796e−37 | −6.1173550883e−38 |
| C107 | $x^{12} y^2$ | 9.1504573841e−37 | −1.4859024048e−36 | 2.7620723221e−37 |
| C109 | $x^{10} y^4$ | 3.3617202635e−36 | 3.1707721165e−37 | −5.6617008379e−36 |
| C111 | $x^8 y^6$ | −6.1736717784e−36 | 1.7203953853e−35 | −6.3584720655e−35 |
| C113 | $x^6 y^8$ | −3.0501766360e−35 | 2.6161789349e−35 | −2.4679393483e−34 |
| C115 | $x^4 y^{10}$ | 1.3612671094e−34 | 1.5370839273e−35 | −3.6650099068e−34 |
| C117 | $x^2 y^{12}$ | 8.7866861356e−34 | 3.6940452189e−36 | −8.3324769412e−34 |
| C119 | $y^{14}$ | 1.9021319268e−33 | 4.1320176184e−36 | −2.2908549281e−33 |
| C121 | $x^{14} y$ | −3.1724176080e−40 | −3.0807880840e−39 | 9.2385422123e−40 |
| C123 | $x^{12} y^3$ | −2.3810083642e−39 | −1.2424284034e−38 | 9.3884607054e−39 |
| C125 | $x^{10} y^5$ | −2.2954013538e−39 | −2.9276025660e−38 | 1.0258041544e−37 |
| C127 | $x^8 y^7$ | 6.8833317428e−38 | −1.3241913303e−38 | 5.0251757855e−37 |
| C129 | $x^6 y^9$ | 4.8297911637e−37 | 1.3699222053e−38 | 1.3274285064e−36 |
| C131 | $x^4 y^{11}$ | 1.4452002485e−36 | 1.1315058418e−38 | −4.9607731988e−37 |
| C133 | $x^2 y^{13}$ | 2.7654094061e−36 | −1.8600600480e−38 | −9.5896503707e−36 |
| C135 | $y^{15}$ | −2.6915220538e−36 | 4.8587893131e−39 | −7.7241296372e−36 |
| C136 | $x^{16}$ | −3.2793717012e−43 | −6.3852937662e−43 | 3.2595223358e−43 |
| C138 | $x^{14} y^2$ | −5.5830068597e−42 | 8.3494970336e−42 | −6.5706319173e−43 |
| C140 | $x^{12} y^4$ | −3.4791199924e−41 | 1.0109081574e−41 | 2.6770336445e−41 |
| C142 | $x^{10} y^6$ | −4.3291872187e−41 | −8.5936562967e−41 | 3.9604946354e−40 |
| C144 | $x^8 y^8$ | 1.6767359119e−40 | −1.9152785634e−40 | 2.1226841939e−39 |
| C146 | $x^6 y^{10}$ | −5.6292179529e−40 | −1.4700794960e−40 | 5.4757816113e−39 |
| C148 | $x^4 y^{12}$ | −7.1918752381e−39 | −3.3947448651e−41 | 4.8572679588e−39 |

TABLE 4-continued for projection optical unit 200 of FIG. 2a:
Free form coefficients of surfaces

| | | | | |
|---|---|---|---|---|
| C150 | $x^2 y^{14}$ | −2.3139623471e−38 | −8.2864415218e−41 | 9.1762922206e−39 |
| C152 | $y^{16}$ | −2.8589050266e−38 | 2.8656510927e−42 | 2.7944022154e−38 |
| C154 | $x^{16} y$ | 1.1477662036e−45 | 7.9930480890e−45 | −2.2605783918e−45 |
| C156 | $x^{14} y^3$ | 9.2616541272e−45 | 3.4010054371e−44 | −2.3674050015e−44 |
| C158 | $x^{12} y^5$ | 1.2851129925e−44 | 8.3336097293e−44 | −3.2024594546e−43 |
| C160 | $x^{10} y^7$ | −2.7867510516e−43 | −4.8400370596e−44 | −1.9990836609e−42 |
| C162 | $x^8 y^9$ | −2.6947148783e−42 | −2.8140377193e−43 | −7.9826907998e−42 |
| C164 | $x^6 y^{11}$ | −1.0858659838e−41 | −2.0682298229e−43 | −1.4165695961e−41 |
| C166 | $x^4 y^{13}$ | −2.4853387780e−41 | 2.9582280271e−44 | 3.1801923441e−41 |
| C168 | $x^2 y^{15}$ | −3.9711405260e−41 | −1.4308615014e−43 | 1.4697289355e−40 |
| C170 | $y^{17}$ | 3.2641760546e−41 | −2.4317654285e−45 | 1.0630088012e−40 |
| C171 | $x^{18}$ | 9.3807609535e−49 | 1.6378787333e−48 | −6.4808506262e−49 |
| C173 | $x^{16} y^2$ | 1.8283088759e−47 | −2.4206936389e−47 | −1.1563651995e−49 |
| C175 | $x^{14} y^4$ | 1.5953422359e−46 | −6.2271486286e−47 | −7.1113764658e−47 |
| C177 | $x^{12} y^6$ | 5.6583172524e−46 | 1.3937263454e−46 | −1.2634373210e−45 |
| C179 | $x^{10} y^8$ | 7.6229354122e−46 | 4.5318249979e−46 | −8.5225093411e−45 |
| C181 | $x^8 y^{10}$ | 3.1739238245e−45 | 4.8998793816e−46 | −3.3084943577e−44 |
| C183 | $x^6 y^{12}$ | 3.4177288975e−44 | 4.0161527675e−46 | −5.7411650994e−44 |
| C185 | $x^4 y^{14}$ | 1.4252492265e−43 | 3.3762735692e−46 | 5.6542785431e−45 |
| C187 | $x^2 y^{16}$ | 3.1868584702e−43 | −1.2274024014e−46 | 5.0891077426e−44 |
| C189 | $y^{18}$ | 2.3977551585e−43 | −7.8790612609e−48 | −1.2166288242e−43 |
| C191 | $x^{18} y$ | −1.7128948485e−51 | −8.3805817185e−51 | 2.2125779066e−51 |
| C193 | $x^{16} y^3$ | −1.4883568540e−50 | −3.7077347056e−50 | 2.4521093939e−50 |
| C195 | $x^{14} y^5$ | −2.3912620643e−50 | −7.5292211098e−50 | 3.9284796942e−49 |
| C197 | $x^{12} y^7$ | 4.8593150694e−49 | 3.5431064161e−49 | 2.9667556677e−48 |
| C199 | $x^{10} y^9$ | 5.6888315159e−48 | 1.3222909580e−48 | 1.5482033905e−47 |
| C201 | $x^8 y^{11}$ | 3.0206266472e−47 | 1.6349217442e−48 | 4.9386213025e−47 |
| C203 | $x^6 y^{13}$ | 8.7406145932e−47 | 1.0908913057e−48 | 3.9694377865e−47 |
| C205 | $x^4 y^{15}$ | 1.7340860718e−46 | 5.1552747781e−49 | −3.4005094327e−46 |
| C207 | $x^2 y^{17}$ | 2.3521148980e−46 | −4.6486529691e−50 | −9.4109560003e−46 |
| C209 | $y^{19}$ | −1.6709407871e−46 | −7.6701722815e−51 | −6.3098039019e−46 |
| C210 | $x^{20}$ | −1.1468848753e−54 | −1.7457410846e−54 | 4.3570623621e−55 |
| C212 | $x^{18} y^2$ | −2.5001515592e−53 | 2.8668298254e−53 | 1.7728301296e−54 |
| C214 | $x^{16} y^4$ | −2.7651704796e−52 | 1.1765705998e−52 | 8.2674940144e−53 |
| C216 | $x^{14} y^6$ | −1.5117327693e−51 | 1.3842730364e−52 | 1.5956297553e−51 |
| C218 | $x^{12} y^8$ | −5.1705595202e−51 | 4.4714717095e−52 | 1.3173465132e−50 |
| C220 | $x^{10} y^{10}$ | −1.6792580509e−50 | 1.0920179092e−51 | 6.6249699918e−50 |
| C222 | $x^8 y^{12}$ | −8.3711007658e−50 | 1.1685063976e−51 | 1.9755952480e−49 |
| C224 | $x^6 y^{14}$ | −3.6866845106e−49 | 6.7111631193e−52 | 1.7123109378e−49 |
| C226 | $x^4 y^{16}$ | −1.0443243640e−48 | 2.5054124967e−52 | −5.8864825581e−49 |
| C228 | $x^2 y^{18}$ | −1.8004435241e−48 | −3.5724159060e−54 | −1.3320070960e−48 |
| C230 | $y^{20}$ | −8.3786576508e−49 | −2.7757694088e−54 | −3.4128789070e−49 |

| Coefficient | Formula | M04 | M05 | M06 |
|---|---|---|---|---|
| C7 | $x^2 y$ | −3.6700133384e−08 | 1.7042974089e−07 | −2.0480366437e−07 |
| C9 | $y^3$ | −5.7287310877e−08 | 1.8329534520e−07 | −1.3351148892e−07 |
| C10 | $x^4$ | −1.3078966541e−11 | −7.3246062700e−11 | −3.6848147529e−11 |
| C12 | $x^2 y^2$ | −1.4203917227e−10 | −2.7831729760e−10 | 1.9290327097e−10 |
| C14 | $y^4$ | 7.5743698221e−12 | 3.0191416398e−10 | −4.4112925525e−10 |
| C16 | $x^4 y$ | −5.1658206112e−14 | 2.0676363930e−13 | −4.0530454997e−14 |
| C18 | $x^2 y^3$ | 7.0418551844e−14 | −7.8216923265e−13 | 3.9854901706e−13 |
| C20 | $y^5$ | −3.5747190902e−13 | 4.1867438787e−13 | −1.1829911786e−12 |
| C21 | $x^6$ | −1.0754632158e−16 | −7.3656042742e−17 | 3.5200753218e−17 |
| C23 | $x^4 y^2$ | 1.1215826578e−16 | 6.9545794086e−16 | 1.5296672235e−16 |
| C25 | $x^2 y^4$ | −1.1651146483e−15 | −1.4026048310e−15 | 2.4919127685e−15 |
| C27 | $y^6$ | 2.3649213987e−16 | 1.1661669079e−15 | −2.7411025624e−15 |
| C29 | $x^6 y$ | −4.9440628101e−20 | −1.9250085058e−19 | −2.8747932278e−19 |
| C31 | $x^4 y^3$ | −1.4468724292e−18 | 1.5135432501e−18 | 1.0503981929e−18 |
| C33 | $x^2 y^5$ | 7.0824206121e−19 | −3.1788955639e−18 | 1.0399666150e−18 |
| C35 | $y^7$ | −2.6840255909e−18 | 5.7604630484e−18 | −1.1014997984e−17 |
| C36 | $x^8$ | 2.6294592498e−22 | −1.9373546658e−22 | 7.6838924127e−23 |
| C38 | $x^6 y^2$ | −1.0350678913e−21 | −2.4460077129e−22 | −2.7847668393e−22 |
| C40 | $x^4 y^4$ | 5.0543353236e−22 | 1.6196049150e−21 | 3.8995189582e−21 |
| C42 | $x^2 y^6$ | −1.1205770492e−20 | −2.4062532838e−20 | 4.1506251632e−20 |
| C44 | $y^8$ | 2.1694724585e−21 | 2.9586095393e−20 | −1.1491259381e−19 |
| C46 | $x^8 y$ | 8.4213689375e−27 | −8.9827517875e−25 | 2.0909924066e−24 |
| C48 | $x^6 y^3$ | −1.7367668878e−24 | 4.1150494318e−24 | −7.8425379783e−24 |
| C50 | $x^4 y^5$ | −2.3985047039e−23 | 3.2236798153e−23 | 8.5843437502e−26 |
| C52 | $x^2 y^7$ | 1.7287082428e−24 | −1.3290724685e−22 | 4.4033566923e−22 |
| C54 | $y^9$ | −1.2823183278e−23 | 1.6040369832e−22 | 1.9095650545e−22 |
| C55 | $x^{10}$ | 2.4238747769e−28 | 5.9096193178e−28 | −8.1084224761e−28 |
| C57 | $x^8 y^2$ | −1.4982322594e−27 | −6.5645236630e−27 | −1.6423935345e−27 |
| C59 | $x^6 y^4$ | −2.1390901048e−26 | −5.5045862363e−27 | −1.0430999339e−25 |
| C61 | $x^4 y^6$ | 1.6681724215e−26 | 2.9227815738e−25 | −1.8895699255e−25 |
| C63 | $x^2 y^8$ | −7.0237136767e−26 | −6.7722687188e−25 | 4.0505828100e−24 |
| C65 | $y^{10}$ | 2.4333214003e−26 | −2.3808964965e−25 | 2.3560154932e−23 |

TABLE 4-continued for projection optical unit 200 of FIG. 2a:
Free form coefficients of surfaces

| | | | | |
|---|---|---|---|---|
| C67 | $x^{10} y$ | −1.6918059411e−30 | 5.8570977465e−30 | −6.2239027538e−30 |
| C69 | $x^8 y^3$ | 1.8829768076e−29 | −3.2613936578e−29 | 2.8552709311e−29 |
| C71 | $x^6 y^5$ | 1.4690425614e−28 | −3.3152880116e−28 | −2.4400121243e−29 |
| C73 | $x^4 y^7$ | −8.0097778566e−30 | 1.5104915598e−27 | −4.2676022696e−27 |
| C75 | $x^2 y^9$ | 2.7148958160e−29 | −2.1539397256e−28 | −1.8896091404e−26 |
| C77 | $y^{11}$ | −6.5704559491e−28 | −1.6565619517e−27 | 8.1614231345e−26 |
| C78 | $x^{12}$ | −1.0712008455e−32 | 2.4153132799e−33 | 1.4680669517e−32 |
| C80 | $x^{10} y^2$ | 1.6238209942e−32 | 2.1031045010e−32 | 5.8354605559e−32 |
| C82 | $x^8 y^4$ | 1.5166353717e−31 | 2.0972339221e−31 | 1.3915893190e−30 |
| C84 | $x^6 y^6$ | −8.6754341381e−32 | −2.4841441959e−30 | 6.8829183770e−30 |
| C86 | $x^4 y^8$ | −1.1110462694e−30 | 4.7852615681e−31 | −5.4514331977e−29 |
| C88 | $x^2 y^{10}$ | −1.8159396617e−30 | 8.5175413179e−30 | −6.6867616452e−28 |
| C90 | $y^{12}$ | −1.2304810888e−30 | 1.6215783997e−29 | −1.7864360072e−27 |
| C92 | $x^{12} y$ | 6.3527779161e−36 | −1.6974774937e−35 | 2.2745618876e−35 |
| C94 | $x^{10} y^3$ | −2.3849048526e−34 | 5.3268848016e−36 | 3.1502174681e−34 |
| C96 | $x^8 y^5$ | −2.2036381819e−33 | 2.6749960357e−33 | 2.8708428491e−33 |
| C98 | $x^6 y^7$ | −6.5336046556e−33 | −1.6419378208e−33 | 1.1017588724e−32 |
| C100 | $x^4 y^9$ | −6.3070218917e−33 | −1.1596757316e−32 | 8.5522668869e−32 |
| C102 | $x^2 y^{11}$ | −1.4693343154e−34 | −7.2636980661e−32 | −1.7366438020e−30 |
| C104 | $y^{13}$ | 1.4976526361e−32 | −2.7264782440e−32 | −1.0089269760e−29 |
| C105 | $x^{14}$ | 5.6308419542e−38 | −3.2252557680e−38 | −1.1454353459e−37 |
| C107 | $x^{12} y^2$ | −1.4108599096e−37 | 1.0729332416e−37 | −4.9647410419e−37 |
| C109 | $x^{10} y^4$ | −2.5872606079e−36 | −2.4047735053e−36 | −9.7328562946e−36 |
| C111 | $x^8 y^6$ | −1.1883017107e−35 | 6.0191831848e−36 | −1.0369036968e−34 |
| C113 | $x^6 y^8$ | −1.0443291919e−35 | 3.4710799755e−35 | −1.2483255673e−34 |
| C115 | $x^4 y^{10}$ | 2.7590767087e−35 | 9.4769583335e−35 | 6.7445152276e−33 |
| C117 | $x^2 y^{12}$ | 1.7266433307e−35 | 1.8927177921e−34 | 4.0443316595e−32 |
| C119 | $y^{14}$ | 6.7915420727e−35 | −6.9613090075e−35 | 6.5018048380e−32 |
| C121 | $x^{14} y$ | −5.0649726310e−41 | 2.3769845183e−41 | −2.9051580950e−40 |
| C123 | $x^{12} y^3$ | 5.5259332201e−40 | 9.5354582017e−40 | −4.8209218514e−39 |
| C125 | $x^{10} y^5$ | 6.3817821378e−39 | −7.6767231566e−39 | −5.7637625524e−38 |
| C127 | $x^8 y^7$ | 3.9909861483e−38 | −5.4329932699e−38 | −3.0504362990e−37 |
| C129 | $x^6 y^9$ | 1.0102156483e−37 | −1.7671082312e−37 | −1.8703499935e−37 |
| C131 | $x^4 y^{11}$ | 4.2886788351e−38 | −1.5958102538e−37 | 2.6393608717e−35 |
| C133 | $x^2 y^{13}$ | 4.9881331722e−38 | 1.1218556828e−37 | 2.1984786100e−34 |
| C135 | $y^{15}$ | −3.1960378941e−37 | −9.3528611633e−39 | 4.8507459279e−34 |
| C136 | $x^{16}$ | −1.4358934165e−43 | 1.4701033587e−43 | 4.3882643258e−43 |
| C138 | $x^{14} y^2$ | 3.9748427477e−43 | −1.2195424014e−42 | 1.4153467198e−42 |
| C140 | $x^{12} y^4$ | 1.3749398106e−41 | 9.6469333394e−42 | 2.7823982873e−41 |
| C142 | $x^{10} y^6$ | 1.0297847080e−40 | 3.6010638137e−41 | 5.0247433350e−40 |
| C144 | $x^8 y^8$ | 2.9601396795e−40 | 1.1763473394e−40 | 3.6995636298e−39 |
| C146 | $x^6 y^{10}$ | −1.2777609073e−41 | 4.5950186874e−40 | −1.2980567669e−38 |
| C148 | $x^4 y^{12}$ | −5.1048564764e−40 | −7.7445091316e−40 | −2.8355333367e−37 |
| C150 | $x^2 y^{14}$ | −5.0782162527e−40 | −1.3193572817e−39 | −9.4257509537e−37 |
| C152 | $y^{16}$ | −1.4579060460e−39 | 2.0799704512e−39 | −1.5038541695e−36 |
| C154 | $x^{16} y$ | 2.0154821528e−46 | 2.6647580751e−47 | 1.7361446270e−45 |
| C156 | $x^{14} y^3$ | 6.8874602347e−46 | −3.4954067719e−46 | 2.3477810371e−44 |
| C158 | $x^{12} y^5$ | 1.9559473702e−44 | −1.9389410142e−44 | 3.4450346821e−43 |
| C160 | $x^{10} y^7$ | 7.1985425649e−44 | 2.3035504536e−44 | 3.4866968576e−42 |
| C162 | $x^8 y^9$ | −2.8996546511e−43 | −3.7446334389e−43 | 1.6108654591e−41 |
| C164 | $x^6 y^{11}$ | −1.4013647138e−42 | 5.3208318576e−43 | −1.1037996511e−40 |
| C166 | $x^4 y^{13}$ | −1.8193256206e−42 | 6.1157061180e−43 | −2.0351301098e−39 |
| C168 | $x^2 y^{15}$ | −1.7091682461e−42 | 4.7103532526e−42 | −8.2550488067e−39 |
| C170 | $y^{17}$ | 2.5916836012e−42 | −6.1904614785e−42 | −1.5401598688e−38 |
| C171 | $x^{18}$ | 2.0012595755e−49 | −3.5645323616e−49 | 6.9586090867e−49 |
| C173 | $x^{16} y^2$ | −2.6735963566e−49 | 4.0070798473e−48 | 1.8520254700e−48 |
| C175 | $x^{14} y^4$ | −3.1437136099e−47 | −6.4044322083e−48 | 4.4793398010e−48 |
| C177 | $x^{12} y^6$ | −2.9944153145e−46 | −3.0655564683e−47 | −3.7032556350e−46 |
| C179 | $x^{10} y^8$ | −1.6660483412e−45 | 7.3432840763e−47 | −7.0773712917e−45 |
| C181 | $x^8 y^{10}$ | −3.2149495209e−45 | −1.0382631617e−46 | −2.6131092666e−44 |
| C183 | $x^6 y^{12}$ | −2.0639664214e−45 | −1.3652668732e−46 | 3.1412245022e−43 |
| C185 | $x^4 y^{14}$ | 1.2286527783e−45 | −1.5605497514e−45 | 1.7551025373e−42 |
| C187 | $x^2 y^{16}$ | −5.1188906429e−46 | 2.1531613890e−45 | 5.7465284774e−43 |
| C189 | $y^{18}$ | 1.5227006124e−44 | −1.3796309583e−44 | 8.7946462638e−42 |
| C191 | $x^{18} y$ | −3.2820014708e−52 | −1.8126270057e−52 | −2.9917983911e−51 |
| C193 | $x^{16} y^3$ | −6.6284086455e−51 | −1.4583083501e−51 | −3.9062227880e−50 |
| C195 | $x^{14} y^5$ | −1.6282458495e−49 | 2.9648369767e−50 | −6.7483675395e−49 |
| C197 | $x^{12} y^7$ | −1.3780473324e−48 | 2.0776249555e−50 | −1.0037974646e−47 |
| C199 | $x^{10} y^9$ | −4.5911698188e−48 | −8.8282447911e−50 | −7.9990423389e−47 |
| C201 | $x^8 y^{11}$ | −5.4845962701e−48 | −6.9971795329e−49 | −2.1593654423e−46 |
| C203 | $x^6 y^{13}$ | 7.0379329679e−48 | 3.0513498842e−48 | 5.3872983443e−45 |
| C205 | $x^4 y^{15}$ | 1.1819083873e−48 | −5.1618223070e−48 | 3.9160602719e−44 |
| C207 | $x^2 y^{17}$ | 1.8192701726e−47 | −1.7356530650e−47 | 1.1308312031e−43 |
| C209 | $y^{19}$ | −1.2454738189e−47 | 7.3456802311e−47 | 2.7995760313e−43 |
| C210 | $x^{20}$ | −1.3790480398e−55 | 3.6328442047e−55 | 2.6839428824e−55 |
| C212 | $x^{18} y^2$ | −1.2386681712e−54 | −3.1444934676e−54 | −9.7338901310e−54 |
| C214 | $x^{16} y^4$ | −8.8626427437e−54 | 1.3804123481e−53 | −1.1555404922e−52 |

TABLE 4-continued for projection optical unit 200 of FIG. 2a:
Free form coefficients of surfaces

| | | | | |
|---|---|---|---|---|
| C216 | $x^{14} y^6$ | −2.9238385754e−52 | −7.2456197426e−53 | −1.9677199453e−51 |
| C218 | $x^{12} y^8$ | −1.3197597774e−51 | 6.7553728490e−53 | −2.0738568955e−50 |
| C220 | $x^{10} y^{10}$ | −4.5486200869e−51 | 7.4420983603e−52 | −1.4263767011e−49 |
| C222 | $x^8 y^{12}$ | 1.9351560669e−51 | −2.6267265497e−51 | −2.0530374273e−49 |
| C224 | $x^6 y^{14}$ | 2.0461363631e−53 | 5.0128044498e−51 | 1.3472678906e−47 |
| C226 | $x^4 y^{16}$ | 1.8658293344e−50 | −4.6692918177e−51 | 7.2276371737e−47 |
| C228 | $x^2 y^{18}$ | −3.7612810227e−53 | 2.7593126858e−50 | 2.3234380683e−46 |
| C230 | $y^{20}$ | −4.7360117086e−50 | −8.3509865344e−50 | 5.6080959191e−46 |

| Coefficient | Formula | M07 | M08 | M09 |
|---|---|---|---|---|
| C7 | $x^2 y$ | 2.8532185189e−07 | 2.4061929143e−07 | −4.0775365688e−08 |
| C9 | $y^3$ | −4.5488655424e−07 | 2.2560132539e−07 | −2.7379463806e−07 |
| C10 | $x^4$ | 1.3083632819e−11 | 5.9615095385e−11 | −1.6038386672e−10 |
| C12 | $x^2 y^2$ | −1.0484017643e−09 | 1.8554389819e−10 | −1.0961343130e−09 |
| C14 | $y^4$ | 1.8996982820e−09 | −3.5056498342e−10 | 3.3765922105e−11 |
| C16 | $x^4 y$ | −4.6317598744e−13 | 4.4552157676e−13 | −7.9855804676e−13 |
| C18 | $x^2 y^3$ | 3.2314583170e−12 | 2.8042795574e−12 | −7.0220759554e−12 |
| C20 | $y^5$ | −4.5588666977e−11 | 1.8028731397e−12 | −1.7398088518e−12 |
| C21 | $x^6$ | −1.9124329121e−16 | −7.5794191403e−16 | 2.1893082964e−15 |
| C23 | $x^4 y^2$ | −3.5839736697e−15 | −1.3549434157e−15 | −6.5079186813e−15 |
| C25 | $x^2 y^4$ | −1.7483598425e−13 | −1.4728274545e−15 | −7.4386360584e−15 |
| C27 | $y^6$ | 2.3135062742e−14 | −4.2680681592e−15 | 3.6373247624e−15 |
| C29 | $x^6 y$ | −6.8891899026e−18 | −3.9058789300e−18 | 3.3130026057e−17 |
| C31 | $x^4 y^3$ | −2.3313296927e−16 | 1.1961183241e−17 | 1.6410032269e−17 |
| C33 | $x^2 y^5$ | 4.7971439136e−16 | 3.4678894092e−17 | −3.6833219506e−17 |
| C35 | $y^7$ | −5.6401667395e−16 | 2.7103550207e−17 | −7.9177802849e−17 |
| C36 | $x^8$ | −2.4317709323e−21 | −5.0437952188e−21 | 9.2271219909e−20 |
| C38 | $x^6 y^2$ | −1.0919948308e−19 | −3.2698263728e−20 | 5.8623247451e−19 |
| C40 | $x^4 y^4$ | 1.6814114466e−18 | −4.3596330218e−20 | 4.2800966543e−19 |
| C42 | $x^2 y^6$ | −1.5491795995e−18 | −1.1015132994e−19 | −3.6707024772e−20 |
| C44 | $y^8$ | −1.3330810569e−18 | −1.3386882215e−19 | 1.5567218575e−18 |
| C46 | $x^8 y$ | −4.2719693341e−24 | −7.7580502574e−23 | 4.1643168273e−22 |
| C48 | $x^6 y^3$ | 2.6085179331e−21 | −1.7375813191e−22 | −1.4473125427e−21 |
| C50 | $x^4 y^5$ | 3.0702865156e−22 | −3.1489144950e−23 | 4.5772089645e−22 |
| C52 | $x^2 y^7$ | 1.5560608864e−20 | −1.7261355830e−22 | 1.3431030284e−20 |
| C54 | $y^9$ | 2.0392183142e−19 | −9.6136536487e−22 | 3.8123400770e−21 |
| C55 | $x^{10}$ | 2.3667396340e−26 | 8.1464025681e−26 | −1.1266508645e−23 |
| C57 | $x^8 y^2$ | 1.6441834920e−24 | −3.5202628796e−25 | −7.5082287435e−23 |
| C59 | $x^6 y^4$ | 2.1973208099e−24 | −1.3153022433e−24 | −1.1736229718e−22 |
| C61 | $x^4 y^6$ | 7.9295222982e−23 | 3.2895106760e−25 | −5.3608955541e−23 |
| C63 | $x^2 y^8$ | 1.7951290560e−21 | 7.7371753570e−24 | −4.7093624693e−23 |
| C65 | $y^{10}$ | 4.9842221371e−21 | 1.0332735138e−23 | −3.2149245834e−22 |
| C67 | $x^{10} y$ | 3.5006540973e−28 | 3.5065031645e−27 | −2.6452023300e−25 |
| C69 | $x^8 y^3$ | −7.7978908619e−27 | 1.0076622074e−26 | 8.7993705331e−26 |
| C71 | $x^6 y^5$ | −6.4046109658e−26 | 2.5775458725e−26 | −5.3733599844e−26 |
| C73 | $x^4 y^7$ | 5.1079962282e−24 | 7.2191087015e−26 | −1.6730534114e−24 |
| C75 | $x^2 y^9$ | 2.6170987443e−23 | 1.2558423366e−25 | −3.3782577747e−24 |
| C77 | $y^{11}$ | 2.9102580743e−23 | 1.7571604472e−25 | −7.7107111005e−25 |
| C78 | $x^{12}$ | −6.1560955854e−31 | 1.0219202551e−30 | 5.0482378307e−28 |
| C80 | $x^{10} y^2$ | −1.1960387607e−30 | 3.0561316671e−29 | 5.6666965393e−27 |
| C82 | $x^8 y^4$ | −5.1048098909e−28 | 5.4323088747e−29 | 2.0082529763e−26 |
| C84 | $x^6 y^6$ | 5.5428647630e−27 | −1.5498400907e−29 | 2.7970284660e−26 |
| C86 | $x^4 y^8$ | 3.4314118094e−26 | −6.6503542465e−28 | −3.6124989963e−28 |
| C88 | $x^2 y^{10}$ | 4.7589780997e−26 | −1.6260553985e−27 | 1.7756985794e−26 |
| C90 | $y^{12}$ | 1.0458848866e−25 | −1.3207895158e−27 | 5.8458031137e−26 |
| C92 | $x^{12} y$ | 4.0587948695e−33 | −5.1246858224e−32 | 2.4689568452e−29 |
| C94 | $x^{10} y^3$ | −5.5847808284e−31 | −2.5653473589e−31 | 1.4705738347e−29 |
| C96 | $x^8 y^5$ | 5.7044473156e−30 | −1.0423853264e−30 | 5.3209699385e−29 |
| C98 | $x^6 y^7$ | −9.6738416644e−30 | −3.0598206424e−30 | 2.9827578891e−28 |
| C100 | $x^4 y^9$ | −3.4735527805e−28 | −7.4491713306e−30 | 4.2190642278e−28 |
| C102 | $x^2 y^{11}$ | −2.8747681291e−28 | −1.0436545170e−29 | 4.9576477196e−28 |
| C104 | $y^{13}$ | 2.0091784512e−27 | −1.3818919767e−29 | 4.5090759219e−29 |
| C105 | $x^{14}$ | 1.1781180905e−35 | −3.9083713694e−35 | −4.9461851945e−33 |
| C107 | $x^{12} y^2$ | −5.4539038778e−34 | −7.8711283224e−34 | −2.1857713698e−31 |
| C109 | $x^{10} y^4$ | 1.1388844809e−32 | −2.0622400755e−33 | −1.7953425704e−30 |
| C111 | $x^8 y^6$ | −1.3059832507e−32 | −3.1378843592e−33 | −3.5775579951e−30 |
| C113 | $x^6 y^8$ | −6.6933508266e−31 | 1.5092584011e−32 | −2.0273059312e−30 |
| C115 | $x^4 y^{10}$ | −3.2309336140e−30 | 8.7592354477e−32 | 1.3201409551e−30 |
| C117 | $x^2 y^{12}$ | 3.0524852836e−30 | 1.3962418388e−31 | −3.1603639681e−30 |
| C119 | $y^{14}$ | 3.7956761183e−29 | 8.8008755619e−32 | −6.3449275640e−30 |
| C121 | $x^{14} y$ | −2.5977239860e−37 | 2.3806627730e−37 | −1.0591625188e−33 |
| C123 | $x^{12} y^3$ | 1.0575267671e−35 | 3.9257057969e−36 | −2.5474094459e−33 |
| C125 | $x^{10} y^5$ | 2.6567643627e−35 | 2.8125507809e−35 | −9.6488582526e−33 |
| C127 | $x^8 y^7$ | 6.0875840438e−35 | 8.7459906478e−35 | −3.7681886641e−32 |
| C129 | $x^6 y^9$ | −5.9273079296e−34 | 2.5391347274e−34 | −5.3184636610e−32 |
| C131 | $x^4 y^{11}$ | −1.3672746912e−32 | 5.1310138045e−34 | −4.4608103749e−32 |

TABLE 4-continued for projection optical unit 200 of FIG. 2a:
Free form coefficients of surfaces

| | | | | |
|---|---|---|---|---|
| C133 | $x^2 y^{13}$ | 1.0849430909e−31 | 5.8686515017e−34 | −4.2025206053e−32 |
| C135 | $y^{15}$ | 2.9764915885e−31 | 6.9302136524e−34 | −1.8025567635e−33 |
| C136 | $x^{16}$ | −1.4868324706e−40 | 3.7653743747e−40 | −3.1560464586e−37 |
| C138 | $x^{14} y^2$ | 8.7834773803e−39 | 8.9644061404e−39 | 3.2418813074e−36 |
| C140 | $x^{12} y^4$ | −1.8186666449e−38 | 4.0023951750e−38 | 8.1661025301e−35 |
| C142 | $x^{10} y^6$ | 6.3756492177e−37 | 1.1755288684e−37 | 1.9899121823e−34 |
| C144 | $x^8 y^8$ | 6.8459558752e−36 | −1.1034126525e−37 | 1.3600982857e−34 |
| C146 | $x^6 y^{10}$ | 3.2110883708e−36 | −2.0244401837e−36 | −5.2165695173e−35 |
| C148 | $x^4 y^{12}$ | 1.1247220878e−34 | −6.1794907074e−36 | −1.6512990821e−34 |
| C150 | $x^2 y^{14}$ | 3.5237290155e−34 | −7.1439508929e−36 | 2.9259050293e−34 |
| C152 | $y^{16}$ | 2.0412100159e−33 | −3.6663623348e−36 | 4.2570229073e−34 |
| C154 | $x^{16} y$ | 3.5226442484e−42 | 5.5497836943e−43 | 2.2839312371e−38 |
| C156 | $x^{14} y^3$ | −1.5026852629e−41 | −3.8158536472e−41 | 1.5413958473e−37 |
| C158 | $x^{12} y^5$ | 3.3477319470e−40 | −3.9887675994e−40 | 7.9539790581e−37 |
| C160 | $x^{10} y^7$ | 2.7650671839e−39 | −1.3140828354e−39 | 2.3334766479e−36 |
| C162 | $x^8 y^9$ | 4.4084486895e−38 | −3.8485353678e−39 | 3.9767574485e−36 |
| C164 | $x^6 y^{11}$ | 9.3779255481e−38 | −1.0581937932e−38 | 3.5652043957e−36 |
| C166 | $x^4 y^{13}$ | 6.7005164439e−37 | −1.7459343209e−38 | 2.1998520562e−36 |
| C168 | $x^2 y^{15}$ | −1.9481519834e−36 | −1.7080305021e−38 | 1.9576582125e−36 |
| C170 | $y^{17}$ | 1.5067103633e−35 | −1.8882186006e−38 | 1.7003791706e−38 |
| C171 | $x^{18}$ | 1.1221979539e−45 | −1.4085648329e−45 | 1.0372315894e−41 |
| C173 | $x^{16} y^2$ | −2.4987344579e−44 | −5.1149337979e−44 | 5.3677442869e−41 |
| C175 | $x^{14} y^4$ | 5.0718481838e−43 | −4.5755063411e−43 | −1.1527327624e−39 |
| C177 | $x^{12} y^6$ | −3.2815562301e−42 | −2.0591370434e−42 | −3.1214916410e−39 |
| C179 | $x^{10} y^8$ | −5.1509407425e−42 | −1.7230238588e−42 | 8.1784464444e−40 |
| C181 | $x^8 y^{10}$ | 3.5116164120e−40 | 1.9339682054e−41 | 8.7974704909e−39 |
| C183 | $x^6 y^{12}$ | −5.5675766764e−40 | 9.7907779091e−41 | 1.2044497627e−38 |
| C185 | $x^4 y^{14}$ | 1.0653260878e−39 | 2.1108425306e−40 | 8.1520586649e−39 |
| C187 | $x^2 y^{16}$ | −1.0983298570e−38 | 1.9129164959e−40 | −1.4028989945e−38 |
| C189 | $y^{18}$ | 6.8785966369e−38 | 8.4563786361e−41 | −1.5728602578e−38 |
| C191 | $x^{18} y$ | −1.1518624015e−47 | −4.4828523414e−48 | −2.1740971925e−43 |
| C193 | $x^{16} y^3$ | 2.0315394054e−46 | 1.9599228957e−46 | −3.3879454955e−42 |
| C195 | $x^{14} y^5$ | −6.4205012230e−48 | 2.3601065742e−45 | −2.3066151220e−41 |
| C197 | $x^{12} y^7$ | −3.3816251739e−44 | 8.6407775058e−45 | −6.2922876911e−41 |
| C199 | $x^{10} y^9$ | 1.3864400870e−43 | 2.5461795097e−44 | −1.0138255795e−40 |
| C201 | $x^8 y^{11}$ | 5.6556487854e−43 | 8.0865671348e−44 | −1.3280183787e−40 |
| C203 | $x^6 y^{13}$ | −4.5430668886e−42 | 1.9148720891e−43 | −8.2004783079e−41 |
| C205 | $x^4 y^{15}$ | 4.3211565576e−42 | 2.6176212924e−43 | −4.1371365916e−41 |
| C207 | $x^2 y^{17}$ | −1.1709452832e−41 | 2.2262683550e−43 | −3.8476398207e−41 |
| C209 | $y^{19}$ | 1.4466068136e−40 | 2.2196599756e−43 | −2.2271882894e−43 |
| C210 | $x^{20}$ | −3.3705777825e−51 | 1.4386485215e−51 | −9.8620496373e−47 |
| C212 | $x^{18} y^2$ | 4.1063237890e−50 | 1.4487598721e−49 | −2.3864620918e−45 |
| C214 | $x^{16} y^4$ | 2.0602283424e−49 | 2.3959764053e−48 | −1.6887149782e−44 |
| C216 | $x^{14} y^6$ | −7.6952707431e−48 | 1.3405885692e−47 | −8.3003479966e−44 |
| C218 | $x^{12} y^8$ | 6.7434148709e−48 | 2.1445643794e−47 | −2.1132149507e−43 |
| C220 | $x^{10} y^{10}$ | −4.3109857131e−47 | 7.1774905594e−47 | −4.1911829806e−43 |
| C222 | $x^8 y^{12}$ | 1.9038239784e−45 | 5.7148856507e−46 | −5.7823356428e−43 |
| C224 | $x^6 y^{14}$ | −1.7827656291e−44 | −1.7808554360e−45 | −3.6057237255e−43 |
| C226 | $x^4 y^{16}$ | 4.9013971612e−44 | 2.9648434303e−45 | −1.3969826714e−43 |
| C228 | $x^2 y^{18}$ | −6.2817784985e−44 | 2.1971707475e−45 | 2.7717101754e−43 |
| C230 | $y^{20}$ | 1.5418141526e−43 | 8.6665502153e−46 | 2.5029080864e−43 |

| Coefficient | Formula | M10 | M11 |
|---|---|---|---|
| C7 | $x^2 y$ | −7.2276737044e−07 | −2.4248080633e−09 |
| C9 | $y^3$ | 1.9638509950e−06 | −1.4305723378e−08 |
| C10 | $x^4$ | 5.0808365188e−10 | −3.4891057205e−11 |
| C12 | $x^2 y^2$ | −1.7891952861e−09 | −4.1226513952e−11 |
| C14 | $y^4$ | 4.8797105713e−09 | −9.3842893895e−12 |
| C16 | $x^4 y$ | 6.3443179564e−13 | 2.4639110383e−15 |
| C18 | $x^2 y^3$ | −6.7510879913e−12 | −2.7467789312e−14 |
| C20 | $y^5$ | 1.6934828510e−11 | −1.5841059563e−14 |
| C21 | $x^6$ | 6.0031216870e−16 | −4.1195863300e−17 |
| C23 | $x^4 y^2$ | 7.8746683626e−15 | −1.2654186546e−16 |
| C25 | $x^2 y^4$ | −1.8385869467e−15 | −1.0456897452e−16 |
| C27 | $y^6$ | −1.8162554696e−14 | −2.0913982009e−17 |
| C29 | $x^6 y$ | −2.5732812724e−18 | 2.2085057294e−20 |
| C31 | $x^4 y^3$ | −5.7262753994e−18 | −1.8340026815e−20 |
| C33 | $x^2 y^5$ | 2.5523191940e−16 | −5.6120704673e−20 |
| C35 | $y^7$ | −1.9776822082e−16 | −2.4068607957e−20 |
| C36 | $x^8$ | 2.1656616935e−21 | −5.3982002538e−23 |
| C38 | $x^6 y^2$ | 1.2120348738e−20 | −2.4513523640e−22 |
| C40 | $x^4 y^4$ | −4.0136050357e−19 | −3.8244309182e−22 |
| C42 | $x^2 y^6$ | 1.8604813320e−18 | −2.1623999236e−22 |
| C44 | $y^8$ | 2.7525380464e−18 | −2.4940745372e−23 |
| C46 | $x^8 y$ | −3.9215936758e−23 | −1.3699844890e−26 |
| C48 | $x^6 y^3$ | −8.0907144792e−23 | −2.6534478957e−26 |

TABLE 4-continued for projection optical unit 200 of FIG. 2a:
Free form coefficients of surfaces

| | | | |
|---|---|---|---|
| C50 | $x^4 y^5$ | −5.2010074072e−21 | −1.2536237464e−25 |
| C52 | $x^2 y^7$ | −9.8472719893e−21 | −7.6433497369e−26 |
| C54 | $y^9$ | 4.3222807965e−20 | −1.9624141924e−26 |
| C55 | $x^{10}$ | −2.7063992998e−26 | −1.7061257537e−28 |
| C57 | $x^8 y^2$ | −5.2088640305e−26 | −1.6898635635e−28 |
| C59 | $x^6 y^4$ | 4.5584719607e−24 | −2.5546907646e−28 |
| C61 | $x^4 y^6$ | 9.7234119869e−24 | −1.5222655233e−28 |
| C63 | $x^2 y^8$ | −2.5517771215e−22 | −4.7277118356e−29 |
| C65 | $y^{10}$ | 1.9120767833e−22 | −1.2966557212e−28 |
| C67 | $x^{10} y$ | 1.0748577806e−27 | −1.1629516838e−31 |
| C69 | $x^8 y^3$ | 1.2112738929e−26 | 5.7921120419e−31 |
| C71 | $x^6 y^5$ | 8.3396543785e−26 | 5.1751297365e−31 |
| C73 | $x^4 y^7$ | 6.9099031223e−25 | −2.5052559500e−31 |
| C75 | $x^2 y^9$ | −1.5269027299e−24 | −6.6525823213e−31 |
| C77 | $y^{11}$ | 9.5275101506e−25 | −1.3845191117e−31 |
| C78 | $x^{12}$ | 5.1324714334e−31 | 1.6217846426e−34 |
| C80 | $x^{10} y^2$ | −4.1863924845e−30 | −2.8531164120e−33 |
| C82 | $x^8 y^4$ | −5.9117693811e−29 | −8.4313905777e−33 |
| C84 | $x^6 y^6$ | −7.2176695692e−28 | −1.3408705049e−32 |
| C86 | $x^4 y^8$ | 3.4633870187e−27 | −1.0947672929e−32 |
| C88 | $x^2 y^{10}$ | −1.7777593668e−27 | −4.2396896726e−33 |
| C90 | $y^{12}$ | 9.6429480815e−27 | −2.8461887992e−35 |
| C92 | $x^{12} y$ | −1.7419522218e−32 | 1.3211537763e−36 |
| C94 | $x^{10} y^3$ | −2.9799864782e−31 | −3.7321108569e−36 |
| C96 | $x^8 y^5$ | −1.8080862900e−30 | −6.2596404479e−36 |
| C98 | $x^6 y^7$ | −1.3241203559e−29 | −3.1613991441e−36 |
| C100 | $x^4 y^9$ | −1.1295117391e−29 | 3.0361530620e−36 |
| C102 | $x^2 y^{11}$ | 3.3947340077e−29 | 4.0363212334e−36 |
| C104 | $y^{13}$ | 2.8666964681e−29 | 4.7449512649e−37 |
| C105 | $x^{14}$ | −4.1912696608e−36 | 2.5463300051e−40 |
| C107 | $x^{12} y^2$ | 1.2914077639e−34 | 1.2470487570e−38 |
| C109 | $x^{10} y^4$ | 1.3778416995e−33 | 4.2293719038e−38 |
| C111 | $x^8 y^6$ | 1.2866380630e−32 | 8.8592526989e−38 |
| C113 | $x^6 y^8$ | 1.7929207751e−32 | 1.0403567494e−37 |
| C115 | $x^4 y^{10}$ | −6.9295317615e−32 | 6.6253480276e−38 |
| C117 | $x^2 y^{12}$ | 3.3870166074e−31 | 2.1244018299e−38 |
| C119 | $y^{14}$ | −1.2188516752e−31 | 1.0931298861e−39 |
| C121 | $x^{14} y$ | 1.6199803773e−37 | −3.5768466511e−42 |
| C123 | $x^{12} y^3$ | 3.5738089682e−36 | 1.5757224374e−41 |
| C125 | $x^{10} y^5$ | 2.7881061370e−35 | 3.0834397969e−41 |
| C127 | $x^8 y^7$ | 1.6208683570e−34 | 2.6203475383e−41 |
| C129 | $x^6 y^9$ | 6.1821159066e−34 | −1.1373659475e−41 |
| C131 | $x^4 y^{11}$ | −4.3142066811e−35 | −3.7747472707e−41 |
| C133 | $x^2 y^{13}$ | 3.5353866934e−34 | −2.4666182874e−41 |
| C135 | $y^{15}$ | −6.1412086537e−34 | −2.9874286186e−42 |
| C136 | $x^{16}$ | 1.7789636824e−41 | −3.5633844409e−45 |
| C138 | $x^{14} y^2$ | −1.6155206861e−39 | −4.5190113713e−44 |
| C140 | $x^{12} y^4$ | −2.1787447722e−38 | −1.8099911204e−43 |
| C142 | $x^{10} y^6$ | −1.6106847823e−37 | −4.5331724107e−43 |
| C144 | $x^8 y^8$ | −7.6059659185e−37 | −6.7659997014e−43 |
| C146 | $x^6 y^{10}$ | −3.1549731203e−37 | −6.1159560424e−43 |
| C148 | $x^4 y^{12}$ | −4.2255473754e−36 | −3.1933036470e−43 |
| C150 | $x^2 y^{14}$ | −1.6786920618e−35 | −8.9575491912e−44 |
| C152 | $y^{16}$ | −4.4462414083e−36 | −7.9962525726e−45 |
| C154 | $x^{16} y$ | −8.1056676173e−43 | 4.4438171432e−48 |
| C156 | $x^{14} y^3$ | −2.1815592502e−41 | −3.1151609316e−47 |
| C158 | $x^{12} y^5$ | −2.1707761152e−40 | −7.6121134541e−47 |
| C160 | $x^{10} y^7$ | −1.2509965264e−39 | −9.6884401166e−47 |
| C162 | $x^8 y^9$ | −6.4571773694e−39 | −1.5141299973e−47 |
| C164 | $x^6 y^{11}$ | −1.1973201547e−38 | 1.0970530041e−46 |
| C166 | $x^4 y^{13}$ | −1.6202865522e−38 | 1.3634023968e−46 |
| C168 | $x^2 y^{15}$ | −7.5298545113e−38 | 6.5246445126e−47 |
| C170 | $y^{17}$ | −3.7613593583e−38 | 7.6119197318e−48 |
| C171 | $x^{18}$ | −2.3565753881e−47 | 7.0626229884e−51 |
| C173 | $x^{16} y^2$ | 9.7297211471e−45 | 7.8301002345e−50 |
| C175 | $x^{14} y^4$ | 1.6578794527e−43 | 3.6575530185e−49 |
| C177 | $x^{12} y^6$ | 1.2962653200e−42 | 1.0713115655e−48 |
| C179 | $x^{10} y^8$ | 7.3590298746e−42 | 1.9455618251e−48 |
| C181 | $x^8 y^{10}$ | 1.7175825509e−41 | 2.2708022765e−48 |
| C183 | $x^6 y^{12}$ | 2.6569320431e−41 | 1.6773586147e−48 |
| C185 | $x^4 y^{14}$ | 1.4226823554e−40 | 7.4753331851e−49 |
| C187 | $x^2 y^{16}$ | 3.1791841821e−40 | 1.8778515863e−49 |
| C189 | $y^{18}$ | 6.5811411857e−43 | 1.8691141350e−50 |
| C191 | $x^{18} y$ | 1.6749669005e−48 | −1.9020917199e−54 |
| C193 | $x^{16} y^3$ | 5.3819887429e−47 | 2.6820434340e−53 |
| C195 | $x^{14} y^5$ | 6.5154622602e−46 | 7.8952011078e−53 |
| C197 | $x^{12} y^7$ | 4.2644921531e−45 | 1.3405840259e−52 |

TABLE 4-continued for projection optical unit 200 of FIG. 2a:
Free form coefficients of surfaces

| | | | |
|---|---|---|---|
| C199 | $x^{10} y^9$ | 2.4097270566e−44 | 5.3791720190e−53 |
| C201 | $x^8 y^{11}$ | 7.8996070218e−44 | −1.4529698574e−52 |
| C203 | $x^6 y^{13}$ | 1.6412324123e−43 | −2.8034797399e−52 |
| C205 | $x^4 y^{15}$ | 8.5286782455e−43 | −2.2168110670e−52 |
| C207 | $x^2 y^{17}$ | 2.8108673555e−42 | −8.3707388950e−53 |
| C209 | $y^{19}$ | 8.0790804290e−43 | −9.8854298058e−54 |
| C210 | $x^{20}$ | −3.3629356813e−53 | −5.9249813053e−57 |
| C212 | $x^{18} y^2$ | −2.2797468564e−50 | −6.8774697517e−56 |
| C214 | $x^{16} y^4$ | −4.7952282029e−49 | −3.6673570884e−55 |
| C216 | $x^{14} y^6$ | −4.4134777356e−48 | −1.2085621357e−54 |
| C218 | $x^{12} y^8$ | −2.7082181692e−47 | −2.5573208652e−54 |
| C220 | $x^{10} y^{10}$ | −9.7650194659e−47 | −3.6529054057e−54 |
| C222 | $x^8 y^{12}$ | −1.9029804017e−46 | −3.4990964992e−54 |
| C224 | $x^6 y^{14}$ | −1.6322286974e−46 | −2.2054155436e−54 |
| C226 | $x^4 y^{16}$ | 1.1092548814e−45 | −8.7188486858e−55 |
| C228 | $x^2 y^{18}$ | 5.1507216625e−45 | −2.0064846492e−55 |
| C230 | $y^{20}$ | 1.8460550265e−45 | −2.0161870178e−56 |

TABLE 5 for projection optical unit 200 of FIG. 2A:
Coordinates of the stop edge

| $x_i$ [mm] | $y_i$ [mm] | $x_{i+N/2}$ [mm] | $y_{i+N/2}$ [mm] |
|---|---|---|---|
| −301.691108 | 145.979568 | 220.840885 | −251.284488 |
| −312.171692 | 139.990663 | 248.290035 | −233.816847 |
| −329.140258 | 128.511928 | 266.755827 | −219.842735 |
| −345.609747 | 114.537815 | 279.731788 | −209.362150 |
| −353.095879 | 106.552608 | 289.713297 | −200.378792 |
| −359.084784 | 99.565552 | 305.184636 | −184.907453 |
| −366.071841 | 90.083118 | 317.162447 | −171.931492 |
| −373.058897 | 78.105308 | 327.643031 | −158.955530 |
| −379.546878 | 64.131195 | 335.628238 | −148.474946 |
| −384.038557 | 50.656158 | 349.602351 | −127.513777 |
| −387.532085 | 35.683894 | 356.589407 | −115.535966 |
| −389.528387 | 20.212556 | 366.071841 | −97.070175 |
| −390.027462 | 13.724575 | 375.554274 | −74.112704 |
| −390.027462 | −4.242141 | 380.045953 | −60.637667 |
| −389.528387 | −12.726424 | 385.535783 | −39.676498 |
| −387.033009 | −31.192215 | 387.532085 | −28.696838 |
| −383.539481 | −48.160781 | 389.528387 | −13.225949 |
| −380.045953 | −60.637667 | 390.027462 | −3.243990 |
| −374.556123 | −76.608081 | 390.027462 | 14.223650 |
| −369.565369 | −89.084967 | 389.528387 | 20.711631 |
| −363.576463 | −102.060929 | 387.532085 | 35.683894 |
| −357.088483 | −114.537815 | 385.535783 | 45.166328 |
| −351.099577 | −125.018400 | 382.541330 | 55.646912 |
| −339.121766 | −143.484191 | 379.047802 | 65.129346 |
| −324.648579 | −162.948134 | 375.055199 | 74.112704 |
| −312.171692 | −177.421322 | 367.569067 | 87.587741 |
| −289.713297 | −200.378792 | 359.084784 | 99.565552 |
| −279.731788 | −209.362150 | 346.108823 | 114.038740 |
| −263.761374 | −222.338112 | 336.626389 | 122.523022 |
| −250.286337 | −232.319621 | 320.655975 | 134.500833 |
| −224.833489 | −248.789111 | 301.691108 | 145.979568 |
| −215.351056 | −254.278940 | 290.711448 | 151.469398 |
| −197.384339 | −263.761374 | 274.241958 | 158.955530 |
| −173.428718 | −274.741034 | 254.278940 | 166.441662 |
| −156.959228 | −281.229015 | 238.807602 | 171.432416 |
| −132.005456 | −289.713297 | 213.354754 | 178.419472 |
| −114.038740 | −294.704052 | 178.419472 | 185.905604 |
| −93.077571 | −299.694806 | 151.469398 | 190.397283 |
| −77.107157 | −302.689259 | 106.053533 | 195.887113 |
| −57.144139 | −305.683712 | 66.127497 | 198.881566 |
| −31.192215 | −308.179089 | 28.696838 | 200.378792 |
| −7.236594 | −309.177240 | −28.197763 | 200.378792 |
| 7.236594 | −309.177240 | −46.164479 | 199.879717 |
| 31.192215 | −308.179089 | −82.097911 | 197.883415 |
| 64.131195 | −304.685561 | −120.526721 | 194.389887 |
| 82.596987 | −301.691108 | −157.957379 | 189.399132 |
| 98.068325 | −298.696655 | −186.404680 | 184.408378 |
| 118.031343 | −293.705901 | −217.347357 | 177.421322 |
| 138.493437 | −287.716995 | −246.792809 | 168.937039 |

TABLE 5-continued for projection optical unit 200 of FIG. 2A:
Coordinates of the stop edge

| $x_i$ [mm] | $y_i$ [mm] | $x_{i+N/2}$ [mm] | $y_{i+N/2}$ [mm] |
|---|---|---|---|
| 160.951832 | −279.731788 | −265.258600 | 162.449058 |
| 175.924095 | −273.742883 | −275.240109 | 158.456455 |
| 191.395434 | −266.755827 | −287.716995 | 152.966625 |

TABLE 6 for projection optical unit 300 of FIG. 3A:

| | |
|---|---|
| Numerical Aperture | 0.75 |
| Magnification in x-direction | 0.233 |
| Magnification in y-direction | 0.125 |
| Chief Ray angle | 5.50° |
| Wavelength | 13.5 nm |
| Image field size in x-direction | 26.0 mm |
| Image field size in y-direction | 1.0 mm |
| Average Wavefront-RMS | 7.88 mλ |

TABLE 7 for projection optical unit 300 of FIG. 3A:
Radii of surfaces

| | $Radius_x$ [mm] | $Power_x$ [1/mm] | $Radius_y$ [mm] | $Power_y$ [1/mm] |
|---|---|---|---|---|
| M01 | −5865.81523622 | 0.00032883 | −2067.88312069 | 0.00093278 |
| M02 | −63374.79828420 | 0.00000395 | 21837.47821316 | −0.00001146 |
| M03 | −8366.11833895 | 0.00004865 | 4289.09824586 | −0.00009489 |
| M04 | −5869.08993915 | 0.00004517 | −12503.51063260 | 0.00002120 |
| M05 | −1600.48535592 | 0.00029099 | −3932.63888021 | 0.00011843 |
| M06 | −975.96408516 | 0.00047086 | −1810.95688936 | 0.00025376 |
| M07 | −1283.34039039 | 0.00021340 | 7378.23227667 | −0.00003712 |
| M08 | −5673.23901632 | 0.00009446 | −3258.25153471 | 0.00016447 |
| M09 | −4558.08819792 | 0.00014250 | 2055.71799723 | −0.00031595 |
| M10 | −12523.98260704 | 0.00013011 | 345.59408179 | −0.00471510 |
| M11 | −966.31588781 | 0.00205638 | −770.02679127 | 0.00258057 |

TABLE 8 for projection optical unit 300 of FIG. 3A:
Decentring (location, angle) of surfaces

|  | $D_x$ [mm] | $D_y$ [mm] | $D_z$ [mm] |
|---|---|---|---|
| Reticle | 0.000000000 | 0.000000000 | 0.000000000 |
| M01 | 0.000000000 | 206.342031983 | 2142.943936469 |
| M02 | 0.000000000 | 751.141443466 | 968.297457580 |
| M03 | 0.000000000 | 1108.062138516 | 663.676987878 |
| M04 | 0.000000000 | 1635.726818408 | 442.413885804 |
| M05 | 0.000000000 | 2111.326138465 | 406.569727272 |
| M06 | 0.000000000 | 2679.156490918 | 589.348742919 |
| M07 | 0.000000000 | 2934.877558834 | 814.689341392 |
| M08 | 0.000000000 | 3039.101069571 | 1089.907055701 |
| M09 | 0.000000000 | 3022.041362790 | 1355.258392494 |
| M10 | 0.000000000 | 3428.901782539 | 2177.702268715 |
| Stop | 0.000000000 | 3402.152487320 | 2082.218345511 |
| M11 | −0.000000000 | 3255.897127319 | 1560.147186330 |
| Wafer | 0.000000000 | 3255.896114501 | 2296.253294176 |

TABLE 8-continued for projection optical unit 300 of FIG. 3A:
Decentring (location, angle) of surfaces

|  | αx [°] | αy [°] | αz [°] |
|---|---|---|---|
| Reticle | 0.000000000 | 0.000000000 | 0.000000000 |
| M01 | 9.690902525 | 0.000000000 | 0.000000000 |
| M02 | −52.798949070 | 180.000000000 | 0.000000000 |
| M03 | 148.385382126 | 0.000000000 | 0.000000000 |
| M04 | −13.529777533 | 180.000000000 | 0.000000000 |
| M05 | 186.766417434 | 0.000000000 | 0.000000000 |
| M06 | 29.614629045 | 180.000000000 | 0.000000000 |
| M07 | 235.322492812 | 0.000000000 | 0.000000000 |
| M08 | 81.468563046 | 180.000000000 | 0.000000000 |
| M09 | 78.678541182 | 0.000000000 | 0.000000000 |
| M10 | −20.985690966 | 0.000000000 | 180.000000000 |
| Stop | 164.350076886 | −0.000000000 | −0.000000000 |
| M11 | 172.175077860 | −0.000000000 | 0.000000000 |
| Wafer | 0.000078834 | 0.000000000 | 180.000000000 |

TABLE 9 for projection optical unit 300 of FIG. 3A:
Free-form coefficients of surfaces

| Coefficient | Formula | M01 | M02 | M03 |
|---|---|---|---|---|
| C7 | $x^2 y$ | −1.2467075401e−08 | −1.3348773466e−08 | 7.2872626293e−08 |
| C9 | $y^3$ | −2.6953264654e−08 | 5.4522752705e−08 | 2.6169253486e−08 |
| C10 | $x^4$ | −2.8831646046e−12 | 1.1120232774e−10 | 8.3530873147e−11 |
| C12 | $x^2 y^2$ | 8.7150874395e−11 | −4.0947377819e−11 | −6.8360178422e−11 |
| C14 | $y^4$ | −1.0666167107e−13 | 1.4339596189e−10 | −3.6577598249e−10 |
| C16 | $x^4 y$ | −2.7441641255e−14 | −5.3346116597e−14 | −3.0710710509e−13 |
| C18 | $x^2 y^3$ | −1.2726847989e−13 | −7.9668038501e−14 | −3.3418102422e−13 |
| C20 | $y^5$ | 3.4096328456e−14 | 3.7541752225e−13 | 3.4404548810e−13 |
| C21 | $x^6$ | 2.5253493969e−18 | 7.0684786785e−17 | −8.4079475057e−17 |
| C23 | $x^4 y^2$ | −4.9978048857e−18 | −1.4520801323e−16 | −1.3998707586e−16 |
| C25 | $x^2 y^4$ | 2.1956981883e−17 | −8.4757253555e−18 | 9.1295648997e−16 |
| C27 | $y^6$ | 6.1687302543e−16 | 1.0524429937e−15 | −1.8570296448e−16 |
| C29 | $x^6 y$ | 1.8197881520e−20 | −2.4040215447e−19 | −2.1766284207e−20 |
| C31 | $x^4 y^3$ | 2.1373260866e−19 | −5.2926133326e−19 | 2.2749446644e−18 |
| C33 | $x^2 y^5$ | −6.9752427252e−19 | 6.3832431855e−20 | −1.2828010170e−18 |
| C35 | $y^7$ | 3.8267458162e−20 | 2.9024294606e−18 | 1.0653505056e−18 |
| C36 | $x^8$ | −1.4480426797e−23 | −2.7727925287e−22 | −2.0063721628e−22 |
| C38 | $x^6 y^2$ | −1.4406031959e−22 | −2.3939935190e−22 | 1.1337619611e−21 |
| C40 | $x^4 y^4$ | 4.7370199633e−22 | −3.7474615537e−22 | −1.6921160199e−21 |
| C42 | $x^2 y^6$ | 1.7248831546e−22 | 2.9766960337e−22 | 1.0472902500e−20 |
| C44 | $y^8$ | −4.0532377358e−20 | 4.5184111748e−21 | 2.1987645795e−20 |
| C46 | $x^8 y$ | 1.8455150442e−25 | 5.1241278232e−24 | 2.7550084650e−25 |
| C48 | $x^6 y^3$ | 1.1327621011e−24 | 1.4806901695e−23 | −1.7730948982e−23 |
| C50 | $x^4 y^5$ | −3.3882508058e−26 | 1.6805001248e−23 | −4.9544283590e−23 |
| C52 | $x^2 y^7$ | −1.4219723243e−23 | −3.4237769863e−24 | 2.9346082042e−23 |
| C54 | $y^9$ | 1.4149924319e−23 | −8.4824871060e−24 | 1.3561832619e−22 |
| C55 | $x^{10}$ | 4.9751179229e−28 | 6.3407118335e−27 | 2.8338518017e−27 |
| C57 | $x^8 y^2$ | 4.7112576339e−27 | −6.9025162063e−27 | −1.2277211414e−27 |
| C59 | $x^6 y^4$ | −4.5961567305e−27 | 2.7190597791e−26 | −5.2905365082e−26 |
| C61 | $x^4 y^8$ | −5.5773662955e−26 | 5.2462334959e−26 | −2.5445274816e−25 |
| C63 | $x^2 y^8$ | 2.0082504680e−25 | −6.1081784301e−26 | −5.9730875595e−25 |
| C65 | $y^{10}$ | 2.2199203861e−24 | −4.8557028558e−26 | −2.3348782296e−24 |
| C67 | $x^{10} y$ | −3.7476656440e−30 | −7.6485672979e−29 | 1.4947673172e−29 |
| C69 | $x^8 y^3$ | −2.3612566194e−29 | −2.4774184419e−28 | 2.2980316977e−28 |
| C71 | $x^6 y^5$ | 2.2187607217e−29 | −3.8120053547e−28 | 1.3217596278e−27 |
| C73 | $x^4 y^7$ | 5.6100070166e−28 | −2.4974317927e−28 | 2.3177009413e−27 |
| C75 | $x^2 y^9$ | 2.0618081612e−27 | −2.6148149268e−28 | −5.5909056888e−27 |
| C77 | $y^{11}$ | −2.7963329316e−27 | 2.0179748939e−29 | −8.7279402890e−27 |
| C78 | $x^{12}$ | −7.4572827042e−33 | −4.4335237142e−32 | −1.9168206138e−33 |
| C80 | $x^{10} y^2$ | −8.5474716742e−32 | 1.4379898868e−31 | −4.2609800121e−32 |
| C82 | $x^8 y^4$ | −9.7649702863e−32 | −2.1619359366e−31 | 7.2298850863e−31 |
| C84 | $x^6 y^6$ | 1.0909533068e−30 | −1.4261848410e−30 | 5.5278484571e−30 |
| C86 | $x^4 y^8$ | 4.3562596563e−31 | −1.1108019099e−30 | 1.3375757200e−29 |
| C88 | $x^2 y^{10}$ | −1.8513248324e−29 | −2.6661306772e−32 | 2.8874205794e−29 |
| C90 | $y^{12}$ | −7.9907007621e−29 | 6.5273825658e−31 | 9.7434965821e−29 |
| C92 | $x^{12} y$ | 4.6491819082e−35 | 6.2946912638e−34 | −1.8258273973e−34 |
| C94 | $x^{10} y^3$ | 3.2696788977e−34 | 2.3921661224e−33 | −1.9553306250e−33 |
| C96 | $x^8 y^5$ | 3.2943984047e−35 | 4.8919543389e−33 | −1.6350292078e−32 |
| C98 | $x^6 y^7$ | −8.5405894077e−33 | 3.6166305683e−33 | −5.6396440055e−32 |
| C100 | $x^4 y^9$ | −4.0709966516e−32 | 2.1558509865e−33 | −4.6125475690e−32 |

TABLE 9-continued for projection optical unit 300 of FIG. 3A:
Free-form coefficients of surfaces

| | | | | |
|---|---|---|---|---|
| C102 | $x^2 y^{11}$ | −1.0107878822e−31 | 2.5105814333e−33 | 3.2773437248e−31 |
| C104 | $y^{13}$ | 1.2064533186e−31 | 2.2238147891e−33 | 3.2764546096e−31 |
| C105 | $x^{14}$ | 6.3869752879e−38 | 1.9267680796e−37 | −6.1173550883e−38 |
| C107 | $x^{12} y^2$ | 9.1504573841e−37 | −1.4859024048e−36 | 2.7620723221e−37 |
| C109 | $x^{10} y^4$ | 3.3617202635e−36 | 3.1707721165e−37 | −5.6617008379e−36 |
| C111 | $x^8 y^6$ | −6.1736717784e−36 | 1.7203953853e−35 | −6.3584720655e−35 |
| C113 | $x^6 y^8$ | −3.0501766360e−35 | 2.6161789349e−35 | −2.4679393483e−34 |
| C115 | $x^4 y^{10}$ | 1.3612671094e−34 | 1.5370839273e−35 | −3.6650099068e−34 |
| C117 | $x^2 y^{12}$ | 8.7866861356e−34 | 3.6940452189e−36 | −8.3324769412e−34 |
| C119 | $y^{14}$ | 1.9021319268e−33 | 4.1320176184e−36 | −2.2908549281e−33 |
| C121 | $x^{14} y$ | −3.1724176080e−40 | −3.0807880840e−39 | 9.2385422123e−40 |
| C123 | $x^{12} y^3$ | −2.3810083642e−39 | −1.2424284034e−38 | 9.3884607054e−39 |
| C125 | $x^{10} y^5$ | −2.2954013538e−39 | −2.9276025660e−38 | 1.0258041544e−37 |
| C127 | $x^8 y^7$ | 6.8833317428e−38 | −1.3241913303e−38 | 5.0251757855e−37 |
| C129 | $x^6 y^9$ | 4.8297911637e−37 | 1.3699222053e−38 | 1.3274285064e−36 |
| C131 | $x^4 y^{11}$ | 1.4452002485e−36 | 1.1315058418e−38 | −4.9607731988e−37 |
| C133 | $x^2 y^{13}$ | 2.7654094061e−36 | −1.8600600480e−38 | −9.5896503707e−36 |
| C135 | $y^{15}$ | −2.6915220538e−36 | 4.8587893131e−39 | −7.7241296372e−36 |
| C136 | $x^{16}$ | −3.2793717012e−43 | −6.3852937662e−43 | 3.2595223358e−43 |
| C138 | $x^{14} y^2$ | −5.5830068597e−42 | 8.3494970336e−42 | −6.5706319173e−43 |
| C140 | $x^{12} y^4$ | −3.4791199924e−41 | 1.0109081574e−41 | 2.6770336445e−41 |
| C142 | $x^{10} y^6$ | −4.3291872187e−41 | −8.5936562967e−41 | 3.9604946354e−40 |
| C144 | $x^8 y^8$ | 1.6767359119e−40 | −1.9152785634e−40 | 2.1226841939e−39 |
| C146 | $x^6 y^{10}$ | −5.6292179529e−40 | −1.4700794960e−40 | 5.4757816113e−39 |
| C148 | $x^4 y^{12}$ | −7.1918752381e−39 | −3.3947448651e−41 | 4.8572679588e−39 |
| C150 | $x^2 y^{14}$ | −2.3139623471e−38 | −8.2864415218e−41 | 9.1762922206e−39 |
| C152 | $y^{16}$ | −2.8589050266e−38 | 2.8656510927e−42 | 2.7944022154e−38 |
| C154 | $x^{16} y$ | 1.1477662036e−45 | 7.9930480890e−45 | −2.2605783918e−45 |
| C156 | $x^{14} y^3$ | 9.2616541272e−45 | 3.4010054371e−44 | −2.3674050015e−44 |
| C158 | $x^{12} y^5$ | 1.2851129925e−44 | 8.3336097293e−44 | −3.2024594546e−43 |
| C160 | $x^{10} y^7$ | −2.7867510516e−43 | −4.8400370596e−44 | −1.9990836609e−42 |
| C162 | $x^8 y^9$ | −2.6947148783e−42 | −2.8140377193e−43 | −7.9826907998e−42 |
| C164 | $x^6 y^{11}$ | −1.0858659838e−41 | −2.0682298229e−43 | −1.4165695961e−41 |
| C166 | $x^4 y^{13}$ | −2.4853387780e−41 | 2.9582280271e−44 | 3.1801923441e−41 |
| C168 | $x^2 y^{15}$ | −3.9711405260e−41 | −1.4308615014e−43 | 1.4697289355e−40 |
| C170 | $y^{17}$ | 3.2641760546e−41 | −2.4317654285e−45 | 1.0630088012e−40 |
| C171 | $x^{18}$ | 9.3807609535e−49 | 1.6378787333e−48 | −6.4808506262e−49 |
| C173 | $x^{16} y^2$ | 1.8283088759e−47 | −2.4206936389e−47 | −1.1563651995e−49 |
| C175 | $x^{14} y^4$ | 1.5953422359e−46 | −6.2271486286e−47 | −7.1113764658e−47 |
| C177 | $x^{12} y^6$ | 5.6583172524e−46 | 1.3937263454e−46 | −1.2634373210e−45 |
| C179 | $x^{10} y^8$ | 7.6229354122e−46 | 4.5318249979e−46 | −8.5225093411e−45 |
| C181 | $x^8 y^{10}$ | 3.1739238245e−45 | 4.8998793816e−46 | −3.3084943577e−44 |
| C183 | $x^6 y^{12}$ | 3.4177288975e−44 | 4.0161527675e−46 | −5.7411650994e−44 |
| C185 | $x^4 y^{14}$ | 1.4252492265e−43 | 3.3762735692e−46 | 5.6542785431e−45 |
| C187 | $x^2 y^{16}$ | 3.1868584702e−43 | −1.2274024014e−46 | 5.0891077426e−44 |
| C189 | $y^{18}$ | 2.3977551585e−43 | −7.8790612609e−48 | −1.2166288242e−43 |
| C191 | $x^{18} y$ | −1.7128948485e−51 | −8.3805817185e−51 | 2.2125779066e−51 |
| C193 | $x^{16} y^3$ | −1.4883568540e−50 | −3.7077347056e−50 | 2.4521093939e−50 |
| C195 | $x^{14} y^5$ | −2.3912620643e−50 | −7.5292211098e−50 | 3.9284796942e−49 |
| C197 | $x^{12} y^7$ | 4.8593150694e−49 | 3.5431064161e−49 | 2.9667556677e−48 |
| C199 | $x^{10} y^9$ | 5.6888315159e−48 | 1.3222909580e−49 | 1.5482033905e−47 |
| C201 | $x^8 y^{11}$ | 3.0206266472e−47 | 1.6349217442e−48 | 4.9386213025e−47 |
| C203 | $x^6 y^{13}$ | 8.7406145932e−47 | 1.0908913057e−48 | 3.9694377865e−47 |
| C205 | $x^4 y^{15}$ | 1.7340860718e−46 | 5.1552747781e−49 | −3.4005094327e−46 |
| C207 | $x^2 y^{17}$ | 2.3521148980e−46 | −4.6486529691e−50 | −9.4109560003e−46 |
| C209 | $y^{19}$ | −1.6709407871e−46 | −7.6701722815e−51 | −6.3098039019e−46 |
| C210 | $x^{20}$ | −1.1468848753e−54 | −1.7457410846e−54 | 4.3570623621e−55 |
| C212 | $x^{18} y^2$ | −2.5001515592e−53 | 2.8668298254e−53 | 1.7728301296e−54 |
| C214 | $x^{16} y^4$ | −2.7651704796e−52 | 1.1765705998e−52 | 8.2674940144e−53 |
| C216 | $x^{14} y^6$ | −1.5117327693e−51 | 1.3842730364e−52 | 1.5956297553e−51 |
| C218 | $x^{12} y^8$ | −5.1705595202e−51 | 4.4714717095e−52 | 1.3173465132e−50 |
| C220 | $x^{10} y^{10}$ | −1.6792580509e−50 | 1.0920179092e−51 | 6.2496999918e−50 |
| C222 | $x^8 y^{12}$ | −8.3711007658e−50 | 1.1685063976e−51 | 1.9755952480e−49 |
| C224 | $x^6 y^{14}$ | −3.6866845106e−49 | 6.7111631193e−52 | 1.7123109378e−49 |
| C226 | $x^4 y^{16}$ | −1.0443243640e−48 | 2.5054124967e−52 | −5.8864825581e−49 |
| C228 | $x^2 y^{18}$ | −1.8004435241e−48 | −3.5724159060e−54 | −1.3320070960e−48 |
| C230 | $y^{20}$ | −8.3786576508e−49 | −2.7757694088e−54 | −3.4128789070e−49 |

| Coefficient | Formula | M07 | M08 | M09 |
|---|---|---|---|---|
| C7 | $x^2 y$ | 2.8532185189e−07 | 2.4061929143e−07 | −4.0775365688e−08 |
| C9 | $y^3$ | −4.5488655424e−07 | 2.2560132539e−07 | −2.7379463806e−07 |
| C10 | $x^4$ | 1.3083632819e−11 | 5.9615095385e−11 | −1.6038386672e−10 |
| C12 | $x^2 y^2$ | −1.0484017643e−09 | 1.8554389819e−10 | −1.0961343130e−09 |
| C14 | $y^4$ | 1.8996982820e−09 | −3.5056498342e−10 | 3.3765922105e−11 |
| C16 | $x^4 y$ | −4.6317598744e−13 | 4.4552157676e−13 | −7.9855804676e−13 |
| C18 | $x^2 y^3$ | 3.2314583170e−12 | 2.8042795574e−12 | −7.0220759554e−12 |

TABLE 9-continued for projection optical unit 300 of FIG. 3A:
Free-form coefficients of surfaces

| | | | | |
|---|---|---|---|---|
| C20 | $y^5$ | −4.5588666977e−11 | 1.8028731397e−12 | −1.7398088518e−12 |
| C21 | $x^6$ | −1.9124329121e−16 | −7.5794191403e−16 | 2.1893082964e−15 |
| C23 | $x^4 y^2$ | −3.5839736697e−15 | −1.3549434157e−15 | −6.5079186813e−15 |
| C25 | $x^2 y^4$ | −1.7483598425e−13 | −1.4728274545e−15 | −7.4386360584e−15 |
| C27 | $y^6$ | 2.3135062742e−14 | −4.2680681592e−15 | 3.6373247624e−15 |
| C29 | $x^6 y$ | −6.8891899026e−18 | −3.9058789300e−18 | 3.3130026057e−17 |
| C31 | $x^4 y^3$ | −2.3313296927e−16 | 1.1961183241e−17 | 1.6410032269e−17 |
| C33 | $x^2 y^5$ | 4.7971439136e−16 | 3.4678894092e−17 | −3.6833219506e−17 |
| C35 | $y^7$ | −5.6401667395e−16 | 2.7103550207e−17 | −7.9177802849e−17 |
| C36 | $x^8$ | −2.4317709323e−21 | −5.0437952188e−21 | 9.2271219909e−20 |
| C38 | $x^6 y^2$ | −1.0919948308e−19 | −3.2698263728e−20 | 5.8623247451e−19 |
| C40 | $x^4 y^4$ | 1.6814114466e−18 | −4.3596330218e−20 | 4.2800966543e−19 |
| C42 | $x^2 y^6$ | −1.5491795995e−18 | −1.1015132994e−19 | −3.6707024772e−20 |
| C44 | $y^8$ | −1.3330810569e−18 | −1.3386882215e−19 | 1.5567218575e−18 |
| C46 | $x^8 y$ | −4.2719693341e−24 | −7.7580502574e−23 | 4.1643168273e−22 |
| C48 | $x^6 y^3$ | 2.6085179331e−21 | −1.7375813191e−22 | −1.4473125427e−21 |
| C50 | $x^4 y^5$ | 3.0702865156e−22 | −3.1489144950e−23 | 4.5772089645e−22 |
| C52 | $x^2 y^7$ | 1.5560608864e−20 | −1.7261355830e−22 | 1.3431030284e−20 |
| C54 | $y^9$ | 2.0392183142e−19 | −9.6136536487e−22 | 3.8123400770e−21 |
| C55 | $x^{10}$ | 2.3667396340e−26 | 8.1464025681e−26 | −1.1266508645e−23 |
| C57 | $x^8 y^2$ | 1.6441834920e−24 | −3.5202628796e−25 | −7.5082287435e−23 |
| C59 | $x^6 y^4$ | 2.1973208099e−24 | −1.3153022433e−24 | −1.1736229718e−22 |
| C61 | $x^4 y^6$ | 7.9295222982e−23 | 3.2895106760e−25 | −5.3608955541e−23 |
| C63 | $x^2 y^8$ | 1.7951290560e−21 | 7.3771753570e−24 | −4.7093624693e−23 |
| C65 | $y^{10}$ | 4.9842221371e−21 | 1.0332735138e−23 | −3.2149245834e−22 |
| C67 | $x^{10} y$ | 3.5006540973e−28 | 3.5065031645e−27 | −2.6452023300e−25 |
| C69 | $x^8 y^3$ | −7.7978908619e−27 | 1.0076622074e−26 | 8.7993705331e−26 |
| C71 | $x^6 y^5$ | −6.4046109658e−26 | 2.5775458725e−26 | −5.3733599844e−26 |
| C73 | $x^4 y^7$ | 5.1079962282e−24 | 7.2191087015e−26 | −1.6730534114e−24 |
| C75 | $x^2 y^9$ | 2.6170987443e−23 | 1.2558423366e−25 | −3.3782577747e−24 |
| C77 | $y^{11}$ | 2.9102580743e−23 | 1.7571604472e−25 | −7.7107111005e−25 |
| C78 | $x^{12}$ | −6.1560955854e−31 | 1.0219205551e−30 | 5.0482378307e−28 |
| C80 | $x^{10} y^2$ | −1.1960387607e−30 | 3.0561316671e−29 | 5.6666965393e−27 |
| C82 | $x^8 y^4$ | −5.1048098909e−28 | 5.4323088747e−29 | 2.0082529763e−26 |
| C84 | $x^6 y^6$ | 5.5428647630e−27 | −1.5498400907e−29 | 2.7970284660e−26 |
| C86 | $x^4 y^8$ | 3.4314118094e−26 | −6.6503542465e−28 | −3.6124989963e−28 |
| C88 | $x^2 y^{10}$ | 4.7589780997e−26 | −1.6260553985e−27 | 1.7756985794e−26 |
| C90 | $y^{12}$ | 1.0458848866e−25 | −1.3207895158e−27 | 5.8458031137e−26 |
| C92 | $x^{12} y$ | 4.0587948695e−33 | −5.1246858224e−32 | 2.4689568452e−29 |
| C94 | $x^{10} y^3$ | −5.5847808284e−31 | −2.5653473589e−31 | 1.4705738347e−29 |
| C96 | $x^8 y^5$ | 5.7044473156e−30 | −1.0423853264e−30 | 5.3209699385e−29 |
| C98 | $x^6 y^7$ | −9.6738416644e−30 | −3.0598206424e−30 | 2.9827578891e−28 |
| C100 | $x^4 y^9$ | −3.4735527805e−28 | −7.4491713306e−30 | 4.2190642278e−28 |
| C102 | $x^2 y^{11}$ | −2.8747681291e−28 | −1.0436545170e−29 | 4.9576477196e−28 |
| C104 | $y^{13}$ | 2.0091784512e−27 | −1.3818919767e−29 | 4.5090759219e−29 |
| C105 | $x^{14}$ | 1.1781180905e−35 | −3.9083713694e−35 | −4.9461851945e−33 |
| C107 | $x^{12} y^2$ | −5.4539038778e−34 | −7.8711283224e−34 | −2.1857713698e−31 |
| C109 | $x^{10} y^4$ | 1.1388844809e−32 | −2.0622400755e−33 | −1.7953425704e−30 |
| C111 | $x^8 y^6$ | −1.3059832507e−32 | −3.1378843592e−33 | −3.5775579951e−30 |
| C113 | $x^6 y^8$ | −6.6933508266e−31 | 1.5092584011e−32 | −2.0273059312e−30 |
| C115 | $x^4 y^{10}$ | −3.2309336140e−30 | 8.7592354477e−32 | 1.3201409551e−30 |
| C117 | $x^2 y^{12}$ | 3.0524852836e−30 | 1.3962418388e−31 | −3.1603639681e−30 |
| C119 | $y^{14}$ | 3.7956761183e−29 | 8.8008755619e−32 | −6.3449275640e−30 |
| C121 | $x^{14} y$ | −2.5977239860e−37 | 2.3806627730e−37 | −1.0591625188e−33 |
| C123 | $x^{12} y^3$ | 1.0575267671e−35 | 3.9257057969e−36 | −2.5474094459e−33 |
| C125 | $x^{10} y^5$ | 2.6567643627e−35 | 2.8125507809e−35 | −9.6488582526e−33 |
| C127 | $x^8 y^7$ | 6.0875840438e−35 | 8.7459906478e−35 | −3.7681886641e−32 |
| C129 | $x^6 y^9$ | −5.9273079296e−34 | 2.5391347274e−34 | −5.3184636610e−32 |
| C131 | $x^4 y^{11}$ | −1.3672746912e−32 | 5.1310138045e−34 | −4.4608103749e−32 |
| C133 | $x^2 y^{13}$ | 1.0849430909e−31 | 5.8686515017e−34 | −4.2025206053e−32 |
| C135 | $y^{15}$ | 2.9764915885e−31 | 6.9302136524e−34 | −1.8025567635e−33 |
| C136 | $x^{16}$ | −1.4868324706e−40 | 3.7653743747e−40 | −3.1560464586e−37 |
| C138 | $x^{14} y^2$ | 8.7834773803e−39 | 8.9644061404e−39 | 3.2418813074e−36 |
| C140 | $x^{12} y^4$ | −1.8186666449e−38 | 4.0023971750e−38 | 8.1661025301e−35 |
| C142 | $x^{10} y^6$ | 6.3756492177e−37 | 1.1755288684e−37 | 1.9899121823e−34 |
| C144 | $x^8 y^8$ | 6.8459558752e−36 | −1.1034126525e−37 | 1.3600982857e−34 |
| C146 | $x^6 y^{10}$ | 3.2110883708e−36 | −2.0244401837e−36 | −5.2165695173e−35 |
| C148 | $x^4 y^{12}$ | 1.1247220878e−34 | −6.1794907074e−36 | −1.6512990821e−34 |
| C150 | $x^2 y^{14}$ | 3.5237290155e−34 | −7.1439508929e−36 | 2.9259050293e−34 |
| C152 | $y^{16}$ | 2.0412100159e−33 | −3.6663623348e−36 | 4.2570229073e−34 |
| C154 | $x^{16} y$ | 3.5226442484e−42 | 5.5497836943e−43 | 2.2839312371e−38 |
| C156 | $x^{14} y^3$ | −1.5026852629e−41 | −3.8158536472e−41 | 1.5413958473e−37 |
| C158 | $x^{12} y^5$ | 3.3477319470e−40 | −3.9887675994e−40 | 7.9539790581e−37 |
| C160 | $x^{10} y^7$ | 2.7650671839e−39 | −1.3140828354e−39 | 2.3334766479e−36 |
| C162 | $x^8 y^9$ | 4.4084486895e−38 | −3.8485353678e−39 | 3.9767574485e−36 |
| C164 | $x^6 y^{11}$ | 9.3779255481e−38 | −1.0581937932e−38 | 3.5652043957e−36 |
| C166 | $x^4 y^{13}$ | 6.7005164439e−37 | −1.7459343209e−38 | 2.1998520562e−36 |

TABLE 9-continued for projection optical unit 300 of FIG. 3A:
Free-form coefficients of surfaces

| | | | | |
|---|---|---|---|---|
| C168 | $x^2 y^{15}$ | −1.9481519834e−36 | −1.7080305021e−38 | 1.9576582125e−36 |
| C170 | $y^{17}$ | 1.5067103633e−35 | −1.8882186006e−38 | 1.7003791706e−38 |
| C171 | $x^{18}$ | 1.1221979539e−45 | −1.4085648329e−45 | 1.0372315894e−41 |
| C173 | $x^{16} y^2$ | −2.4987344579e−44 | −5.1149337979e−44 | 5.3677442869e−41 |
| C175 | $x^{14} y^4$ | 5.0718481838e−43 | −4.5755063411e−43 | −1.1527327624e−39 |
| C177 | $x^{12} y^6$ | −3.2815562301e−42 | −2.0591370434e−42 | −3.1214916410e−39 |
| C179 | $x^{10} y^8$ | −5.1509407425e−42 | −1.7230238588e−42 | 8.1784464444e−40 |
| C181 | $x^8 y^{10}$ | 3.5116164120e−40 | 1.9339682054e−41 | 8.7974704909e−39 |
| C183 | $x^6 y^{12}$ | −5.5675766764e−40 | 9.7907779091e−41 | 1.2044497627e−38 |
| C185 | $x^4 y^{14}$ | 1.0653260878e−39 | 2.1108425306e−40 | 8.1520586649e−39 |
| C187 | $x^2 y^{16}$ | −1.0983298570e−38 | 1.9129164959e−40 | −1.4028989945e−38 |
| C189 | $y^{18}$ | 6.8785966369e−38 | 8.4563786361e−41 | −1.5728602578e−38 |
| C191 | $x^{18} y$ | −1.1518624015e−47 | −4.4828523414e−48 | −2.1740971925e−43 |
| C193 | $x^{16} y^3$ | 2.0315394054e−46 | 1.9599228957e−46 | −3.3879454955e−42 |
| C195 | $x^{14} y^5$ | −6.4205012230e−48 | 2.3601065742e−45 | −2.3066151220e−41 |
| C197 | $x^{12} y^7$ | −3.3816251739e−44 | 8.6407775058e−45 | −6.2922876931e−41 |
| C199 | $x^{10} y^9$ | 1.3864400870e−43 | 2.5461795097e−44 | −1.0138255795e−40 |
| C201 | $x^8 y^{11}$ | 5.6556487854e−43 | 8.0865671348e−44 | −1.3280183787e−40 |
| C203 | $x^6 y^{13}$ | −4.5430668886e−42 | 1.9148720891e−43 | −8.2004783079e−41 |
| C205 | $x^4 y^{15}$ | 4.3211565576e−42 | 2.6176212924e−43 | −4.1371365916e−41 |
| C207 | $x^2 y^{17}$ | −1.1709452832e−41 | 2.2262683550e−43 | −3.8476398207e−41 |
| C209 | $y^{19}$ | 1.4466068136e−40 | 2.2196599756e−43 | −2.2271882894e−43 |
| C210 | $x^{20}$ | −3.3705777825e−51 | 1.4386485215e−51 | −9.8620496373e−47 |
| C212 | $x^{18} y^2$ | 4.1063237890e−50 | 1.4487598721e−49 | −2.3864620918e−45 |
| C214 | $x^{16} y^4$ | 2.0602283424e−49 | 2.3959764053e−48 | −1.6887149782e−44 |
| C216 | $x^{14} y^6$ | −7.6952707431e−48 | 1.3405885692e−47 | −8.3003479966e−44 |
| C218 | $x^{12} y^8$ | 6.7434148709e−48 | 2.1445643794e−47 | −2.1132149507e−43 |
| C220 | $x^{10} y^{10}$ | −4.3109857131e−47 | −7.1774905594e−47 | −4.1911829806e−43 |
| C222 | $x^8 y^{12}$ | 1.9038239784e−45 | −5.7148856507e−46 | −5.7823356428e−43 |
| C224 | $x^6 y^{14}$ | −1.7827656291e−44 | −1.7808554360e−45 | −3.6057237255e−43 |
| C226 | $x^4 y^{16}$ | 4.9013971612e−44 | −2.9648434303e−45 | −1.3969826714e−43 |
| C228 | $x^2 y^{18}$ | −6.2817784985e−44 | −2.1971707475e−45 | 2.7717101754e−43 |
| C230 | $y^{20}$ | 1.5418141526e−43 | −8.6665502153e−46 | 2.5029080864e−43 |

| Coefficient | Formula | M10 | M11 |
|---|---|---|---|
| C7 | $x^2 y$ | −7.2276737044e−07 | −2.4248080633e−09 |
| C9 | $y^3$ | 1.9638509950e−06 | −1.4305723378e−08 |
| C10 | $x^4$ | 5.0808365188e−10 | −3.4891057205e−11 |
| C12 | $x^2 y^2$ | −1.7891952861e−09 | −4.1226513952e−11 |
| C14 | $y^4$ | 4.8797105713e−09 | −9.3842893895e−12 |
| C16 | $x^4 y$ | 6.3443179564e−13 | 2.4639110383e−15 |
| C18 | $x^2 y^3$ | −6.7510879913e−12 | −2.7467789312e−14 |
| C20 | $y^5$ | 1.6934828510e−11 | −1.5841059563e−14 |
| C21 | $x^6$ | 6.0031216870e−16 | −4.1195863300e−17 |
| C23 | $x^4 y^2$ | 7.8746683626e−15 | −1.2654186546e−16 |
| C25 | $x^2 y^4$ | −1.8385869467e−15 | −1.0456897452e−16 |
| C27 | $y^6$ | −1.8162554696e−14 | −2.0913982009e−17 |
| C29 | $x^6 y$ | −2.5732812724e−18 | 2.2085057294e−20 |
| C31 | $x^4 y^3$ | −5.7262753994e−18 | −1.8340026815e−20 |
| C33 | $x^2 y^5$ | 2.5523191940e−16 | −5.6120704673e−20 |
| C35 | $y^7$ | −1.9776822082e−16 | −2.4068607957e−20 |
| C36 | $x^8$ | 2.1656616935e−21 | −5.3982002538e−23 |
| C38 | $x^6 y^2$ | 1.2120348738e−20 | −2.4513523640e−22 |
| C40 | $x^4 y^4$ | −4.0136050357e−19 | −3.8244309182e−22 |
| C42 | $x^2 y^6$ | 1.8604813320e−18 | −2.1623999236e−22 |
| C44 | $y^8$ | 2.7525380464e−18 | −2.4940745372e−23 |
| C46 | $x^8 y$ | −3.9215936758e−23 | −1.3699844890e−26 |
| C48 | $x^6 y^3$ | −8.0907144792e−23 | −2.6534478957e−26 |
| C50 | $x^4 y^5$ | −5.2010074072e−21 | −1.2536237464e−25 |
| C52 | $x^2 y^7$ | −9.8472719893e−21 | −7.6433497369e−26 |
| C54 | $y^9$ | 4.3222807965e−20 | −1.9624141924e−26 |
| C55 | $x^{10}$ | −2.7063992998e−26 | −1.7061257537e−28 |
| C57 | $x^8 y^2$ | −5.2088640305e−26 | −1.6898653635e−28 |
| C59 | $x^6 y^4$ | 4.5584719607e−24 | −2.5546907646e−28 |
| C61 | $x^4 y^6$ | 9.7234119869e−24 | −1.5222655233e−28 |
| C63 | $x^2 y^8$ | −2.5517771215e−22 | −4.7277118356e−29 |
| C65 | $y^{10}$ | 1.9120767833e−22 | −1.2966557212e−28 |
| C67 | $x^{10} y$ | 1.0748577806e−27 | −1.1629516838e−31 |
| C69 | $x^8 y^3$ | 1.2112738929e−26 | 5.7921120419e−31 |
| C71 | $x^6 y^5$ | 8.3396543785e−26 | 5.1751297365e−31 |
| C73 | $x^4 y^7$ | 6.9099031223e−25 | −2.5052559500e−31 |
| C75 | $x^2 y^9$ | −1.5269027299e−24 | −6.6525823213e−31 |
| C77 | $y^{11}$ | 9.5275101506e−25 | −1.3845191117e−31 |
| C78 | $x^{12}$ | 5.1324714334e−31 | 1.6217846426e−34 |
| C80 | $x^{10} y^2$ | −4.1863924845e−30 | −2.8531164120e−33 |
| C82 | $x^8 y^4$ | −5.9117693811e−29 | −8.4313905777e−33 |

TABLE 9-continued for projection optical unit 300 of FIG. 3A:
Free-form coefficients of surfaces

| | | | |
|---|---|---|---|
| C84 | $x^6 y^6$ | −7.2176695692e−28 | −1.3408705049e−32 |
| C86 | $x^4 y^8$ | 3.4633870187e−27 | −1.0947672929e−32 |
| C88 | $x^2 y^{10}$ | −1.7777593668e−27 | −4.2396896726e−33 |
| C90 | $y^{12}$ | 9.6429480815e−27 | −2.8461887992e−35 |
| C92 | $x^{12} y$ | −1.7419522218e−32 | 1.3211537763e−36 |
| C94 | $x^{10} y^3$ | −2.9799864782e−31 | −3.7321108569e−36 |
| C96 | $x^8 y^5$ | −1.8080862900e−30 | −6.2596404479e−36 |
| C98 | $x^6 y^7$ | −1.3241203559e−29 | −3.1613991441e−36 |
| C100 | $x^4 y^9$ | −1.1295117391e−29 | 3.0361530620e−36 |
| C102 | $x^2 y^{11}$ | 3.3947340077e−29 | 4.0363212334e−36 |
| C104 | $y^{13}$ | 2.8666964681e−29 | 4.7449512649e−37 |
| C105 | $x^{14}$ | −4.1912696608e−36 | 2.5463300051e−40 |
| C107 | $x^{12} y^2$ | 1.2914077639e−34 | 1.2470487570e−38 |
| C109 | $x^{10} y^4$ | 1.3778416995e−33 | 4.2293719038e−38 |
| C111 | $x^8 y^6$ | 1.2866380630e−32 | 8.8592526989e−38 |
| C113 | $x^6 y^8$ | 1.7929207751e−32 | 1.0403567494e−37 |
| C115 | $x^4 y^{10}$ | −6.9295317615e−32 | 6.6253480276e−38 |
| C117 | $x^2 y^{12}$ | 3.3870166074e−31 | 2.1244018299e−38 |
| C119 | $y^{14}$ | −1.2188516752e−31 | 1.0931298861e−39 |
| C121 | $x^{14} y$ | 1.6199803773e−37 | −3.5768466511e−42 |
| C123 | $x^{12} y^3$ | 3.5738089682e−36 | 1.5757224374e−41 |
| C125 | $x^{10} y^5$ | 2.7881061370e−35 | 3.0834397969e−41 |
| C127 | $x^8 y^7$ | 1.6208683570e−34 | 2.6203475383e−41 |
| C129 | $x^6 y^9$ | 6.1821159066e−34 | −1.1373659475e−41 |
| C131 | $x^4 y^{11}$ | −4.3142066811e−35 | −3.7747472707e−41 |
| C133 | $x^2 y^{13}$ | 3.5353866934e−34 | −2.4666182874e−41 |
| C135 | $y^{15}$ | −6.1412086537e−34 | −2.9874286186e−42 |
| C136 | $x^{16}$ | 1.7789636824e−41 | −3.5633844409e−45 |
| C138 | $x^{14} y^2$ | −1.6155206861e−39 | −4.5190113713e−44 |
| C140 | $x^{12} y^4$ | −2.1787447722e−38 | −1.8099112044e−43 |
| C142 | $x^{10} y^6$ | −1.6106847823e−37 | −4.5331724107e−43 |
| C144 | $x^8 y^8$ | −7.6059659185e−37 | −6.7659997014e−43 |
| C146 | $x^6 y^{10}$ | −3.1549731203e−37 | −6.1159560424e−43 |
| C148 | $x^4 y^{12}$ | −4.2255473754e−36 | −3.1933036470e−43 |
| C150 | $x^2 y^{14}$ | −1.6786920618e−35 | −8.9575491912e−44 |
| C152 | $y^{16}$ | −4.4462414083e−36 | −7.9962525726e−45 |
| C154 | $x^{16} y$ | −8.1056676173e−43 | 4.4438171432e−48 |
| C156 | $x^{14} y^3$ | −2.1815592502e−41 | −3.1151609316e−47 |
| C158 | $x^{12} y^5$ | −2.1707761152e−40 | −7.6121134541e−47 |
| C160 | $x^{10} y^7$ | −1.2509965264e−39 | −9.6884401166e−47 |
| C162 | $x^8 y^9$ | −6.4571773694e−39 | −1.5141299973e−47 |
| C164 | $x^6 y^{11}$ | −1.1973201547e−38 | 1.0970530041e−46 |
| C166 | $x^4 y^{13}$ | −1.6202865522e−38 | 1.3634023968e−46 |
| C168 | $x^2 y^{15}$ | −7.5298545113e−38 | 6.5246445126e−47 |
| C170 | $y^{17}$ | −3.7613593583e−38 | 7.6119197318e−48 |
| C171 | $x^{18}$ | −2.3565753881e−47 | 7.0626229884e−51 |
| C173 | $x^{16} y^2$ | 9.7297211471e−45 | 7.8301002345e−50 |
| C175 | $x^{14} y^4$ | 1.6578794527e−43 | 3.6575530185e−49 |
| C177 | $x^{12} y^6$ | 1.2962653200e−42 | 1.0713115655e−48 |
| C179 | $x^{10} y^8$ | 7.3590298746e−42 | 1.9455618251e−48 |
| C181 | $x^8 y^{10}$ | 1.7175825509e−41 | 2.2708022576e−48 |
| C183 | $x^6 y^{12}$ | 2.6569320431e−41 | 1.6773586147e−48 |
| C185 | $x^4 y^{14}$ | 1.4226823554e−40 | 7.4753331851e−49 |
| C187 | $x^2 y^{16}$ | 3.1791841821e−40 | 1.8778515863e−49 |
| C189 | $y^{18}$ | 6.5811411857e−43 | 1.8691411350e−50 |
| C191 | $x^{18} y$ | 1.6749669005e−48 | −1.9020917199e−54 |
| C193 | $x^{16} y^3$ | 5.3819887429e−47 | 2.6820434340e−53 |
| C195 | $x^{14} y^5$ | 6.5154622602e−46 | 7.8952011078e−53 |
| C197 | $x^{12} y^7$ | 4.2644921531e−45 | 1.3405840259e−52 |
| C199 | $x^{10} y^9$ | 2.4097270566e−44 | 5.3791720190e−53 |
| C201 | $x^8 y^{11}$ | 7.8996070218e−44 | −1.4529698574e−52 |
| C203 | $x^6 y^{13}$ | 1.6412324123e−43 | −2.8034797399e−52 |
| C205 | $x^4 y^{15}$ | 8.5286782455e−43 | −2.2168110670e−52 |
| C207 | $x^2 y^{17}$ | 2.8108673555e−42 | −8.3707388950e−53 |
| C209 | $y^{19}$ | 8.0790804290e−43 | −9.8854298058e−54 |
| C210 | $x^{20}$ | −3.3629356813e−53 | −5.9249813053e−57 |
| C212 | $x^{18} y^2$ | −2.2797468564e−50 | −6.8774697517e−56 |
| C214 | $x^{16} y^4$ | −4.7952282029e−49 | −3.6673970884e−55 |
| C216 | $x^{14} y^6$ | −4.4134777356e−48 | −1.2085621357e−54 |
| C218 | $x^{12} y^8$ | −2.7082181692e−47 | −2.5573208652e−54 |
| C220 | $x^{10} y^{10}$ | −9.7650194659e−47 | −3.6529054057e−54 |
| C222 | $x^8 y^{12}$ | −1.9029804017e−46 | −3.4990964992e−54 |
| C224 | $x^6 y^{14}$ | −1.6322286974e−46 | −2.2054155436e−54 |
| C226 | $x^4 y^{16}$ | 1.1092548814e−45 | −8.7188486858e−55 |
| C228 | $x^2 y^{18}$ | 5.1507216625e−45 | −2.0064846492e−55 |
| C230 | $y^{20}$ | 1.8460550265e−45 | −2.0161870178e−56 |

TABLE 10 for projection optical unit 300 of FIG. 3A:
Coordinates of stop edge:

| $x_i$ [mm] | $y_i$ [mm] | $x_{i+N/2}$ [mm] | $y_{i+N/2}$ [mm] |
|---|---|---|---|
| −385.835606 | 42.993261 | 388.106548 | 31.142767 |
| −384.385864 | 48.749308 | 388.924481 | 25.054013 |
| −382.728677 | 54.389216 | 389.528426 | 18.860467 |
| −380.865534 | 59.910851 | 389.916569 | 12.565580 |
| −378.797898 | 65.312391 | 390.087034 | 6.173017 |
| −376.527235 | 70.592338 | 390.037894 | −0.313355 |
| −374.055035 | 75.749522 | 389.767180 | −6.889470 |
| −371.382850 | 80.783102 | 389.272903 | −13.551064 |
| −368.512323 | 85.692559 | 388.553062 | −20.293680 |
| −365.445217 | 90.477684 | 387.605661 | −27.112656 |
| −362.183440 | 95.138562 | 386.428720 | −34.003123 |
| −358.729072 | 99.675547 | 385.020289 | −40.959997 |
| −355.084380 | 104.089245 | 383.378452 | −47.977967 |
| −351.251828 | 108.380479 | 381.501344 | −55.051487 |
| −347.234087 | 112.550270 | 379.387149 | −62.174770 |
| −343.034030 | 116.599808 | 377.034115 | −69.341779 |
| −338.654728 | 120.530422 | 374.440561 | −76.546216 |
| −334.099440 | 124.343566 | 371.604880 | −83.781526 |
| −329.371592 | 128.040784 | 368.525555 | −91.040886 |
| −324.474764 | 131.623703 | 365.201166 | −98.317211 |
| −319.412661 | 135.094006 | 361.630399 | −105.603155 |
| −314.189092 | 138.453422 | 357.812067 | −112.891114 |
| −308.807950 | 141.703710 | 353.745113 | −120.173238 |
| −303.273181 | 144.846651 | 349.428636 | −127.441440 |
| −297.588769 | 147.884036 | 344.861903 | −134.687413 |
| −291.758714 | 150.817658 | 340.044370 | −141.902646 |
| −285.787017 | 153.649310 | 334.975702 | −149.078446 |
| −279.677668 | 156.380772 | 329.655800 | −156.205956 |
| −273.434636 | 159.013817 | 324.084817 | −163.276183 |
| −267.061866 | 161.550199 | 318.263190 | −170.280018 |
| −260.563272 | 163.991653 | 312.191661 | −177.208269 |
| −253.942740 | 166.339894 | 305.871303 | −184.051679 |
| −247.204129 | 168.596612 | 299.303543 | −190.800959 |
| −240.351271 | 170.763472 | 292.490182 | −197.446813 |
| −233.387978 | 172.842110 | 285.433417 | −203.979963 |
| −226.318037 | 174.834130 | 278.135854 | −210.391180 |
| −219.145223 | 176.741104 | 270.600525 | −216.671307 |
| −211.873288 | 178.564567 | 262.830898 | −222.811287 |
| −204.505973 | 180.306018 | 254.830882 | −228.802188 |
| −197.046998 | 181.966912 | 246.604836 | −234.635231 |
| −189.500069 | 183.548663 | 238.157568 | −240.301810 |
| −181.868874 | 185.052638 | 229.494339 | −245.793520 |
| −174.157082 | 186.480159 | 220.620857 | −251.102175 |
| −166.368343 | 187.832498 | 211.543275 | −256.219835 |
| −158.506293 | 189.110875 | 202.268187 | −261.138820 |
| −150.574546 | 190.316461 | 192.802613 | −265.851734 |
| −142.576708 | 191.450370 | 183.153997 | −270.351483 |
| −134.516370 | 192.513666 | 173.330187 | −274.631284 |
| −126.397118 | 193.507355 | 163.339423 | −278.684692 |
| −118.222534 | 194.432389 | 153.190321 | −282.505602 |
| −109.996202 | 195.289662 | 142.891850 | −286.088270 |
| −101.721715 | 196.080013 | 132.453312 | −289.427320 |
| −93.402672 | 196.804220 | 121.884321 | −292.517751 |
| −85.042690 | 197.463005 | 111.194776 | −295.354951 |
| −76.645401 | 198.057029 | 100.394835 | −297.934698 |
| −68.214457 | 198.586893 | 89.494893 | −300.253166 |
| −59.753530 | 199.053137 | 78.505553 | −302.306930 |
| −51.266312 | 199.456240 | 67.437602 | −304.092967 |
| −42.756517 | 199.796618 | 56.301984 | −305.608657 |
| −34.227876 | 200.074626 | 45.109777 | −306.851785 |
| −25.684137 | 200.290552 | 33.872170 | −307.820539 |
| −17.129062 | 200.444624 | 22.600438 | −308.513511 |
| −8.566423 | 200.537002 | 11.305921 | −308.929697 |
| 0.000000 | 200.567784 | 0.000000 | −309.068492 |
| 8.566423 | 200.537002 | −11.305921 | −308.929697 |
| 17.129062 | 200.444624 | −22.600438 | −308.513511 |
| 25.684137 | 200.290552 | −33.872170 | −307.820539 |
| 34.227876 | 200.074626 | −45.109777 | −306.851785 |
| 42.756517 | 199.796618 | −56.301984 | −305.608657 |
| 51.266312 | 199.456240 | −67.437602 | −304.092967 |
| 59.753530 | 199.053137 | −78.505553 | −302.306930 |
| 68.214457 | 198.586893 | −89.494893 | −300.253166 |
| 76.645401 | 198.057029 | −100.394835 | −297.934698 |
| 85.042690 | 197.463005 | −111.194776 | −295.354951 |
| 93.402672 | 196.804220 | −121.884321 | −292.517751 |
| 101.721715 | 196.080013 | −132.453312 | −289.427320 |
| 109.996202 | 195.289662 | −142.891850 | −286.088270 |
| 118.222534 | 194.432389 | −153.190321 | −282.505602 |
| 126.397118 | 193.507355 | −163.339423 | −278.684692 |
| 134.516370 | 192.513666 | −173.330187 | −274.631284 |
| 142.576708 | 191.450370 | −183.153997 | −270.351483 |
| 150.574546 | 190.316461 | −192.802613 | −265.851734 |
| 158.506293 | 189.110875 | −202.268187 | −261.138820 |
| 166.368343 | 187.832498 | −211.543275 | −256.219835 |
| 174.157082 | 186.480159 | −220.620857 | −251.102175 |
| 181.868874 | 185.052638 | −229.494339 | −245.793520 |
| 189.500069 | 183.548663 | −238.157568 | −240.301810 |
| 197.046998 | 181.966912 | −246.604836 | −234.635231 |
| 204.505973 | 180.306018 | −254.830882 | −228.802188 |
| 211.873288 | 178.564567 | −262.830898 | −222.811287 |
| 219.145223 | 176.741104 | −270.600525 | −216.671307 |
| 226.318037 | 174.834130 | −278.135854 | −210.391180 |
| 233.387978 | 172.842110 | −285.433417 | −203.979963 |
| 240.351271 | 170.763472 | −292.490182 | −197.446813 |
| 247.204129 | 168.596612 | −299.303543 | −190.800959 |
| 253.942740 | 166.339894 | −305.871303 | −184.051679 |
| 260.563272 | 163.991653 | −312.191661 | −177.208269 |
| 267.061866 | 161.550199 | −318.263190 | −170.280018 |
| 273.434636 | 159.013817 | −324.084817 | −163.276183 |
| 279.677668 | 156.380772 | −329.655800 | −156.205956 |
| 285.787017 | 153.649310 | −334.975702 | −149.078446 |
| 291.758714 | 150.817658 | −340.044370 | −141.902646 |
| 297.588769 | 147.884036 | −344.861903 | −134.687413 |
| 303.273181 | 144.846651 | −349.428636 | −127.441440 |
| 308.807950 | 141.703710 | −353.745113 | −120.173238 |
| 314.189092 | 138.453422 | −357.812067 | −112.891114 |
| 319.412661 | 135.094006 | −361.630399 | −105.603155 |
| 324.474764 | 131.623703 | −365.201166 | −98.317211 |
| 329.371592 | 128.040784 | −368.525555 | −91.040886 |
| 334.099440 | 124.343566 | −371.604880 | −83.781526 |
| 338.654728 | 120.530422 | −374.440561 | −76.546216 |
| 343.034030 | 116.599808 | −377.034115 | −69.341779 |
| 347.234087 | 112.550270 | −379.387149 | −62.174770 |
| 351.251828 | 108.380479 | −381.501344 | −55.051487 |
| 355.084380 | 104.089245 | −383.378452 | −47.977967 |
| 358.729072 | 99.675547 | −385.020289 | −40.959997 |
| 362.183440 | 95.138562 | −386.428720 | −34.003123 |
| 365.445217 | 90.477684 | −387.605661 | −27.112656 |
| 368.512323 | 85.692559 | −388.553062 | −20.293680 |
| 371.382850 | 80.783102 | −389.272903 | −13.551064 |
| 374.055035 | 75.749522 | −389.767180 | −6.889470 |
| 376.527235 | 70.592338 | −390.037894 | −0.313355 |
| 378.797898 | 65.312391 | −390.087034 | 6.173017 |
| 380.865534 | 59.910851 | −389.916569 | 12.565580 |
| 382.728677 | 54.389216 | −389.528426 | 18.860467 |
| 384.385864 | 48.749308 | −388.924481 | 25.054013 |
| 385.835606 | 42.993261 | −388.106548 | 31.142767 |
| 387.076366 | 37.123509 | −387.076366 | 37.123509 |

Design Data for FIG. 4A

TABLE 11 for projection optical unit 400 of FIG. 4A:

| | |
|---|---|
| Numerical Aperture | 0.75 |
| Magnification in x-direction | 0.250 |
| Magnification in y-direction | 0.125 |
| Chief Ray angle | 5.50° |
| Wavelength | 13.5 nm |
| Image field size in x-direction | 26 mm |
| Image field size in y-direction | 1 mm |
| Average Wavefront-RMS | 6.87 mλ |

TABLE 12 for projection optical unit 400 of FIG. 4A:
Radii of Surfaces

|  | Radius$_x$ [mm] | Power$_x$ [1/mm] | Radius$_y$ [mm] | Power$_y$ [1/mm] |
|---|---|---|---|---|
| M01 | −3689.86177464 | 0.00052901 | −1889.42699031 | 0.00103311 |
| M02 | 2262.82803946 | −0.00011284 | 18970.07022923 | −0.00001346 |
| M03 | 9289.99315567 | −0.00007790 | −4145.35851898 | 0.00017459 |
| M04 | −2781.52934966 | 0.00071116 | −1634.09969128 | 0.00121052 |
| M05 | −66228.84296239 | 0.00000890 | 57980.90482880 | −0.00001016 |
| M06 | 20296.78796403 | −0.00001267 | −10074.33166421 | 0.00002552 |
| M07 | 4607.97616416 | −0.00038954 | 434.68724528 | −0.00412939 |
| M08 | −984.23726449 | 0.00201689 | −851.26294444 | 0.00233194 |

TABLE 13 for projection optical unit 400 of FIG. 4A:
Decentring (location, angle) of surfaces

|  | D$_x$ [mm] | D$_y$ [mm] | D$_z$ [mm] |
|---|---|---|---|
| Reticle | 0.000000000 | 0.000000000 | 0.000000000 |
| M01 | 0.000000000 | −215.495043511 | 2238.001595668 |
| M02 | 0.000000000 | −570.064547548 | 1090.549078471 |
| M03 | 0.000000000 | −1180.350914725 | 570.109066363 |
| M04 | 0.000000000 | −3044.361576313 | 258.680581926 |
| M05 | 0.000000000 | −2368.480962084 | 687.516145920 |
| M06 | 0.000000000 | −2030.465535471 | 1113.526237736 |
| M07 | −0.000000000 | −1775.493177437 | 2381.352572167 |
| Stop | −0.000000000 | −1799.080518072 | 2304.006588682 |
| M08 | 0.000000000 | −1981.747071377 | 1705.019003181 |
| Wafer | −0.000000000 | −1981.750996952 | 2497.592638799 |

|  | α$_x$ [°] | α$_y$ [°] | α$_z$ [°] |
|---|---|---|---|
| Reticle | 0.000000000 | 0.000000000 | 0.000000000 |
| M01 | −5.835726662 | 0.000000000 | 0.000000000 |
| M02 | 56.642714131 | 180.000000000 | 0.000000000 |
| M03 | 204.970966472 | 0.000000000 | 0.000000000 |
| M04 | −69.060233763 | 180.000000000 | 0.000000000 |
| M05 | 221.982213560 | 0.000000000 | 0.000000000 |
| M06 | 65.099441448 | 180.000000000 | 0.000000000 |
| M07 | −14.165305433 | −0.000000000 | −0.000000000 |
| Stop | 3.082253291 | 180.000000000 | −0.000000000 |
| M08 | −8.479631987 | 180.000000000 | −0.000000000 |
| Wafer | 0.000283783 | −0.000000000 | 0.000000000 |

TABLE 14 for projection optical unit 400 of FIG. 4A:
Free form coefficients of surfaces

| Coefficient | Formula | M01 | M02 | M03 |
|---|---|---|---|---|
| C7 | $x^2 y$ | 3.9664864304e−08 | 6.2055423613e−09 | −1.1664650656e−07 |
| C9 | $y^3$ | 1.1045629451e−09 | −1.3685039357e−07 | 5.0942985965e−08 |
| C10 | $x^4$ | 1.7726692614e−11 | −4.2291488739e−11 | −7.7971336916e−11 |
| C12 | $x^2 y^2$ | 2.4620783833e−11 | −1.5070109961e−10 | 5.4145270950e−11 |
| C14 | $y^4$ | −1.7868222013e−11 | 2.2949722748e−10 | −1.3548376981e−12 |
| C16 | $x^4 y$ | 1.7074574712e−14 | 1.3694280350e−13 | 5.7964800377e−14 |
| C18 | $x^2 y^3$ | 1.3630323002e−14 | 1.5247912631e−13 | 2.8014537833e−14 |
| C20 | $y^5$ | −6.2700372245e−14 | −1.2085266994e−12 | −5.1630442224e−14 |
| C21 | $x^6$ | 1.4962804236e−17 | −1.2611303104e−16 | −9.8706120538e−17 |
| C23 | $x^4 y^2$ | 2.4197049221e−17 | −2.8587966469e−16 | 1.4190136454e−17 |
| C25 | $x^2 y^4$ | 7.4055298794e−17 | −1.5927431834e−17 | −1.7204279550e−16 |
| C27 | $y^6$ | −9.0556677762e−17 | 5.2186461472e−15 | 1.3043537193e−16 |
| C29 | $x^6 y$ | −8.6149869147e−21 | 1.0703352441e−19 | 1.8461596673e−19 |
| C31 | $x^4 y^3$ | −1.6385881134e−20 | 5.1382075616e−19 | −1.9974994625e−19 |
| C33 | $x^2 y^5$ | 5.7357245908e−20 | −3.5720112725e−18 | 3.8590192262e−19 |
| C35 | $y^7$ | −1.9219901140e−19 | −1.4876540285e−17 | 4.0737832415e−19 |
| C36 | $x^8$ | −2.5350813751e−24 | −6.4073682498e−22 | −2.6237229725e−23 |
| C38 | $x^6 y^2$ | −3.3572632366e−23 | 2.2261437236e−22 | −3.0312148285e−22 |
| C40 | $x^4 y^4$ | −3.7915462826e−22 | −1.1097556559e−21 | 3.2794041434e−22 |
| C42 | $x^2 y^6$ | 9.3749923165e−22 | 2.4164873484e−20 | 1.4613379930e−21 |
| C44 | $y^8$ | 1.9166580897e−21 | 1.5681796957e−20 | 5.8145282726e−22 |
| C46 | $x^8 y$ | 3.9258913875e−26 | 1.6677324438e−24 | 2.6768156456e−26 |
| C48 | $x^6 y^3$ | −1.2266158092e−25 | −4.3011792692e−24 | 1.3309136322e−25 |
| C50 | $x^4 y^5$ | −3.0713642221e−25 | −1.9012113015e−23 | 8.3934582291e−25 |
| C52 | $x^2 y^7$ | 9.3299290004e−24 | −8.5481625873e−23 | −4.0235974399e−24 |
| C54 | $y^9$ | 6.2497173471e−24 | −1.0076883167e−22 | −7.4365199849e−25 |
| C55 | $x^{10}$ | 3.3021902780e−29 | 7.8705825888e−27 | 4.8384775287e−28 |
| C57 | $x^8 y^2$ | 9.3919897258e−28 | 4.6884464602e−27 | 4.9905868933e−29 |
| C59 | $x^6 y^4$ | 9.5452863382e−27 | 5.8964599175e−26 | 3.0740068878e−27 |
| C61 | $x^4 y^6$ | 2.9385272024e−26 | 1.1944333777e−25 | 2.9322819934e−27 |
| C63 | $x^2 y^8$ | −2.7963147244e−26 | −2.0527567448e−25 | 5.4272894367e−26 |
| C65 | $y^{10}$ | −1.0971768970e−25 | 1.8370235595e−24 | 2.7581455650e−26 |
| C67 | $x^{10} y$ | −1.9317514726e−31 | −1.6338495986e−30 | −1.4952974970e−30 |
| C69 | $x^8 y^3$ | 2.4550580645e−31 | 6.4001166686e−29 | 4.5356690234e−30 |
| C71 | $x^6 y^5$ | 1.6667635239e−29 | 1.8024186267e−28 | 4.3069853822e−29 |
| C73 | $x^4 y^7$ | −5.6933443116e−29 | 6.2804071719e−28 | 2.7265072802e−28 |
| C75 | $x^2 y^9$ | −8.0026705242e−28 | 1.6248367164e−27 | 4.5837023777e−28 |
| C77 | $y^{11}$ | −7.9389382555e−28 | −1.0768757560e−26 | 5.7193284117e−29 |
| C78 | $x^{12}$ | −2.9852448203e−34 | −2.7674830986e−32 | −2.2105103719e−33 |
| C80 | $x^{10} y^2$ | −8.8613571441e−33 | −6.5502438464e−32 | −2.0543789034e−33 |
| C82 | $x^8 y^4$ | −1.2071464115e−31 | −9.1918193521e−31 | 1.4116944767e−32 |
| C84 | $x^6 y^6$ | −6.4446367789e−31 | −2.9712495921e−30 | 3.6677856214e−31 |
| C86 | $x^4 y^8$ | −1.2231375293e−30 | −2.0296693129e−30 | −2.6824236079e−31 |

TABLE 14-continued for projection optical unit 400 of FIG. 4A:
Free form coefficients of surfaces

| | | | | |
|---|---|---|---|---|
| C88 | $x^2 y^{10}$ | 1.0644328418e−30 | 2.2040482092e−29 | −3.5978371022e−30 |
| C90 | $y^{12}$ | 3.2700914419e−30 | 2.9427716513e−29 | −3.4391806760e−30 |
| C92 | $x^{12} y$ | 1.6876732821e−36 | 1.8985325314e−35 | 1.2087177200e−35 |
| C94 | $x^{10} y^3$ | 3.6637199170e−36 | −6.1638833092e−34 | −1.0880682011e−35 |
| C96 | $x^8 y^5$ | −9.4278695533e−35 | −3.3181807092e−33 | −1.3540012059e−34 |
| C98 | $x^6 y^7$ | −5.1385809247e−34 | −1.0570183788e−32 | −2.4927237785e−33 |
| C100 | $x^4 y^9$ | 4.5008639763e−33 | −4.4485963436e−32 | −1.5806617912e−32 |
| C102 | $x^2 y^{11}$ | 3.0176109024e−32 | −2.1094761773e−31 | −3.4942943877e−32 |
| C104 | $y^{13}$ | 2.7360883594e−32 | −1.9921035218e−32 | −1.5088204103e−32 |
| C105 | $x^{14}$ | 1.3881896314e−39 | 3.5685987973e−38 | 7.3296297351e−39 |
| C107 | $x^{12} y^2$ | 4.6848990951e−38 | 5.8271069137e−37 | 2.5128752682e−38 |
| C109 | $x^{10} y^4$ | 7.5193796292e−37 | 8.6831667968e−36 | −1.3179184807e−38 |
| C111 | $x^8 y^6$ | 6.1180573141e−36 | 4.4709083266e−35 | −4.1962512541e−36 |
| C113 | $x^6 y^8$ | 2.1191002541e−35 | 9.1281763302e−35 | −2.2067328831e−35 |
| C115 | $x^4 y^{10}$ | 3.3200878604e−35 | 1.8296825291e−34 | −1.3867933484e−35 |
| C117 | $x^2 y^{12}$ | −9.9290243986e−36 | 3.6272836091e−34 | 5.2399072970e−35 |
| C119 | $y^{14}$ | −4.1883091920e−35 | −3.5117585872e−34 | 8.2299026873e−35 |
| C121 | $x^{14} y$ | −6.9307066555e−42 | 2.4855488479e−40 | −4.6411241968e−41 |
| C123 | $x^{12} y^3$ | −2.6494616783e−41 | 3.1956997008e−39 | 1.2068609299e−40 |
| C125 | $x^{10} y^5$ | 7.5957361796e−41 | 1.9868423491e−38 | −4.3804039799e−40 |
| C127 | $x^8 y^7$ | 2.8461488989e−39 | 9.3511865077e−38 | −1.2305966184e−38 |
| C129 | $x^6 y^9$ | 1.0245097841e−39 | 2.0540743098e−37 | 3.1127239566e−38 |
| C131 | $x^4 y^{11}$ | −1.1284015896e−37 | 5.3584395940e−37 | 4.0473661977e−37 |
| C133 | $x^2 y^{13}$ | −5.6961243590e−37 | 2.5225734553e−36 | 1.0170314653e−36 |
| C135 | $y^{15}$ | −4.3547148498e−37 | 2.6412018607e−36 | 5.0457678658e−37 |
| C136 | $x^{16}$ | −3.6439774609e−45 | −1.5984693428e−43 | −1.3028864809e−44 |
| C138 | $x^{14} y^2$ | −1.3161405399e−43 | −2.6404000112e−42 | −5.1771423606e−44 |
| C140 | $x^{12} y^4$ | −2.4059399466e−42 | −3.8883173012e−41 | −1.9513683039e−43 |
| C142 | $x^{10} y^6$ | −2.5072152548e−41 | −2.8276083994e−40 | 5.3122445462e−42 |
| C144 | $x^8 y^8$ | −1.3395462785e−40 | −8.7831340365e−40 | 9.2566044483e−41 |
| C146 | $x^6 y^{10}$ | −3.5147113550e−40 | −1.1559106071e−39 | 3.7733428276e−40 |
| C148 | $x^4 y^{12}$ | −5.1065276334e−40 | −4.2540756895e−39 | 8.5249561669e−40 |
| C150 | $x^2 y^{14}$ | −3.2629694036e−40 | −1.3919168206e−38 | 7.6999450965e−40 |
| C152 | $y^{16}$ | −5.3937006908e−42 | −8.9784947111e−39 | −2.7456337260e−40 |
| C154 | $x^{16} y$ | 9.0556099491e−48 | −5.1042612211e−46 | 6.2908267208e−47 |
| C156 | $x^{14} y^3$ | 5.5899410166e−47 | −6.5745362795e−45 | −5.3691243814e−46 |
| C158 | $x^{12} y^5$ | 2.2711276662e−46 | −4.9753431263e−44 | −1.7371104867e−45 |
| C160 | $x^{10} y^7$ | −2.1342930323e−45 | −3.2190115168e−43 | 7.1916152687e−44 |
| C162 | $x^8 y^9$ | −2.0535904468e−44 | −1.3335193119e−42 | 3.9603994342e−43 |
| C164 | $x^6 y^{11}$ | 7.9646881418e−44 | −2.3332197593e−42 | 1.0355687111e−43 |
| C166 | $x^4 y^{13}$ | 9.7005315946e−43 | 8.0391837581e−42 | −4.3319926708e−42 |
| C168 | $x^2 y^{15}$ | 4.3198666300e−42 | 2.6816703361e−41 | −1.0665168742e−41 |
| C170 | $y^{17}$ | 2.2454045636e−42 | 1.4889097355e−41 | −5.3297460523e−42 |
| C171 | $x^{18}$ | 4.1872349782e−51 | 5.4820086405e−49 | 1.0589952876e−50 |
| C173 | $x^{16} y^2$ | 1.5039378574e−49 | 5.4752404715e−48 | −2.5213744367e−50 |
| C175 | $x^{14} y^4$ | 3.0846997272e−48 | 7.1812639805e−47 | −1.5476848231e−48 |
| C177 | $x^{12} y^6$ | 3.8747955413e−47 | 6.7163150949e−46 | 4.9641949310e−48 |
| C179 | $x^{10} y^8$ | 2.6861711567e−46 | 3.2071454862e−45 | 1.4187222151e−46 |
| C181 | $x^8 y^{10}$ | 1.0794113751e−45 | 7.6631344165e−45 | 2.5896772316e−46 |
| C183 | $x^6 y^{12}$ | 2.3600289824e−45 | 8.5992025295e−45 | −1.3984080841e−45 |
| C185 | $x^4 y^{14}$ | 3.3824867926e−45 | −4.6051479192e−45 | −1.3159179846e−44 |
| C187 | $x^2 y^{16}$ | 5.9366602831e−45 | −1.8967619610e−44 | −2.0871517822e−44 |
| C189 | $y^{18}$ | 1.3124851518e−45 | −9.7358055589e−45 | −8.0348459291e−45 |

| Coefficient | Formula | M04 | M05 | M06 |
|---|---|---|---|---|
| C7 | $x^2 y$ | −1.1889462116e−08 | 1.0803014811e−07 | −1.5574183556e−08 |
| C9 | $y^3$ | −1.5175697959e−07 | 4.3360348778e−09 | 5.3980081958e−08 |
| C10 | $x^4$ | −9.7892441339e−13 | 2.7740619699e−11 | 8.2621358927e−11 |
| C12 | $x^2 y^2$ | 7.4870553983e−12 | −1.4171540184e−10 | −4.9728632987e−11 |
| C14 | $y^4$ | −6.4586744649e−10 | 5.7196640861e−11 | −1.0886295127e−10 |
| C16 | $x^4 y$ | −4.2366437961e−15 | −8.1278683426e−14 | 2.1492040193e−13 |
| C18 | $x^2 y^3$ | −7.2734591451e−14 | 2.1057968845e−13 | 2.3034720713e−13 |
| C20 | $y^5$ | −2.6020653763e−12 | −1.2521389455e−13 | 2.4782937547e−14 |
| C21 | $x^6$ | 8.5999864319e−19 | −3.1563552296e−17 | −1.0941821814e−16 |
| C23 | $x^4 y^2$ | −1.4881512436e−18 | 1.4616074314e−16 | −7.7105511856e−17 |
| C25 | $x^2 y^4$ | −2.1194936878e−16 | −4.3449855554e−16 | 8.2094305722e−16 |
| C27 | $y^6$ | −9.8302217171e−15 | 3.6207067553e−16 | 6.3094888352e−16 |
| C29 | $x^6 y$ | −2.6433521307e−22 | 5.9772657790e−20 | −3.3092440447e−19 |
| C31 | $x^4 y^3$ | −5.5564149907e−20 | −2.1731266213e−19 | −4.4090423322e−18 |
| C33 | $x^2 y^5$ | −9.9017470705e−19 | 9.4786522341e−19 | −4.7426364304e−18 |
| C35 | $y^7$ | −2.3777070226e−17 | −5.1535348926e−19 | 6.9723762339e−18 |
| C36 | $x^8$ | 6.6813877252e−25 | −5.2215224448e−23 | −3.4739652762e−21 |
| C38 | $x^6 y^2$ | 8.6440640368e−25 | 3.3675018090e−23 | 4.8123988276e−21 |
| C40 | $x^4 y^4$ | −1.2673964184e−22 | 4.9033896043e−22 | 4.6492412183e−21 |
| C42 | $x^2 y^6$ | −6.8134578758e−21 | −2.7551997096e−21 | −7.0688634875e−20 |
| C44 | $y^8$ | 1.2854629917e−19 | 7.0686436876e−22 | −8.9714560391e−20 |

TABLE 14-continued for projection optical unit 400 of FIG. 4A:
Free form coefficients of surfaces

| | | | | |
|---|---|---|---|---|
| C46 | $x^8 y$ | 1.6763878105e−27 | −1.2254482577e−26 | 1.1603989325e−22 |
| C48 | $x^6 y^3$ | −2.7075044736e−26 | −3.5558404940e−25 | 2.1320450004e−22 |
| C50 | $x^4 y^5$ | −3.5075243593e−24 | 9.3166539883e−26 | 4.2001644961e−22 |
| C52 | $x^2 y^7$ | −1.1830246799e−22 | 1.2188584117e−23 | 5.6186066009e−22 |
| C54 | $y^9$ | −2.6980748707e−22 | −2.3829220559e−23 | −1.2883611668e−23 |
| C55 | $x^{10}$ | −1.1582252478e−30 | 8.4610577686e−28 | 2.4644341252e−25 |
| C57 | $x^8 y^2$ | −8.2897175732e−30 | −1.1581364502e−27 | 5.5456411541e−25 |
| C59 | $x^6 y^4$ | −1.4407421655e−27 | 2.8315688802e−27 | 4.6686712286e−25 |
| C61 | $x^4 y^6$ | −4.6157453258e−26 | −3.7557856277e−27 | −8.2889130963e−25 |
| C63 | $x^2 y^8$ | −4.6106556973e−25 | −5.0016852954e−26 | 2.9905817085e−24 |
| C65 | $y^{10}$ | −5.5399535762e−24 | 3.2078052289e−26 | 4.7069245023e−24 |
| C67 | $x^{10} y$ | −9.6284071855e−33 | 3.2051161267e−31 | −1.1854523257e−26 |
| C69 | $x^8 y^3$ | −3.2356105780e−32 | −1.1437837778e−30 | −3.1055605090e−26 |
| C71 | $x^6 y^5$ | 4.4119639162e−30 | −1.5412277126e−29 | −9.7498319337e−27 |
| C73 | $x^4 y^7$ | 3.9091741188e−28 | −8.4281499833e−29 | −2.8016099673e−26 |
| C75 | $x^2 y^9$ | 6.9479390089e−27 | 1.5778014480e−28 | −3.9176969581e−26 |
| C77 | $y^{11}$ | 6.0198776726e−26 | 1.2414625561e−27 | −1.8566866418e−26 |
| C78 | $x^{12}$ | 3.6349419194e−36 | −6.6921373350e−33 | −2.4421538154e−29 |
| C80 | $x^{10} y^2$ | 4.1729286790e−35 | 2.2546804714e−32 | −5.5220516976e−29 |
| C82 | $x^8 y^4$ | 5.7724338021e−33 | −1.5770461456e−32 | −1.9207176835e−28 |
| C84 | $x^6 y^6$ | 3.2018718641e−31 | 4.0411357406e−32 | −2.6781274778e−30 |
| C86 | $x^4 y^8$ | 6.1575436610e−30 | 1.0254323778e−30 | 1.0521727248e−28 |
| C88 | $x^2 y^{10}$ | −5.5814158629e−30 | 5.9913658247e−31 | −7.5255205721e−30 |
| C90 | $y^{12}$ | −4.2953518841e−28 | −4.5568375622e−30 | −9.3353989747e−29 |
| C92 | $x^{12} y$ | 1.4006338500e−38 | 5.1222870885e−36 | 5.2407289746e−31 |
| C94 | $x^{10} y^3$ | −1.0440574764e−37 | 1.9320249815e−35 | 2.6685224840e−30 |
| C96 | $x^8 y^5$ | −6.6131517009e−36 | 2.4565309591e−34 | 1.2741390086e−30 |
| C98 | $x^6 y^7$ | −1.1419505524e−33 | 2.5004499588e−34 | 8.1396825647e−33 |
| C100 | $x^4 y^9$ | −5.7680409840e−32 | −3.2102003843e−33 | 1.0137747949e−30 |
| C102 | $x^2 y^{11}$ | −9.1987881432e−31 | −9.6518164408e−33 | 1.3359390234e−30 |
| C104 | $y^{13}$ | −6.2198470157e−30 | −2.7944107970e−32 | 8.7749131060e−31 |
| C105 | $x^{14}$ | −5.9120494565e−42 | 3.8300053718e−38 | 1.1728499580e−33 |
| C107 | $x^{12} y^2$ | −2.4093007298e−40 | −3.1199325629e−37 | 2.9405516875e−33 |
| C109 | $x^{10} y^4$ | −1.6284601898e−38 | −5.2657846642e−37 | 1.4813916263e−32 |
| C111 | $x^8 y^6$ | −1.0410299806e−36 | −3.1296272281e−37 | 1.1209030741e−32 |
| C113 | $x^6 y^8$ | −4.2233158742e−35 | −5.2350385460e−36 | −6.2500433413e−34 |
| C115 | $x^4 y^{10}$ | −6.1447694539e−34 | −1.5849663524e−35 | −5.9130605065e−33 |
| C117 | $x^2 y^{12}$ | −8.2369651293e−34 | 3.0993794759e−35 | −4.0625084492e−33 |
| C119 | $y^{14}$ | 2.9199912939e−32 | 1.8492992593e−34 | −1.1391763535e−33 |
| C121 | $x^{14} y$ | −2.7071762133e−44 | −3.7321581238e−41 | −1.4173430277e−35 |
| C123 | $x^{12} y^3$ | 3.6256378412e−44 | 1.1064940629e−39 | −1.1250757036e−34 |
| C125 | $x^{10} y^5$ | 1.4600372340e−42 | −6.9750245073e−40 | −1.0425115590e−34 |
| C127 | $x^8 y^7$ | 9.0782831568e−40 | 4.5229033687e−39 | 5.2578461470e−36 |
| C129 | $x^6 y^9$ | 1.0003019700e−37 | 6.8798542950e−39 | 1.0533190311e−35 |
| C131 | $x^4 y^{11}$ | 3.7988957797e−36 | 2.4731227245e−37 | −8.6703778059e−36 |
| C133 | $x^2 y^{13}$ | 5.4947553803e−35 | −4.2224002766e−38 | −1.2987048831e−35 |
| C135 | $y^{15}$ | 1.1253528568e−34 | 1.4804530732e−37 | −1.1082931599e−35 |
| C136 | $x^{16}$ | 3.8678720059e−48 | −1.1066670268e−43 | −2.8587141582e−38 |
| C138 | $x^{14} y^2$ | 7.0383260333e−46 | 1.1902940737e−42 | −1.3539989281e−37 |
| C140 | $x^{12} y^4$ | 2.6890733666e−44 | 1.6670323365e−42 | −6.5422751577e−37 |
| C142 | $x^{10} y^6$ | 1.6949956574e−42 | 4.8333599106e−42 | −6.4919823692e−37 |
| C144 | $x^8 y^8$ | 8.6606310347e−41 | −3.9949984749e−41 | −3.1738838058e−37 |
| C146 | $x^6 y^{10}$ | 2.6604897748e−39 | 1.5072458274e−40 | 1.0403073986e−39 |
| C148 | $x^4 y^{12}$ | 3.2831967592e−38 | −1.4250525172e−39 | 1.2195426274e−37 |
| C150 | $x^2 y^{14}$ | 1.5039394485e−37 | 4.7788437190e−40 | 1.0255180160e−37 |
| C152 | $y^{16}$ | −9.6283082192e−37 | −3.8433868056e−39 | 5.5383752125e−38 |
| C154 | $x^{16} y$ | 2.8828707289e−50 | −2.4136997923e−47 | 1.6634061863e−40 |
| C156 | $x^{14} y^3$ | 3.8846436889e−49 | −6.7483325986e−45 | 1.7338050560e−39 |
| C158 | $x^{12} y^5$ | 1.9371977941e−48 | −7.4424023720e−45 | 2.3172617240e−39 |
| C160 | $x^{10} y^7$ | −8.6604124188e−47 | 5.3436583245e−45 | 2.5345306257e−40 |
| C162 | $x^8 y^9$ | −5.6778591913e−44 | 1.0505376916e−43 | −3.4292687512e−40 |
| C164 | $x^6 y^{11}$ | −3.3978522403e−42 | −7.0101093965e−43 | −3.5483627028e−40 |
| C166 | $x^4 y^{13}$ | −9.7554605682e−41 | 4.0255034003e−42 | −2.7773437364e−40 |
| C168 | $x^2 y^{15}$ | −1.3327520563e−39 | −2.6303587217e−42 | −2.2741514003e−40 |
| C170 | $y^{17}$ | 3.1013408614e−39 | 1.1593642183e−41 | −1.0382269805e−40 |
| C171 | $x^{18}$ | −6.0549491816e−55 | 1.2769287730e−49 | 2.8050935096e−43 |
| C173 | $x^{16} y^2$ | −6.4388733863e−52 | 2.6348258796e−50 | 2.3670096589e−42 |
| C175 | $x^{14} y^4$ | −2.2559491999e−50 | 1.2478527944e−47 | 1.1808940965e−41 |
| C177 | $x^{12} y^6$ | −1.0586155072e−48 | −1.0684278379e−47 | 1.1559775439e−41 |
| C179 | $x^{10} y^8$ | −6.6358098091e−47 | 1.4015976604e−47 | 8.5438875348e−42 |
| C181 | $x^8 y^{10}$ | −2.6873632528e−45 | −1.5206483006e−46 | 4.2300134143e−42 |

TABLE 14-continued for projection optical unit 400 of FIG. 4A:
Free form coefficients of surfaces

| | | | | |
|---|---|---|---|---|
| C183 | $x^6 y^{12}$ | −6.4520861904e−44 | 1.0064641931e−45 | 9.6529658727e−43 |
| C185 | $x^4 y^{14}$ | −7.4232686951e−43 | −4.5512086095e−45 | 1.7865928108e−43 |
| C187 | $x^2 y^{16}$ | −5.6717504267e−42 | 4.0984120054e−45 | 1.7941238276e−43 |
| C189 | $y^{18}$ | 2.8018721209e−41 | −1.1626854779e−44 | 7.3214094903e−44 |

| Coefficient | Formula | M07 | M08 |
|---|---|---|---|
| C7 | $x^2 y$ | 5.8591450504e−07 | 6.2879666942e−09 |
| C9 | $y^3$ | 4.5919571917e−08 | 6.4928885423e−09 |
| C10 | $x^4$ | 3.0278887945e−10 | −2.8734281770e−12 |
| C12 | $x^2 y^2$ | 2.0192601662e−09 | −4.3110568837e−11 |
| C14 | $y^4$ | 4.2968825080e−09 | −1.6106818200e−11 |
| C16 | $x^4 y$ | 1.0166565410e−12 | −5.3467978515e−15 |
| C18 | $x^2 y^3$ | 6.6903130116e−12 | 4.4723393341e−15 |
| C20 | $y^5$ | −5.7693430208e−12 | 7.4075084342e−15 |
| C21 | $x^6$ | 1.1549252169e−16 | −3.4436357830e−18 |
| C23 | $x^4 y^2$ | 7.4131307107e−15 | −7.5631170879e−17 |
| C25 | $x^2 y^4$ | 1.9117910572e−14 | −9.2557541833e−17 |
| C27 | $y^6$ | 5.4648984188e−14 | −2.5313062887e−17 |
| C29 | $x^6 y$ | 3.9397452144e−18 | −1.1592200297e−20 |
| C31 | $x^4 y^3$ | 2.6328937160e−17 | −4.5478542013e−21 |
| C33 | $x^2 y^5$ | 5.1636896863e−17 | 1.5123239423e−20 |
| C35 | $y^7$ | −2.0310963665e−16 | 9.5012100765e−21 |
| C36 | $x^8$ | 1.8030046938e−21 | −3.9699292308e−24 |
| C38 | $x^6 y^2$ | 2.5061459131e−20 | −1.0402613623e−22 |
| C40 | $x^4 y^4$ | 1.9000433399e−19 | −2.1349820462e−22 |
| C42 | $x^2 y^6$ | 1.7947789498e−19 | −1.5351425534e−22 |
| C44 | $y^8$ | 1.2389426842e−18 | −3.5266942201e−23 |
| C46 | $x^8 y$ | −2.3071811289e−25 | −2.2416267429e−26 |
| C48 | $x^6 y^3$ | 1.9548830734e−22 | −2.6571944691e−26 |
| C50 | $x^4 y^5$ | 2.8100207761e−22 | −2.1107662863e−27 |
| C52 | $x^2 y^7$ | 1.5069274432e−21 | 1.5767740531e−26 |
| C54 | $y^9$ | 1.0958365245e−20 | −8.0678812181e−28 |
| C55 | $x^{10}$ | −9.8175603540e−27 | −4.5973070743e−29 |
| C57 | $x^8 y^2$ | −6.6086006917e−26 | −1.8092104893e−28 |
| C59 | $x^6 y^4$ | −2.2348322146e−24 | −5.4700475971e−28 |
| C61 | $x^4 y^6$ | −1.4759069386e−23 | −6.6438338438e−28 |
| C63 | $x^2 y^8$ | −2.6540756738e−24 | −3.5713190043e−28 |
| C65 | $y^{10}$ | −6.5278658257e−24 | −6.3593818199e−29 |
| C67 | $x^{10} y$ | 8.4168331196e−29 | 3.2941515726e−32 |
| C69 | $x^8 y^3$ | −1.7286122351e−27 | 7.9387144461e−33 |
| C71 | $x^6 y^5$ | −1.4552605266e−26 | 1.9531209160e−31 |
| C73 | $x^4 y^7$ | 8.5340131769e−26 | 2.1706816849e−31 |
| C75 | $x^2 y^9$ | −6.8117633536e−26 | 1.3994351444e−31 |
| C77 | $y^{11}$ | −3.2507739915e−24 | 1.2078665261e−31 |
| C78 | $x^{12}$ | 2.1293167785e−31 | 7.5260308471e−35 |
| C80 | $x^{10} y^2$ | 4.6368980127e−30 | 2.8192976246e−34 |
| C82 | $x^8 y^4$ | 7.6024915925e−29 | 1.1330392042e−33 |
| C84 | $x^6 y^6$ | 8.8457127676e−28 | 2.0989464381e−33 |
| C86 | $x^4 y^8$ | 4.1247639513e−27 | 1.8562198360e−33 |
| C88 | $x^2 y^{10}$ | 2.3757563727e−27 | 5.9691356170e−34 |
| C90 | $y^{12}$ | 1.1089271540e−26 | 4.5744656230e−35 |
| C92 | $x^{12} y$ | −1.2604194133e−33 | 3.1684120565e−39 |
| C94 | $x^{10} y^3$ | 5.1355957130e−32 | −2.9159696579e−37 |
| C96 | $x^8 y^5$ | 8.2393492464e−31 | −1.5508371008e−36 |
| C98 | $x^6 y^7$ | 1.3982933836e−30 | −1.9605953330e−36 |
| C100 | $x^4 y^9$ | −1.6219115973e−29 | −1.0416816736e−36 |
| C102 | $x^2 y^{11}$ | 3.9337972715e−29 | −3.7313911597e−37 |
| C104 | $y^{13}$ | 3.8969203040e−28 | −5.0880055559e−37 |
| C105 | $x^{14}$ | −3.0923202678e−36 | −3.6069628073e−40 |
| C107 | $x^{12} y^2$ | −7.0307384216e−35 | −3.3045202834e−39 |
| C109 | $x^{10} y^4$ | −1.0921920569e−33 | −1.3712397510e−38 |
| C111 | $x^8 y^6$ | −1.6322206821e−32 | −3.1331521401e−38 |
| C113 | $x^6 y^8$ | −1.5355218039e−31 | −4.0343661112e−38 |
| C115 | $x^4 y^{10}$ | −5.5099552525e−31 | −2.7046699845e−38 |
| C117 | $x^2 y^{12}$ | −3.9201412334e−31 | −7.7727790672e−39 |
| C119 | $y^{14}$ | −1.6186247279e−30 | −7.5873752781e−40 |
| C121 | $x^{14} y$ | 2.3592624001e−38 | −2.5976423847e−43 |
| C123 | $x^{12} y^3$ | −5.9757351513e−37 | 6.3110496223e−43 |
| C125 | $x^{10} y^5$ | −1.5793966354e−35 | 6.6950868037e−42 |
| C127 | $x^8 y^7$ | −8.1031033444e−35 | 1.1943555705e−41 |
| C129 | $x^6 y^9$ | 1.5242878696e−34 | 9.8383872705e−42 |
| C131 | $x^4 y^{11}$ | 1.4504685420e−33 | 4.0945090538e−42 |
| C133 | $x^2 y^{13}$ | −6.9250390502e−33 | 1.0912763666e−42 |
| C135 | $y^{15}$ | −3.0767389213e−32 | 1.5502629017e−42 |
| C136 | $x^{16}$ | 3.2009425124e−41 | 1.0799106135e−45 |
| C138 | $x^{14} y^2$ | 7.7609203072e−40 | 1.1587702096e−44 |

TABLE 14-continued for projection optical unit 400 of FIG. 4A:
Free form coefficients of surfaces

| | | | |
|---|---|---|---|
| C140 | $x^{12} y^4$ | 1.0547926042e−38 | 5.4288895239e−44 |
| C142 | $x^{10} y^6$ | 1.7117284509e−37 | 1.4944350369e−43 |
| C144 | $x^8 y^8$ | 2.3247824741e−36 | 2.5051834895e−43 |
| C146 | $x^6 y^{10}$ | 1.6583891722e−35 | 2.4631259253e−43 |
| C148 | $x^4 y^{12}$ | 4.5579699659e−35 | 1.3235487993e−43 |
| C150 | $x^2 y^{14}$ | 4.0309377092e−35 | 3.1286597406e−44 |
| C152 | $y^{16}$ | 1.4017713731e−34 | 2.6154787466e−45 |
| C154 | $x^{16} y$ | −2.1322017114e−43 | 4.4423168097e−49 |
| C156 | $x^{14} y^3$ | 4.3802377386e−42 | −1.1675627061e−48 |
| C158 | $x^{12} y^5$ | 1.7963885593e−40 | −1.7823882665e−47 |
| C160 | $x^{10} y^7$ | 1.4604963485e−39 | −4.3728662892e−47 |
| C162 | $x^8 y^9$ | 1.4855904233e−39 | −4.3650115366e−47 |
| C164 | $x^6 y^{11}$ | −2.5669508766e−38 | −2.0560188697e−47 |
| C166 | $x^4 y^{13}$ | −5.3146362249e−38 | −1.9519133867e−48 |
| C168 | $x^2 y^{15}$ | 5.5888272702e−37 | 1.7460467076e−48 |
| C170 | $y^{17}$ | 1.4308525784e−36 | −2.1142995515e−48 |
| C171 | $x^{18}$ | −2.0895154564e−46 | −2.3186639035e−51 |
| C173 | $x^{16} y^2$ | −5.4698631430e−45 | −2.8149892927e−50 |
| C175 | $x^{14} y^4$ | −5.4986476975e−44 | −1.5117151055e−49 |
| C177 | $x^{12} y^6$ | −8.0198336512e−43 | −4.7856613581e−49 |
| C179 | $x^{10} y^8$ | −1.7307390353e−41 | −9.6982155825e−49 |
| C181 | $x^8 y^{10}$ | −1.9805613309e−40 | −1.2438181640e−48 |
| C183 | $x^6 y^{12}$ | −1.0524507553e−39 | −9.8032783691e−49 |
| C185 | $x^4 y^{14}$ | −2.2943340563e−39 | −4.4276608240e−49 |
| C187 | $x^2 y^{16}$ | −2.5970624312e−39 | −9.2847726577e−50 |
| C189 | $y^{18}$ | −6.9069422647e−39 | −7.2445661309e−51 |
| C191 | $x^{18} y$ | 1.0394509825e−48 | −5.0430730055e−55 |
| C193 | $x^{16} y^3$ | −1.5409800965e−47 | 5.6286971050e−55 |
| C195 | $x^{14} y^5$ | −1.0494220255e−45 | 2.4848826121e−53 |
| C197 | $x^{12} y^7$ | −1.2490997499e−44 | 8.1634388312e−53 |
| C199 | $x^{10} y^9$ | −3.7707200126e−44 | 1.1147560465e−52 |
| C201 | $x^8 y^{11}$ | 1.6598876440e−43 | 6.6618136336e−53 |
| C203 | $x^6 y^{13}$ | 1.2757418511e−42 | 6.7694998903e−54 |
| C205 | $x^4 y^{15}$ | 2.0573595298e−43 | −1.7599605070e−53 |
| C207 | $x^2 y^{17}$ | −2.1853498739e−41 | −1.0941714729e−53 |
| C209 | $y^{19}$ | −3.5169008901e−41 | 5.6179001778e−55 |
| C210 | $x^{20}$ | 7.8471602375e−52 | 2.6936340216e−57 |
| C212 | $x^{18} y^2$ | 2.3362586035e−50 | 3.7085309618e−56 |
| C214 | $x^{16} y^4$ | 1.4776050341e−49 | 2.2376679050e−55 |
| C216 | $x^{14} y^6$ | 5.9602463710e−50 | 7.9831432866e−55 |
| C218 | $x^{12} y^8$ | 4.7355798579e−47 | 1.8795286333e−54 |
| C220 | $x^{10} y^{10}$ | 1.0639407840e−45 | 2.9528626694e−54 |
| C222 | $x^8 y^{12}$ | 9.0867560848e−45 | 3.0494331341e−54 |
| C224 | $x^6 y^{14}$ | 3.6195308132e−44 | 2.0078799656e−54 |
| C226 | $x^4 y^{16}$ | 6.7188688213e−44 | 7.8434370610e−55 |
| C228 | $x^2 y^{18}$ | 9.6719304247e−44 | 1.4756858954e−55 |
| C230 | $y^{20}$ | 1.7971593619e−43 | 1.0388955136e−56 |
| C232 | $x^{20} y$ | −2.0590142635e−54 | 2.1222781504e−61 |
| C234 | $x^{18} y^3$ | 2.2772383448e−53 | −7.3512550517e−61 |
| C236 | $x^{16} y^5$ | 2.5547168047e−51 | −1.7905602422e−59 |
| C238 | $x^{14} y^7$ | 4.1784264203e−50 | −6.7940598131e−59 |
| C240 | $x^{12} y^9$ | 2.2651281241e−49 | −1.1438670506e−58 |
| C242 | $x^{10} y^{11}$ | −1.7281537318e−49 | −9.1321121036e−59 |
| C244 | $x^8 y^{13}$ | −6.1917057952e−48 | −1.1798516165e−59 |
| C246 | $x^6 y^{15}$ | −2.1096821938e−47 | 3.9720900576e−59 |
| C248 | $x^4 y^{17}$ | 2.0766851928e−47 | 3.8838255906e−59 |
| C250 | $x^2 y^{19}$ | 3.3743329001e−46 | 1.6267270291e−59 |
| C252 | $y^{21}$ | 3.2201734386e−46 | 1.5043212354e−60 |
| C253 | $x^{22}$ | −1.2848945662e−57 | −1.5048535995e−63 |
| C255 | $x^{20} y^2$ | −4.3804338774e−56 | −2.3438373946e−62 |
| C257 | $x^{18} y^4$ | −1.0956227257e−55 | −1.5738453319e−61 |
| C259 | $x^{16} y^6$ | 9.1567525089e−54 | −6.2705704939e−61 |
| C261 | $x^{14} y^8$ | 4.6866683148e−53 | −1.6688456532e−60 |
| C263 | $x^{12} y^{10}$ | −1.7190809823e−51 | −3.0649305046e−60 |
| C265 | $x^{10} y^{12}$ | −2.6806942562e−50 | −3.8818410032e−60 |
| C267 | $x^8 y^{14}$ | −1.6741473721e−49 | −3.3483242387e−60 |
| C269 | $x^6 y^{16}$ | −5.2364624394e−49 | −1.9026855291e−60 |
| C271 | $x^4 y^{18}$ | −9.0258252309e−49 | −6.6441940854e−61 |
| C273 | $x^2 y^{20}$ | −1.5656504955e−48 | −1.1764046265e−61 |
| C275 | $y^{22}$ | −1.7575245240e−48 | −8.0461244359e−63 |

TABLE 15 for projection optical unit 400 of FIG. 4A:
Coordinates of stop edge

| $x_i$ [mm] | $y_i$ [mm] | $x_{i+N/2}$ [mm] | $y_{i+N/2}$ [mm] |
|---|---|---|---|
| −375.785573 | −120.600951 | 348.818901 | 71.162052 |
| −371.790511 | −127.592311 | 338.331862 | 82.647857 |
| −363.800386 | −140.076881 | 326.846057 | 93.634279 |
| −349.817667 | −158.554046 | 311.864572 | 106.618232 |
| −335.335565 | −174.534296 | 304.373830 | 112.610826 |
| −327.844822 | −182.025038 | 287.394814 | 125.095397 |
| −314.361486 | −194.509609 | 274.410860 | 133.584905 |
| −302.376298 | −204.497265 | 259.928759 | 142.573796 |
| −286.396048 | −216.482453 | 237.456532 | 155.058366 |
| −271.414564 | −226.969492 | 227.468875 | 160.052194 |
| −251.938633 | −238.954680 | 203.498500 | 171.038616 |
| −227.468875 | −252.438016 | 179.528124 | 180.526890 |
| −212.986773 | −259.429376 | 165.545405 | 185.520718 |
| −194.010226 | −267.918884 | 151.562686 | 190.015164 |
| −160.551577 | −280.403454 | 134.084288 | 195.008992 |
| −130.588608 | −289.392345 | 116.605889 | 199.503437 |
| −98.628107 | −296.883087 | 95.631810 | 203.997883 |
| −68.665138 | −301.876916 | 71.661435 | 207.992945 |
| −46.692294 | −304.373830 | 50.687356 | 210.489859 |
| −17.728090 | −306.371361 | 25.218832 | 212.487391 |
| 17.228707 | −306.371361 | 8.739199 | 212.986773 |
| 34.707106 | −305.372595 | −10.736731 | 212.986773 |
| 57.678716 | −303.375064 | −24.220067 | 212.487391 |
| 79.152177 | −300.378767 | −45.693528 | 210.989242 |
| 96.131193 | −297.382470 | −68.165755 | 208.492328 |
| 112.610826 | −293.886790 | −98.128724 | 203.498500 |
| 132.586139 | −288.892962 | −120.600951 | 198.504672 |
| 163.547874 | −279.404689 | −143.073178 | 192.512078 |
| 187.518250 | −270.415798 | −154.558983 | 189.016398 |
| 206.494797 | −262.425673 | −183.523187 | 179.028742 |
| 236.957149 | −247.444188 | −211.488625 | 167.542937 |
| 259.429376 | −234.460235 | −225.471344 | 161.050960 |
| 277.407157 | −222.974430 | −243.948508 | 151.562686 |
| 287.894197 | −215.483688 | −259.928759 | 142.573796 |
| 297.382470 | −208.492328 | −276.907775 | 132.086756 |
| 311.365189 | −197.006523 | −290.890494 | 122.598483 |
| 318.356549 | −191.013929 | −304.373830 | 112.610826 |
| 336.334330 | −173.535530 | −314.361486 | 104.620701 |
| 345.822604 | −163.048491 | −327.345440 | 93.134896 |
| 355.810260 | −151.063304 | −345.323221 | 75.157115 |
| 362.801620 | −141.575030 | −356.809026 | 61.673778 |
| 371.291128 | −128.591077 | −363.800386 | 52.185505 |
| 382.776933 | −106.618232 | −369.293597 | 44.195380 |
| 387.770761 | −93.634279 | −376.284956 | 32.709575 |
| 390.767058 | −84.645388 | −382.776933 | 19.725621 |
| 394.762120 | −67.666372 | −388.769527 | 4.744137 |
| 396.260269 | −55.681185 | −392.265206 | −7.241051 |
| 396.759652 | −48.190442 | −394.762120 | −18.726856 |
| 396.759652 | −37.703403 | −396.260269 | −30.212661 |
| 395.760886 | −24.719450 | −396.759652 | −37.204020 |
| 393.763355 | −13.233645 | −396.759652 | −48.190442 |
| 390.767058 | −1.747840 | −396.260269 | −56.180567 |
| 388.270144 | 6.242285 | −394.262738 | −69.663904 |
| 383.276316 | 18.726856 | −391.765824 | −81.149709 |
| 376.784339 | 31.710809 | −386.771995 | −96.630576 |
| 370.292362 | 42.697231 | −383.775698 | −104.121318 |
| 358.307174 | 59.676247 | | |

Design Data for FIG. 5A

TABLE 16 for projection optical unit 500 of FIG. 5A:

| | |
|---|---|
| Numerical Aperture | 0.75 |
| Magnification in x-direction | 0.250 |
| Magnification in y-direction | 0.125 |
| Chief Ray angle | 5.50° |
| Wavelength | 13.5 nm |
| Image field size in x-direction | 26.0 mm |
| Image field size in y-direction | 1.0 mm |
| Average Wavefront-RMS | 9.30 mλ |

TABLE 17 for projection optical unit 500 of FIG. 5A:
Radii of surfaces

| | Radius$_x$ [mm] | Power$_x$ [1/mm] | Radius$_y$ [mm] | Power$_y$ [1/mm] |
|---|---|---|---|---|
| M01 | −3773.45945611 | 0.00052356 | −1984.50851403 | 0.00099553 |
| M02 | 2494.73642034 | −0.00013910 | 35075.30462390 | −0.00000989 |
| M03 | 31768.81673263 | −0.00002335 | −3837.72785145 | 0.00019327 |
| M04 | −2972.94472808 | 0.00066709 | −2239.56644945 | 0.00088553 |
| M05 | −14022.61923403 | 0.00003802 | −12378.61280352 | 0.00004307 |
| M06 | 27111.27722735 | −0.00000676 | 70046.07947562 | −0.00000262 |
| M07 | 8037.79742245 | −0.00021854 | 563.24653474 | −0.00311873 |
| M08 | −1022.18217130 | 0.00193229 | −854.42823841 | 0.00231167 |

TABLE 18 for projection optical unit 500 of FIG. 5A:
Decentring (location, angle) of surfaces

| | $D_x$ [mm] | $D_y$ [mm] | $D_z$ [mm] |
|---|---|---|---|
| Reticle | 0.000000000 | 0.000000000 | 0.000000000 |
| M01 | 0.000000000 | −206.637809028 | 2146.015698531 |
| M02 | 0.000000000 | −473.982097337 | 797.484943900 |
| M03 | 0.000000000 | −1113.229211002 | 208.980263943 |
| M04 | 0.000000000 | −2712.118667808 | −47.291695627 |
| M05 | 0.000000000 | −1960.784168915 | 356.299086230 |
| M06 | 0.000000000 | −1600.021134398 | 761.528950886 |
| M07 | 0.000000000 | −1102.426170878 | 2266.628412283 |
| Stop | 0.000000000 | −1118.939719509 | 2216.679086078 |
| M08 | 0.000000000 | −1316.056862636 | 1620.449365718 |
| Wafer | 0.000000000 | −1316.032908671 | 2398.486124526 |

| | $\alpha_x$ [°] | $\alpha_y$ [°] | $\alpha_z$ [°] |
|---|---|---|---|
| Reticle | 0.000000000 | 0.000000000 | 0.000000000 |
| M01 | −2.856704943 | 0.000000000 | 0.000000000 |
| M02 | 60.709964014 | 180.000000000 | 0.000000000 |
| M03 | 205.869662456 | 0.000000000 | 0.000000000 |
| M04 | −71.325433118 | 180.000000000 | 0.000000000 |
| M05 | 218.282754271 | 0.000000000 | 0.000000000 |
| M06 | 60.014082153 | 180.000000000 | 0.000000000 |
| M07 | −18.294197471 | −0.000000000 | −0.000000000 |
| Stop | 2.082883661 | 180.000000000 | −0.000000000 |
| M08 | −9.147980738 | 180.000000000 | −0.000000000 |
| Wafer | −0.001764005 | −0.000000000 | 0.000000000 |

TABLE 19 for projection optical unit 500 of FIG. 5A:
Free form coefficients of surfaces

| Coefficient | Formula | M01 | M02 | M03 |
|---|---|---|---|---|
| C7 | $x^2 y$ | 2.0862621761e−08 | 4.4526531713e−08 | −1.2038553821e−07 |
| C9 | $y^3$ | 1.5914713957e−08 | −2.7134909466e−07 | 4.4948931547e−08 |
| C10 | $x^4$ | 1.2040965275e−11 | 9.8115077253e−12 | −7.2077179325e−11 |

TABLE 19-continued for projection optical unit 500 of FIG. 5A:
Free form coefficients of surfaces

| | | | | |
|---|---|---|---|---|
| C12 | $x^2 y^2$ | 5.4471285484e−12 | −2.2705164881e−10 | 7.2075077254e−11 |
| C14 | $y^4$ | −3.9916150166e−11 | 3.4054603272e−10 | −5.4058145886e−12 |
| C16 | $x^4 y$ | 1.6394253286e−14 | 9.8587175192e−14 | 5.7308487103e−14 |
| C18 | $x^2 y^3$ | 4.4127514733e−14 | 1.7311390006e−13 | −2.2343813008e−14 |
| C20 | $y^5$ | −4.4104138494e−14 | −7.6801152903e−13 | −2.5515831759e−14 |
| C21 | $x^6$ | 8.5725785905e−18 | 6.8753147996e−17 | −5.2448887688e−18 |
| C23 | $x^4 y^2$ | 1.1561605616e−17 | −5.5538306738e−17 | −1.0331514900e−17 |
| C25 | $x^2 y^4$ | 5.7630795069e−17 | −9.2009769174e−16 | −2.7294156057e−17 |
| C27 | $y^6$ | −2.0207927957e−16 | 3.6212807229e−15 | 3.1215571985e−17 |
| C29 | $x^6 y$ | −2.5190575063e−22 | 4.6902430039e−20 | 3.2657743246e−20 |
| C31 | $x^4 y^3$ | −1.0702224878e−20 | −2.0470077650e−19 | −1.3821383004e−20 |
| C33 | $x^2 y^5$ | 1.1664351205e−19 | 2.2084238387e−18 | 3.7462924279e−20 |
| C35 | $y^7$ | 3.0654350872e−20 | −2.1484607595e−17 | 2.7144717854e−19 |
| C36 | $x^8$ | −3.1545823931e−24 | −1.9444168169e−22 | 3.8017403512e−23 |
| C38 | $x^6 y^2$ | 9.4532254394e−24 | −1.0160625945e−22 | −4.4494011784e−23 |
| C40 | $x^4 y^4$ | −5.1062776320e−23 | −1.9712199912e−21 | −2.4019580655e−24 |
| C42 | $x^2 y^6$ | −2.0943886193e−22 | −3.4645513771e−21 | 1.4573968008e−21 |
| C44 | $y^8$ | 4.8742872183e−21 | 1.4071531857e−20 | 1.5784150896e−21 |
| C46 | $x^8 y$ | 1.3661177774e−26 | 1.8826276011e−24 | −1.2936090802e−25 |
| C48 | $x^6 y^3$ | 3.9437316397e−25 | 6.3176556016e−25 | 1.7244972146e−26 |
| C50 | $x^4 y^5$ | 1.4148539006e−24 | −9.7098782081e−24 | 1.5540753408e−24 |
| C52 | $x^2 y^7$ | −4.8878345496e−24 | −8.3462914158e−23 | −4.8889183525e−24 |
| C54 | $y^9$ | −3.9673238822e−23 | 1.1996621514e−21 | −1.6329087779e−23 |
| C55 | $x^{10}$ | −3.1473545094e−30 | 2.6952280173e−27 | −1.3419066199e−28 |
| C57 | $x^8 y^2$ | −2.0774541887e−28 | 3.7971456267e−27 | 3.5648464872e−28 |
| C59 | $x^6 y^4$ | −6.0097407920e−28 | 2.2069674054e−26 | 2.6796431169e−27 |
| C61 | $x^4 y^6$ | 1.5762364294e−27 | 1.5590726827e−25 | −1.6382791546e−26 |
| C63 | $x^2 y^8$ | −7.2178530611e−27 | 4.9411624087e−25 | −6.7522670861e−26 |
| C65 | $y^{10}$ | −5.0556959782e−25 | −8.7606475938e−24 | −4.6113949464e−26 |
| C67 | $x^{10} y$ | −1.1087499135e−31 | −9.8585942186e−30 | 7.4114382563e−31 |
| C69 | $x^8 y^3$ | −4.0097718351e−30 | 2.5010651659e−30 | 1.0718095343e−30 |
| C71 | $x^6 y^5$ | −3.7206035283e−29 | 1.6224079355e−28 | −1.5339965647e−29 |
| C73 | $x^4 y^7$ | −4.2503796056e−29 | 1.5664288247e−27 | −1.7033370522e−30 |
| C75 | $x^2 y^9$ | 2.6154693834e−28 | 9.0941142140e−27 | 2.7624728920e−28 |
| C77 | $y^{11}$ | 9.6815038555e−28 | 4.8455051194e−27 | 4.4811271212e−28 |
| C78 | $x^{12}$ | 1.4915052368e−34 | −1.2248492309e−32 | −3.1580648371e−34 |
| C80 | $x^{10} y^2$ | 3.0888317919e−33 | −6.5360848831e−32 | −1.9208824586e−33 |
| C82 | $x^8 y^4$ | 2.5120700028e−32 | −3.9354735285e−31 | −3.4064722380e−32 |
| C84 | $x^6 y^6$ | 8.0801596950e−32 | −2.0988724331e−30 | −2.3679531354e−32 |
| C86 | $x^4 y^8$ | 3.2126723556e−31 | −1.1026009122e−29 | 8.3677317131e−31 |
| C88 | $x^2 y^{10}$ | 4.3471488184e−31 | −8.8107191232e−29 | 2.1082560461e−30 |
| C90 | $y^{12}$ | 1.8155414578e−29 | 1.8988516408e−28 | 1.1896012241e−30 |
| C92 | $x^{12} y$ | 6.3230330769e−37 | 1.0260784530e−34 | −3.3451756978e−36 |
| C94 | $x^{10} y^3$ | 2.2758981848e−35 | 1.4551204461e−34 | −1.0608646184e−35 |
| C96 | $x^8 y^5$ | 3.2350162697e−34 | −2.0111818244e−33 | −8.9923512506e−35 |
| C98 | $x^6 y^7$ | 1.4679398762e−33 | −1.3728766456e−32 | 5.3131364114e−34 |
| C100 | $x^4 y^9$ | 5.8773515569e−34 | −8.9252509799e−32 | −1.4496732657e−33 |
| C102 | $x^2 y^{11}$ | −8.7981147593e−33 | −2.9466362793e−32 | −7.3492934464e−33 |
| C104 | $y^{13}$ | −1.2594286105e−32 | −5.8669520062e−31 | −7.9728511719e−33 |
| C105 | $x^{14}$ | −8.4393719325e−40 | 5.14322764346e−38 | 2.7577535721e−39 |
| C107 | $x^{12} y^2$ | −2.1012297674e−38 | 7.9130876077e−37 | 2.6635252673e−39 |
| C109 | $x^{10} y^4$ | −2.2258898555e−37 | 3.0239359920e−36 | 1.2378864306e−37 |
| C111 | $x^8 y^6$ | −1.6138803853e−36 | 3.5625413524e−35 | 1.1439391533e−36 |
| C113 | $x^6 y^8$ | −4.4319953959e−36 | 2.7796110466e−35 | −2.6221026624e−36 |
| C115 | $x^4 y^{10}$ | −1.7798653484e−35 | 4.0212493418e−34 | −2.1955523186e−35 |
| C117 | $x^2 y^{12}$ | 1.1755036540e−35 | 3.1140221116e−33 | −4.2878640113e−35 |
| C119 | $y^{14}$ | −3.9394095438e−34 | −1.0445824873e−33 | −2.0108606353e−35 |
| C121 | $x^{14} y$ | −1.8325637868e−42 | −5.1345854251e−40 | 1.4930507429e−41 |
| C123 | $x^{12} y^3$ | −6.6021076786e−41 | −1.9409054822e−39 | 1.1833651617e−41 |
| C125 | $x^{10} y^5$ | −1.2665653569e−39 | 1.2230055397e−38 | 1.4254920245e−39 |
| C127 | $x^8 y^7$ | −1.0562096264e−38 | 1.1106955742e−37 | 1.0366362278e−39 |
| C129 | $x^6 y^9$ | −2.1800821761e−38 | 1.1825964005e−36 | −5.7350822900e−39 |
| C131 | $x^4 y^{11}$ | −3.0083682668e−38 | 3.6343467698e−36 | 4.1594092134e−38 |
| C133 | $x^2 y^{13}$ | 2.6679576157e−37 | −1.0844785714e−35 | 9.2500788698e−38 |
| C135 | $y^{15}$ | −3.6893304794e−37 | 2.7897788810e−36 | 8.1803842153e−38 |
| C136 | $x^{16}$ | 2.1235877506e−45 | −5.9327943069e−44 | −8.7059993069e−45 |
| C138 | $x^{14} y^2$ | 7.5089809248e−44 | −4.8872380727e−42 | 3.0817681521e−44 |
| C140 | $x^{12} y^4$ | 9.2009847810e−43 | −1.2249845606e−41 | −2.7573941337e−43 |
| C142 | $x^{10} y^6$ | 8.9378216898e−42 | −1.9555626216e−40 | −7.5458944996e−43 |
| C144 | $x^8 y^8$ | 4.6785101393e−41 | −1.2702337594e−39 | −1.5282184127e−41 |
| C146 | $x^6 y^{10}$ | 1.2441213154e−40 | −9.4411562258e−41 | 9.7266023088e−41 |
| C148 | $x^4 y^{12}$ | 2.6472699337e−40 | −1.9048468274e−38 | 2.5058398851e−40 |
| C150 | $x^2 y^{14}$ | −1.1661185788e−40 | −1.1052343743e−38 | 5.5105647972e−40 |
| C152 | $y^{16}$ | 3.0888744323e−39 | 3.2819721433e−38 | 1.7714535510e−40 |
| C154 | $x^{16} y$ | 2.0176683761e−48 | 1.4237382341e−45 | −2.9208968457e−47 |
| C156 | $x^{14} y^3$ | 6.1753209884e−47 | 9.5809007223e−45 | 2.8688517393e−47 |
| C158 | $x^{12} y^5$ | 1.8530510377e−45 | −8.7789044366e−45 | −2.8771220197e−45 |

TABLE 19-continued for projection optical unit 500 of FIG. 5A:
Free form coefficients of surfaces

| | | | | |
|---|---|---|---|---|
| C160 | $x^{10} y^7$ | 1.9973088616e−44 | −2.5833852359e−43 | −2.5972979161e−44 |
| C162 | $x^8 y^9$ | 1.1650362682e−43 | −2.7427270126e−42 | 4.2591448733e−44 |
| C164 | $x^6 y^{11}$ | 2.3189367342e−44 | −4.3448950330e−41 | −1.4600669507e−43 |
| C166 | $x^4 y^{13}$ | 7.1419447490e−43 | 1.4103980483e−42 | −7.8081532922e−44 |
| C168 | $x^2 y^{15}$ | −3.1991998052e−42 | 1.2160183323e−40 | −6.8117673446e−43 |
| C170 | $y^{17}$ | 6.7812235106e−42 | −1.3702353078e−40 | −2.9261301404e−43 |
| C171 | $x^{18}$ | −2.1304574876e−51 | −3.3170003488e−51 | 1.0268381112e−50 |
| C173 | $x^{16} y^2$ | −1.0821879622e−49 | 1.4102048734e−47 | −1.5061400132e−49 |
| C175 | $x^{14} y^4$ | −1.4495215591e−48 | 4.0986046076e−47 | 1.2927552297e−48 |
| C177 | $x^{12} y^6$ | −1.6414429751e−47 | 3.4280309776e−46 | −2.0053260587e−47 |
| C179 | $x^{10} y^8$ | −1.2933785928e−46 | 4.24379546576e−45 | 4.0598795740e−47 |
| C181 | $x^8 y^{10}$ | −4.4877998432e−46 | 1.8859113439e−44 | −2.0066353095e−46 |
| C183 | $x^6 y^{12}$ | −1.5144207075e−45 | 1.1192211003e−43 | −2.6239718724e−46 |
| C185 | $x^4 y^{14}$ | 3.6601800504e−46 | 6.8816718627e−44 | −2.0414458643e−45 |
| C187 | $x^2 y^{16}$ | −3.2314081441e−45 | −1.7944290025e−43 | −2.3289001527e−45 |
| C189 | $y^{18}$ | 3.2192294445e−45 | 1.5488698589e−43 | −8.3916509789e−46 |

| Coefficient | Formula | M04 | M05 | M06 |
|---|---|---|---|---|
| C7 | $x^2 y$ | −1.0340736175e−08 | 6.1461742513e−08 | −2.2979275528e−08 |
| C9 | $y^3$ | 1.4564202765e−09 | 1.7832450701e−08 | 6.2489369329e−09 |
| C10 | $x^4$ | −4.8299747578e−14 | 1.2055544451e−11 | 6.7274370335e−11 |
| C12 | $x^2 y^2$ | 2.4045617257e−11 | −5.8439212621e−11 | 2.7734473430e−11 |
| C14 | $y^4$ | −3.8118447927e−10 | −6.1485451989e−12 | 1.4053021591e−11 |
| C16 | $x^4 y$ | −4.8222471792e−15 | −3.1692780882e−14 | 1.0677278315e−13 |
| C18 | $x^2 y^3$ | −5.9494841092e−14 | 6.6418891029e−14 | 4.8432396094e−14 |
| C20 | $y^5$ | −4.0168343984e−12 | 1.0975495706e−14 | −2.2366162070e−13 |
| C21 | $x^6$ | 5.9235278736e−20 | 5.3610259960e−18 | −1.3494968052e−16 |
| C23 | $x^4 y^2$ | −9.2501457734e−18 | 5.6512921178e−17 | 1.3884951937e−16 |
| C25 | $x^2 y^4$ | −5.0368199442e−16 | −1.0116344790e−16 | 3.9598742480e−16 |
| C27 | $y^6$ | −2.5360315488e−14 | −7.5189031221e−18 | 1.6354160026e−15 |
| C29 | $x^6 y$ | −2.0220529433e−21 | 1.8097438903e−20 | −7.6003375136e−19 |
| C31 | $x^4 y^3$ | −9.9737625129e−20 | −6.0458760794e−20 | −1.1928936900e−18 |
| C33 | $x^2 y^5$ | −5.0881465300e−18 | 1.9704604948e−19 | −1.5859642599e−17 |
| C35 | $y^7$ | −1.1533267980e−16 | 3.0049005823e−20 | 6.6697470698e−18 |
| C36 | $x^8$ | −5.9713125373e−25 | 8.3306999211e−23 | −1.8094616450e−22 |
| C38 | $x^6 y^2$ | −4.3423632472e−24 | −1.3304322532e−22 | 4.2647121626e−21 |
| C40 | $x^4 y^4$ | −2.0918985672e−22 | −3.1708769602e−23 | 7.5496306155e−20 |
| C42 | $x^2 y^6$ | −2.6889221960e−20 | −5.9190999506e−22 | −4.1843653058e−20 |
| C44 | $y^8$ | 1.6139746006e−18 | −6.4627354075e−22 | −8.8454223849e−20 |
| C46 | $x^8 y$ | 2.6610229438e−28 | −3.6277622770e−25 | 7.9455589168e−24 |
| C48 | $x^6 y^3$ | 1.5886967391e−26 | 3.3404501277e−25 | −1.6054666116e−22 |
| C50 | $x^4 y^5$ | −6.9118820885e−24 | −5.8905508801e−25 | 8.2287174501e−23 |
| C52 | $x^2 y^7$ | −6.0156072171e−22 | 3.8002813068e−24 | 1.8789843696e−21 |
| C54 | $y^9$ | −1.4674213084e−20 | 2.8024812565e−24 | −3.4758185655e−22 |
| C55 | $x^{10}$ | 1.4778033959e−30 | −1.1998060432e−27 | 7.8209274545e−26 |
| C57 | $x^8 y^2$ | −1.7617406454e−29 | 1.7080399262e−27 | −2.4211524989e−25 |
| C59 | $x^6 y^4$ | −3.3324498448e−27 | 2.7392877109e−27 | −1.4002351579e−24 |
| C61 | $x^4 y^6$ | −1.7765840460e−25 | −2.5425718407e−28 | −1.2756342771e−23 |
| C63 | $x^2 y^8$ | 2.1445083525e−24 | −1.1419149615e−27 | 1.3502872719e−24 |
| C65 | $y^{10}$ | −8.1290467347e−22 | 1.6500328423e−26 | 7.5274904136e−24 |
| C67 | $x^{10} y$ | −1.9068215286e−33 | 5.8191120082e−30 | −6.9567380630e−28 |
| C69 | $x^8 y^3$ | 2.4844761257e−31 | −1.3349761159e−29 | −1.5930983096e−26 |
| C71 | $x^6 y^5$ | −1.7963495973e−29 | 3.1771959670e−30 | 8.8050530656e−26 |
| C73 | $x^4 y^7$ | 4.6897188010e−27 | 3.2260746728e−29 | 4.3491214381e−27 |
| C75 | $x^2 y^9$ | 3.2439245228e−25 | −1.7821059830e−28 | −1.8868585012e−25 |
| C77 | $y^{11}$ | 3.3715580187e−24 | −1.1293465940e−29 | −1.1792506091e−26 |
| C78 | $x^{12}$ | −2.1288314555e−37 | 5.8265551878e−33 | −3.0788636458e−30 |
| C80 | $x^{10} y^2$ | 8.6617784442e−35 | −1.7150237282e−32 | 5.6785080422e−29 |
| C82 | $x^8 y^4$ | 1.2953523805e−32 | −1.4698465768e−33 | −2.2187332471e−28 |
| C84 | $x^6 y^6$ | 1.2487394046e−30 | −1.2121618825e−31 | 1.9578070334e−28 |
| C86 | $x^4 y^8$ | 8.8286182470e−29 | 9.3319514976e−32 | 1.3808736998e−27 |
| C88 | $x^2 y^{10}$ | 3.0055125508e−27 | −5.8181551042e−33 | 4.6654184309e−28 |
| C90 | $y^{12}$ | 2.4834055520e−25 | −8.0648398886e−31 | −2.9891406817e−28 |
| C92 | $x^{12} y$ | 7.5362752466e−39 | −3.2092216658e−35 | 2.6147308285e−32 |
| C94 | $x^{10} y^3$ | −1.7173427133e−36 | 1.7838957617e−34 | 2.4459640064e−30 |
| C96 | $x^8 y^5$ | 1.8549651015e−35 | 2.0541381647e−34 | −3.0433359000e−30 |
| C98 | $x^6 y^7$ | 6.2603193166e−33 | −2.1703231233e−34 | −1.1568769945e−29 |
| C100 | $x^4 y^9$ | −7.6137250748e−31 | −5.9424699182e−34 | −1.8449970893e−30 |
| C102 | $x^2 y^{11}$ | −3.2002943660e−29 | 7.9564560348e−33 | 9.8812238419e−30 |
| C104 | $y^{13}$ | 8.2090777235e−28 | 3.3344255315e−34 | 1.8002408143e−30 |
| C105 | $x^{14}$ | −2.6566237284e−42 | −1.5699792115e−38 | 4.6956714102e−35 |
| C107 | $x^{12} y^2$ | −3.0324452347e−40 | 2.8617723291e−38 | −3.8112969264e−33 |
| C109 | $x^{10} y^4$ | −4.1083977309e−38 | −6.9182652380e−37 | 5.1840527908e−33 |
| C111 | $x^8 y^6$ | −1.6360154891e−36 | 4.1327718620e−37 | 3.6458688204e−32 |
| C113 | $x^6 y^8$ | −2.4259455130e−34 | 2.7408114877e−36 | −9.4710233915e−33 |
| C115 | $x^4 y^{10}$ | −1.5193269387e−32 | −3.8304973803e−36 | −8.2270304096e−32 |

TABLE 19-continued for projection optical unit 500 of FIG. 5A:
Free form coefficients of surfaces

| | | | | |
|---|---|---|---|---|
| C117 | $x^2 y^{12}$ | −6.8870581187e−31 | −2.1731518563e−35 | −5.7594649773e−32 |
| C119 | $y^{14}$ | −3.1350829528e−29 | 1.8767131409e−35 | 4.8491178608e−34 |
| C121 | $x^{14} y$ | −2.0555276388e−44 | 1.1270248862e−40 | −3.8065102450e−37 |
| C123 | $x^{12} y^3$ | 3.0959830381e−42 | −5.8266743190e−40 | −9.6495026826e−35 |
| C125 | $x^{10} y^5$ | 3.1718646165e−40 | −1.5580962397e−40 | −7.4365938716e−35 |
| C127 | $x^8 y^7$ | −5.0659585290e−39 | −3.1562801108e−39 | 3.8693613893e−34 |
| C129 | $x^6 y^9$ | −9.5135759307e−37 | 1.1742339013e−39 | 5.9931685136e−34 |
| C131 | $x^4 y^{11}$ | 2.3396486795e−35 | 1.2354162710e−38 | 2.6140677164e−34 |
| C133 | $x^2 y^{13}$ | −2.1841189683e−33 | −1.0945371125e−37 | −1.1895776296e−34 |
| C135 | $y^{15}$ | −2.5833007126e−31 | −8.0431550676e−39 | −4.2273559456e−35 |
| C136 | $x^{16}$ | 4.5653349380e−48 | 1.8525143601e−44 | −4.6047268414e−41 |
| C138 | $x^{14} y^2$ | 6.7161698912e−46 | 6.7090528783e−44 | 1.0106255506e−37 |
| C140 | $x^{12} y^4$ | 8.6528962878e−44 | 4.4965876214e−42 | 3.4324508466e−37 |
| C142 | $x^{10} y^6$ | 5.8088183441e−42 | 6.8083663374e−42 | −1.1127847969e−36 |
| C144 | $x^8 y^8$ | 1.0099538102e−40 | −2.8918895961e−41 | −1.9598658825e−36 |
| C146 | $x^6 y^{10}$ | 2.4604134550e−38 | 5.9437662467e−41 | −3.2570112896e−37 |
| C148 | $x^4 y^{12}$ | 8.1459230441e−37 | −1.4059483196e−40 | 1.9412445840e−36 |
| C150 | $x^2 y^{14}$ | 3.8952760968e−35 | 9.4040228238e−40 | 1.9076632484e−36 |
| C152 | $y^{16}$ | 8.8850322097e−34 | −4.8273492807e−40 | 1.8332922475e−37 |
| C154 | $x^{16} y$ | 2.0483495867e−50 | −2.4857620868e−46 | 5.4416193526e−43 |
| C156 | $x^{14} y^3$ | −1.4239110306e−48 | −8.4781407214e−46 | 1.2418489639e−39 |
| C158 | $x^{12} y^5$ | −3.6140385391e−46 | −1.2798996179e−44 | 3.3666601871e−39 |
| C160 | $x^{10} y^7$ | −2.5551926258e−44 | −1.2528893193e−44 | −1.3480349311e−39 |
| C162 | $x^8 y^9$ | 1.8852259749e−43 | 1.8190938068e−43 | −8.6531455905e−39 |
| C164 | $x^6 y^{11}$ | 1.3282062940e−40 | −5.6944090126e−43 | −1.3114723128e−38 |
| C166 | $x^4 y^{13}$ | −2.2036058915e−41 | 1.1355298523e−42 | −1.1822136143e−38 |
| C168 | $x^2 y^{15}$ | 3.9438839148e−37 | −3.0767809363e−42 | −5.9731152057e−39 |
| C170 | $y^{17}$ | 1.6193103961e−35 | 1.9908090744e−42 | −3.4449002514e−40 |
| C171 | $x^{18}$ | −2.5930830634e−54 | 8.3767611202e−51 | −4.2891110413e−45 |
| C173 | $x^{16} y^2$ | −6.6424810963e−52 | 6.1164404632e−49 | −9.4627334757e−43 |
| C175 | $x^{14} y^4$ | −6.7206218612e−50 | −1.1273029117e−48 | −1.0095329440e−41 |
| C177 | $x^{12} y^6$ | −7.8638761767e−48 | 2.6240653984e−47 | −7.4397943283e−43 |
| C179 | $x^{10} y^8$ | −3.1606293512e−46 | −5.3418714579e−47 | 2.2378507132e−41 |
| C181 | $x^8 y^{10}$ | −3.6449161843e−45 | −1.0581568159e−46 | 3.4201095858e−41 |
| C183 | $x^6 y^{12}$ | −1.6848849722e−43 | 7.5676228217e−46 | 3.1900600321e−41 |
| C185 | $x^4 y^{14}$ | −1.4011901686e−41 | −1.8594866093e−45 | 1.7472566141e−41 |
| C187 | $x^2 y$ | 1.1123482957e−39 | 3.7451466412e−45 | 6.2954372669e−42 |
| C189 | $y^{18}$ | 4.7520258884e−38 | −2.5027110933e−45 | 2.5323299022e−43 |

| Coefficient | Formula | M07 | M08 |
|---|---|---|---|
| C7 | $x^2 y$ | 5.6885194695e−07 | −2.6032338827e−09 |
| C9 | $y^3$ | −5.3045284442e−07 | 1.7967303548e−08 |
| C10 | $x^4$ | 3.1572492372e−10 | −1.0853263628e−11 |
| C12 | $x^2 y^2$ | 1.1891894195e−09 | −5.7350371926e−11 |
| C14 | $y^4$ | 1.9242714778e−09 | −1.2382079862e−11 |
| C16 | $x^4 y$ | 8.2337947850e−13 | −1.6568636147e−14 |
| C18 | $x^2 y^3$ | 2.6096925596e−12 | 3.6180394218e−15 |
| C20 | $y^5$ | −6.2497084633e−12 | 2.0115422054e−14 |
| C21 | $x^6$ | 3.7606136031e−16 | −2.2564167591e−17 |
| C23 | $x^4 y^2$ | 4.2020867235e−15 | −1.0090003444e−16 |
| C25 | $x^2 y^4$ | 1.7320506635e−15 | −1.0742153983e−16 |
| C27 | $y^6$ | 2.7198591970e−14 | −2.3600663856e−17 |
| C29 | $x^6 y$ | 2.3909402939e−18 | −1.4543501577e−20 |
| C31 | $x^4 y^3$ | 8.5356687225e−18 | −1.8788394391e−20 |
| C33 | $x^2 y^5$ | 2.4012249847e−17 | 2.3739576170e−20 |
| C35 | $y^7$ | −1.2853465750e−16 | 2.5262547690e−20 |
| C36 | $x^8$ | 1.0564617190e−21 | −2.5533973988e−23 |
| C38 | $x^6 y^2$ | 1.2298668556e−20 | −1.4551399703e−22 |
| C40 | $x^4 y^4$ | 4.6130810708e−20 | −2.5461757210e−22 |
| C42 | $x^2 y^6$ | −4.9969668210e−20 | −1.7417593690e−22 |
| C44 | $y^8$ | 5.8608431243e−20 | −2.4277765791e−23 |
| C46 | $x^8 y$ | 6.7819067514e−24 | −2.8608047726e−26 |
| C48 | $x^6 y^3$ | 4.2200344142e−23 | −4.7066653677e−26 |
| C50 | $x^4 y^5$ | −2.6587289175e−23 | 9.0127012549e−28 |
| C52 | $x^2 y^7$ | −1.7038498767e−22 | 5.0142663052e−26 |
| C54 | $y^9$ | 6.3859357141e−21 | 1.0491743548e−26 |
| C55 | $x^{10}$ | 1.8366650806e−27 | −4.0387050684e−29 |
| C57 | $x^8 y^2$ | 4.3925865487e−26 | −2.4802384999e−28 |
| C59 | $x^6 y^4$ | 1.7032620490e−25 | −7.1143501657e−28 |
| C61 | $x^4 y^6$ | 3.3967306775e−25 | −8.4926123882e−28 |
| C63 | $x^2 y^8$ | 1.4595165705e−25 | −4.1368835927e−28 |
| C65 | $y^{10}$ | 1.8876331218e−23 | −1.3017913322e−28 |
| C67 | $x^{10} y$ | 3.0650439074e−31 | 4.0461095305e−32 |
| C69 | $x^8 y^3$ | 1.4438586711e−28 | 1.0178711624e−32 |
| C71 | $x^6 y^5$ | 2.9672152106e−27 | −5.4838176811e−32 |
| C73 | $x^4 y^7$ | 2.1146627271e−26 | −4.8775545325e−32 |

TABLE 19-continued for projection optical unit 500 of FIG. 5A:
Free form coefficients of surfaces

| | | | |
|---|---|---|---|
| C75 | $x^2 y^9$ | 2.6822138046e−26 | 6.0406376870e−33 |
| C77 | $y^{11}$ | −7.3677504306e−25 | 8.5305470943e−32 |
| C78 | $x^{12}$ | −5.2741446894e−33 | 2.1991958235e−35 |
| C80 | $x^{10} y^2$ | 4.3027958224e−32 | 2.0130726290e−34 |
| C82 | $x^8 y^4$ | 8.5133943223e−31 | 1.5580235926e−33 |
| C84 | $x^6 y^6$ | 5.6295898281e−31 | 3.3571029379e−33 |
| C86 | $x^4 y^8$ | 1.3332205474e−29 | 2.9651905665e−33 |
| C88 | $x^2 y^{10}$ | −1.7129729092e−27 | 8.9685300131e−34 |
| C90 | $y^{12}$ | 1.1130815224e−27 | 3.2993334471e−34 |
| C92 | $x^{12} y$ | 4.9673908983e−34 | −3.2103607359e−37 |
| C94 | $x^{10} y^3$ | 6.4956092755e−33 | −1.0029902628e−36 |
| C96 | $x^8 y^5$ | −1.8400789599e−32 | −1.1410950653e−36 |
| C98 | $x^6 y^7$ | −3.3375751871e−31 | 5.6352689956e−37 |
| C100 | $x^4 y^9$ | −2.4387105227e−30 | 1.4839886827e−36 |
| C102 | $x^2 y^{11}$ | 3.1121030442e−30 | 1.1417700815e−36 |
| C104 | $y^{13}$ | 3.6596456192e−29 | 1.4364846567e−37 |
| C105 | $x^{14}$ | 1.8798457813e−37 | −2.3403572809e−40 |
| C107 | $x^{12} y^2$ | 3.5510225875e−36 | −2.8319402014e−39 |
| C109 | $x^{10} y^4$ | 2.0761548716e−35 | −1.6607663249e−38 |
| C111 | $x^8 y^6$ | 1.2715375844e−34 | −4.2855856990e−38 |
| C113 | $x^6 y^8$ | 5.0790267914e−34 | −5.5129905220e−38 |
| C115 | $x^4 y^{10}$ | 3.8570291884e−33 | −3.5852190320e−38 |
| C117 | $x^2 y^{12}$ | 9.7224476991e−32 | −1.0065799940e−38 |
| C119 | $y^{14}$ | −1.4704261445e−31 | −1.6248064258e−39 |
| C121 | $x^{14} y$ | −5.5835679642e−39 | 9.9036616242e−43 |
| C123 | $x^{12} y^3$ | −1.1758824220e−37 | 4.4824196464e−42 |
| C125 | $x^{10} y^5$ | −2.8529678560e−37 | 8.3595187208e−42 |
| C127 | $x^8 y^7$ | 5.0441627057e−36 | 2.2072469229e−42 |
| C129 | $x^6 y^9$ | 2.7177538479e−35 | −9.5383391203e−42 |
| C131 | $x^4 y^{11}$ | 1.5227062881e−34 | −1.0491272927e−41 |
| C133 | $x^2 y^{13}$ | −4.4632613620e−34 | −5.7569812843e−42 |
| C135 | $y^{15}$ | −8.8821628531e−34 | −1.3572452083e−42 |
| C136 | $x^{16}$ | −1.6345142206e−42 | 5.4844234244e−46 |
| C138 | $x^{14} y^2$ | −4.6036381779e−41 | 8.6852862505e−45 |
| C140 | $x^{12} y^4$ | −4.5915532794e−40 | 6.0701764444e−44 |
| C142 | $x^{10} y^6$ | −1.6682132695e−39 | 1.9703987179e−43 |
| C144 | $x^8 y^8$ | −1.6337921453e−38 | 3.4203614057e−43 |
| C146 | $x^6 y^{10}$ | −3.5281658687e−38 | 3.2696702313e−43 |
| C148 | $x^4 y^{12}$ | −4.9734008785e−37 | 1.6839854713e−43 |
| C150 | $x^2 y^{14}$ | −2.3327839149e−36 | 4.0490246540e−44 |
| C152 | $y^{16}$ | 6.6730746923e−36 | 4.3581655755e−45 |
| C154 | $x^{16} y$ | 4.6758705533e−44 | −2.2269473443e−48 |
| C156 | $x^{14} y^3$ | 1.3120410116e−42 | −1.4008031239e−47 |
| C158 | $x^{12} y^5$ | 9.1388106395e−42 | −3.7372791137e−47 |
| C160 | $x^{10} y^7$ | −1.6475569488e−41 | −3.6253482673e−47 |
| C162 | $x^8 y^9$ | −3.4027520925e−40 | 1.4378738943e−47 |
| C164 | $x^6 y^{11}$ | −1.2144442461e−39 | 5.9693880730e−47 |
| C166 | $x^4 y^{13}$ | −4.8142003087e−39 | 5.0244675231e−47 |
| C168 | $x^2 y^{15}$ | 2.0924490431e−38 | 2.2613909308e−47 |
| C170 | $y^{17}$ | −9.0673262626e−40 | 5.2547475960e−48 |
| C171 | $x^{18}$ | 1.0935651918e−47 | −1.2789411747e−51 |
| C173 | $x^{16} y^2$ | 4.6577282993e−46 | −2.1547792660e−50 |
| C175 | $x^{14} y^4$ | 6.8830229834e−45 | −1.6006316860e−49 |
| C177 | $x^{12} y^6$ | 3.7537872018e−44 | −6.0050672082e−49 |
| C179 | $x^{10} y^8$ | 1.1409352073e−43 | −1.2860171790e−48 |
| C181 | $x^8 y^{10}$ | 1.1046252568e−42 | −1.6474208538e−48 |
| C183 | $x^6 y^{12}$ | 1.4248842192e−42 | −1.2490210050e−48 |
| C185 | $x^4 y^{14}$ | 2.6058140132e−41 | −5.3683973453e−49 |
| C187 | $x^2 y^{16}$ | −1.5312731044e−41 | −1.1741398224e−49 |
| C189 | $y^{18}$ | −9.8680216528e−41 | −1.0455455507e−50 |
| C191 | $x^{18} y$ | −2.0219293224e−49 | 2.7338046251e−54 |
| C193 | $x^{16} y^3$ | −7.0207882571e−48 | 2.1780801775e−53 |
| C195 | $x^{14} y^5$ | −7.3539154988e−47 | 7.4738195206e−53 |
| C197 | $x^{12} y^7$ | −1.8117254970e−46 | 1.1470357667e−52 |
| C199 | $x^{10} y^9$ | 1.6467663541e−45 | 4.5131168773e−53 |
| C201 | $x^8 y^{11}$ | 9.4445347087e−45 | −1.0431040557e−52 |
| C203 | $x^6 y^{13}$ | 3.4834666945e−44 | −1.7317400566e−52 |
| C205 | $x^4 y^{15}$ | 3.8080772395e−44 | −1.1816630025e−52 |
| C207 | $x^2 y^{17}$ | −3.0103230600e−43 | −4.5384891892e−53 |
| C209 | $y^{19}$ | 2.7310006242e−43 | −9.0844232110e−54 |
| C210 | $x^{20}$ | −4.1070528863e−53 | 1.6074347592e−57 |
| C212 | $x^{18} y^2$ | −2.3527876230e−51 | 2.8555277581e−56 |
| C214 | $x^{16} y^4$ | −4.5239324159e−50 | 2.2666189493e−55 |
| C216 | $x^{14} y^6$ | −3.5682858864e−49 | 9.6074034102e−55 |
| C218 | $x^{12} y^8$ | −1.0967266190e−48 | 2.4332626799e−54 |
| C220 | $x^{10} y^{10}$ | −4.1867080606e−48 | 3.8784664605e−54 |
| C222 | $x^8 y^{12}$ | −3.1094343232e−47 | 3.9488159196e−54 |

TABLE 19-continued for projection optical unit 500 of FIG. 5A:
Free form coefficients of surfaces

| | | | |
|---|---|---|---|
| C224 | $x^6 y^{14}$ | −5.6386546669e−47 | 2.4850098135e−54 |
| C226 | $x^4 y^{16}$ | −4.7854236015e−46 | 9.1593629654e−55 |
| C228 | $x^2 y^{18}$ | 1.1408004666e−45 | 1.8156323411e−55 |
| C230 | $y^{20}$ | −4.2844296228e−47 | 1.4794818365e−56 |
| C232 | $x^{20} y$ | 4.1249372141e−55 | −1.6589564286e−60 |
| C234 | $x^{18} y^3$ | 1.6554405153e−53 | −1.5968123830e−59 |
| C236 | $x^{16} y^5$ | 2.2253811097e−52 | −6.7607917385e−59 |
| C238 | $x^{14} y^7$ | 1.1667484720e−51 | −1.4231160934e−58 |
| C240 | $x^{12} y^9$ | −2.8457969308e−52 | −1.3903998508e−58 |
| C242 | $x^{10} y^{11}$ | −3.0558023660e−50 | 7.2307176144e−60 |
| C244 | $x^8 y^{13}$ | −8.8050100099e−50 | 1.8005183183e−58 |
| C246 | $x^6 y^{15}$ | −5.1355664704e−49 | 2.1462012981e−58 |
| C248 | $x^4 y^{17}$ | 8.4042896579e−49 | 1.2889176973e−58 |
| C250 | $x^2 y^{19}$ | −1.4116882150e−48 | 4.4414404818e−59 |
| C252 | $y^{21}$ | −6.7094714642e−49 | 7.4738978858e−60 |
| C253 | $x^{22}$ | 7.3989403985e−59 | −1.0911210563e−63 |
| C255 | $x^{20} y^2$ | 5.4860130425e−57 | −1.9646788131e−62 |
| C257 | $x^{18} y^4$ | 1.2642775431e−55 | −1.5928429571e−61 |
| C259 | $x^{16} y^6$ | 1.2817302100e−54 | −7.2873811166e−61 |
| C261 | $x^{14} y^8$ | 5.8299523698e−54 | −2.0867620199e−60 |
| C263 | $x^{12} y^{10}$ | 1.2728240403e−53 | −3.9213888107e−60 |
| C265 | $x^{10} y^{12}$ | 6.9696875487e−53 | −4.9609392228e−60 |
| C267 | $x^8 y^{14}$ | 2.8722921852e−52 | −4.1999838719e−60 |
| C269 | $x^6 y^{16}$ | 1.3665033976e−51 | −2.2814914530e−60 |
| C271 | $x^4 y^{18}$ | −4.0070337954e−53 | −7.5025193792e−61 |
| C273 | $x^2 y^{20}$ | 3.0591555199e−52 | −1.3794023687e−61 |
| C275 | $y^{22}$ | 5.9452620674e−52 | −1.0815145836e−62 |

TABLE 20 for projection optical unit 500 of FIG. 5A:
Coordinates of stop edge

| $x_i$ [mm] | $y_i$ [mm] | $x_{i+N/2}$ [mm] | $y_{i+N/2}$ [mm] |
|---|---|---|---|
| −406.462054 | −45.859836 | 406.714375 | −58.643623 |
| −405.899996 | −39.438857 | 406.404447 | −64.998727 |
| −405.048244 | −33.003645 | 405.804439 | −71.324209 |
| −403.908062 | −26.558073 | 404.915414 | −77.616285 |
| −402.481168 | −20.106014 | 403.738880 | −83.871220 |
| −400.769737 | −13.651331 | 402.276789 | −90.085330 |
| −398.776384 | −7.197874 | 400.531518 | −96.254998 |
| −396.504154 | −0.749477 | 398.505858 | −102.376679 |
| −393.956508 | 5.690047 | 396.202994 | −108.446908 |
| −391.137306 | 12.116909 | 393.626491 | −114.462312 |
| −388.050789 | 18.527344 | 390.780270 | −120.419609 |
| −384.701558 | 24.917610 | 387.668588 | −126.315617 |
| −381.094555 | 31.283989 | 384.296016 | −132.147253 |
| −377.235041 | 37.622782 | 380.667412 | −137.911537 |
| −373.128572 | 43.930303 | 376.787898 | −143.605588 |
| −368.780974 | 50.202879 | 372.662836 | −149.226629 |
| −364.198320 | 56.436838 | 368.297798 | −154.771979 |
| −359.386902 | 62.628507 | 363.698542 | −160.239052 |
| −354.353204 | 68.774208 | 358.870985 | −165.625356 |
| −349.103876 | 74.870254 | 353.821177 | −170.928486 |
| −343.645708 | 80.912944 | 348.555278 | −176.146121 |
| −337.985597 | 86.898561 | 343.079528 | −181.276021 |
| −332.130524 | 92.823371 | 337.400231 | −186.316021 |
| −326.087528 | 98.683618 | 331.523726 | −191.264024 |
| −319.863677 | 104.475519 | 325.456371 | −196.118000 |
| −313.466047 | 110.195264 | 319.204523 | −200.875981 |
| −306.901696 | 115.839003 | 312.774519 | −205.536051 |
| −300.177647 | 121.402844 | 306.172660 | −210.096349 |
| −293.300867 | 126.882848 | 299.405202 | −214.555060 |
| −286.278247 | 132.275019 | 292.478336 | −218.910413 |
| −279.116587 | 137.575308 | 285.398182 | −223.160680 |
| −271.822581 | 142.779611 | 278.170779 | −227.304171 |
| −264.402802 | 147.883774 | 270.802077 | −231.339233 |
| −256.863688 | 152.883601 | 263.297929 | −235.264249 |
| −249.211530 | 157.774870 | 255.664089 | −239.077638 |
| −241.452463 | 162.553341 | 247.906205 | −242.777851 |
| −233.592454 | 167.214780 | 240.029817 | −246.363377 |
| −225.637294 | 171.754968 | 232.040355 | −249.832737 |
| −217.592590 | 176.169720 | 223.943139 | −253.184488 |
| −209.463761 | 180.454894 | 215.743379 | −256.417222 |
| −201.256035 | 184.606401 | 207.446171 | −259.529567 |
| −192.974440 | 188.620207 | 199.056506 | −262.520190 |
| −184.623811 | 192.492332 | 190.579263 | −265.387794 |
| −176.208784 | 196.218848 | 182.019219 | −268.131123 |
| −167.733799 | 199.795872 | 173.381046 | −270.748961 |
| −159.203103 | 203.219562 | 164.669318 | −273.240135 |
| −150.620751 | 206.486109 | 155.888510 | −275.603514 |
| −141.990616 | 209.591737 | 147.043007 | −277.838014 |
| −133.316390 | 212.532703 | 138.137103 | −279.942597 |
| −124.601594 | 215.305304 | 129.175007 | −281.916274 |
| −115.849588 | 217.905889 | 120.160848 | −283.758109 |
| −107.063581 | 220.330878 | 111.098680 | −285.467216 |
| −98.246644 | 222.576780 | 101.992483 | −287.042764 |
| −89.401721 | 224.640226 | 92.846172 | −288.483983 |
| −80.531646 | 226.517992 | 83.663597 | −289.790156 |
| −71.639158 | 228.207037 | 74.448554 | −290.960632 |
| −62.726913 | 229.704535 | 65.204786 | −291.994821 |
| −53.797499 | 231.007902 | 55.935987 | −292.892196 |
| −44.853451 | 232.114832 | 46.645811 | −293.652300 |
| −35.897261 | 233.023324 | 37.337878 | −294.274742 |
| −26.931391 | 233.731704 | 28.015775 | −294.759199 |
| −17.958277 | 234.238650 | 18.683066 | −295.105420 |
| −8.980343 | 234.543203 | 9.343297 | −295.313225 |
| 0.000000 | 234.644786 | 0.000000 | −295.382505 |
| 8.980343 | 234.543203 | −9.343297 | −295.313225 |
| 17.958277 | 234.238650 | −18.683066 | −295.105420 |
| 26.931391 | 233.731704 | −28.015775 | −294.759199 |
| 35.897261 | 233.023324 | −37.337878 | −294.274742 |
| 44.853451 | 232.114832 | −46.645811 | −293.652300 |
| 53.797499 | 231.007902 | −55.935987 | −292.892196 |
| 62.726913 | 229.704535 | −65.204786 | −291.994821 |
| 71.639158 | 228.207037 | −74.448554 | −290.960632 |
| 80.531646 | 226.517992 | −83.663597 | −289.790156 |
| 89.401721 | 224.640226 | −92.846172 | −288.483983 |
| 98.246644 | 222.576780 | −101.992483 | −287.042764 |
| 107.063581 | 220.330878 | −111.098680 | −285.467216 |
| 115.849588 | 217.905889 | −120.160848 | −283.758109 |
| 124.601594 | 215.305304 | −129.175007 | −281.916274 |

TABLE 20-continued for projection optical unit 500 of FIG. 5A:
Coordinates of stop edge

| $x_i$ [mm] | $y_i$ [mm] | $x_{i+N/2}$ [mm] | $y_{i+N/2}$ [mm] |
|---|---|---|---|
| 133.316390 | 212.532703 | −138.137103 | −279.942597 |
| 141.990616 | 209.591737 | −147.043007 | −277.838014 |
| 150.620751 | 206.486109 | −155.888510 | −275.603514 |
| 159.203103 | 203.219562 | −164.669318 | −273.240135 |
| 167.733799 | 199.795872 | −173.381046 | −270.748961 |
| 176.208784 | 196.218848 | −182.019219 | −268.131123 |
| 184.623811 | 192.492332 | −190.579263 | −265.387794 |
| 192.974440 | 188.620207 | −199.056506 | −262.520190 |
| 201.256035 | 184.606401 | −207.446171 | −259.529567 |
| 209.463761 | 180.454894 | −215.743379 | −256.417222 |
| 217.592590 | 176.169720 | −223.943139 | −253.184488 |
| 225.637294 | 171.754968 | −232.040355 | −249.832737 |
| 233.592454 | 167.214780 | −240.029817 | −246.363377 |
| 241.452463 | 162.553341 | −247.906205 | −242.777851 |
| 249.211530 | 157.774870 | −255.664089 | −239.077638 |
| 256.863688 | 152.883601 | −263.297929 | −235.264249 |
| 264.402802 | 147.883774 | −270.802077 | −231.339233 |
| 271.822581 | 142.779611 | −278.170779 | −227.304171 |
| 279.116587 | 137.575308 | −285.398182 | −223.160680 |
| 286.278247 | 132.275019 | −292.478336 | −218.910413 |
| 293.300867 | 126.882848 | −299.405202 | −214.555060 |
| 300.177647 | 121.402844 | −306.172660 | −210.096349 |
| 306.901696 | 115.839003 | −312.774519 | −205.536051 |
| 313.466047 | 110.195264 | −319.204523 | −200.875981 |
| 319.863677 | 104.475519 | −325.456371 | −196.118000 |
| 326.087528 | 98.683618 | −331.523726 | −191.264024 |
| 332.130524 | 92.823371 | −337.400231 | −186.316021 |
| 337.985597 | 86.898561 | −343.079528 | −181.276021 |
| 343.645708 | 80.912944 | −348.555278 | −176.146121 |
| 349.103876 | 74.870254 | −353.821177 | −170.928486 |
| 354.353204 | 68.774208 | −358.870985 | −165.625356 |
| 359.386902 | 62.628507 | −363.698542 | −160.239052 |
| 364.198320 | 56.436838 | −368.297798 | −154.771979 |
| 368.780974 | 50.202879 | −372.662836 | −149.226629 |
| 373.128572 | 43.930303 | −376.787898 | −143.605588 |
| 377.235041 | 37.622782 | −380.667412 | −137.911537 |
| 381.094555 | 31.283989 | −384.296016 | −132.147253 |
| 384.701558 | 24.917610 | −387.668588 | −126.315617 |
| 388.050789 | 18.527344 | −390.780270 | −120.419609 |
| 391.137306 | 12.116909 | −393.626491 | −114.462312 |
| 393.956508 | 5.690047 | −396.202994 | −108.446908 |
| 396.504154 | −0.749477 | −398.505858 | −102.376679 |
| 398.776384 | −7.197874 | −400.531518 | −96.254998 |
| 400.769737 | −13.651331 | −402.276789 | −90.085330 |
| 402.481168 | −20.106014 | −403.738880 | −83.871220 |
| 403.908062 | −26.558073 | −404.915414 | −77.616285 |
| 405.048244 | −33.003645 | −405.804439 | −71.324209 |
| 405.899996 | −39.438857 | −406.404447 | −64.998727 |
| 406.462054 | −45.859836 | −406.714375 | −58.643623 |
| 406.733624 | −52.262711 | −406.733624 | −52.262711 |

Design Data for FIG. 6A

TABLE 21 for projection optical unit 600 of FIG. 6A:

| Numerical Aperture | 0.75 |
|---|---|
| Magnification in x-direction | 0.250 |
| Magnification in y-direction | 0.125 |

TABLE 21-continued for projection optical unit 600 of FIG. 6A:

| Chief Ray angle | 5.50° |
|---|---|
| Wavelength | 13.5 nm |
| Image field size in x-direction | 26.0 mm |
| Image field size in y-direction | 1.0 mm |
| Average Wavefront-RMS | 6.44 mλ |

TABLE 22 for projection optical unit 600 of FIG. 6A:
Radii of surfaces

| | $Radius_x$ [mm] | $Power_x$ [1/mm] | $Radius_y$ [mm] | $Power_y$ [1/mm] |
|---|---|---|---|---|
| M01 | −3486.28243986 | 0.00056059 | −1766.40692175 | 0.00110642 |
| M02 | 2369.93311258 | −0.00007260 | 4906.80225378 | −0.00003507 |
| M03 | 4389.12570925 | −0.00013087 | −3614.17172875 | 0.00015893 |
| M04 | −16782.42570130 | 0.00002821 | −6988.74667041 | 0.00006774 |
| M05 | −1952.45480809 | 0.00016281 | 53943.63267445 | −0.00000589 |
| M06 | −1254.94617921 | 0.00046323 | 12859.59130175 | −0.00004521 |
| M07 | −3857.10189695 | 0.00009200 | −12121.45037338 | 0.00002927 |
| M08 | 3011.82967387 | −0.00059603 | 419.64055323 | −0.00427778 |
| M09 | −959.84488570 | 0.00206727 | −859.26405830 | 0.00230925 |

TABLE 23 for projection optical unit 600 of FIG. 6A:
Decentring (location, angle) of surfaces

| | $D_x$ [mm] | $D_y$ [mm] | $D_z$ [mm] |
|---|---|---|---|
| Reticle | 0.000000000 | 0.000000000 | 0.000000000 |
| M01 | 0.000000000 | −345.245562113 | 1913.482180940 |
| M02 | 0.000000000 | −548.901396172 | 760.290710030 |
| M03 | −0.000000000 | −899.095821506 | 350.889638881 |
| M04 | 0.000000000 | −2237.449387764 | −329.143585485 |
| M05 | 0.000000000 | −3622.246165313 | −373.468283476 |
| M06 | 0.000000000 | −4132.231979780 | −64.977368863 |
| M07 | 0.000000000 | −4660.239714259 | 632.885856819 |
| M08 | 0.000000000 | −5011.764212328 | 2410.053273405 |
| Stop | 0.000000000 | −4991.422468685 | 2307.213544746 |
| M09 | 0.000000000 | −4874.060362072 | 1713.877623750 |
| Wafer | 0.000000000 | −4814.035425435 | 2507.483578368 |

| | $\alpha_x$ [°] | $\alpha_y$ [°] | $\alpha_z$ [°] |
|---|---|---|---|
| Reticle | 0.000000000 | 0.000000000 | 0.000000000 |
| M01 | 0.106220844 | 0.000000000 | 0.000000000 |
| M02 | 244.720814462 | 0.000000000 | −0.000000000 |
| M03 | 218.196283414 | −0.000000000 | −0.000000000 |
| M04 | 194.384481474 | −0.000000000 | −0.000000000 |
| M05 | 165.331759027 | −0.000000000 | −0.000000000 |
| M06 | 137.970797777 | −0.000000000 | −0.000000000 |
| M07 | 114.150041508 | −0.000000000 | −0.000000000 |
| M08 | 11.188703040 | 0.000000000 | −0.000000000 |
| Stop | 172.109020591 | −0.000000000 | −0.000000000 |
| M09 | 183.431666309 | −0.000000000 | −0.000000000 |
| Wafer | −4.325370423 | 0.000000000 | 180.000000000 |

TABLE 24 for projection optical unit 600 of FIG. 6A:
Free form coefficients of surfaces

| Coefficient | Formula | M01 | M02 | M03 |
|---|---|---|---|---|
| C2 | y | 2.4183195098e−03 | −2.6134959608e−02 | 6.4323763267e−03 |
| C7 | $x^2 y$ | 2.5309837790e−08 | −2.8600701612e−08 | −2.1182530091e−07 |
| C9 | $y^3$ | −8.6682753157e−08 | −1.8180749743e−09 | 1.3136293930e−08 |
| C10 | $x^4$ | 4.6764314472e−12 | 7.7762519316e−11 | 5.1264392056e−12 |

TABLE 24-continued for projection optical unit 600 of FIG. 6A:
Free form coefficients of surfaces

| | | | | |
|---|---|---|---|---|
| C12 | $x^2 y^2$ | 1.3674742125e−10 | −2.1050960978e−11 | 1.2130069053e−10 |
| C14 | $y^4$ | 2.5547947289e−10 | −9.7787642390e−10 | 1.1501852017e−11 |
| C16 | $x^4 y$ | −1.8821786926e−14 | 2.2203349884e−13 | 5.8403900821e−14 |
| C18 | $x^2 y^3$ | −2.8937633590e−13 | 5.0097482198e−13 | −3.0081746329e−15 |
| C20 | $y^5$ | −1.6337256541e−12 | −4.5222731772e−12 | 2.2913769739e−14 |
| C21 | $x^6$ | 4.6006625315e−18 | −4.2390177775e−17 | −2.0175026598e−16 |
| C23 | $x^4 y^2$ | 5.0400651154e−17 | 1.1768414977e−15 | −1.8818786273e−17 |
| C25 | $x^2 y^4$ | 1.8068377419e−16 | −2.3312386073e−15 | 1.1006226432e−16 |
| C27 | $y^6$ | 9.1925099653e−15 | −8.8441729582e−15 | −4.0373510404e−16 |
| C29 | $x^6 y$ | −9.9691078937e−21 | 5.0379612318e−19 | 3.2924840953e−19 |
| C31 | $x^4 y^3$ | 4.5325211023e−19 | 1.3111819581e−17 | 5.0392582534e−20 |
| C33 | $x^2 y^5$ | 8.0166138803e−19 | −8.2289294180e−17 | −3.1056995445e−18 |
| C35 | $y^7$ | −3.7452262094e−17 | 1.1646244229e−17 | −7.2863516967e−19 |
| C36 | $x^8$ | −6.1545363263e−24 | 7.2026470105e−22 | 1.6171281423e−21 |
| C38 | $x^6 y^2$ | 3.3002430812e−22 | 5.7140558572e−21 | 1.8788996873e−22 |
| C40 | $x^4 y^4$ | 4.1222433024e−21 | 1.9259194213e−19 | −3.0274484120e−21 |
| C42 | $x^2 y^6$ | 1.2156298564e−20 | −7.6134979435e−19 | 3.1291091908e−20 |
| C44 | $y^8$ | 9.0374219894e−20 | 1.0536976895e−19 | 9.4000357214e−20 |
| C46 | $x^8 y$ | −2.7773625350e−26 | −9.3954405466e−25 | −2.0192667103e−24 |
| C48 | $x^6 y^3$ | −1.1146607416e−23 | −3.7028485380e−24 | −3.0459881911e−24 |
| C50 | $x^4 y^5$ | −9.6596403438e−23 | 1.9788449526e−21 | 8.2320296311e−23 |
| C52 | $x^2 y^7$ | −1.6511725874e−22 | −3.7136084466e−21 | −1.1670374595e−22 |
| C54 | $y^9$ | 3.7733566425e−23 | 1.7181200123e−22 | −1.4279933000e−21 |
| C55 | $x^{10}$ | 2.0219211610e−28 | 5.7410791808e−28 | −1.6175476519e−26 |
| C57 | $x^8 y^2$ | −2.9118226489e−27 | −5.0115519425e−26 | −8.7409540432e−27 |
| C59 | $x^6 y^4$ | 7.6618358586e−26 | −7.4621080786e−26 | −1.1261623515e−26 |
| C61 | $x^4 y^6$ | 5.9734337633e−25 | 1.2771559399e−23 | −1.3869559945e−24 |
| C63 | $x^2 y^8$ | 1.4666169111e−25 | −9.4966020317e−24 | −1.6510318783e−24 |
| C65 | $y^{10}$ | −9.5184017793e−25 | −1.5151055209e−25 | 1.1233098883e−23 |
| C67 | $x^{10} y$ | −1.5565945765e−30 | 2.6228618507e−29 | 2.9421127201e−29 |
| C69 | $x^8 y^3$ | 2.4607272284e−28 | 5.7761504003e−28 | 8.1576558681e−29 |
| C71 | $x^6 y^5$ | 5.1220193744e−28 | −7.8258857987e−27 | −4.0079674532e−28 |
| C73 | $x^4 y^7$ | −3.9907667505e−28 | 4.7881440639e−26 | 1.1123285985e−26 |
| C75 | $x^2 y^9$ | 6.0418820574e−27 | −7.0832530992e−27 | 2.6419453610e−26 |
| C77 | $y^{11}$ | 5.3435940014e−28 | −3.4276423005e−28 | −4.8713357492e−26 |
| C78 | $x^{12}$ | −4.1731325239e−33 | −7.8578016911e−32 | 1.0192813630e−31 |
| C80 | $x^{10} y^2$ | −1.1968533115e−31 | 1.4739797894e−30 | 1.0615054211e−31 |
| C82 | $x^8 y^4$ | −3.8375741786e−30 | 1.2218849731e−29 | 4.3572394230e−31 |
| C84 | $x^6 y^6$ | −8.7956399131e−30 | −4.1996775292e−29 | 1.8599128026e−29 |
| C86 | $x^4 y^8$ | −1.2566190787e−29 | 7.8082054550e−29 | −2.2702095755e−29 |
| C88 | $x^2 y^{10}$ | −2.6135660560e−29 | 2.0674353015e−29 | −1.5127580209e−28 |
| C90 | $y^{12}$ | 1.0009167315e−29 | 1.9495854854e−30 | 8.2832654423e−29 |
| C92 | $x^{12} y$ | 1.4748125598e−34 | 2.9673787601e−34 | −2.3343461353e−34 |
| C94 | $x^{10} y^3$ | −2.8152971069e−34 | 1.2141778481e−33 | −1.2677605893e−33 |
| C96 | $x^8 y^5$ | 2.1504732797e−32 | 5.2314442501e−32 | −9.7778181031e−33 |
| C98 | $x^6 y^7$ | 3.5538638666e−32 | −1.1268517403e−31 | −2.0500477099e−31 |
| C100 | $x^4 y^9$ | 6.4762013785e−32 | −9.2426736866e−32 | −2.8422025534e−31 |
| C102 | $x^2 y^{11}$ | −3.1243398406e−32 | 2.8014138555e−32 | 2.0051020835e−31 |
| C104 | $y^{13}$ | −1.6512245839e−32 | 5.0500991246e−33 | 2.1718088248e−31 |
| C105 | $x^{14}$ | 3.2299701155e−38 | 7.6951687191e−37 | −3.4284451583e−37 |
| C107 | $x^{12} y^2$ | 1.1229100989e−36 | −1.5416205244e−35 | −9.1385940743e−37 |
| C109 | $x^{10} y^4$ | 3.2293335120e−35 | −1.1768343656e−34 | 5.0869378379e−38 |
| C111 | $x^8 y^6$ | −1.4166257016e−35 | −2.8884626638e−37 | −5.0780424301e−35 |
| C113 | $x^6 y^8$ | −6.6541185791e−36 | 4.2849541553e−35 | 8.5951752323e−34 |
| C115 | $x^4 y^{10}$ | −1.3186527705e−34 | −5.8594613778e−34 | 2.2844589052e−33 |
| C117 | $x^2 y^{12}$ | 3.4069621812e−34 | −7.5201196996e−35 | 2.3055060362e−33 |
| C119 | $y^{14}$ | −9.1708274369e−36 | 4.0613523471e−37 | −1.2429210373e−33 |
| C121 | $x^{14} y$ | −2.6131362528e−39 | −8.8292058414e−39 | 9.4724893718e−40 |
| C123 | $x^{12} y^3$ | −2.2997210975e−38 | −8.5566569571e−38 | 1.0990720042e−38 |
| C125 | $x^{10} y^5$ | −3.0249604440e−37 | −4.5901038310e−37 | 1.3064585517e−37 |
| C127 | $x^8 y^7$ | −2.6049885156e−37 | −5.4383064506e−37 | 1.4731071088e−36 |
| C129 | $x^6 y^9$ | −1.6289950032e−37 | 1.3747026880e−36 | 1.9114363871e−37 |
| C131 | $x^4 y^{11}$ | 4.8453044574e−38 | −5.3330495189e−37 | −4.1049184727e−36 |
| C133 | $x^2 y^{13}$ | 7.8098077770e−38 | −8.6258379941e−38 | −1.3781627395e−35 |
| C135 | $y^{15}$ | −1.4697678852e−37 | −3.6539390220e−39 | 7.8793580514e−37 |
| C136 | $x^{16}$ | 5.2505777146e−44 | −5.4517589035e−42 | 5.2020588752e−43 |
| C138 | $x^{14} y^2$ | 9.1606577927e−42 | 5.8209590823e−41 | 4.9439841483e−42 |
| C140 | $x^{12} y^4$ | 7.0364706966e−41 | 7.1838319277e−40 | −4.6554302089e−41 |
| C142 | $x^{10} y^6$ | 1.1029624651e−39 | 8.4332789034e−40 | −7.6551470601e−40 |
| C144 | $x^8 y^8$ | 4.2494163347e−40 | −1.6870132885e−39 | −8.4836098339e−39 |
| C146 | $x^6 y^{10}$ | −4.9158441024e−40 | 4.2581365418e−39 | −1.4975739451e−38 |
| C148 | $x^4 y^{12}$ | 3.1321120985e−40 | 1.0360808145e−39 | −3.0978625328e−38 |
| C150 | $x^2 y^{14}$ | −3.0478318580e−39 | 3.1621476465e−40 | 2.2629682524e−38 |
| C152 | $y^{16}$ | 4.1516298749e−40 | 1.1539305513e−41 | 4.6986094499e−39 |
| C154 | $x^{16} y$ | 2.0716101459e−44 | 5.8766825045e−44 | −2.0723418245e−45 |
| C156 | $x^{14} y^3$ | 7.9379161170e−44 | 9.2931927769e−43 | −4.9583406255e−44 |
| C158 | $x^{12} y^5$ | −4.9170266405e−44 | 4.7440707881e−42 | −4.0551198101e−43 |

TABLE 24-continued for projection optical unit 600 of FIG. 6A:
Free form coefficients of surfaces

| | | | | |
|---|---|---|---|---|
| C160 | $x^{10} y^7$ | −1.2987668742e−42 | 7.4089885981e−42 | −2.2510650248e−42 |
| C162 | $x^8 y^9$ | 1.8662031876e−42 | −3.1797626614e−42 | 1.2524543154e−41 |
| C164 | $x^6 y^{11}$ | 1.3002495697e−42 | 5.0465922358e−42 | 5.6702178944e−41 |
| C166 | $x^4 y^{13}$ | 2.6713235972e−43 | 1.0482152481e−42 | 2.2898300255e−40 |
| C168 | $x^2 y^{15}$ | 2.2227149433e−42 | 2.4316705562e−43 | 6.2089407291e−41 |
| C170 | $y^{17}$ | 6.0853774874e−43 | −7.6381192577e−45 | 6.9509541438e−42 |
| C171 | $x^{18}$ | −2.6184684291e−48 | 3.5269309765e−47 | −7.8752317584e−49 |
| C173 | $x^{16} y^2$ | −1.3270550454e−46 | 2.2267602223e−46 | −1.4785742151e−47 |
| C175 | $x^{14} y^4$ | −3.0542087164e−46 | 7.1201170040e−46 | 3.0739671944e−46 |
| C177 | $x^{12} y^6$ | 2.0606121511e−45 | 6.6686401445e−45 | 4.9610661752e−45 |
| C179 | $x^{10} y^8$ | −1.8998859446e−45 | 1.3191111634e−44 | 3.4971234319e−44 |
| C181 | $x^8 y^{10}$ | 3.6776724472e−46 | −5.7185103377e−45 | 4.8436721551e−44 |
| C183 | $x^6 y^{12}$ | 1.3399006602e−44 | −3.7699884622e−46 | −9.4633303884e−44 |
| C185 | $x^4 y^{14}$ | −3.7649082662e−45 | −4.6410687150e−45 | −6.8020045079e−43 |
| C187 | $x^2 y^{16}$ | 4.1812489028e−45 | −1.5289165199e−45 | −3.4694281130e−43 |
| C189 | $y^{18}$ | 3.8358756447e−46 | −1.1969611704e−46 | −9.6158998321e−44 |
| C191 | $x^{18} y$ | −8.9868564379e−50 | −2.0305279390e−50 | 6.2272466983e−51 |
| C193 | $x^{16} y^3$ | −1.5720533890e−49 | −1.7130481241e−48 | 9.5063790172e−50 |
| C195 | $x^{14} y^5$ | 1.1621439734e−48 | −6.7599541866e−48 | −5.3942991047e−49 |
| C197 | $x^{12} y^7$ | −1.2518594220e−47 | −3.4978744476e−48 | −1.8009708516e−47 |
| C199 | $x^{10} y^9$ | 1.6269105542e−47 | 4.3774661557e−48 | −1.2283787668e−46 |
| C201 | $x^8 y^{11}$ | −2.6004435457e−47 | −8.2291192159e−48 | −1.9703664383e−46 |
| C203 | $x^6 y^{13}$ | −4.5132685407e−47 | −5.1636892700e−48 | 6.6001828067e−47 |
| C205 | $x^4 y^{15}$ | −1.8877396471e−47 | −9.5969812671e−48 | 9.6487685142e−46 |
| C207 | $x^2 y^{17}$ | 2.6040496474e−47 | −3.0640273275e−48 | 5.8531443769e−46 |
| C209 | $y^{19}$ | −7.0142766614e−48 | −1.8870472875e−49 | 2.2578414341e−46 |
| C210 | $x^{20}$ | 1.9604124261e−53 | −9.3020315707e−53 | 2.3004655367e−54 |
| C212 | $x^{18} y^2$ | 8.8457668107e−52 | −9.4122855490e−52 | 1.6676380903e−53 |
| C214 | $x^{16} y^4$ | 1.6268593625e−51 | −3.6406402942e−51 | −5.5223453057e−52 |
| C216 | $x^{14} y^6$ | −2.0041028217e−50 | −8.1721258964e−51 | −2.1332404315e−51 |
| C218 | $x^{12} y^8$ | 1.6755522269e−50 | −7.2583889604e−51 | 2.4138319322e−50 |
| C220 | $x^{10} y^{10}$ | −1.0223776315e−49 | −9.4309997192e−51 | 1.6685855410e−49 |
| C222 | $x^8 y^{12}$ | −1.2842996984e−50 | −6.3786985417e−51 | 2.0361550455e−49 |
| C224 | $x^6 y^{14}$ | −1.4305051390e−50 | −1.1564178959e−51 | 1.9281515924e−50 |
| C226 | $x^4 y^{16}$ | 1.4977851564e−49 | −5.4804891471e−51 | −4.0840988235e−49 |
| C228 | $x^2 y^{18}$ | −1.9839916205e−50 | −1.9150290473e−51 | −2.9995209573e−49 |
| C230 | $y^{20}$ | −9.3483225501e−51 | −9.6935598469e−53 | −1.9242992754e−49 |
| C232 | $x^{20} y$ | 1.2221771704e−55 | −3.9713265527e−55 | −1.6464755979e−56 |
| C234 | $x^{18} y^3$ | −1.6619941079e−54 | −3.9646848046e−55 | −1.1354695099e−56 |
| C236 | $x^{16} y^5$ | −3.2665127213e−54 | 1.7711686720e−54 | 1.3076722998e−54 |
| C238 | $x^{14} y^7$ | 7.4739467823e−53 | 5.0697253680e−54 | 5.8082880207e−54 |
| C240 | $x^{12} y^9$ | 1.7532289680e−53 | 3.1072415756e−54 | −5.0994385118e−54 |
| C242 | $x^{10} y^{11}$ | 2.7582455412e−52 | −7.7539406384e−54 | −5.9691278735e−53 |
| C244 | $x^8 y^{13}$ | 3.0132472722e−52 | −1.7360482848e−54 | −9.3148000268e−54 |
| C246 | $x^6 y^{15}$ | 1.3469049402e−52 | 2.2302172347e−54 | −6.4940963316e−53 |
| C248 | $x^4 y^{17}$ | −1.8775488149e−52 | −1.4085203761e−55 | −2.5600496539e−52 |
| C250 | $x^2 y^{19}$ | −2.2632338136e−52 | −2.4608384938e−55 | −1.0522054748e−52 |
| C252 | $y^{21}$ | 8.3164667372e−55 | −4.5288063055e−57 | 2.8883252301e−53 |
| C253 | $x^{22}$ | −5.8181503721e−59 | 0.0000000000e+00 | 0.0000000000e+00 |
| C255 | $x^{20} y^2$ | −2.3704317505e−57 | 0.0000000000e+00 | 0.0000000000e+00 |
| C257 | $x^{18} y^4$ | −2.5950502785e−57 | 0.0000000000e+00 | 0.0000000000e+00 |
| C259 | $x^{16} y^6$ | 7.6321375674e−56 | 0.0000000000e+00 | 0.0000000000e+00 |
| C261 | $x^{14} y^8$ | −1.2448230371e−56 | 0.0000000000e+00 | 0.0000000000e+00 |
| C263 | $x^{12} y^{10}$ | 5.0796598834e−56 | 0.0000000000e+00 | 0.0000000000e+00 |
| C265 | $x^{10} y^{12}$ | 1.0670836187e−55 | 0.0000000000e+00 | 0.0000000000e+00 |
| C267 | $x^8 y^{14}$ | −5.4159843888e−55 | 0.0000000000e+00 | 0.0000000000e+00 |
| C269 | $x^6 y^{16}$ | 2.9829969832e−55 | 0.0000000000e+00 | 0.0000000000e+00 |
| C271 | $x^4 y^{18}$ | −7.2525836420e−55 | 0.0000000000e+00 | 0.0000000000e+00 |
| C273 | $x^2 y^{20}$ | 1.8243445845e−56 | 0.0000000000e+00 | 0.0000000000e+00 |
| C275 | $y^{22}$ | 2.8109520778e−55 | 0.0000000000e+00 | 0.0000000000e+00 |
| C277 | $x^{22} y$ | 2.9006949371e−61 | 0.0000000000e+00 | 0.0000000000e+00 |
| C279 | $x^{20} y^3$ | 1.0846793628e−59 | 0.0000000000e+00 | 0.0000000000e+00 |
| C281 | $x^{18} y^5$ | −1.4931201959e−59 | 0.0000000000e+00 | 0.0000000000e+00 |
| C283 | $x^{16} y^7$ | −3.7584592242e−58 | 0.0000000000e+00 | 0.0000000000e+00 |
| C285 | $x^{14} y^9$ | −1.9043883221e−58 | 0.0000000000e+00 | 0.0000000000e+00 |
| C287 | $x^{12} y^{11}$ | −4.9131531771e−58 | 0.0000000000e+00 | 0.0000000000e+00 |
| C289 | $x^{10} y^{13}$ | −1.5613459538e−57 | 0.0000000000e+00 | 0.0000000000e+00 |
| C291 | $x^8 y^{15}$ | 3.1875257682e−58 | 0.0000000000e+00 | 0.0000000000e+00 |
| C293 | $x^6 y^{17}$ | −9.7242837599e−58 | 0.0000000000e+00 | 0.0000000000e+00 |
| C295 | $x^4 y^{19}$ | 2.5751695576e−57 | 0.0000000000e+00 | 0.0000000000e+00 |
| C297 | $x^2 y^{21}$ | 1.3735227616e−57 | 0.0000000000e+00 | 0.0000000000e+00 |
| C299 | $y^{23}$ | −6.7445729628e−58 | 0.0000000000e+00 | 0.0000000000e+00 |
| C300 | $x^{24}$ | 3.8903739740e−65 | 0.0000000000e+00 | 0.0000000000e+00 |
| C302 | $x^{22} y^2$ | −7.3000161712e−64 | 0.0000000000e+00 | 0.0000000000e+00 |
| C304 | $x^{20} y^4$ | −1.7010781132e−62 | 0.0000000000e+00 | 0.0000000000e+00 |
| C306 | $x^{18} y^6$ | 7.7317552042e−62 | 0.0000000000e+00 | 0.0000000000e+00 |
| C308 | $x^{16} y^8$ | 5.0786036727e−61 | 0.0000000000e+00 | 0.0000000000e+00 |

TABLE 24-continued for projection optical unit 600 of FIG. 6A:
Free form coefficients of surfaces

| Coefficient | Formula | | | |
|---|---|---|---|---|
| C310 | $x^{14} y^{10}$ | −1.1674499661e−61 | 0.0000000000e+00 | 0.0000000000e+00 |
| C312 | $x^{12} y^{12}$ | 8.4725634391e−61 | 0.0000000000e+00 | 0.0000000000e+00 |
| C314 | $x^{10} y^{14}$ | 1.7108264132e−60 | 0.0000000000e+00 | 0.0000000000e+00 |
| C316 | $x^{8} y^{16}$ | −3.5956537155e−61 | 0.0000000000e+00 | 0.0000000000e+00 |
| C318 | $x^{6} y^{18}$ | −2.6982184908e−61 | 0.0000000000e+00 | 0.0000000000e+00 |
| C320 | $x^{4} y^{20}$ | −2.9723486422e−60 | 0.0000000000e+00 | 0.0000000000e+00 |
| C322 | $x^{2} y^{22}$ | −1.5946328476e−60 | 0.0000000000e+00 | 0.0000000000e+00 |
| C324 | $y^{24}$ | 4.6721914299e−61 | 0.0000000000e+00 | 0.0000000000e+00 |
| C326 | $x^{24} y$ | −5.6550316877e−68 | 0.0000000000e+00 | 0.0000000000e+00 |
| C328 | $x^{22} y^{3}$ | 3.1391229369e−67 | 0.0000000000e+00 | 0.0000000000e+00 |
| C330 | $x^{20} y^{5}$ | 9.4860306238e−66 | 0.0000000000e+00 | 0.0000000000e+00 |
| C332 | $x^{18} y^{7}$ | −4.7032196678e−65 | 0.0000000000e+00 | 0.0000000000e+00 |
| C334 | $x^{16} y^{9}$ | −5.7513547056e−65 | 0.0000000000e+00 | 0.0000000000e+00 |
| C336 | $x^{14} y^{11}$ | 4.8850116112e−64 | 0.0000000000e+00 | 0.0000000000e+00 |
| C338 | $x^{12} y^{13}$ | −3.4519833198e−64 | 0.0000000000e+00 | 0.0000000000e+00 |
| C340 | $x^{10} y^{15}$ | 1.3807902353e−64 | 0.0000000000e+00 | 0.0000000000e+00 |
| C342 | $x^{8} y^{17}$ | 5.3804763444e−64 | 0.0000000000e+00 | 0.0000000000e+00 |
| C344 | $x^{6} y^{19}$ | 1.6380192153e−63 | 0.0000000000e+00 | 0.0000000000e+00 |
| C346 | $x^{4} y^{21}$ | 1.1600173834e−63 | 0.0000000000e+00 | 0.0000000000e+00 |
| C348 | $x^{2} y^{23}$ | 2.7320915331e−65 | 0.0000000000e+00 | 0.0000000000e+00 |
| C350 | $y^{25}$ | 3.1018259247e−66 | 0.0000000000e+00 | 0.0000000000e+00 |

| Coefficient | Formula | M04 | M05 | M06 |
|---|---|---|---|---|
| C2 | $y$ | −1.2528805854e−02 | 7.7445895160e−03 | 3.4729233624e−02 |
| C7 | $x^{2} y$ | −3.8710302301e−08 | 5.8453671340e−08 | −1.3279259410e−07 |
| C9 | $y^{3}$ | 3.8640894048e−09 | 2.2995071308e−08 | 1.1113054625e−07 |
| C10 | $x^{4}$ | −7.5248068213e−12 | 4.8977868890e−12 | 3.0116759195e−11 |
| C12 | $x^{2} y^{2}$ | 3.6168632644e−11 | 4.0999880081e−11 | −2.4848162064e−10 |
| C14 | $y^{4}$ | −4.8240621889e−12 | 1.9105987874e−11 | 1.5835369415e−10 |
| C16 | $x^{4} y$ | −2.3612132340e−14 | 4.0910255015e−14 | 9.6493538820e−14 |
| C18 | $x^{2} y^{3}$ | −1.5363533663e−14 | −4.9290366110e−14 | −4.9842630111e−13 |
| C20 | $y^{5}$ | 7.1041126340e−14 | −1.5094513465e−13 | 2.4736593103e−13 |
| C21 | $x^{6}$ | 5.3974790713e−18 | 9.4842666280e−18 | −1.7445683173e−17 |
| C23 | $x^{4} y^{2}$ | 2.6242213584e−17 | −1.4587170146e−16 | 4.5233682714e−16 |
| C25 | $x^{2} y^{4}$ | −5.2392932071e−17 | −6.3211052716e−16 | −9.1668442880e−16 |
| C27 | $y^{6}$ | −4.1388707403e−16 | −9.5757734804e−16 | 4.3959415056e−16 |
| C29 | $x^{6} y$ | 4.1844481041e−21 | −1.0565584212e−19 | −1.9370695589e−19 |
| C31 | $x^{4} y^{3}$ | −3.1168691743e−19 | −3.9122639081e−19 | 1.1487011424e−18 |
| C33 | $x^{2} y^{5}$ | −4.7759950205e−20 | −3.4569441825e−18 | −5.3410136961e−19 |
| C35 | $y^{7}$ | 1.4693441731e−18 | −2.4131732891e−18 | 1.5134397345e−17 |
| C36 | $x^{8}$ | 1.5940296677e−23 | −4.4144663685e−23 | 3.7625717858e−23 |
| C38 | $x^{6} y^{2}$ | 1.5021629042e−22 | 1.9459630704e−22 | −8.1948863572e−22 |
| C40 | $x^{4} y^{4}$ | 2.2658649887e−21 | −3.2701759697e−22 | 2.2014036116e−21 |
| C42 | $x^{2} y^{6}$ | 1.7991761138e−21 | −9.9075440178e−21 | 9.6926674690e−21 |
| C44 | $y^{8}$ | −3.1831667011e−21 | −9.5284970514e−22 | 1.7086342961e−19 |
| C46 | $x^{8} y$ | 8.5284021485e−26 | 1.1003178182e−25 | 3.2552735575e−25 |
| C48 | $x^{6} y^{3}$ | 4.2808551563e−25 | 3.6427924595e−24 | −2.3414773385e−25 |
| C50 | $x^{4} y^{5}$ | −7.6446693269e−24 | 9.2827895279e−24 | 1.2044352823e−23 |
| C52 | $x^{2} y^{7}$ | −7.8633817403e−24 | −1.9949817954e−23 | −4.5967078855e−22 |
| C54 | $y^{9}$ | 3.4418417603e−24 | 1.1097155362e−23 | −1.0006987363e−21 |
| C55 | $x^{10}$ | −1.0018031835e−28 | 1.4802872872e−28 | −1.1614652231e−28 |
| C57 | $x^{8} y^{2}$ | −2.5047395581e−27 | 1.4656996250e−27 | 2.3837464742e−27 |
| C59 | $x^{6} y^{4}$ | −1.1193056343e−26 | 2.7932694307e−26 | 3.0292053672e−26 |
| C61 | $x^{4} y^{6}$ | 8.9597191930e−27 | 3.9197891202e−26 | 4.2843704197e−26 |
| C63 | $x^{2} y^{8}$ | 1.4790370956e−26 | −4.0428341149e−26 | −1.0800142908e−23 |
| C65 | $y^{10}$ | 5.2887989870e−28 | 2.8921805588e−26 | −3.5665679096e−23 |
| C67 | $x^{10} y$ | 5.4452694818e−31 | 8.7723986678e−31 | −1.1367893511e−30 |
| C69 | $x^{8} y^{3}$ | 1.4240099980e−29 | 1.2418385144e−29 | −1.2866838701e−29 |
| C71 | $x^{6} y^{5}$ | 5.3636163445e−29 | 1.0934334379e−28 | −2.7608858518e−28 |
| C73 | $x^{4} y^{7}$ | 1.3167682960e−29 | 1.5904621632e−29 | 2.4047739667e−27 |
| C75 | $x^{2} y^{9}$ | −6.8881405078e−30 | −6.8290738175e−29 | −5.1686724983e−26 |
| C77 | $y^{11}$ | −5.3757178536e−30 | 1.2802765679e−29 | −2.4572460633e−25 |
| C78 | $x^{12}$ | 1.5245676814e−34 | −6.4470179536e−34 | 3.0827461579e−34 |
| C80 | $x^{10} y^{2}$ | 4.3271631174e−33 | 3.7587917898e−33 | −1.3599270431e−32 |
| C82 | $x^{8} y^{4}$ | −2.8421699518e−32 | 9.2838387476e−32 | −5.7129619089e−31 |
| C84 | $x^{6} y^{6}$ | −1.0723045370e−31 | 1.1084522619e−31 | −7.6164643714e−30 |
| C86 | $x^{4} y^{8}$ | −4.0378683059e−32 | −1.3289686704e−31 | 8.4294969397e−29 |
| C88 | $x^{2} y^{10}$ | −1.7792228258e−32 | −6.2366427757e−32 | 7.0494740538e−28 |
| C90 | $y^{12}$ | 2.4033260709e−33 | −3.4750922280e−32 | 2.9574973515e−28 |
| C92 | $x^{12} y$ | −3.3942967123e−36 | −6.4380319922e−36 | 3.0501320549e−36 |
| C94 | $x^{10} y^{3}$ | −4.5805771593e−35 | 7.0056258345e−35 | −1.8219779755e−35 |
| C96 | $x^{8} y^{5}$ | −5.0861895909e−36 | 1.9232873663e−34 | −2.1030813256e−33 |
| C98 | $x^{6} y^{7}$ | 5.3205805679e−35 | −3.4936020630e−34 | −1.9202299246e−32 |
| C100 | $x^{4} y^{9}$ | −2.9580590111e−36 | 1.3456044662e−34 | 7.2823186868e−31 |
| C102 | $x^{2} y^{11}$ | 1.8244521951e−35 | −2.1760741047e−34 | 1.0151570056e−29 |
| C104 | $y^{13}$ | 5.5682427876e−36 | 1.4376194950e−34 | 1.1777796929e−29 |

TABLE 24-continued for projection optical unit 600 of FIG. 6A:
Free form coefficients of surfaces

| | | | | |
|---|---|---|---|---|
| C105 | $x^{14}$ | 3.7202547978e−40 | 1.7278940326e−39 | −4.1948637734e−40 |
| C107 | $x^{12} y^2$ | 8.6781993443e−39 | 2.4113667319e−38 | 4.9468596835e−38 |
| C109 | $x^{10} y^4$ | 1.4307524108e−37 | 1.9247595109e−37 | 2.5467223029e−36 |
| C111 | $x^8 y^6$ | 5.3331222183e−38 | −1.0826021807e−37 | 6.4076370316e−35 |
| C113 | $x^6 y^8$ | 1.1869182603e−37 | −5.1070978063e−37 | 4.0998936662e−34 |
| C115 | $x^4 y^{10}$ | 6.3575719079e−38 | 7.2748689168e−37 | −2.4152907806e−33 |
| C117 | $x^2 y^{12}$ | 2.2149702702e−38 | −4.0575196794e−37 | 4.3562926605e−32 |
| C119 | $y^{14}$ | −4.8250203679e−39 | 5.8561565876e−37 | 4.4492522061e−32 |
| C121 | $x^{14} y$ | 5.4955158641e−42 | 4.6809480011e−41 | −3.5547147595e−42 |
| C123 | $x^{12} y^3$ | 3.8217079356e−41 | 1.2994723633e−40 | 4.1949563767e−40 |
| C125 | $x^{10} y^5$ | −1.6478042347e−40 | −1.6568205122e−40 | 3.3594896446e−38 |
| C127 | $x^8 y^7$ | 1.3496102786e−40 | 9.8220984007e−41 | 7.5853668320e−37 |
| C129 | $x^6 y^9$ | −1.0040570650e−40 | 1.3641569041e−40 | 2.5938834508e−36 |
| C131 | $x^4 y^{11}$ | 8.0929150523e−41 | −1.5167673564e−40 | −7.3720892548e−35 |
| C133 | $x^2 y^{13}$ | −2.6261428943e−41 | 5.6173653685e−40 | −1.9807277392e−36 |
| C135 | $y^{15}$ | 6.0058163235e−43 | 6.6097837174e−41 | −9.4117064114e−35 |
| C136 | $x^{16}$ | −1.4803962505e−45 | 2.7839437457e−45 | 9.2007896243e−47 |
| C138 | $x^{14} y^2$ | −3.3903749104e−44 | 1.9828359083e−43 | −7.7895424168e−44 |
| C140 | $x^{12} y^4$ | −2.2270143563e−43 | −8.6706718825e−45 | 2.4277105751e−43 |
| C142 | $x^{10} y^6$ | 2.3060040368e−44 | −5.2695874855e−43 | 1.2722886543e−40 |
| C144 | $x^8 y^8$ | −5.1396516137e−43 | 1.5749348760e−42 | 2.1489586032e−39 |
| C146 | $x^6 y^{10}$ | −1.7307363243e−43 | −5.7412323117e−43 | −3.7396684056e−39 |
| C148 | $x^4 y^{12}$ | −2.9885213403e−43 | −1.8847821755e−42 | −4.2355185167e−37 |
| C150 | $x^2 y^{14}$ | −3.8378722757e−44 | 1.4519580080e−42 | −3.9631025300e−37 |
| C152 | $y^{16}$ | −8.5789649226e−45 | −2.0582245579e−42 | −9.0857276151e−37 |
| C154 | $x^{16} y$ | 6.5466740425e−49 | −3.1167106271e−47 | −1.0389065179e−48 |
| C156 | $x^{14} y^3$ | 6.1521636917e−47 | 3.5808071608e−46 | −5.7823230179e−46 |
| C158 | $x^{12} y^5$ | 3.6925038157e−46 | −1.2243453250e−46 | −2.6596475647e−44 |
| C160 | $x^{10} y^7$ | −8.0078075897e−47 | 4.4287259272e−46 | −5.2093733757e−43 |
| C162 | $x^8 y^9$ | 3.7871211893e−46 | −1.7358191461e−46 | −1.2263353541e−41 |
| C164 | $x^6 y^{11}$ | 1.2280486889e−46 | 8.2699410068e−46 | −7.2302459519e−41 |
| C166 | $x^4 y^{13}$ | 8.6342881328e−47 | −4.3290229607e−45 | −5.4561681698e−40 |
| C168 | $x^2 y^{15}$ | 6.0487139404e−47 | −3.2839737034e−46 | 1.1217563478e−39 |
| C170 | $y^{17}$ | 1.5353591587e−47 | −3.5678574152e−45 | −2.1971923973e−41 |
| C171 | $x^{18}$ | 7.5367290347e−52 | −6.7363050576e−51 | 3.6657203991e−52 |
| C173 | $x^{16} y^2$ | 1.2564480150e−50 | −2.2761263083e−49 | 7.1665726422e−50 |
| C175 | $x^{14} y^4$ | 2.6854178846e−50 | 6.6855036909e−49 | −3.2113755579e−48 |
| C177 | $x^{12} y^6$ | −1.8597380191e−49 | 1.2805202298e−48 | −2.2442446141e−46 |
| C179 | $x^{10} y^8$ | 5.0837853259e−49 | −2.6726047791e−48 | −5.6979374942e−45 |
| C181 | $x^8 y^{10}$ | 3.7845410826e−49 | 1.0905216635e−48 | −1.0753880426e−43 |
| C183 | $x^6 y^{12}$ | 3.6104270144e−49 | 1.8174988739e−48 | −2.0292161304e−43 |
| C185 | $x^4 y^{14}$ | 4.0590031648e−49 | −5.9403377803e−48 | 3.7515319658e−42 |
| C187 | $x^2 y^{16}$ | 5.5720614802e−52 | −2.4451814824e−48 | 1.4719944394e−41 |
| C189 | $y^{18}$ | −5.1937662997e−51 | −3.1971760197e−48 | 1.3872656651e−41 |
| C191 | $x^{18} y$ | −1.9052782918e−54 | −1.9859976443e−53 | 6.6525898815e−54 |
| C193 | $x^{16} y^3$ | −5.0902055749e−53 | −5.9911037387e−52 | 9.4026672252e−53 |
| C195 | $x^{14} y^5$ | −1.5778159825e−52 | 2.4188991852e−51 | −2.0750143141e−50 |
| C197 | $x^{12} y^7$ | −1.0646684439e−52 | −1.5145088076e−51 | −7.0050331906e−49 |
| C199 | $x^{10} y^9$ | −6.8102906593e−52 | −1.9545864229e−51 | −1.4639623314e−47 |
| C201 | $x^8 y^{11}$ | −7.4018607700e−52 | 3.4143195617e−51 | −3.1351701247e−46 |
| C203 | $x^6 y^{13}$ | −5.2323340614e−52 | −1.2959945990e−51 | −2.0131233573e−46 |
| C205 | $x^4 y^{15}$ | −4.7694500668e−52 | −2.9668807249e−51 | 1.6489536373e−44 |
| C207 | $x^2 y^{17}$ | −3.6483400867e−53 | −1.8356363838e−51 | 4.1897863826e−44 |
| C209 | $y^{19}$ | −4.3693122376e−54 | −2.6190158701e−51 | 4.3547985764e−44 |
| C210 | $x^{20}$ | 8.4688927194e−58 | 3.1472133606e−57 | −2.4406794986e−58 |
| C212 | $x^{18} y^2$ | 1.1229204192e−56 | −5.4447936407e−56 | −5.7013165880e−56 |
| C214 | $x^{16} y^4$ | 3.9834761631e−56 | −3.2103913380e−55 | −2.5146342715e−54 |
| C216 | $x^{14} y^6$ | 1.4505598199e−55 | 2.1854819023e−54 | −7.9178374996e−53 |
| C218 | $x^{12} y^8$ | 1.4619341693e−55 | −4.3698429354e−54 | −5.0073981039e−52 |
| C220 | $x^{10} y^{10}$ | 3.5096598826e−55 | 5.6566436065e−54 | −3.1102758902e−51 |
| C222 | $x^8 y^{12}$ | 3.9331076268e−55 | −5.5225078774e−54 | −4.0591416986e−49 |
| C224 | $x^6 y^{14}$ | 2.2235259236e−55 | 4.5836120790e−54 | −4.5747696329e−49 |
| C226 | $x^4 y^{16}$ | 1.7363139842e−55 | −3.7337510238e−54 | 2.2604161853e−47 |
| C228 | $x^2 y^{18}$ | 1.6195978603e−56 | 1.2175777066e−54 | 4.1049092591e−47 |
| C230 | $y^{20}$ | 2.2693722141e−57 | −2.1878233249e−54 | 4.7782409568e−47 |
| C232 | $x^{20} y$ | −3.6586085665e−60 | 2.6981603257e−60 | −5.3286365016e−60 |
| C234 | $x^{18} y^3$ | −2.9091073540e−60 | −1.5497609068e−59 | −2.7311451599e−58 |
| C236 | $x^{16} y^5$ | −5.2039371922e−60 | 6.9392627326e−60 | −7.5326227793e−57 |
| C238 | $x^{14} y^7$ | −5.2380168952e−59 | 1.7004344120e−60 | −1.1056316754e−55 |
| C240 | $x^{12} y^9$ | −4.5802846444e−59 | 1.2198019026e−58 | 7.8396719535e−55 |
| C242 | $x^{10} y^{11}$ | −5.9937283023e−59 | 5.1768164805e−59 | 2.3332062689e−53 |
| C244 | $x^8 y^{13}$ | −6.3024359579e−59 | −2.9958733896e−58 | −2.0013710262e−52 |
| C246 | $x^6 y^{15}$ | −1.6693775559e−59 | 1.9713055874e−58 | −1.1693109321e−51 |
| C248 | $x^4 y^{17}$ | −7.3784558652e−60 | 9.4308983763e−59 | 6.9016548972e−51 |
| C250 | $x^2 y^{19}$ | −4.5093457762e−61 | 1.1442132021e−58 | 1.3694710886e−51 |
| C252 | $y^{21}$ | 2.5181784325e−61 | −6.1621979903e−58 | 1.0176518371e−50 |

TABLE 24-continued for projection optical unit 600 of FIG. 6A:
Free form coefficients of surfaces

| Coefficient | Formula | M07 | M08 | M09 |
|---|---|---|---|---|
| C2 | $y$ | −7.8446494187e−03 | −4.4306971181e−03 | 1.6594953981e−03 |
| C7 | $x^2 y$ | −6.9416100795e−09 | −2.7624484613e−07 | 2.5401450650e−08 |
| C9 | $y^3$ | 3.8449931211e−08 | 1.2636412860e−06 | 1.9839003582e−08 |
| C10 | $x^4$ | −3.7076334723e−12 | 4.0658163182e−10 | −8.9053426021e−12 |
| C12 | $x^2 y^2$ | −1.1218808555e−10 | 1.8333942565e−09 | −4.0866741995e−11 |
| C14 | $y^4$ | −2.4806937215e−11 | 7.3000159311e−09 | −1.7884091212e−11 |
| C16 | $x^4 y$ | 8.8752130285e−14 | −3.6590941781e−13 | 1.9789360796e−14 |
| C18 | $x^2 y^3$ | 2.8955328576e−14 | −2.8805310103e−12 | 3.5175493413e−14 |
| C20 | $y^5$ | 2.3848612627e−14 | 2.6683775501e−11 | 1.6499230515e−14 |
| C21 | $x^6$ | −1.4781134690e−17 | 7.2045616203e−16 | −1.3298670517e−17 |
| C23 | $x^4 y^2$ | −2.5567301877e−17 | 6.1329295531e−15 | −7.9420381455e−17 |
| C25 | $x^2 y^4$ | −9.7816747866e−17 | 1.8964387033e−14 | −9.2963520665e−17 |
| C27 | $y^6$ | −3.5880399094e−17 | 1.7145749650e−13 | −2.9648289124e−17 |
| C29 | $x^6 y$ | 1.2285489035e−19 | −2.1624921334e−18 | 1.5564316251e−20 |
| C31 | $x^4 y^3$ | 1.9662748570e−19 | −2.6540687917e−18 | 5.7645892729e−20 |
| C33 | $x^2 y^5$ | 2.0647197293e−19 | −3.2240458918e−17 | 5.5830283305e−20 |
| C35 | $y^7$ | 5.4410786947e−20 | 9.4583301204e−16 | 2.0111995195e−20 |
| C36 | $x^8$ | 2.1000486268e−22 | −3.8982750815e−22 | −3.4418978824e−23 |
| C38 | $x^6 y^2$ | 2.5961955370e−22 | 2.1487695909e−20 | −1.2010718681e−22 |
| C40 | $x^4 y^4$ | −4.2662898224e−22 | 2.0809077804e−19 | −2.2377830865e−22 |
| C42 | $x^2 y^6$ | −2.3674796296e−22 | 5.4557566367e−20 | −1.5900839678e−22 |
| C44 | $y^8$ | −2.5787854832e−23 | 5.4626707702e−18 | −3.6076329303e−23 |
| C46 | $x^8 y$ | −1.0292234488e−24 | 3.3793864832e−23 | 2.8016847145e−26 |
| C48 | $x^6 y^3$ | 1.0266038308e−24 | 3.1973087756e−24 | 8.0197094525e−26 |
| C50 | $x^4 y^5$ | −1.8138047788e−24 | 1.5121992937e−22 | 1.2670255151e−25 |
| C52 | $x^2 y^7$ | −1.4636711983e−24 | −1.9688336057e−21 | 9.7239352746e−26 |
| C54 | $y^9$ | −2.2796345069e−26 | 2.2799533627e−20 | 2.1022720095e−26 |
| C55 | $x^{10}$ | −1.2746450052e−26 | 2.8452928004e−26 | 1.7708597689e−29 |
| C57 | $x^8 y^2$ | −2.5980699176e−26 | 4.0523621739e−25 | −1.7156700283e−28 |
| C59 | $x^6 y^4$ | −1.4246024797e−26 | 4.2171005734e−24 | −4.5386706623e−28 |
| C61 | $x^4 y^6$ | 9.8011272654e−27 | 1.8339321263e−23 | −5.5851133029e−28 |
| C63 | $x^2 y^8$ | 1.4495704133e−27 | 4.8982106887e−23 | −3.4397115809e−28 |
| C65 | $y^{10}$ | −5.1387942263e−28 | 9.3069900562e−23 | −6.5671203149e−29 |
| C67 | $x^{10} y$ | 3.9954182561e−29 | −1.9245505582e−27 | −2.1374440788e−32 |
| C69 | $x^8 y^3$ | −2.6089734203e−29 | −7.6786794692e−27 | 7.1275425778e−32 |
| C71 | $x^6 y^5$ | 7.5466035966e−29 | 1.1773714267e−26 | 1.9847604531e−31 |
| C73 | $x^4 y^7$ | 5.9706264569e−29 | 2.4914393678e−25 | 2.7402812945e−31 |
| C75 | $x^2 y^9$ | 3.1426219168e−29 | 9.8818058751e−25 | 1.1049650951e−31 |
| C77 | $y^{11}$ | 1.8930526971e−30 | 8.3142895730e−25 | 1.3068049247e−33 |
| C78 | $x^{12}$ | 3.7272265501e−31 | −1.7679679996e−31 | −9.6745012321e−35 |
| C80 | $x^{10} y^2$ | 1.0983593746e−30 | −1.5460387732e−29 | −3.7039254458e−34 |
| C82 | $x^8 y^4$ | 1.4121639658e−30 | −2.3269099716e−28 | −8.1788621789e−34 |
| C84 | $x^6 y^6$ | −1.0671709849e−31 | −1.3210353662e−27 | −6.7912287575e−34 |
| C86 | $x^4 y^8$ | −4.3909577302e−31 | −3.2102441511e−27 | 8.4150919567e−35 |
| C88 | $x^2 y^{10}$ | −1.0219718974e−31 | −1.4949145134e−27 | 4.6332954145e−34 |
| C90 | $y^{12}$ | −3.5000170566e−34 | 1.3328196048e−26 | −2.7299767543e−35 |
| C92 | $x^{12} y$ | −1.2831614709e−33 | 5.4184112005e−32 | 5.9967471226e−39 |
| C94 | $x^{10} y^3$ | 1.7902011570e−34 | 3.1362647697e−31 | 3.3624295873e−37 |
| C96 | $x^8 y^5$ | −5.9356899836e−33 | 3.3094379296e−31 | 9.8615307417e−37 |
| C98 | $x^6 y^7$ | −7.3394937906e−34 | −9.6149068350e−30 | 1.4182363500e−36 |
| C100 | $x^4 y^9$ | 3.1435731593e−34 | −6.5841283108e−29 | 9.3608237873e−37 |
| C102 | $x^2 y^{11}$ | −6.8176725240e−35 | −1.4705311077e−28 | 5.6014926952e−37 |
| C104 | $y^{13}$ | −7.8372722547e−36 | 1.0224458070e−28 | 2.4109157822e−37 |
| C105 | $x^{14}$ | −6.4451808624e−36 | 5.3015268417e−36 | −1.9045851153e−40 |
| C107 | $x^{12} y^2$ | −2.7073918336e−35 | 4.9403482504e−34 | 9.8003568975e−40 |
| C109 | $x^{10} y^4$ | −4.3962506544e−35 | 8.3526787984e−33 | 1.8671986245e−39 |
| C111 | $x^8 y^6$ | −6.6738227472e−36 | 6.5147537153e−32 | −3.3551385444e−40 |
| C113 | $x^6 y^8$ | 6.3423892423e−36 | 2.5223541021e−31 | −7.6276006815e−39 |
| C115 | $x^4 y^{10}$ | 4.2776380374e−36 | 3.7344998796e−31 | −1.1876834618e−38 |
| C117 | $x^2 y^{12}$ | 9.6249541599e−37 | −3.1083370755e−31 | −7.3902434979e−39 |
| C119 | $y^{14}$ | 1.1526703761e−38 | 6.8347387188e−32 | −4.8292195629e−40 |
| C121 | $x^{14} y$ | 2.8850027766e−38 | −9.1385233177e−37 | 7.7229132671e−43 |
| C123 | $x^{12} y^3$ | 9.1980956079e−39 | −7.0766166809e−36 | 1.3050816292e−43 |
| C125 | $x^{10} y^5$ | 2.3628257108e−37 | −2.0367952351e−35 | −1.5045499933e−43 |
| C127 | $x^8 y^7$ | 1.0587996691e−37 | 1.7005323921e−34 | −4.3103104380e−42 |
| C129 | $x^6 y^9$ | −2.3630605789e−38 | 2.6433184032e−33 | −4.7912971749e−42 |
| C131 | $x^4 y^{11}$ | −1.4372454114e−38 | 1.0168494781e−32 | −3.8497404734e−42 |
| C133 | $x^2 y^{13}$ | −2.1048681492e−39 | 1.2026609653e−32 | −2.8269844063e−42 |
| C135 | $y^{15}$ | 1.6768521447e−42 | −3.0199280978e−33 | −6.2655361176e−43 |
| C136 | $x^{16}$ | 6.6091003089e−41 | −1.6109628446e−40 | 8.1686265555e−46 |
| C138 | $x^{14} y^2$ | 4.0790071654e−40 | −9.7504630322e−39 | −7.5372887164e−45 |
| C140 | $x^{12} y^4$ | 5.9570101663e−40 | −1.8410966520e−37 | −2.2189908274e−44 |
| C142 | $x^{10} y^6$ | −3.1188206894e−40 | −1.7518152935e−36 | −5.3983503054e−44 |
| C144 | $x^8 y^8$ | −2.2352234614e−40 | −9.3053686793e−36 | −4.3087059802e−44 |
| C146 | $x^6 y^{10}$ | 4.0234731825e−41 | −1.9350125365e−35 | 1.5571628159e−44 |

TABLE 24-continued for projection optical unit 600 of FIG. 6A:
Free form coefficients of surfaces

| | | | | |
|---|---|---|---|---|
| C148 | $x^4 y^{12}$ | 1.4044945686e−41 | 4.6069166794e−36 | 4.7443001615e−44 |
| C150 | $x^2 y^{14}$ | 1.7128455220e−42 | 6.3991275876e−35 | 3.0065957765e−44 |
| C152 | $y^{16}$ | −6.2097347227e−45 | −1.1194071146e−35 | 2.3114326920e−45 |
| C154 | $x^{16} y$ | −3.9685526952e−43 | 9.0875190448e−42 | −3.2128584439e−48 |
| C156 | $x^{14} y^3$ | −2.4712737266e−43 | 9.0445484913e−41 | −2.2890343044e−48 |
| C158 | $x^{12} y^5$ | −3.1717312478e−42 | 3.2675196917e−40 | −1.0672808770e−47 |
| C160 | $x^{10} y^7$ | −1.8546588262e−42 | −1.6573972181e−39 | 2.3064022617e−48 |
| C162 | $x^8 y^9$ | −1.1518603141e−43 | −5.3906709125e−38 | 3.6060579361e−47 |
| C164 | $x^6 y^{11}$ | 1.0734033449e−45 | −3.3272218337e−37 | 1.8918522203e−47 |
| C166 | $x^4 y^{13}$ | 1.4134429511e−44 | −6.8691715217e−37 | 2.7790000280e−47 |
| C168 | $x^2 y^{15}$ | 5.2982029110e−46 | −2.9003149149e−37 | 1.8861055752e−47 |
| C170 | $y^{17}$ | −2.6991028425e−47 | 6.8457981546e−38 | 1.7131386581e−48 |
| C171 | $x^{18}$ | −3.9598139016e−46 | 2.4662158874e−45 | −1.4660146756e−51 |
| C173 | $x^{16} y^2$ | −3.7889252038e−45 | 1.2422726562e−43 | 2.4640681752e−50 |
| C175 | $x^{14} y^4$ | −4.3384393094e−45 | 2.6538850877e−42 | 1.1757510607e−49 |
| C177 | $x^{12} y^6$ | 9.6310045477e−45 | 2.9301412025e−41 | 3.0828363803e−49 |
| C179 | $x^{10} y^8$ | 8.4023782167e−45 | 1.8930990406e−40 | 4.6105340841e−49 |
| C181 | $x^8 y^{10}$ | 1.0648908068e−45 | 5.8915504677e−40 | 3.0197306177e−49 |
| C183 | $x^6 y^{12}$ | −1.1633275349e−46 | −1.2680802403e−40 | −1.5133752164e−50 |
| C185 | $x^4 y^{14}$ | −4.6615914875e−47 | −2.6235785509e−39 | −1.3841551604e−49 |
| C187 | $x^2 y^{16}$ | −2.0580762623e−48 | −2.6622891776e−39 | −8.6358815298e−50 |
| C189 | $y^{18}$ | 5.9680526939e−50 | 1.0953493348e−39 | −8.5870015675e−51 |
| C191 | $x^{18} y$ | 3.3111703464e−48 | −4.8508082496e−47 | 7.1547575718e−54 |
| C193 | $x^{16} y^3$ | 4.2222616369e−48 | −6.0387844731e−46 | 9.6694477137e−54 |
| C195 | $x^{14} y^5$ | 1.1263819852e−47 | −5.3740727315e−46 | 7.2806159787e−53 |
| C197 | $x^{12} y^7$ | −1.2813941130e−47 | 2.2517525644e−44 | 1.2884717276e−52 |
| C199 | $x^{10} y^9$ | −1.3943815583e−47 | 6.3109491274e−43 | 1.8742041395e−53 |
| C201 | $x^8 y^{11}$ | −1.6254211152e−48 | 5.9751915941e−42 | −2.8815090946e−53 |
| C203 | $x^6 y^{13}$ | 1.7978486772e−49 | 1.7063034631e−41 | 9.4848275535e−53 |
| C205 | $x^4 y^{15}$ | 4.3242721924e−50 | 1.7489012564e−41 | −6.2410424098e−53 |
| C207 | $x^2 y^{17}$ | 1.4025281182e−51 | −4.7463753603e−42 | −5.8398960429e−53 |
| C209 | $y^{19}$ | −4.5522013446e−53 | 7.0434957037e−42 | −3.4852377666e−54 |
| C210 | $x^{20}$ | 1.2154144648e−51 | −2.0925794170e−50 | 5.2901440705e−58 |
| C212 | $x^{18} y^2$ | 1.7462143018e−50 | −1.0037005879e−48 | −5.8345959184e−56 |
| C214 | $x^{16} y^4$ | 2.0007099760e−50 | −2.4182521080e−47 | −3.2571601050e−55 |
| C216 | $x^{14} y^6$ | −2.3572927431e−50 | −3.0411734912e−46 | −1.0387538571e−54 |
| C218 | $x^{12} y^8$ | 1.8959703584e−51 | −2.2185821170e−45 | −2.1041978607e−54 |
| C220 | $x^{10} y^{10}$ | 1.0887800919e−50 | −9.0989011804e−45 | −2.4936132130e−54 |
| C222 | $x^8 y^{12}$ | 1.0924697389e−51 | −1.7857181133e−45 | −1.5522176366e−54 |
| C224 | $x^6 y^{14}$ | −1.0986624031e−52 | 7.9317569772e−44 | −3.9513470302e−55 |
| C226 | $x^4 y^{16}$ | −1.6078854442e−53 | 1.3369087621e−43 | 8.8693900322e−56 |
| C228 | $x^2 y^{18}$ | −2.6709201454e−55 | −5.3315496993e−46 | 1.1562077258e−55 |
| C230 | $y^{20}$ | 1.2906925072e−56 | 3.3595318871e−44 | 1.4158778489e−56 |
| C232 | $x^{20} y$ | −1.4846876466e−53 | 5.5911266902e−53 | −8.6653763952e−60 |
| C234 | $x^{18} y^3$ | −3.8356013646e−53 | 9.1229421497e−52 | −1.0380700392e−59 |
| C236 | $x^{16} y^5$ | −2.1578410415e−53 | −4.3794742202e−50 | −1.6680890898e−58 |
| C238 | $x^{14} y^7$ | 2.6513538765e−53 | −4.5279347849e−49 | −4.4797168084e−58 |
| C240 | $x^{12} y^9$ | 4.6137220941e−54 | −4.9263245864e−48 | −4.3370487059e−58 |
| C242 | $x^{10} y^{11}$ | −3.5044328796e−54 | −5.4747302988e−47 | −3.3156538985e−59 |
| C244 | $x^8 y^{13}$ | −2.8980202026e−55 | −2.2196004244e−46 | −3.6241948840e−58 |
| C246 | $x^6 y^{15}$ | 2.2784551004e−56 | −1.7056688554e−46 | −6.1696715195e−58 |
| C248 | $x^4 y^{17}$ | 1.3999459535e−57 | 8.6047085047e−47 | 7.1783500369e−59 |
| C250 | $x^2 y^{19}$ | −3.8768203818e−59 | 3.0334979480e−46 | 1.1050929383e−58 |
| C252 | $y^{21}$ | −2.3313576403e−61 | 2.4432981442e−46 | 7.1461620855e−60 |
| C253 | $x^{22}$ | 0.0000000000e+00 | 9.7107414669e−56 | 1.3295570245e−63 |
| C255 | $x^{20} y^2$ | 0.0000000000e+00 | 4.7033813282e−54 | 7.7604218211e−62 |
| C257 | $x^{18} y^4$ | 0.0000000000e+00 | 1.2621314089e−52 | 4.7950728798e−61 |
| C259 | $x^{16} y^6$ | 0.0000000000e+00 | 1.8029163801e−51 | 1.7500558900e−60 |
| C261 | $x^{14} y^8$ | 0.0000000000e+00 | 1.4529141589e−50 | 4.2726658046e−60 |
| C263 | $x^{12} y^{10}$ | 0.0000000000e+00 | 6.9130535398e−50 | 6.7223428855e−60 |
| C265 | $x^{10} y^{12}$ | 0.0000000000e+00 | 5.0614578818e−50 | 6.5670479413e−60 |
| C267 | $x^8 y^{14}$ | 0.0000000000e+00 | −9.6771765209e−49 | 3.8441799586e−60 |
| C269 | $x^6 y^{16}$ | 0.0000000000e+00 | −2.3713014937e−48 | 1.3917412910e−60 |
| C271 | $x^4 y^{18}$ | 0.0000000000e+00 | −1.6989810528e−48 | 2.6384369367e−61 |
| C273 | $x^2 y^{20}$ | 0.0000000000e+00 | 4.0548139497e−48 | −4.3467540264e−62 |
| C275 | $y^{22}$ | 0.0000000000e+00 | 1.5912954335e−48 | −9.7418847348e−63 |
| C277 | $x^{22} y$ | 0.0000000000e+00 | 7.4877001489e−58 | 4.6002776029e−66 |
| C279 | $x^{20} y^3$ | 0.0000000000e+00 | 1.1999688137e−56 | −3.8198953402e−66 |
| C281 | $x^{18} y^5$ | 0.0000000000e+00 | 5.0182721510e−55 | 1.8117565541e−64 |
| C283 | $x^{16} y^7$ | 0.0000000000e+00 | 4.9097448319e−54 | 6.2855567560e−64 |
| C285 | $x^{14} y^9$ | 0.0000000000e+00 | 3.1068858665e−53 | 9.5693585223e−64 |
| C287 | $x^{12} y^{11}$ | 0.0000000000e+00 | 2.3776364827e−52 | 4.4482359087e−64 |
| C289 | $x^{10} y^{13}$ | 0.0000000000e+00 | 1.1695708107e−51 | 1.7787605224e−64 |
| C291 | $x^8 y^{15}$ | 0.0000000000e+00 | 1.8120222996e−52 | 1.4351836294e−63 |
| C293 | $x^6 y^{17}$ | 0.0000000000e+00 | −5.3230871251e−51 | 1.3487790395e−63 |
| C295 | $x^4 y^{19}$ | 0.0000000000e+00 | −5.3973526820e−51 | −5.1971477262e−66 |
| C297 | $x^2 y^{21}$ | 0.0000000000e+00 | 1.9851768372e−50 | −1.1040256143e−64 |

TABLE 24-continued for projection optical unit 600 of FIG. 6A:
Free form coefficients of surfaces

| | | | | |
|---|---|---|---|---|
| C299 | $y^{23}$ | 0.0000000000e+00 | 5.3023983038e−51 | −9.2205479288e−66 |
| C300 | $x^{24}$ | 0.0000000000e+00 | −1.9248172283e−61 | −1.8230221324e−69 |
| C302 | $x^{22} y^2$ | 0.0000000000e+00 | −9.6245620741e−60 | −5.0278786404e−68 |
| C304 | $x^{20} y^4$ | 0.0000000000e+00 | −2.8553081252e−58 | −3.3669501960e−67 |
| C306 | $x^{18} y^6$ | 0.0000000000e+00 | −4.6444449037e−57 | −1.3687314298e−66 |
| C308 | $x^{16} y^8$ | 0.0000000000e+00 | −4.1801314112e−56 | −3.8279693501e−66 |
| C310 | $x^{14} y^{10}$ | 0.0000000000e+00 | −2.1786206045e−55 | −7.2847252127e−66 |
| C312 | $x^{12} y^{12}$ | 0.0000000000e+00 | −2.0283813767e−55 | −9.3905393351e−66 |
| C314 | $x^{10} y^{14}$ | 0.0000000000e+00 | 4.6565342126e−54 | −8.0887082053e−66 |
| C316 | $x^8 y^{16}$ | 0.0000000000e+00 | 1.3778334586e−53 | −4.6924880637e−66 |
| C318 | $x^6 y^{18}$ | 0.0000000000e+00 | 1.0029120625e−53 | −1.9717266649e−66 |
| C320 | $x^4 y^{20}$ | 0.0000000000e+00 | 2.5018917738e−54 | −5.6384627421e−67 |
| C322 | $x^2 y^{22}$ | 0.0000000000e+00 | 4.3737519489e−53 | −6.6189078716e−68 |
| C324 | $y^{24}$ | 0.0000000000e+00 | 7.3315917218e−54 | −2.4063002101e−69 |
| C326 | $x^{24} y$ | 0.0000000000e+00 | −2.8949671977e−63 | 3.9640201909e−73 |
| C328 | $x^{22} y^3$ | 0.0000000000e+00 | −5.2973511098e−62 | 1.5372186556e−71 |
| C330 | $x^{20} y^5$ | 0.0000000000e+00 | −1.7594090377e−60 | −4.1478029555e−71 |
| C332 | $x^{18} y^7$ | 0.0000000000e+00 | −1.9690596269e−59 | −1.8721035685e−70 |
| C334 | $x^{16} y^9$ | 0.0000000000e+00 | −1.1828775353e−58 | −2.4320580918e−70 |
| C336 | $x^{14} y11$ | 0.0000000000e+00 | −4.6128327550e−58 | 2.0820748566e−70 |
| C338 | $x^{12} y^{13}$ | 0.0000000000e+00 | −4.7519515302e−58 | 9.8238365291e−70 |
| C340 | $x^{10} y^{15}$ | 0.0000000000e+00 | 9.1752543077e−57 | 5.0516893860e−70 |
| C342 | $x^8 y^{17}$ | 0.0000000000e+00 | 3.3805756544e−56 | −9.1913208178e−70 |
| C344 | $x^6 y^{19}$ | 0.0000000000e+00 | 4.4746971686e−56 | −7.1782627028e−70 |
| C346 | $x^4 y^{21}$ | 0.0000000000e+00 | 2.8369229439e−56 | 6.9720198410e−71 |
| C348 | $x^2 y^{23}$ | 0.0000000000e+00 | 3.9263413003e−56 | 6.6166049715e−71 |
| C350 | $y^{25}$ | 0.0000000000e+00 | 2.4856909779e−57 | 6.9953209582e−72 |

TABLE 25 for projection optical unit 600 of FIG. 6A:
Coordinates of stop edge

| $x_i$ [mm] | $y_i$ [mm] | $x_{i+N/2}$ [mm] | $y_{i+N/2}$ [mm] |
|---|---|---|---|
| 211.428792 | 202.442444 | −266.345361 | −226.406038 |
| 192.457613 | 210.929550 | −245.377217 | −242.381767 |
| 169.492503 | 219.915898 | −230.899212 | −252.366598 |
| 153.017532 | 225.407555 | −206.935618 | −266.844603 |
| 132.548629 | 231.398454 | −194.953821 | −273.334743 |
| 103.592619 | 238.387835 | −181.973541 | −279.824883 |
| 81.625992 | 242.381767 | −160.506155 | −289.310472 |
| 71.141919 | 243.879492 | −143.531943 | −295.800612 |
| 60.158605 | 245.377217 | −119.568349 | −303.788477 |
| 39.190461 | 247.374183 | −97.102479 | −309.779375 |
| 22.715490 | 248.372666 | −88.116132 | −311.776340 |
| 13.229901 | 248.372666 | −73.138886 | −314.771791 |
| 4.243553 | 248.871907 | −44.682118 | −318.765723 |
| −21.217765 | 248.372666 | −27.707905 | −320.263448 |
| −45.181359 | 246.874941 | −17.223833 | −320.762689 |
| −64.152538 | 244.877975 | 18.222316 | −320.762689 |
| −78.131301 | 242.881009 | 44.182876 | −318.765723 |
| −101.096412 | 238.887077 | 66.648746 | −315.770274 |
| −112.578967 | 236.390869 | 90.612339 | −311.277100 |
| −140.037252 | 229.401487 | 116.073658 | −304.786960 |
| −150.022083 | 226.406038 | 133.547112 | −299.295303 |
| −173.486435 | 218.418173 | 150.521324 | −293.304404 |
| −195.952304 | 209.431826 | 165.498570 | −287.313506 |
| −211.428792 | 202.442444 | 190.959889 | −275.331709 |
| −225.407555 | 195.453063 | 210.430309 | −264.847637 |
| −243.380250 | 185.468232 | 221.413623 | −258.357497 |
| −252.366598 | 179.976575 | 240.384801 | −245.876458 |
| −265.846120 | 170.990227 | 252.865840 | −236.890110 |
| −276.829434 | 163.002363 | 275.830951 | −218.418173 |
| −294.302887 | 149.023600 | 290.308955 | −204.938652 |
| −306.284684 | 138.040286 | 305.785443 | −188.962923 |
| −315.271032 | 129.053938 | 317.767240 | −174.984160 |
| −330.248278 | 112.079726 | 325.755104 | −164.999329 |
| −338.735384 | 100.597170 | 337.237660 | −148.524358 |
| −346.224008 | 89.613856 | 346.723249 | −133.047870 |
| −357.207321 | 70.143436 | 352.714148 | −122.064556 |
| −362.698978 | 58.161639 | 361.201254 | −103.592619 |
| −366.193669 | 49.175292 | 364.695945 | −94.606272 |
| −369.688360 | 39.190461 | 368.689877 | −82.624475 |

TABLE 25-continued for projection optical unit 600 of FIG. 6A:
Coordinates of stop edge

| $x_i$ [mm] | $y_i$ [mm] | $x_{i+N/2}$ [mm] | $y_{i+N/2}$ [mm] |
|---|---|---|---|
| −371.685326 | 32.201079 | 373.183051 | −66.648746 |
| −375.180017 | 17.223833 | 376.178500 | −50.673016 |
| −376.677741 | 8.237485 | 377.676225 | −39.689702 |
| −377.676225 | 0.249621 | 378.674708 | −19.720041 |
| −378.674708 | −16.724592 | 378.175466 | −7.239002 |
| −377.676225 | −38.691219 | 376.178500 | 11.232935 |
| −377.176983 | −44.182876 | 372.683809 | 28.207147 |
| −375.180017 | −56.663915 | 367.192152 | 46.679084 |
| −373.183051 | −66.149504 | 361.201254 | 61.656330 |
| −368.689877 | −83.123716 | 355.210355 | 74.137369 |
| −363.198220 | −98.600204 | 346.723249 | 88.615373 |
| −354.711114 | −118.070624 | 336.738418 | 103.592619 |
| −348.720215 | −129.553179 | 327.252829 | 115.574416 |
| −342.230075 | −140.536493 | 315.271032 | 129.053938 |
| −331.746003 | −156.512223 | 298.296820 | 145.528909 |
| −321.761172 | −169.991744 | 282.820332 | 158.509189 |
| −310.278617 | −183.970507 | 265.346878 | 171.489469 |
| −298.796061 | −196.451546 | 247.374183 | 182.972024 |
| −289.809714 | −205.437893 | 227.404521 | 194.454580 |
| −276.829434 | −217.419690 | | |

Design Data for FIG. 7A

TABLE 26 for projection optical unit 700 of FIG. 7A:

| | |
|---|---|
| Numerical Aperture | 0.55 |
| Magnification in x-direction | 0.250 |
| Magnification in y- direction | 0.125 |
| Chief Ray angle | 5.11° |
| Wavelength | 13.5 nm |
| Image field size in x-direction | 26.0 mm |
| Image field size in y-direction | 1.2 mm |
| Average Wavefront-RMS | 6.22 mλ |

TABLE 27 for projection optical unit 700 of FIG. 7A:
Radii of Surfaces

|  | Radius$_x$ [mm] | Power$_x$ [1/mm] | Radius$_y$ [mm] | Power$_y$ [1/mm] |
|---|---|---|---|---|
| M01 | −1970.69460999 | 0.00098512 | −1511.85882424 | 0.00128409 |
| M02 | 941.40747587 | −0.00025763 | 7869.30126742 | −0.00003082 |
| M03 | 1062.34333576 | −0.00063183 | −5417.37433191 | 0.00012390 |
| M04 | −1627.20602698 | 0.00018520 | −3097.59050172 | 0.00009729 |
| M05 | −1637.75997050 | 0.00022724 | −2673.59542090 | 0.00013920 |
| M06 | −1054.58408200 | 0.00067327 | 1389.83722957 | −0.00051087 |
| M07 | −709.51421838 | 0.00073884 | −2224.87048681 | 0.00023562 |
| M08 | 1093.97975212 | −0.00035480 | 3489.29474619 | −0.00011124 |
| M09 | 1141.82784219 | −0.00163231 | 277.00525975 | −0.00672847 |
| M10 | −728.60000391 | 0.00273657 | −663.10844910 | 0.00300685 |

TABLE 28 for projection optical unit 700 of FIG. 7A:
Decentring (location, angle) of surfaces

|  | D$_x$ [mm] | D$_y$ [mm] | D$_z$ [mm] |
|---|---|---|---|
| Reticle | 0.000000000 | 0.000000000 | 0.000000000 |
| M01 | 0.000000000 | −147.747700656 | 1688.763946112 |
| M02 | 0.000000000 | −475.220806491 | 813.757153071 |
| M03 | 0.000000000 | −736.595820501 | 541.550583105 |
| M04 | 0.000000000 | −1291.955188953 | 414.279152033 |
| M05 | 0.000000000 | −2201.852432377 | 554.740368368 |
| M06 | 0.000000000 | −2427.794005811 | 706.276967819 |
| M07 | 0.000000000 | −2571.396016926 | 1047.356562534 |
| M08 | 0.000000000 | −2527.967678133 | 1278.013285002 |
| M09 | −0.000000000 | −2769.283984422 | 2247.791647401 |
| Stop | −0.000000000 | −2736.362660894 | 2115.490653284 |
| M10 | 0.000000000 | −2636.139966021 | 1712.725492471 |
| Wafer | −0.000000000 | −2636.170856256 | 2351.863122345 |

|  | α$_x$ [°] | α$_y$ [°] | α$_z$ [°] |
|---|---|---|---|
| Reticle | 0.000000000 | 0.000000000 | 0.000000000 |
| M01 | −7.759233079 | 0.000000000 | 0.000000000 |
| M02 | 57.822231158 | 180.000000000 | 0.000000000 |
| M03 | 209.535245804 | 0.000000000 | 0.000000000 |
| M04 | 2.066029837 | 180.000000000 | 0.000000000 |
| M05 | 158.687580727 | 0.000000000 | 0.000000000 |
| M06 | −50.508585991 | 180.000000000 | 0.000000000 |
| M07 | 96.084635597 | 0.000000000 | 0.000000000 |
| M08 | −88.344702455 | 0.000000000 | 180.000000000 |
| M09 | 13.973487001 | −0.000000000 | 0.000000000 |
| Stop | 0.097324946 | 180.000000000 | 0.000000000 |
| M10 | 6.988128085 | 180.000000000 | 0.000000000 |
| Wafer | 0.002769169 | −0.000000000 | −0.000000000 |

TABLE 29 for projection optical unit 700 of FIG. 7A:
Free form coefficients of surfaces

| Coefficient | Formular | M01 | M02 | M03 |
|---|---|---|---|---|
| C7 | $x^2 y$ | 2.9888852171e−08 | −5.4233934047e−07 | −1.5580990270e−07 |
| C9 | $y^3$ | −9.9313264378e−08 | 9.5134224154e−08 | −8.4093594223e−08 |
| C10 | $x^4$ | −3.9380462724e−12 | 2.9380275014e−10 | 1.7199126593e−10 |
| C12 | $x^2 y^2$ | 2.7890851404e−11 | 1.6005602346e−09 | −1.1412845193e−09 |
| C14 | $y^4$ | −5.4207485335e−11 | −3.0846017716e−10 | −2.7007085765e−10 |
| C16 | $x^4 y$ | 1.7799771117e−15 | −5.7783047247e−13 | −3.3105549011e−12 |
| C18 | $x^2 y^3$ | 3.1830484261e−14 | −6.0579824993e−12 | −1.2452076900e−12 |
| C20 | $y^5$ | −1.8268004177e−13 | 9.7181744918e−13 | 1.2524620025e−13 |
| C21 | $x^6$ | 1.2770813647e−16 | −4.6570784872e−16 | −3.4324796250e−15 |
| C23 | $x^4 y^2$ | 2.9194535732e−17 | −3.3076714928e−15 | −6.9480410443e−15 |
| C25 | $x^2 y^4$ | 1.1842999686e−16 | 1.9131763507e−14 | −4.1944118442e−17 |
| C27 | $y^6$ | 1.1655722599e−16 | −2.2624338769e−15 | −1.9194134619e−14 |
| C29 | $x^6 y$ | −6.2624105697e−21 | 2.3573582834e−18 | −1.8334481262e−17 |
| C31 | $x^4 y^3$ | −7.5623342275e−20 | 1.6368485078e−17 | 4.1166466486e−17 |
| C33 | $x^2 y$ | 1.2100992295e−19 | −5.1717553979e−17 | −3.1555347175e−16 |
| C35 | $y^7$ | 2.0268229274e−18 | 4.5076636281e−18 | 5.7322366241e−17 |
| C36 | $x^8$ | −2.3774631064e−24 | 6.5046359798e−21 | −9.5118201243e−21 |
| C38 | $x^6 y^2$ | −2.2639441174e−24 | −2.9220327882e−20 | 2.5810244968e−19 |
| C40 | $x^4 y^4$ | −2.1735834782e−22 | −1.7614006405e−21 | −2.4266342566e−18 |
| C42 | $x^2 y^6$ | −9.5608989305e−22 | 1.1574570790e−19 | 1.7139364765e−18 |
| C44 | $y^8$ | −4.8387797394e−21 | −1.3807140138e−21 | 1.0720122982e−18 |
| C46 | $x^8 y$ | 1.4323843652e−26 | −8.1806067888e−23 | 5.3521067225e−22 |
| C48 | $x^6 y^3$ | 2.3962710110e−25 | 2.6850491540e−22 | −1.0636894546e−20 |
| C50 | $x^4 y^5$ | −4.6109488357e−25 | −2.9027882773e−22 | 1.8186025237e−20 |
| C52 | $x^2 y^7$ | 2.4006618280e−23 | −2.9440130266e−22 | 1.8764659122e−20 |
| C54 | $y^9$ | −9.2849982882e−23 | −2.3621929681e−23 | −2.3493397266e−22 |
| C55 | $x^{10}$ | −5.2394686580e−30 | −8.4632296878e−26 | 1.2076513975e−24 |
| C57 | $x^8 y^2$ | −4.6673707829e−28 | 6.2935914873e−25 | −2.6258239290e−23 |
| C59 | $x^6 y^4$ | −2.5339892950e−27 | −1.4205011985e−24 | 1.0609405889e−22 |
| C61 | $x^4 y^6$ | −1.0248535195e−26 | 1.0140796795e−24 | 1.0555108376e−22 |
| C63 | $x^2 y^8$ | 2.4565110005e−25 | 1.2469593546e−24 | −1.3693594009e−22 |
| C65 | $y^{10}$ | −7.1074900499e−25 | −9.5098760465e−26 | −9.3601909086e−23 |
| C67 | $x^{10} y$ | −6.6546851220e−32 | 1.4480375209e−27 | −3.0311270412e−26 |
| C69 | $x^8 y^3$ | −3.5378682079e−30 | −1.7934134990e−27 | 3.5904855766e−25 |
| C71 | $x^6 y^5$ | −2.1889413390e−30 | 8.2947322580e−28 | 3.4362306188e−25 |
| C73 | $x^4 y^7$ | −1.8822309462e−28 | 7.2978834638e−28 | −1.4548653126e−24 |
| C75 | $x^2 y^9$ | 1.2658645951e−28 | −4.5731337443e−27 | −1.5569624553e−24 |
| C77 | $y^{11}$ | 4.2751917523e−28 | 1.5679517242e−27 | −6.6840996954e−25 |
| C78 | $x^{12}$ | 2.4429025328e−34 | −3.7357751409e−31 | −4.9774608242e−29 |
| C80 | $x^{10} y^2$ | 7.1187710549e−33 | −8.2619431373e−30 | 6.6886538247e−28 |

TABLE 29-continued for projection optical unit 700 of FIG. 7A:
Free form coefficients of surfaces

| | | | | |
|---|---|---|---|---|
| C82 | $x^8 y^4$ | 5.2568960882e−32 | −4.1134467381e−30 | −1.7759512677e−28 |
| C84 | $x^6 y^6$ | 4.3418477530e−31 | 2.5512036888e−29 | −6.8573639559e−27 |
| C86 | $x^4 y^8$ | 3.7092671582e−31 | 1.5965731932e−29 | −5.2411092466e−27 |
| C88 | $x^2 y^{10}$ | −1.6489870244e−29 | 1.9219348698e−29 | 3.4462996537e−27 |
| C90 | $y^{12}$ | 4.8176548665e−29 | −1.7372729714e−30 | 3.2952744392e−27 |
| C92 | $x^{12} y$ | 6.0000170595e−37 | −1.4457150351e−32 | 5.6015023155e−31 |
| C94 | $x^{10} y^3$ | 3.1491885614e−35 | −7.5669269483e−33 | −2.4615982116e−30 |
| C96 | $x^8 y^5$ | 1.5996797120e−34 | 1.4033935594e−31 | −2.7356748036e−29 |
| C98 | $x^6 y^7$ | −4.2078152435e−34 | −6.6015297800e−32 | −1.3294017835e−29 |
| C100 | $x^4 y^9$ | 1.3927541876e−32 | −2.5584479947e−31 | 5.6641174584e−29 |
| C102 | $x^2 y^{11}$ | −5.7160666261e−32 | −1.0326514343e−31 | 8.7562310878e−29 |
| C104 | $y^{13}$ | 1.4150329911e−31 | −1.8496060717e−32 | 7.3622195680e−29 |
| C105 | $x^{14}$ | −1.8646013650e−39 | 1.5992716554e−35 | 5.1943311137e−34 |
| C107 | $x^{12} y^2$ | −5.2673076786e−38 | 8.8658715576e−35 | −2.5835937247e−33 |
| C109 | $x^{10} y^4$ | −4.7852072756e−37 | 4.0042063817e−35 | −3.2254857311e−32 |
| C111 | $x^8 y^6$ | −3.8206260989e−36 | −6.8177527562e−34 | −7.6265432503e−32 |
| C113 | $x^6 y^8$ | −3.4315656590e−35 | −3.4499710184e−36 | 1.2554759608e−31 |
| C115 | $x^4 y^{10}$ | 6.0114254814e−35 | 6.9151235428e−34 | 2.1363858441e−31 |
| C117 | $x^2 y^{12}$ | 5.7159188426e−34 | 2.1910507977e−34 | 3.4000209616e−31 |
| C119 | $y^{14}$ | −8.3969056303e−34 | 4.5161730053e−35 | 2.6843814841e−31 |
| C121 | $x^{14} y$ | −2.3963867717e−42 | 0.0000000000e+00 | 0.0000000000e+00 |
| C123 | $x^{12} y^3$ | −1.1764738795e−40 | 0.0000000000e+00 | 0.0000000000e+00 |
| C125 | $x^{10} y^5$ | −9.7597340479e−40 | 0.0000000000e+00 | 0.0000000000e+00 |
| C127 | $x^8 y^7$ | 7.6379758745e−40 | 0.0000000000e+00 | 0.0000000000e+00 |
| C129 | $x^6 y^9$ | 4.0431867337e−39 | 0.0000000000e+00 | 0.0000000000e+00 |
| C131 | $x^4 y^{11}$ | −3.8807977144e−37 | 0.0000000000e+00 | 0.0000000000e+00 |
| C133 | $x^2 y^{13}$ | 1.8806566242e−36 | 0.0000000000e+00 | 0.0000000000e+00 |
| C135 | $y^{15}$ | −4.5173713948e−36 | 0.0000000000e+00 | 0.0000000000e+00 |
| C136 | $x^{16}$ | 4.8287113524e−45 | 0.0000000000e+00 | 0.0000000000e+00 |
| C138 | $x^{14} y^2$ | 1.6227676750e−43 | 0.0000000000e+00 | 0.0000000000e+00 |
| C140 | $x^{12} y^4$ | 1.8265759393e−42 | 0.0000000000e+00 | 0.0000000000e+00 |
| C142 | $x^{10} y^6$ | 1.3868063724e−41 | 0.0000000000e+00 | 0.0000000000e+00 |
| C144 | $x^8 y^8$ | 1.4221682696e−40 | 0.0000000000e+00 | 0.0000000000e+00 |
| C146 | $x^6 y^{10}$ | 8.0228529171e−40 | 0.0000000000e+00 | 0.0000000000e+00 |
| C148 | $x^4 y^{12}$ | −2.9658894203e−39 | 0.0000000000e+00 | 0.0000000000e+00 |
| C150 | $x^2 y^{14}$ | −8.3554443187e−39 | 0.0000000000e+00 | 0.0000000000e+00 |
| C152 | $y^{16}$ | 3.1733949699e−39 | 0.0000000000e+00 | 0.0000000000e+00 |

| Coefficient | Formular | M04 | M05 | M06 |
|---|---|---|---|---|
| C7 | $x^2 y$ | −9.7621314849e−08 | −8.4546421035e−08 | −7.8656126633e−09 |
| C9 | $y^3$ | −6.1670181624e−08 | −1.0275938411e−07 | −8.5973038135e−07 |
| C10 | $x^4$ | −1.5710696415e−11 | 5.2342835257e−11 | 5.8666395567e−11 |
| C12 | $x^2 y^2$ | −8.1443757654e−12 | −1.7610287537e−10 | 1.8668069731e−10 |
| C14 | $y^4$ | −6.4830103677e−11 | −2.2972292337e−10 | 5.6463657422e−09 |
| C16 | $x^4 y$ | 1.4961196689e−13 | −2.1495308003e−13 | −2.3651844507e−13 |
| C18 | $x^2 y^3$ | −3.6712539224e−14 | −3.9008180524e−13 | −3.6375291931e−12 |
| C20 | $y^5$ | −3.1412320213e−14 | −5.8337028498e−13 | −3.7384069278e−11 |
| C21 | $x^6$ | −1.2246765290e−15 | 2.0233961472e−16 | 2.4976037227e−16 |
| C23 | $x^4 y^2$ | 5.1693842865e−16 | −4.4218917521e−16 | 4.0884758599e−15 |
| C25 | $x^2 y^4$ | −3.7550554666e−16 | −1.0369147884e−15 | 1.0678081509e−14 |
| C27 | $y^6$ | 6.1471566134e−17 | −1.6174660468e−15 | 2.7210412767e−13 |
| C29 | $x^6 y$ | −3.4431990156e−18 | −9.2658183232e−19 | −1.0972120994e−18 |
| C31 | $x^4 y^3$ | 2.6568208479e−18 | −1.6345870557e−18 | −1.3472056872e−17 |
| C33 | $x^2 y^5$ | −1.0127928856e−18 | −2.9532734978e−18 | 7.2864938301e−17 |
| C35 | $y^7$ | −8.7795917550e−19 | −6.8447646558e−18 | 6.5527025150e−14 |
| C36 | $x^8$ | −4.8954847577e−21 | 1.4440718636e−21 | 6.5856741694e−22 |
| C38 | $x^6 y^2$ | −1.1804124593e−20 | −2.8007048521e−22 | 7.2029159254e−21 |
| C40 | $x^4 y^4$ | 8.1432806949e−21 | −1.9327609967e−21 | 4.7429671955e−19 |
| C42 | $x^2 y^6$ | 1.1810955458e−21 | −2.2466223100e−20 | −1.5116108716e−17 |
| C44 | $y^8$ | −7.2670201011e−21 | −9.2682138541e−20 | −3.9930757659e−16 |
| C46 | $x^8 y$ | −2.0121692380e−23 | −6.5541997168e−25 | −1.2409823685e−23 |
| C48 | $x^6 y^3$ | −3.5956178475e−23 | 2.6098913530e−24 | −8.6437240846e−23 |
| C50 | $x^4 y^5$ | 1.9462273746e−23 | −9.5197915435e−24 | 6.4043320518e−21 |
| C52 | $x^2 y^7$ | 1.8104186221e−23 | −2.7990262729e−22 | −7.8313304626e−19 |
| C54 | $y^9$ | 5.9495467340e−23 | −3.4972872299e−22 | −1.4583385132e−16 |
| C55 | $x^{10}$ | 6.1658568171e−26 | −2.5190773518e−27 | 5.6052284105e−27 |
| C57 | $x^8 y^2$ | −6.7154387198e−26 | 3.1578129329e−26 | 6.1088121176e−26 |
| C59 | $x^6 y^4$ | −3.1065463793e−25 | −9.1129807219e−26 | −4.2837510886e−24 |
| C61 | $x^4 y^6$ | −1.8370772466e−25 | −5.9844977879e−25 | −1.0758492440e−21 |
| C63 | $x^2 y^8$ | −1.2385896007e−25 | 1.3543503875e−24 | 6.2523867389e−20 |
| C65 | $y^{10}$ | 7.6517060150e−26 | 8.1081725334e−24 | 7.5733316403e−19 |
| C67 | $x^{10} y$ | 3.3366651021e−28 | −3.9031257535e−29 | −2.7070739349e−29 |
| C69 | $x^8 y^3$ | −4.0764197868e−30 | −2.6776073926e−28 | −8.4299136531e−28 |
| C71 | $x^6 y^5$ | −5.9569752648e−28 | −1.7651553623e−27 | −3.0464241926e−26 |
| C73 | $x^4 y^7$ | 2.5941930399e−29 | −1.0190945774e−27 | −1.6728948736e−23 |
| C75 | $x^2 y^9$ | −7.2961720995e−28 | 3.2058868716e−26 | 1.0681299282e−21 |

TABLE 29-continued for projection optical unit 700 of FIG. 7A:
Free form coefficients of surfaces

| Coefficient | Formular | | | |
|---|---|---|---|---|
| C77 | $y^{11}$ | −1.9012552872e−27 | 5.7599570048e−26 | 1.5447793782e−19 |
| C78 | $x^{12}$ | −6.8177240126e−31 | 3.6122647505e−32 | −9.3278287638e−33 |
| C80 | $x^{10} y^2$ | 1.6314141946e−30 | −3.0712870525e−31 | 1.1918512594e−30 |
| C82 | $x^8 y^4$ | 7.3989276522e−30 | −6.2108145069e−31 | 1.2934862444e−28 |
| C84 | $x^6 y^6$ | 1.1027398101e−29 | 2.7530455919e−30 | 2.8487975384e−27 |
| C86 | $x^4 y^8$ | 7.1355233349e−30 | 1.7616624611e−29 | 2.2581554642e−24 |
| C88 | $x^2 y^{10}$ | 3.9079466996e−30 | −1.0425732501e−28 | −1.0774594569e−22 |
| C90 | $y^{12}$ | 3.0269108987e−30 | −4.3016235302e−28 | −5.9061968597e−22 |
| C92 | $x^{12} y$ | −5.7232493510e−34 | −8.2659347711e−35 | 4.4820436419e−34 |
| C94 | $x^{10} y^3$ | −9.2356125691e−34 | 1.3596288320e−33 | −1.0469534243e−33 |
| C96 | $x^8 y^5$ | 6.1379860255e−33 | 1.5499267832e−32 | 2.6463457623e−31 |
| C98 | $x^6 y^7$ | 6.9099505397e−33 | 1.3410556845e−31 | −4.0192208354e−29 |
| C100 | $x^4 y^9$ | −7.3907286260e−33 | −3.0967162026e−31 | 1.8016184333e−26 |
| C102 | $x^2 y^{11}$ | 1.1653025783e−32 | −2.5471685015e−30 | −6.8995197936e−25 |
| C104 | $y^{13}$ | 2.1407564200e−32 | −5.4623627875e−30 | −6.2298075891e−23 |
| C105 | $x^{14}$ | 9.9761341305e−36 | −9.7792789953e−38 | −2.5128985171e−38 |
| C107 | $x^{12} y^2$ | 2.9638624814e−36 | 4.0815415868e−36 | −1.0185724931e−35 |
| C109 | $x^{10} y^4$ | −8.5014074254e−35 | 8.9719565713e−36 | −1.1108453750e−33 |
| C111 | $x^8 y^6$ | −2.0235714171e−34 | 7.9940508960e−35 | −1.9443870410e−32 |
| C113 | $x^6 y^8$ | −1.7494672136e−34 | 5.2216419216e−34 | −3.1893117719e−30 |
| C115 | $x^4 y^{10}$ | −4.8633268436e−35 | −2.6448872890e−33 | −1.5060764556e−27 |
| C117 | $x^2 y^{12}$ | −7.0233125043e−35 | −7.0022575786e−33 | 6.1939843825e−26 |
| C119 | $y^{14}$ | −6.4842550596e−35 | −1.5383246493e−32 | 1.5174477646e−25 |
| Coefficient | Formular | M07 | M08 | M09 |
| C7 | $x^2 y$ | −5.3247574162e−07 | 9.2290576454e−07 | −2.2497841045e−06 |
| C9 | $y^3$ | 1.7824971085e−07 | 2.5727825498e−08 | −3.2900782221e−07 |
| C10 | $x^4$ | −5.5773152921e−10 | 2.0322366217e−09 | 1.7930637554e−09 |
| C12 | $x^2 y^2$ | −1.6808198643e−10 | 9.4839199936e−10 | 8.7675643741e−09 |
| C14 | $y^4$ | −3.9586396101e−10 | −1.6563940517e−11 | 7.4602870217e−09 |
| C16 | $x^4 y$ | −1.6697683838e−12 | 4.6285728372e−12 | −1.0930582881e−11 |
| C18 | $x^2 y^3$ | 2.6298070251e−13 | −9.3332348305e−14 | −1.3388947210e−11 |
| C20 | $y^5$ | 9.6311807353e−13 | −7.7465823969e−14 | 1.9298012531e−11 |
| C21 | $x^6$ | −2.7634793454e−15 | 4.2566583496e−15 | 8.8731882335e−15 |
| C23 | $x^4 y^2$ | −7.1123181696e−16 | 2.1772395142e−15 | 7.3135925789e−14 |
| C25 | $x^2 y^4$ | 1.2591997571e−15 | −4.8384037527e−15 | 1.4977465063e−13 |
| C27 | $y^6$ | −2.5794924943e−15 | 5.3366790508e−17 | 6.1242182808e−14 |
| C29 | $x^6 y$ | −7.6393817827e−18 | 1.2758371886e−17 | −1.1024781456e−16 |
| C31 | $x^4 y^3$ | 2.4390827214e−18 | −4.0126005376e−17 | −4.9004277397e−16 |
| C33 | $x^2 y^5$ | 4.0488175575e−18 | −1.3138083890e−17 | 5.3404977450e−16 |
| C35 | $y^7$ | 5.8425723805e−18 | −2.7787232169e−18 | −3.9901516786e−16 |
| C36 | $x^8$ | −1.6114280460e−20 | 1.1236283787e−19 | 5.7348160491e−20 |
| C38 | $x^6 y^2$ | −3.9425457682e−21 | −7.2893398592e−20 | 1.4096531954e−18 |
| C40 | $x^4 y^4$ | 2.2807528020e−20 | −1.7192164616e−19 | 8.7141605006e−19 |
| C42 | $x^2 y^6$ | 8.4616222094e−21 | −1.0018425746e−19 | 9.5039121398e−18 |
| C44 | $y^8$ | −2.6901296894e−20 | 5.5417703690e−20 | 1.0913121006e−17 |
| C46 | $x^8 y$ | −2.5867742646e−23 | 3.3763591769e−22 | −1.2013934139e−21 |
| C48 | $x^6 y^3$ | 4.4453033180e−23 | −5.1520715205e−22 | −2.8452083986e−21 |
| C50 | $x^4 y^5$ | 3.6145735497e−23 | −1.0890837037e−21 | −1.5147995549e−20 |
| C52 | $x^2 y^7$ | −9.8719591813e−23 | 8.3586877249e−22 | −3.0775490741e−20 |
| C54 | $y^9$ | 3.5345367220e−22 | −7.4418682937e−23 | 8.1491134147e−20 |
| C55 | $x^{10}$ | −9.2188175803e−27 | −3.9163393407e−24 | 3.6025424487e−25 |
| C57 | $x^8 y^2$ | 1.5346127694e−25 | −4.7136624860e−24 | 6.7712097465e−24 |
| C59 | $x^6 y^4$ | 3.7039295750e−25 | −7.7493267481e−24 | 4.3520771784e−23 |
| C61 | $x^4 y^6$ | −1.7413898933e−25 | 6.0690698133e−24 | 6.9078168122e−23 |
| C63 | $x^2 y^8$ | −1.4602998968e−25 | 1.0569044058e−24 | −3.8546433238e−22 |
| C65 | $y^{10}$ | 1.2303167513e−25 | −2.5588558118e−24 | 1.2537676325e−21 |
| C67 | $x^{10} y$ | −1.1660065501e−28 | −3.5664278481e−26 | −2.6070240874e−26 |
| C69 | $x^8 y^3$ | 7.9038078846e−28 | −7.4899046031e−26 | −2.2633904127e−25 |
| C71 | $x^6 y^5$ | 1.5967109369e−27 | −3.8332662451e−27 | −7.6502569835e−25 |
| C73 | $x^4 y^7$ | 2.2825300291e−27 | 2.5839153971e−26 | 6.0869587376e−25 |
| C75 | $x^2 y^9$ | 7.9338910794e−27 | −4.5750923747e−26 | −5.3022886559e−24 |
| C77 | $y^{11}$ | −1.2993005128e−26 | 2.9920797476e−26 | 3.0600807582e−24 |
| C78 | $x^{12}$ | −5.2424759959e−31 | 8.0165005557e−29 | 3.5116495573e−29 |
| C80 | $x^{10} y^2$ | −1.7945084130e−30 | −1.9372805260e−29 | 4.1286171178e−28 |
| C82 | $x^8 y^4$ | −6.5011609678e−32 | −8.7831268792e−29 | 2.0804747775e−27 |
| C84 | $x^6 y^6$ | 1.4737073305e−29 | 6.1801867018e−29 | 4.6623027195e−27 |
| C86 | $x^4 y^8$ | 5.2368813330e−29 | −4.9370909186e−28 | 2.2770595142e−26 |
| C88 | $x^2 y^{10}$ | −1.8174862625e−29 | 2.2839152171e−30 | 9.2884904118e−26 |
| C90 | $y^{12}$ | 5.8033982739e−30 | 4.1917024539e−29 | −3.0693337999e−25 |
| C92 | $x^{12} y$ | 2.0969111795e−33 | 7.7093248706e−31 | 5.4368980978e−31 |
| C94 | $x^{10} y^3$ | 8.4938248258e−33 | 2.3071322265e−30 | 4.9942897587e−30 |
| C96 | $x^8 y^5$ | 1.4006923580e−32 | 1.6152041470e−30 | 6.3643119532e−29 |
| C98 | $x^6 y^7$ | 2.1531562919e−33 | −3.2708655507e−30 | 3.0075197958e−28 |
| C100 | $x^4 y^9$ | −1.1124653384e−31 | −7.3760845388e−31 | −3.8872832756e−28 |
| C102 | $x^2 y^{11}$ | −7.4345145974e−32 | 4.7354751975e−31 | 3.2860757169e−27 |

TABLE 29-continued for projection optical unit 700 of FIG. 7A:
Free form coefficients of surfaces

| | | | | |
|---|---|---|---|---|
| C104 | $y^{13}$ | 2.1801457151e−31 | −2.0614054457e−32 | −1.5536664700e−27 |
| C105 | $x^{14}$ | 1.6117436940e−36 | −6.0889150257e−34 | −8.0931525126e−34 |
| C107 | $x^{12} y^2$ | 3.6317336530e−35 | 3.8363227542e−33 | −9.3114839633e−33 |
| C109 | $x^{10} y^4$ | 9.7651944912e−35 | 1.0872994441e−32 | −9.5742648369e−32 |
| C111 | $x^8 y^6$ | −1.1829097010e−34 | −1.1148207274e−33 | −1.2738812662e−30 |
| C113 | $x^6 y^8$ | −5.3563131590e−34 | −9.6044852905e−33 | −3.6118221924e−31 |
| C115 | $x^4 y^{10}$ | −1.2552770877e−33 | 4.3803836288e−33 | −1.8088561626e−29 |
| C117 | $x^2 y^{12}$ | 6.6819054285e−34 | −6.9621580245e−34 | 1.1440685620e−29 |
| C119 | $y^{14}$ | −3.5064119783e−34 | −1.6134424158e−34 | 1.6768844411e−29 |
| C121 | $x^{14} y$ | 0.0000000000e+00 | 0.0000000000e+00 | −1.5031466721e−35 |
| C123 | $x^{12} y^3$ | 0.0000000000e+00 | 0.0000000000e+00 | −1.5333652789e−34 |
| C125 | $x^{10} y^5$ | 0.0000000000e+00 | 0.0000000000e+00 | −7.4197129558e−34 |
| C127 | $x^8 y^7$ | 0.0000000000e+00 | 0.0000000000e+00 | −1.4371629320e−32 |
| C129 | $x^6 y^9$ | 0.0000000000e+00 | 0.0000000000e+00 | 7.5730704720e−33 |
| C131 | $x^4 y^{11}$ | 0.0000000000e+00 | 0.0000000000e+00 | −4.9623581427e−32 |
| C133 | $x^2 y^{13}$ | 0.0000000000e+00 | 0.0000000000e+00 | −1.4614401268e−31 |
| C135 | $y^{15}$ | 0.0000000000e+00 | 0.0000000000e+00 | 4.1497470940e−32 |
| C136 | $x^{16}$ | 0.0000000000e+00 | 0.0000000000e+00 | 1.1978990101e−38 |
| C138 | $x^{14} y^2$ | 0.0000000000e+00 | 0.0000000000e+00 | 2.9811413328e−37 |
| C140 | $x^{12} y^4$ | 0.0000000000e+00 | 0.0000000000e+00 | 1.2007310585e−36 |
| C142 | $x^{10} y^6$ | 0.0000000000e+00 | 0.0000000000e+00 | 3.6215428098e−35 |
| C144 | $x^8 y^8$ | 0.0000000000e+00 | 0.0000000000e+00 | 8.6906021090e−35 |
| C146 | $x^6 y^{10}$ | 0.0000000000e+00 | 0.0000000000e+00 | 3.8825048132e−34 |
| C148 | $x^4 y^{12}$ | 0.0000000000e+00 | 0.0000000000e+00 | 9.0244514726e−34 |
| C150 | $x^2 y^{14}$ | 0.0000000000e+00 | 0.0000000000e+00 | −5.5278112099e−34 |
| C152 | $y^{16}$ | 0.0000000000e+00 | 0.0000000000e+00 | −5.4323248483e−34 |

| Coefficient | Formula | M10 |
|---|---|---|
| C7 | $x^2 y$ | 2.0115417809e−08 |
| C9 | $y^3$ | −1.9492426731e−09 |
| C10 | $x^4$ | −2.3863017328e−11 |
| C12 | $x^2 y^2$ | −7.7247982404e−11 |
| C14 | $y^4$ | −2.4972155007e−11 |
| C16 | $x^4 y$ | 4.9503013433e−14 |
| C18 | $x^2 y^3$ | 3.1738294986e−14 |
| C20 | $y^5$ | −4.2932210182e−15 |
| C21 | $x^6$ | −6.0868711248e−17 |
| C23 | $x^4 y^2$ | −2.6186718211e−16 |
| C25 | $x^2 y^4$ | −2.5638585875e−16 |
| C27 | $y^6$ | −5.8772984219e−17 |
| C29 | $x^6 y$ | 9.7363306861e−20 |
| C31 | $x^4 y^3$ | 1.5153722933e−19 |
| C33 | $x^2 y^5$ | 5.5510825507e−20 |
| C35 | $y^7$ | −7.1233621350e−22 |
| C36 | $x^8$ | −1.3159498325e−22 |
| C38 | $x^6 y^2$ | −7.0826089433e−22 |
| C40 | $x^4 y^4$ | −1.1360756639e−21 |
| C42 | $x^2 y^6$ | −7.0900935248e−22 |
| C44 | $y^8$ | −1.5258853719e−22 |
| C46 | $x^8 y$ | 1.6999506260e−25 |
| C48 | $x^6 y^3$ | 4.5633184594e−25 |
| C50 | $x^4 y^5$ | 3.9940827528e−25 |
| C52 | $x^2 y^7$ | 1.2816230270e−25 |
| C54 | $y^9$ | −9.8515757187e−27 |
| C55 | $x^{10}$ | −2.4461536382e−28 |
| C57 | $x^8 y^2$ | −1.5437461375e−27 |
| C59 | $x^6 y^4$ | −3.3990755916e−27 |
| C61 | $x^4 y^6$ | −3.4398418309e−27 |
| C63 | $x^2 y^8$ | −1.5909821813e−27 |
| C65 | $y^{10}$ | −3.1804493684e−28 |
| C67 | $x^{10} y$ | 4.7680153661e−31 |
| C69 | $x^8 y^3$ | 1.8766627312e−30 |
| C71 | $x^6 y^5$ | 2.8172563479e−30 |
| C73 | $x^4 y^7$ | 1.8703803233e−30 |
| C75 | $x^2 y^9$ | 4.0466814460e−31 |
| C77 | $y^{11}$ | −3.5616206880e−33 |
| C78 | $x^{12}$ | −7.5470116009e−34 |
| C80 | $x^{10} y^2$ | −6.1815024869e−33 |
| C82 | $x^8 y^4$ | −1.7879302804e−32 |
| C84 | $x^6 y^6$ | −2.6471378197e−32 |
| C86 | $x^4 y^8$ | −2.0802846735e−32 |
| C88 | $x^2 y^{10}$ | −9.1147276835e−33 |
| C90 | $y^{12}$ | −1.0461964574e−33 |
| C92 | $x^{12} y$ | −6.5220858880e−38 |
| C94 | $x^{10} y^3$ | −1.6509323690e−36 |
| C96 | $x^8 y^5$ | −4.1100204291e−36 |

TABLE 29-continued for projection optical unit 700 of FIG. 7A:
Free form coefficients of surfaces

| | | |
|---|---|---|
| C98 | $x^6 y^7$ | −5.4615310788e−36 |
| C100 | $x^4 y^9$ | −2.7775905138e−36 |
| C102 | $x^2 y^{11}$ | −1.3900256135e−36 |
| C104 | $y^{13}$ | −1.5840741423e−37 |
| C105 | $x^{14}$ | 5.3358470580e−40 |
| C107 | $x^{12} y^2$ | 7.5697455749e−39 |
| C109 | $x^{10} y^4$ | 2.5683192184e−38 |
| C111 | $x^8 y^6$ | 5.6562840713e−38 |
| C113 | $x^6 y^8$ | 6.7249675134e−38 |
| C115 | $x^4 y^{10}$ | 4.3595848549e−38 |
| C117 | $x^2 y^{12}$ | 1.9003711694e−38 |
| C119 | $y^{14}$ | 2.1382341233e−39 |
| C121 | $x^{14} y$ | 4.1220157045e−42 |
| C123 | $x^{12} y^3$ | 3.0333612772e−41 |
| C125 | $x^{10} y^5$ | 7.8359674052e−41 |
| C127 | $x^8 y^7$ | 1.0863471355e−40 |
| C129 | $x^6 y^9$ | 8.6970617349e−41 |
| C131 | $x^4 y^{11}$ | 3.3521897751e−41 |
| C133 | $x^2 y^{13}$ | 7.2064793018e−42 |
| C135 | $y^{15}$ | 1.2943742130e−42 |
| C136 | $x^{16}$ | −7.5169925607e−45 |
| C138 | $x^{14} y^2$ | −7.8999062924e−44 |
| C140 | $x^{12} y^4$ | −3.1638004523e−43 |
| C142 | $x^{10} y^6$ | −7.2574537450e−43 |
| C144 | $x^8 y^8$ | −1.0303716216e−42 |
| C146 | $x^6 y^{10}$ | −8.8567924280e−43 |
| C148 | $x^4 y^{12}$ | −4.5870199651e−43 |
| C150 | $x^2 y^{14}$ | −1.3861322359e−43 |
| C152 | $y^{16}$ | −1.5266451319e−44 |

TABLE 30 for projection optical unit 700 of FIG. 7A:
Coordinates of the stop edge

| $x_i$ [mm] | $y_i$ [mm] | $x_{i+N/2}$ [mm] | $y_{i+N/2}$ [mm] |
|---|---|---|---|
| −204.646808 | 19.983783 | 204.514621 | 11.917218 |
| −204.516985 | 24.007112 | 204.253004 | 7.878967 |
| −204.256502 | 28.020507 | 203.861511 | 3.840747 |
| −203.865482 | 32.021518 | 203.340653 | −0.194919 |
| −203.344174 | 36.007713 | 202.691064 | −4.225504 |
| −202.692956 | 39.976687 | 201.913497 | −8.248475 |
| −201.912328 | 43.926054 | 201.008825 | −12.261298 |
| −201.002916 | 47.853458 | 199.978031 | −16.261438 |
| −199.965464 | 51.756568 | 198.822213 | −20.246362 |
| −198.800835 | 55.633086 | 197.542571 | −24.213542 |
| −197.510008 | 59.480740 | 196.140410 | −28.160458 |
| −196.094073 | 63.297293 | 194.617129 | −32.084597 |
| −194.554226 | 67.080538 | 192.974223 | −35.983459 |
| −192.891768 | 70.828305 | 191.213270 | −39.854555 |
| −191.108102 | 74.538453 | 189.335933 | −43.695414 |
| −189.204723 | 78.208883 | 187.343951 | −47.503578 |
| −187.183219 | 81.837525 | 185.239135 | −51.276611 |
| −185.045263 | 85.422349 | 183.023360 | −55.012096 |
| −182.792611 | 88.961360 | 180.698565 | −58.707638 |
| −180.427096 | 92.452600 | 178.266742 | −62.360866 |
| −177.950624 | 95.894148 | 175.729936 | −65.969435 |
| −175.365168 | 99.284119 | 173.090237 | −69.531026 |
| −172.672766 | 102.620668 | 170.349776 | −73.043349 |
| −169.875514 | 105.901983 | 167.510725 | −76.504144 |
| −166.975565 | 109.126294 | 164.575283 | −79.911183 |
| −163.975121 | 112.291868 | 161.545685 | −83.262269 |
| −160.876433 | 115.397007 | 158.424187 | −86.555242 |
| −157.681794 | 118.440054 | 155.213071 | −89.787977 |
| −154.393538 | 121.419390 | 151.914637 | −92.958386 |
| −151.014034 | 124.333434 | 148.531203 | −96.064420 |
| −147.545686 | 127.180644 | 145.065103 | −99.104069 |
| −143.990927 | 129.959518 | 141.518683 | −102.075367 |
| −140.352218 | 132.668592 | 137.894299 | −104.976388 |
| −136.632043 | 135.306442 | 134.194319 | −107.805250 |
| −132.832910 | 137.871684 | 130.421119 | −110.560119 |
| −128.957348 | 140.362974 | 126.577081 | −113.239203 |
| −125.007901 | 142.779010 | 122.664594 | −115.840762 |

TABLE 30-continued for projection optical unit 700 of FIG. 7A:
Coordinates of the stop edge

| $x_i$ [mm] | $y_i$ [mm] | $x_{i+N/2}$ [mm] | $y_{i+N/2}$ [mm] |
|---|---|---|---|
| −120.987130 | 145.118527 | 118.686053 | −118.363100 |
| −116.897611 | 147.380305 | 114.643858 | −120.804575 |
| −112.741932 | 149.563162 | 110.540412 | −123.163592 |
| −108.522692 | 151.665958 | 106.378125 | −125.438610 |
| −104.242499 | 153.687596 | 102.159408 | −127.628140 |
| −99.903970 | 155.627019 | 97.886678 | −129.730747 |
| −95.509729 | 157.483214 | 93.562355 | −131.745052 |
| −91.062407 | 159.255208 | 89.188863 | −133.669731 |
| −86.564639 | 160.942072 | 84.768629 | −135.503517 |
| −82.019066 | 162.542920 | 80.304083 | −137.245201 |
| −77.428332 | 164.056910 | 75.797661 | −138.893633 |
| −72.795084 | 165.483242 | 71.251800 | −140.447724 |
| −68.121973 | 166.821162 | 66.668943 | −141.906446 |
| −63.411650 | 168.069961 | 62.051535 | −143.268830 |
| −58.666771 | 169.228972 | 57.402025 | −144.533973 |
| −53.889989 | 170.297578 | 52.722866 | −145.701034 |
| −49.083962 | 171.275207 | 48.016516 | −146.769237 |
| −44.251347 | 172.161333 | 43.285432 | −147.737870 |
| −39.394802 | 172.955479 | 38.532080 | −148.606287 |
| −34.516985 | 173.657215 | 33.758924 | −149.373908 |
| −29.620554 | 174.266162 | 28.968433 | −150.040221 |
| −24.708170 | 174.781987 | 24.163079 | −150.604781 |
| −19.782490 | 175.204412 | 19.345336 | −151.067210 |
| −14.846175 | 175.533204 | 14.517679 | −151.427199 |
| −9.901881 | 175.768184 | 9.682585 | −151.684506 |
| −4.952270 | 175.909223 | 4.842532 | −151.838959 |
| 0.000000 | 175.956245 | 0.000000 | −151.890455 |
| 4.952270 | 175.909223 | −4.842532 | −151.838959 |
| 9.901881 | 175.768184 | −9.682585 | −151.684506 |
| 14.846175 | 175.533204 | −14.517679 | −151.427199 |
| 19.782490 | 175.204412 | −19.345336 | −151.067210 |
| 24.708170 | 174.781987 | −24.163079 | −150.604781 |
| 29.620554 | 174.266162 | −28.968433 | −150.040221 |

TABLE 30-continued for projection optical unit 700 of FIG. 7A:
Coordinates of the stop edge

| $x_i$ [mm] | $y_i$ [mm] | $x_{i+N/2}$ [mm] | $y_{i+N/2}$ [mm] |
|---|---|---|---|
| 34.516985 | 173.657215 | −33.758924 | −149.373908 |
| 39.394802 | 172.955479 | −38.532080 | −148.606287 |
| 44.251347 | 172.161333 | −43.285432 | −147.737870 |
| 49.083962 | 171.275207 | −48.016516 | −146.769237 |
| 53.889989 | 170.297578 | −52.722866 | −145.701034 |
| 58.666771 | 169.228972 | −57.402025 | −144.533973 |
| 63.411650 | 168.069961 | −62.051535 | −143.268830 |
| 68.121973 | 166.821162 | −66.668943 | −141.906446 |
| 72.795084 | 165.483242 | −71.251800 | −140.447724 |
| 77.428332 | 164.056910 | −75.797661 | −138.893633 |
| 82.019066 | 162.542920 | −80.304083 | −137.245201 |
| 86.564639 | 160.942072 | −84.768629 | −135.503517 |
| 91.062407 | 159.255208 | −89.188863 | −133.669731 |
| 95.509729 | 157.483214 | −93.562355 | −131.745052 |
| 99.903970 | 155.627019 | −97.886678 | −129.730747 |
| 104.242499 | 153.687596 | −102.159408 | −127.628140 |
| 108.522692 | 151.665958 | −106.378125 | −125.438610 |
| 112.741932 | 149.563162 | −110.540412 | −123.163592 |
| 116.897611 | 147.380305 | −114.643858 | −120.804575 |
| 120.987130 | 145.118527 | −118.686053 | −118.363100 |
| 125.007901 | 142.779010 | −122.664594 | −115.840762 |
| 128.957348 | 140.362974 | −126.577081 | −113.239203 |
| 132.832910 | 137.871684 | −130.421119 | −110.560119 |
| 136.632043 | 135.306442 | −134.194319 | −107.805250 |
| 140.352218 | 132.668592 | −137.894299 | −104.976388 |
| 143.990927 | 129.959518 | −141.518683 | −102.075367 |
| 147.545686 | 127.180644 | −145.065103 | −99.104069 |
| 151.014034 | 124.333434 | −148.531203 | −96.064420 |
| 154.393538 | 121.419390 | −151.914637 | −92.958386 |
| 157.681794 | 118.440054 | −155.213071 | −89.787977 |
| 160.876433 | 115.397007 | −158.424187 | −86.555242 |
| 163.975121 | 112.291868 | −161.545685 | −83.262269 |
| 166.975565 | 109.126294 | −164.575283 | −79.911183 |
| 169.875514 | 105.901983 | −167.510725 | −76.504144 |
| 172.672766 | 102.620668 | −170.349776 | −73.043349 |
| 175.365168 | 99.284119 | −173.090237 | −69.531026 |

TABLE 30-continued for projection optical unit 700 of FIG. 7A:
Coordinates of the stop edge

| $x_i$ [mm] | $y_i$ [mm] | $x_{i+N/2}$ [mm] | $y_{i+N/2}$ [mm] |
|---|---|---|---|
| 177.950624 | 95.894148 | −175.729936 | −65.969435 |
| 180.427096 | 92.452600 | −178.266742 | −62.360866 |
| 182.792611 | 88.961360 | −180.698565 | −58.707638 |
| 185.045263 | 85.422349 | −183.023360 | −55.012096 |
| 187.183219 | 81.837525 | −185.239135 | −51.276611 |
| 189.204723 | 78.208883 | −187.343951 | −47.503578 |
| 191.108102 | 74.538453 | −189.335933 | −43.695414 |
| 192.891768 | 70.828305 | −191.213270 | −39.854555 |
| 194.554226 | 67.080538 | −192.974223 | −35.983459 |
| 196.094073 | 63.297293 | −194.617129 | −32.084597 |
| 197.510008 | 59.480740 | −196.140410 | −28.160458 |
| 198.800835 | 55.633086 | −197.542571 | −24.213542 |
| 199.965464 | 51.756568 | −198.822213 | −20.246362 |
| 201.002916 | 47.853458 | −199.978031 | −16.261438 |
| 201.912328 | 43.926054 | −201.008825 | −12.261298 |
| 202.692956 | 39.976687 | −201.913497 | −8.248475 |
| 203.344174 | 36.007713 | −202.691064 | −4.225504 |
| 203.865482 | 32.021518 | −203.340653 | −0.194919 |
| 204.256502 | 28.020507 | −203.861511 | 3.840747 |
| 204.516985 | 24.007112 | −204.253004 | 7.878967 |
| 204.646808 | 19.983783 | −204.514621 | 11.917218 |

Design Data for FIG. 8A

TABLE 31 for projection optical unit 800 of FIG. 8A:

| | |
|---|---|
| Numerical Aperture | 0.55 |
| Magnification in x-direction | 0.250 |
| Magnification in y- direction | 0.125 |
| Chief Ray angle | 5.33° |
| Wavelength | 13.5 nm |
| Image field size in x-direction | 26.0 mm |
| Image field size in y-direction | 1.2 mm |
| Average Wavefront-RMS | 8.31 m&lambda |

TABLE 32 for projection optical unit 800 of FIG. 8A:
Radii of Surfaces

| | $Radius_x$ [mm] | $Power_x$ [1/mm] | $Radius_y$ [mm] | $Power_y$ [1/mm] |
|---|---|---|---|---|
| M01 | −2353.18509077 | 0.00081338 | −1470.03122685 | 0.00130204 |
| M02 | 1973.67515594 | −0.00008112 | −62745.91223364 | 0.00000255 |
| M03 | 10608.88422849 | −0.00005041 | −5533.72094487 | 0.00009665 |
| M04 | −2760.08940756 | 0.00071064 | −1836.32252129 | 0.00106812 |
| M05 | 14583.85631299 | −0.00002569 | −27412.76998179 | 0.00001367 |
| M06 | −2014421.56157814 | 0.00000011 | −20309.33883668 | 0.00001095 |
| M07 | 1143.83203545 | −0.00173045 | 447.76549633 | −0.00442049 |
| M08 | −796.21541131 | 0.00247560 | −742.49157078 | 0.00265473 |

TABLE 33 for projection optical unit 800 of FIG. 8A:
Decentring (location, angle) of surfaces

| | $D_x$ [mm] | $D_y$ [mm] | $D_z$ [mm] |
|---|---|---|---|
| Reticle | 0.000000000 | 0.000000000 | 0.000000000 |
| M01 | 0.000000000 | 144.250856906 | 1540.361338792 |
| M02 | 0.000000000 | 537.764444131 | 713.151288989 |
| M03 | 0.000000000 | 1111.209624162 | 258.338414196 |
| M04 | 0.000000000 | 2890.190949188 | −197.396822696 |
| M05 | 0.000000000 | 2111.271259947 | 484.707360267 |
| M06 | 0.000000000 | 1856.703416123 | 893.470451342 |
| M07 | 0.000000000 | 1515.941078855 | 2002.463804120 |
| Stop | 0.000000000 | 1557.785521731 | 1869.222397640 |

TABLE 33-continued for projection optical unit 800 of FIG. 8A:
Decentring (location, angle) of surfaces

| | | | |
|---|---|---|---|
| M08 | 0.000000000 | 1693.863965847 | 1435.920337926 |
| Wafer | 0.000000000 | 1693.884277930 | 2122.838786550 |

| | $\alpha_x$ [°] | $\alpha_y$ [°] | $\alpha_z$ [°] |
|---|---|---|---|
| Reticle | 0.000000000 | 0.000000000 | 0.000000000 |
| M01 | 10.045493065 | 0.000000000 | 0.000000000 |
| M02 | −51.488888806 | 180.000000000 | 0.000000000 |
| M03 | 153.606174816 | 0.000000000 | 0.000000000 |
| M04 | 62.211151880 | 180.000000000 | 0.000000000 |
| M05 | 130.352425781 | 0.000000000 | 0.000000000 |
| M06 | −65.502812866 | 180.000000000 | 0.000000000 |
| M07 | 17.257801350 | 0.000000000 | 0.000000000 |
| Stop | 1.421814519 | 180.000000000 | 0.000000000 |
| M08 | 8.716596932 | 180.000000000 | 0.000000000 |
| Wafer | −0.001694228 | 0.000000000 | 0.000000000 |

TABLE 34 for projection optical unit 800 of FIG. 8A:
Free form coefficients of surfaces

| Coefficient | Formular | M01 | M02 | M03 |
|---|---|---|---|---|
| C7 | $x^2 y$ | −4.0059115432e−10 | −9.8528583278e−08 | 9.3248417733e−08 |
| C9 | $y^3$ | 8.0891942530e−08 | 1.1407247884e−07 | −4.6461617193e−08 |
| C10 | $x^4$ | 4.5770816360e−11 | 1.1868269127e−10 | −4.7808433532e−11 |
| C12 | $x^2 y^2$ | 8.2295384818e−12 | 1.1070170122e−10 | 4.8189922001e−11 |
| C14 | $y^4$ | −1.8350188196e−10 | 1.1018643928e−10 | 1.2323628994e−11 |
| C16 | $x^4 y$ | −3.6219008934e−14 | −4.4012064098e−13 | 1.1580527310e−14 |
| C18 | $x^2 y^3$ | 1.1681748470e−14 | −2.2401658495e−13 | −6.2005641805e−14 |
| C20 | $y^5$ | 6.2180029449e−13 | 7.0596277061e−13 | 1.4706857502e−15 |
| C21 | $x^6$ | 1.1434401190e−16 | 3.6695339472e−16 | −1.9191867545e−16 |
| C23 | $x^4 y^2$ | 1.0582989016e−16 | 8.7401337330e−16 | 1.2736606516e−16 |
| C25 | $x^2 y^4$ | 5.0780683478e−16 | 1.7626183018e−15 | −4.6256015537e−17 |
| C27 | $y^6$ | −4.5012373355e−16 | 3.4628444607e−15 | −1.6603773327e−17 |
| C29 | $x^6 y$ | −1.8359959429e−20 | −2.3929592888e−18 | −2.7021060026e−19 |
| C31 | $x^4 y^3$ | 8.1671738729e−19 | −3.1545270438e−18 | 5.4842627744e−20 |
| C33 | $x^2 y$ | 2.3098734113e−18 | 4.2005939739e−18 | 1.4333668261e−19 |
| C35 | $y^7$ | −5.2926669704e−18 | 1.4604003879e−17 | −4.7255473589e−19 |
| C36 | $x^8$ | 1.0853196021e−22 | 5.6900373647e−22 | −4.4029034743e−22 |
| C38 | $x^6 y^2$ | 1.3181829294e−22 | 8.2580698255e−21 | 1.1002380446e−22 |
| C40 | $x^4 y^4$ | −1.3153803835e−21 | 1.9181618509e−20 | 1.3308049519e−21 |
| C42 | $x^2 y^6$ | −4.6497279103e−20 | 5.4777484320e−20 | 5.1804538976e−21 |
| C44 | $y^8$ | 2.5690758849e−20 | −1.3840049968e−20 | 2.0900767760e−21 |
| C46 | $x^8 y$ | −3.4095970425e−25 | 5.4298483306e−25 | 1.2803679480e−24 |
| C48 | $x^6 y^3$ | 2.8980061492e−24 | −2.8475885603e−23 | 2.4068351043e−24 |
| C50 | $x^4 y^5$ | −3.1884737678e−23 | 4.0972457476e−23 | −1.6837816672e−23 |
| C52 | $x^2 y^7$ | 1.5927653638e−22 | 1.5805113802e−22 | −2.3059492478e−23 |
| C54 | $y^9$ | 1.2758741377e−21 | 3.1764095019e−23 | 1.9220197963e−23 |
| C55 | $x^{10}$ | −2.8940432267e−27 | 1.9718691754e−26 | −8.6587256497e−28 |
| C57 | $x^8 y^2$ | −1.2208056467e−26 | −8.1603235819e−27 | −2.5566299695e−27 |
| C59 | $x^6 y^4$ | −6.1925309190e−26 | 4.6823503098e−26 | −3.5941582470e−26 |
| C61 | $x^4 y^6$ | 1.1601214200e−24 | −5.2400290798e−25 | −1.9264105284e−25 |
| C63 | $x^2 y^8$ | 9.3676039663e−24 | −1.5226726600e−25 | −3.3733862125e−25 |
| C65 | $y^{10}$ | −8.7051841220e−24 | 3.6907239073e−24 | 1.8925582853e−26 |
| C67 | $x^{10} y$ | 2.3822614711e−29 | −5.8111373527e−28 | −6.8667735759e−29 |
| C69 | $x^8 y^3$ | 1.0560337414e−28 | 3.2596790860e−28 | −2.3460880089e−28 |
| C71 | $x^6 y^5$ | 1.3411467126e−27 | 5.6096350577e−28 | 4.6880475961e−28 |
| C73 | $x^4 y^7$ | 1.6456911379e−26 | −1.3015042016e−27 | 2.5906776270e−27 |
| C75 | $x^2 y^9$ | −3.7678617268e−26 | 1.6875519917e−27 | 1.4463995091e−27 |
| C77 | $y^{11}$ | −2.9743688452e−26 | 7.0215865076e−27 | −2.3598964024e−28 |
| C78 | $x^{12}$ | 9.0841031766e−32 | 1.7180455603e−31 | −3.7509134857e−32 |
| C80 | $x^{10} y^2$ | −1.8892283096e−31 | 2.4641923146e−30 | 1.0177203436e−31 |
| C82 | $x^8 y^4$ | −1.2831073321e−30 | −8.0974837835e−30 | 2.1153324820e−31 |
| C84 | $x^6 y^6$ | −3.1009569686e−29 | 1.0269953073e−29 | 1.1627056886e−30 |
| C86 | $x^4 y^8$ | −4.8800952567e−28 | 7.2340581188e−29 | 7.0657535618e−30 |
| C88 | $x^2 y^{10}$ | −1.2769264338e−27 | 1.1956773634e−29 | 8.1814313771e−30 |
| C90 | $y^{12}$ | −6.8754493558e−29 | −1.5742324181e−28 | −1.0316174859e−30 |
| C92 | $x^{12} y$ | −1.1855488031e−34 | 2.6530873612e−33 | 1.1608434431e−33 |
| C94 | $x^{10} y^3$ | −5.4978309788e−34 | −5.1689425063e−32 | 8.4156544481e−33 |
| C96 | $x^8 y^5$ | −1.9677252877e−32 | −1.3246789175e−31 | 5.3144989301e−33 |
| C98 | $x^6 y^7$ | −5.3522978021e−31 | 1.9403962249e−32 | −6.6107727823e−32 |
| C100 | $x^4 y^9$ | −2.1037340536e−30 | 1.2888890214e−31 | −1.5189848556e−31 |
| C102 | $x^2 y^{11}$ | 1.6688213938e−30 | −2.2060381328e−31 | −5.9684058237e−32 |
| C104 | $y^{13}$ | −4.1919512816e−31 | −9.9648658312e−31 | −6.0780204645e−33 |
| C105 | $x^{14}$ | −1.8742111910e−36 | −1.5003321055e−36 | 5.6338285471e−37 |
| C107 | $x^{12} y^2$ | 1.4744630615e−35 | 1.4937493894e−35 | −4.6926353832e−36 |
| C109 | $x^{10} y^4$ | 1.6686659334e−34 | 6.1699104316e−34 | −1.9290028848e−35 |
| C111 | $x^8 y^6$ | 9.4753648641e−34 | 1.0890964059e−33 | 4.4393595579e−35 |
| C113 | $x^6 y^8$ | 1.0514591645e−32 | −6.9914282998e−34 | 2.2665511078e−34 |
| C115 | $x^4 y^{10}$ | 6.7563863426e−32 | −2.4147929226e−33 | 2.6532701632e−34 |

TABLE 34-continued for projection optical unit 800 of FIG. 8A:
Free form coefficients of surfaces

| | | | | |
|---|---|---|---|---|
| C117 | $x^2 y^{12}$ | 1.1220705917e−31 | −4.0082035413e−35 | 1.1202324904e−34 |
| C119 | $y^{14}$ | 5.2085265740e−32 | 2.6780470616e−33 | 4.6859995368e−35 |
| C121 | $x^{14} y$ | −1.3947646746e−40 | 2.7774551451e−38 | −7.6982725707e−39 |
| C123 | $x^{12} y^3$ | 2.9296158199e−38 | 7.6228824658e−37 | −9.2787098007e−38 |
| C125 | $x^{10} y^5$ | 4.8191101824e−37 | 2.7288430253e−36 | −2.9227582708e−37 |
| C127 | $x^8 y^7$ | 9.0670418741e−36 | 2.1686657873e−36 | 3.0203052634e−38 |
| C129 | $x^6 y^9$ | 6.3392016100e−35 | −2.5666915297e−36 | 9.8756213195e−37 |
| C131 | $x^4 y^{11}$ | 1.2433426620e−34 | −1.3845057146e−36 | 1.6094176155e−36 |
| C133 | $x^2 y^{13}$ | 7.8364413621e−35 | 1.1508245987e−35 | −8.5765691800e−38 |
| C135 | $y^{15}$ | 3.9737051436e−35 | 2.3727067782e−35 | 5.8634324230e−38 |
| C136 | $x^{16}$ | 2.1285708898e−41 | −4.7054301707e−41 | −9.0534848836e−43 |
| C138 | $x^{14} y^2$ | −2.8266412852e−40 | −5.3827998165e−40 | 5.9026980261e−41 |
| C140 | $x^{12} y^4$ | −4.7042590614e−39 | −9.0887430351e−39 | 5.1826993972e−40 |
| C142 | $x^{10} y^6$ | −2.7238388339e−38 | −2.5249046217e−38 | 6.9364957107e−40 |
| C144 | $x^8 y^8$ | −1.7860515111e−37 | −1.4827259485e−38 | −1.2021253960e−39 |
| C146 | $x^6 y^{10}$ | −1.1508803951e−36 | 1.7772089728e−38 | −4.2042066603e−39 |
| C148 | $x^4 y^{12}$ | −4.3393286484e−36 | 4.0559254915e−38 | −4.5024586738e−39 |
| C150 | $x^2 y^{14}$ | −5.8611110830e−36 | 3.4728240415e−38 | 1.1021391008e−40 |
| C152 | $y^{16}$ | −3.3892195998e−36 | 4.3296212582e−38 | −3.6958714935e−40 |
| C154 | $x^{16} y$ | −1.2925036159e−45 | 0.0000000000e+00 | 0.0000000000e+00 |
| C156 | $x^{14} y^3$ | −4.4714287160e−43 | 0.0000000000e+00 | 0.0000000000e+00 |
| C158 | $x^{12} y^5$ | −6.1712733275e−42 | 0.0000000000e+00 | 0.0000000000e+00 |
| C160 | $x^{10} y^7$ | −8.5453128697e−41 | 0.0000000000e+00 | 0.0000000000e+00 |
| C162 | $x^8 y^9$ | −5.1333868087e−40 | 0.0000000000e+00 | 0.0000000000e+00 |
| C164 | $x^6 y^{11}$ | −2.3908219552e−39 | 0.0000000000e+00 | 0.0000000000e+00 |
| C166 | $x^4 y^{13}$ | −1.7517425140e−39 | 0.0000000000e+00 | 0.0000000000e+00 |
| C168 | $x^2 y^{15}$ | −7.3130392854e−39 | 0.0000000000e+00 | 0.0000000000e+00 |
| C170 | $y^{17}$ | 3.6471651065e−39 | 0.0000000000e+00 | 0.0000000000e+00 |
| C171 | $x^{18}$ | −9.7570230254e−47 | 0.0000000000e+00 | 0.0000000000e+00 |
| C173 | $x^{16} y^2$ | 1.7253794975e−45 | 0.0000000000e+00 | 0.0000000000e+00 |
| C175 | $x^{14} y^4$ | 3.9252476863e−44 | 0.0000000000e+00 | 0.0000000000e+00 |
| C177 | $x^{12} y^6$ | 2.8356820694e−43 | 0.0000000000e+00 | 0.0000000000e+00 |
| C179 | $x^{10} y^8$ | 1.6315336561e−42 | 0.0000000000e+00 | 0.0000000000e+00 |
| C181 | $x^8 y^{10}$ | 8.8647907278e−42 | 0.0000000000e+00 | 0.0000000000e+00 |
| C183 | $x^6 y^{12}$ | 4.1606048151e−41 | 0.0000000000e+00 | 0.0000000000e+00 |
| C185 | $x^4 y^{14}$ | 9.7787962384e−41 | 0.0000000000e+00 | 0.0000000000e+00 |
| C187 | $x^2 y^{16}$ | 1.4659596257e−40 | 0.0000000000e+00 | 0.0000000000e+00 |
| C189 | $y^{18}$ | 4.5429779474e−41 | 0.0000000000e+00 | 0.0000000000e+00 |

| Coefficient | Formular | M04 | M05 | M06 |
|---|---|---|---|---|
| C7 | $x^2 y$ | 4.2976128008e−09 | −8.4721247266e−08 | 3.2559812326e−08 |
| C9 | $y^3$ | 1.6399728434e−07 | −1.9350411901e−08 | −1.8491510018e−08 |
| C10 | $x^4$ | 7.5477922263e−13 | 2.6263100265e−12 | 6.1496968703e−11 |
| C12 | $x^2 y^2$ | 1.9030164590e−11 | −1.1582036123e−10 | −2.7929091473e−11 |
| C14 | $y^4$ | −4.4816461964e−10 | 5.8552323513e−11 | −3.9058953587e−11 |
| C16 | $x^4 y$ | 7.1415669162e−15 | 2.8379754825e−16 | 1.6540377106e−14 |
| C18 | $x^2 y^3$ | −7.8222159788e−15 | −1.3332039251e−13 | −5.8669388442e−14 |
| C20 | $y^5$ | 1.3607541627e−12 | 2.1423774057e−13 | −8.8401079945e−14 |
| C21 | $x^6$ | 1.5724050029e−18 | −1.6956474433e−16 | −1.0547082495e−15 |
| C23 | $x^4 y^2$ | −5.7690175797e−18 | 3.6535111096e−17 | −3.6115132158e−16 |
| C25 | $x^2 y^4$ | −1.1605397348e−17 | −3.4552540902e−16 | −3.2208239930e−16 |
| C27 | $y^6$ | −2.8288275301e−15 | 6.6902997154e−16 | −1.2511715438e−16 |
| C29 | $x^6 y$ | 5.1337391035e−21 | −1.5095081092e−18 | −3.6422935048e−17 |
| C31 | $x^4 y^3$ | 4.0692212644e−20 | −4.8461035153e−19 | −1.0032921889e−18 |
| C33 | $x^2 y^5$ | 2.3849423414e−18 | −1.4719760677e−18 | −5.5535732062e−19 |
| C35 | $y^7$ | 2.2876004513e−18 | 1.7965603386e−18 | −8.0931363711e−20 |
| C36 | $x^8$ | 1.5427191208e−24 | −4.6734351121e−21 | 2.5218548097e−19 |
| C38 | $x^6 y^2$ | −4.8329271920e−23 | −8.0787879400e−21 | 1.9321765511e−19 |
| C40 | $x^4 y^4$ | −6.6176792110e−22 | 3.7375381514e−20 | 1.3233786672e−20 |
| C42 | $x^2 y^6$ | −9.3808675869e−21 | −6.5688435878e−21 | 1.6808564734e−21 |
| C44 | $y^8$ | 5.9741515849e−19 | 6.8873405681e−21 | −3.1240882156e−21 |
| C46 | $x^8 y$ | −4.0180795691e−26 | 1.1342724045e−23 | 3.0864397333e−20 |
| C48 | $x^6 y^3$ | −1.7011816597e−24 | 5.7689726822e−23 | −2.7658496333e−22 |
| C50 | $x^4 y^5$ | −1.4983857203e−23 | 7.2740796822e−23 | 1.3128634371e−22 |
| C52 | $x^2 y^7$ | 1.4226500274e−22 | −1.3400063282e−23 | 1.7136973176e−24 |
| C54 | $y^9$ | −3.8435800315e−21 | 1.3258785709e−22 | −1.7933288366e−23 |
| C55 | $x^{10}$ | 1.9858556431e−29 | 1.2766086903e−25 | −1.9706712299e−22 |
| C57 | $x^8 y^2$ | 5.2508811113e−28 | 7.6951828924e−25 | −1.0170431589e−22 |
| C59 | $x^6 y^4$ | 2.1984385954e−26 | 4.6402289184e−25 | −8.4357039958e−24 |
| C61 | $x^4 y^6$ | 2.9174164467e−25 | −1.4598383159e−25 | 2.6874112292e−25 |
| C63 | $x^2 y^8$ | −4.8450497710e−24 | 3.2852643857e−25 | −7.3534405345e−26 |
| C65 | $y^{10}$ | −9.1999124033e−23 | 1.1420183220e−24 | 2.4609028572e−26 |
| C67 | $x^{10} y$ | 5.5197836208e−31 | 1.1931849928e−27 | −1.3767613643e−23 |
| C69 | $x^8 y^3$ | 4.3225638935e−29 | 1.5945256288e−27 | 2.6617314077e−25 |
| C71 | $x^6 y^5$ | 7.3371605266e−28 | −4.6095257248e−27 | −4.6728851084e−26 |
| C73 | $x^4 y^7$ | 3.0182344874e−27 | −5.1467873298e−27 | −1.1460185058e−27 |

TABLE 34-continued for projection optical unit 800 of FIG. 8A:
Free form coefficients of surfaces

| | | | | |
|---|---|---|---|---|
| C75 | $x^2 y^9$ | −1.2473989454e−26 | 2.0389267256e−27 | −2.0007382256e−28 |
| C77 | $y^{11}$ | 9.2555180421e−25 | −1.7445301156e−28 | 6.0479928643e−28 |
| C78 | $x^{12}$ | −2.6949571260e−34 | −3.6954090523e−30 | 9.2196674509e−26 |
| C80 | $x^{10} y^2$ | −2.5214037132e−33 | −2.9716068254e−29 | 3.6256501908e−26 |
| C82 | $x^8 y^4$ | −1.5424497393e−31 | −3.7997478028e−29 | 4.5540652048e−27 |
| C84 | $x^6 y^6$ | −5.8653002683e−30 | −2.5152039288e−29 | −3.4869248731e−28 |
| C86 | $x^4 y^8$ | −5.6787910670e−29 | −9.8033561171e−30 | 8.1484624125e−30 |
| C88 | $x^2 y^{10}$ | 8.7426444451e−28 | −1.7612913184e−29 | 1.4552154751e−30 |
| C90 | $y^{12}$ | 8.7178688186e−27 | −6.6031561170e−29 | 2.7807446305e−30 |
| C92 | $x^{12} y$ | −4.9486290336e−36 | −9.0229807336e−32 | 3.0160477707e−27 |
| C94 | $x^{10} y^3$ | −5.6109539293e−34 | −2.9455415390e−31 | −7.0573180575e−29 |
| C96 | $x^8 y^5$ | −1.4675191908e−32 | −9.4408810960e−32 | 1.5460209155e−29 |
| C98 | $x^6 y^7$ | −1.2443693800e−31 | 2.7819608974e−31 | −1.5751489916e−30 |
| C100 | $x^4 y^9$ | −4.2679832736e−31 | 1.3465219616e−31 | 1.3828126962e−31 |
| C102 | $x^2 y^{11}$ | −3.0062505961e−31 | −2.5305117513e−31 | 1.0563656730e−32 |
| C104 | $y^{13}$ | −1.2817122333e−28 | −4.9044875249e−31 | 6.7092305744e−33 |
| C105 | $x^{14}$ | 2.8100623101e−39 | 7.5744804666e−35 | −2.0772264830e−29 |
| C107 | $x^{12} y^2$ | −1.3111378826e−38 | 2.3395431083e−35 | −8.1647876933e−30 |
| C109 | $x^{10} y^4$ | −1.6326631935e−36 | −2.2358998140e−34 | −8.7452658144e−31 |
| C111 | $x^8 y^6$ | 1.7859581533e−35 | 8.0857524485e−34 | 6.0189071070e−32 |
| C113 | $x^6 y^8$ | 8.3048777075e−34 | 2.7587702950e−33 | −3.1984547552e−33 |
| C115 | $x^4 y^{10}$ | 6.2176098172e−33 | 7.2147714905e−34 | 5.6881749232e−34 |
| C117 | $x^2 y^{12}$ | −8.0286447187e−32 | −1.1786600241e−33 | 2.7996729050e−35 |
| C119 | $y^{14}$ | −3.7568917952e−31 | −1.7175006116e−33 | 9.3565076415e−36 |
| C121 | $x^{14} y$ | 2.2746406372e−41 | 1.6722560947e−36 | −2.5223142310e−31 |
| C123 | $x^{12} y^3$ | 3.6348346328e−39 | 5.2381577828e−36 | 4.0996325606e−33 |
| C125 | $x^{10} y^5$ | 1.3730079748e−37 | 1.1629843985e−36 | −1.3816318235e−33 |
| C127 | $x^8 y^7$ | 1.6840494545e−36 | 4.5693363911e−36 | 1.9271121788e−34 |
| C129 | $x^6 y^9$ | 9.4427974322e−36 | 8.6668275684e−36 | −2.8932760638e−36 |
| C131 | $x^4 y^{11}$ | 3.7666987798e−35 | 1.1179085609e−36 | 9.8981996853e−37 |
| C133 | $x^2 y^{13}$ | 1.3180785553e−34 | −2.4846452556e−36 | 3.4922519339e−38 |
| C135 | $y^{15}$ | 9.6952465355e−33 | −3.0668577167e−36 | 7.1474857753e−39 |
| C136 | $x^{16}$ | −1.8523929465e−44 | −5.3366426688e−40 | 1.7245149977e−33 |
| C138 | $x^{14} y^2$ | 1.4815100640e−43 | 1.0320329665e−38 | 8.5926964041e−34 |
| C140 | $x^{12} y^4$ | 2.9886202644e−41 | 9.3911039809e−39 | 3.2057415698e−35 |
| C142 | $x^{10} y^6$ | 4.8419727330e−40 | 1.1855251021e−39 | 4.6610701628e−38 |
| C144 | $x^8 y^8$ | −1.2249331147e−39 | 6.9915920999e−39 | 2.1059697474e−37 |
| C146 | $x^6 y^{10}$ | −6.3176565026e−38 | 9.4498033079e−39 | −1.0794967322e−39 |
| C148 | $x^4 y^{12}$ | −4.2770877313e−37 | 2.2401449304e−40 | 6.4146236782e−40 |
| C150 | $x^2 y^{14}$ | 3.2302040197e−36 | −1.9892807033e−39 | 1.7092370308e−41 |
| C152 | $y^{16}$ | −1.2369634335e−35 | −2.2556737669e−39 | 2.3201040390e−42 |
| C154 | $x^{16} y$ | −3.9204698077e−47 | 0.0000000000e+00 | 0.0000000000e+00 |
| C156 | $x^{14} y^3$ | −8.8689687444e−45 | 0.0000000000e+00 | 0.0000000000e+00 |
| C158 | $x^{12} y^5$ | −4.7424409364e−43 | 0.0000000000e+00 | 0.0000000000e+00 |
| C160 | $x^{10} y^7$ | −8.2835386400e−42 | 0.0000000000e+00 | 0.0000000000e+00 |
| C162 | $x^8 y^9$ | −6.0038203718e−41 | 0.0000000000e+00 | 0.0000000000e+00 |
| C164 | $x^6 y^{11}$ | −3.0426219154e−40 | 0.0000000000e+00 | 0.0000000000e+00 |
| C166 | $x^4 y^{13}$ | −1.4967652886e−39 | 0.0000000000e+00 | 0.0000000000e+00 |
| C168 | $x^2 y^{15}$ | −8.6261859587e−39 | 0.0000000000e+00 | 0.0000000000e+00 |
| C170 | $y^{17}$ | −2.8663519501e−37 | 0.0000000000e+00 | 0.0000000000e+00 |
| C171 | $x^{18}$ | 4.9500422895e−50 | 0.0000000000e+00 | 0.0000000000e+00 |
| C173 | $x^{16} y^2$ | −2.6676630911e−49 | 0.0000000000e+00 | 0.0000000000e+00 |
| C175 | $x^{14} y^4$ | −1.1628501361e−46 | 0.0000000000e+00 | 0.0000000000e+00 |
| C177 | $x^{12} y^6$ | −3.4080983750e−45 | 0.0000000000e+00 | 0.0000000000e+00 |
| C179 | $x^{10} y^8$ | −2.9678397842e−44 | 0.0000000000e+00 | 0.0000000000e+00 |
| C181 | $x^8 y^{10}$ | 7.8803192184e−44 | 0.0000000000e+00 | 0.0000000000e+00 |
| C183 | $x^6 y^{12}$ | 2.1039763373e−42 | 0.0000000000e+00 | 0.0000000000e+00 |
| C185 | $x^4 y^{14}$ | 1.4107255693e−41 | 0.0000000000e+00 | 0.0000000000e+00 |
| C187 | $x^2 y^{16}$ | −1.6619154849e−41 | 0.0000000000e+00 | 0.0000000000e+00 |
| C189 | $y^{18}$ | 1.0923192488e−39 | 0.0000000000e+00 | 0.0000000000e+00 |

| Coefficient | Formular | M07 | M08 |
|---|---|---|---|
| C7 | $x^2 y$ | −1.5543693630e−06 | 2.4103020012e−08 |
| C9 | $y^3$ | −1.0737073011e−06 | 6.1769280966e−09 |
| C10 | $x^4$ | 1.5568619090e−09 | −2.9108003221e−11 |
| C12 | $x^2 y^2$ | 7.7231086542e−09 | −7.6772118406e−11 |
| C14 | $y^4$ | 7.6755963510e−09 | −3.8588343897e−11 |
| C16 | $x^4 y$ | −1.0236346382e−11 | 4.2763149173e−14 |
| C18 | $x^2 y^3$ | −3.3692865233e−11 | 6.0148866826e−14 |
| C20 | $y^5$ | −1.9945434920e−11 | 1.5974446510e−14 |
| C21 | $x^6$ | 7.3020823490e−15 | −5.6598045628e−17 |
| C23 | $x^4 y^2$ | 8.5867803799e−14 | −2.0795247703e−16 |
| C25 | $x^2 y^4$ | 1.9452636563e−13 | −2.3170200348e−16 |
| C27 | $y^6$ | 1.7982120989e−13 | −8.8202856878e−17 |
| C29 | $x^6 y$ | −9.3305728924e−17 | 7.0591601997e−20 |
| C31 | $x^4 y^3$ | −5.7960281555e−16 | 1.7494039912e−19 |

TABLE 34-continued for projection optical unit 800 of FIG. 8A:
Free form coefficients of surfaces

| | | | |
|---|---|---|---|
| C33 | $x^2 y^5$ | −1.1000790009e−15 | 1.2909943186e−19 |
| C35 | $y^7$ | −4.6008853587e−16 | 2.1810900643e−20 |
| C36 | $x^8$ | 5.4342574101e−20 | −9.4170252704e−23 |
| C38 | $x^6 y^2$ | 1.0392494090e−18 | −4.5827851146e−22 |
| C40 | $x^4 y^4$ | 4.3986512828e−18 | −7.8371974930e−22 |
| C42 | $x^2 y^6$ | 7.6513245026e−18 | −6.2169501356e−22 |
| C44 | $y^8$ | 3.2599798561e−18 | −1.5044359069e−22 |
| C46 | $x^8 y$ | −8.9100470789e−22 | 1.1749302257e−25 |
| C48 | $x^6 y^3$ | −9.3980821951e−21 | 4.2113135902e−25 |
| C50 | $x^4 y^5$ | −3.2593595273e−20 | 4.9662321789e−25 |
| C52 | $x^2 y^7$ | −4.0957128868e−20 | 2.7863533945e−25 |
| C54 | $y^9$ | −2.8670488876e−20 | 7.0393438493e−26 |
| C55 | $x^{10}$ | 5.8040655545e−25 | −1.7680202369e−28 |
| C57 | $x^8 y^2$ | 1.4219977408e−23 | −1.0528490090e−27 |
| C59 | $x^6 y^4$ | 8.6975706852e−23 | −2.3978487001e−27 |
| C61 | $x^4 y^6$ | 1.9532521221e−22 | −2.5997215751e−27 |
| C63 | $x^2 y^8$ | 1.1136271310e−22 | −1.1785238811e−27 |
| C65 | $y^{10}$ | 3.2279082977e−22 | −3.4230665177e−28 |
| C67 | $x^{10} y$ | −1.8887082592e−26 | 2.1811796914e−31 |
| C69 | $x^8 y^3$ | −2.0696463615e−25 | 8.6773238689e−31 |
| C71 | $x^6 y^5$ | −7.4626404354e−25 | 1.6587420220e−30 |
| C73 | $x^4 y^7$ | −8.3801643630e−25 | 1.7758588650e−30 |
| C75 | $x^2 y^9$ | −2.8088505380e−25 | 4.8191768045e−31 |
| C77 | $y^{11}$ | −8.7698133959e−25 | 2.4329776228e−31 |
| C78 | $x^{12}$ | −1.0999078215e−30 | −9.0886368951e−35 |
| C80 | $x^{10} y^2$ | 1.9764717083e−28 | −4.2538792169e−34 |
| C82 | $x^8 y^4$ | 1.8284401583e−27 | −1.2325632073e−33 |
| C84 | $x^6 y^6$ | 9.4085348987e−27 | −3.4797245150e−33 |
| C86 | $x^4 y^8$ | 2.5572621660e−26 | −5.6867848162e−33 |
| C88 | $x^2 y^{10}$ | 4.9111856328e−26 | −4.5999915085e−33 |
| C90 | $y^{12}$ | 2.5838514486e−27 | −4.8182873417e−34 |
| C92 | $x^{12} y$ | 2.2877422511e−31 | 5.3509148799e−37 |
| C94 | $x^{10} y^3$ | 1.6472011059e−30 | 3.5712174429e−36 |
| C96 | $x^8 y^5$ | −1.1266338435e−29 | 6.7295415380e−36 |
| C98 | $x^6 y^7$ | −1.1498992451e−28 | 4.5521755022e−36 |
| C100 | $x^4 y^9$ | −3.7977718834e−28 | 6.5193257757e−38 |
| C102 | $x^2 y^{11}$ | −4.9928062120e−28 | 3.0791652535e−36 |
| C104 | $y^{13}$ | −8.4950741805e−29 | −5.2317697327e−37 |
| C105 | $x^{14}$ | 2.8594346904e−34 | −1.5682511105e−39 |
| C107 | $x^{12} y^2$ | −1.2065391470e−33 | −1.4324541281e−38 |
| C109 | $x^{10} y^4$ | 1.9042355621e−33 | −5.2095750241e−38 |
| C111 | $x^8 y^6$ | −2.0743409085e−32 | −9.3255433895e−38 |
| C113 | $x^6 y^8$ | −3.8777435449e−31 | −8.4789602855e−38 |
| C115 | $x^4 y^{10}$ | −1.0976016177e−30 | −3.1566868276e−38 |
| C117 | $x^2 y^{12}$ | −2.5471636403e−30 | −2.2092444458e−40 |
| C119 | $y^{14}$ | −2.7123217883e−32 | −3.4211959420e−40 |
| C121 | $x^{14} y$ | −1.1410098730e−35 | −9.3595868924e−43 |
| C123 | $x^{12} y^3$ | −2.1104396299e−34 | −6.3207822622e−42 |
| C125 | $x^{10} y^5$ | −8.6716705420e−34 | −1.2627019157e−41 |
| C127 | $x^8 y^7$ | 1.3071876078e−33 | 2.9160014765e−42 |
| C129 | $x^6 y^9$ | 1.7562153994e−32 | 1.8584133297e−41 |
| C131 | $x^4 y^{11}$ | 4.3325600631e−32 | 2.6485094631e−41 |
| C133 | $x^2 y^{13}$ | 4.0564313699e−32 | 2.5573606120e−42 |
| C135 | $y^{15}$ | −1.6568587771e−34 | 6.5970689238e−42 |
| C136 | $x^{16}$ | −4.8262692018e−39 | 3.6290990137e−45 |
| C138 | $x^{14} y^2$ | 2.3988578901e−37 | 3.7910928570e−44 |
| C140 | $x^{12} y^4$ | 2.6115505140e−36 | 1.6559616710e−43 |
| C142 | $x^{10} y^6$ | 1.2591162772e−35 | 3.7434301834e−43 |
| C144 | $x^8 y^8$ | 3.2083597540e−35 | 4.5532463977e−43 |
| C146 | $x^6 y^{10}$ | 6.0208760434e−35 | 2.9611756479e−43 |
| C148 | $x^4 y^{12}$ | 9.7852762241e−35 | 6.7485222868e−44 |
| C150 | $x^2 y^{14}$ | 1.8330012170e−34 | −1.3280412846e−44 |
| C152 | $y^{16}$ | 1.0723637032e−34 | −8.1860602572e−45 |
| C154 | $x^{16} y$ | 7.9245800701e−41 | 5.2362929884e−48 |
| C156 | $x^{14} y^3$ | 1.5073998009e−39 | 3.5554124054e−47 |
| C158 | $x^{12} y^5$ | −2.7099890169e−40 | 1.1669546065e−46 |
| C160 | $x^{10} y^7$ | −1.0746964499e−37 | 1.7500249184e−46 |
| C162 | $x^8 y^9$ | −8.1541868955e−37 | 1.7594384262e−46 |
| C164 | $x^6 y^{11}$ | −2.6934231610e−36 | 1.3083882133e−46 |
| C166 | $x^4 y^{13}$ | −4.4256307603e−36 | 3.6145150726e−47 |
| C168 | $x^2 y^{15}$ | −3.5410439167e−36 | 1.1510616108e−47 |
| C170 | $y^{17}$ | −9.0790475418e−37 | −1.2291396420e−47 |
| C171 | $x^{18}$ | 4.8997934907e−44 | −8.3647085493e−51 |
| C173 | $x^{16} y^2$ | −2.5639462991e−42 | −9.9706804591e−50 |
| C175 | $x^{14} y^4$ | −2.6881775576e−41 | −4.8484241552e−49 |
| C177 | $x^{12} y^6$ | −6.5360388167e−41 | −1.3173692320e−48 |
| C179 | $x^{10} y^8$ | 5.2584322264e−40 | −2.1773359117e−48 |

TABLE 34-continued for projection optical unit 800 of FIG. 8A:
Free form coefficients of surfaces

| | | | |
|---|---|---|---|
| C181 | $x^8 y^{10}$ | 4.3186506801e-39 | -2.1765069762e-48 |
| C183 | $x^6 y^{12}$ | 1.2681371676e-38 | -1.4035306109e-48 |
| C185 | $x^4 y^{14}$ | 1.8089796604e-38 | -5.4481956075e-49 |
| C187 | $x^2 y^{16}$ | 1.1406293050e-38 | -1.1984484181e-49 |
| C189 | $y^{18}$ | 2.4634383811e-39 | 2.7120474752e-51 |

TABLE 35 for projection optical unit 800 of FIG. 8A:
Coordinates of the stop edge

| $x_i$ [mm] | $y_i$ [mm] | $x_{i+N/2}$ [mm] | $y_{i+N/2}$ [mm] |
|---|---|---|---|
| -222.334185 | 7.352106 | 222.334185 | 7.352106 |
| -221.396734 | 0.394465 | 222.962920 | 14.358886 |
| -220.158646 | -6.499245 | 223.276074 | 21.399499 |
| -218.628044 | -13.314266 | 223.269709 | 28.457417 |
| -216.814638 | -20.037350 | 222.940319 | 35.515934 |
| -214.730220 | -26.657228 | 222.285128 | 42.558369 |
| -212.386722 | -33.162766 | 221.305756 | 49.568217 |
| -209.796103 | -39.542910 | 220.005457 | 56.529033 |
| -206.970898 | -45.788633 | 218.387487 | 63.424375 |
| -203.924262 | -51.893056 | 216.455827 | 70.238099 |
| -200.669377 | -57.849405 | 214.218177 | 76.955599 |
| -197.219362 | -63.651172 | 211.683431 | 83.562761 |
| -193.586816 | -69.294028 | 208.860541 | 90.045537 |
| -189.784089 | -74.774698 | 205.760145 | 96.391723 |
| -185.823525 | -80.089913 | 202.394756 | 102.591166 |
| -181.717039 | -85.236957 | 198.776986 | 108.633820 |
| -177.475135 | -90.214904 | 194.919514 | 114.509825 |
| -173.108034 | -95.023188 | 190.835945 | 120.211807 |
| -168.625956 | -99.661247 | 186.540547 | 125.734170 |
| -164.038918 | -104.128725 | 182.047597 | 131.071354 |
| -159.355700 | -108.426535 | 177.371114 | 136.218702 |
| -154.584621 | -112.556064 | 172.524371 | 141.174125 |
| -149.733993 | -116.518702 | 167.520506 | 145.935987 |
| -144.811446 | -120.315983 | 162.372662 | 150.502656 |
| -139.823038 | -123.949772 | 157.093782 | 154.872796 |
| -134.774607 | -127.421982 | 151.695493 | 159.047100 |
| -129.671990 | -130.734524 | 146.188873 | 163.027106 |
| -124.520950 | -133.889334 | 140.584999 | 166.814352 |
| -119.326332 | -136.888633 | 134.894279 | 170.410615 |
| -114.092363 | -139.734835 | 129.125224 | 173.818346 |
| -108.823258 | -142.430359 | 123.286009 | 177.040117 |
| -103.523174 | -144.977610 | 117.384807 | 180.078498 |
| -98.195466 | -147.378857 | 111.429332 | 182.936250 |
| -92.842928 | -149.636273 | 105.425796 | 185.616744 |
| -87.468341 | -151.752026 | 99.380109 | 188.123478 |
| -82.074488 | -153.728285 | 93.298170 | 190.459946 |
| -76.663905 | -155.567108 | 87.185134 | 192.629411 |
| -71.238446 | -157.270235 | 81.044770 | 194.634706 |
| -65.799846 | -158.839351 | 74.880694 | 196.478614 |
| -60.349842 | -160.276145 | 68.696522 | 198.163920 |
| -54.890114 | -161.582273 | 62.495634 | 199.693311 |
| -49.421977 | -162.759207 | 56.280377 | 201.069052 |
| -43.946597 | -163.808343 | 50.052815 | 202.293296 |
| -38.465141 | -164.731074 | 43.815013 | 203.368192 |
| -32.978751 | -165.528751 | 37.569038 | 204.295891 |
| -27.488298 | -166.202248 | 31.316717 | 205.078281 |
| -21.994500 | -166.752162 | 25.059265 | 205.716568 |
| -16.498071 | -167.179084 | 18.797798 | 206.211847 |
| -10.999725 | -167.483607 | 12.533426 | 206.565194 |
| -5.500161 | -167.666246 | 6.267181 | 206.777186 |
| 0.000000 | -167.727126 | 0.000000 | 206.847850 |
| 5.500161 | -167.666246 | -6.267181 | 206.777186 |
| 10.999725 | -167.483607 | -12.533426 | 206.565194 |
| 16.498071 | -167.179084 | -18.797798 | 206.211847 |
| 21.994500 | -166.752162 | -25.059265 | 205.716568 |
| 27.488298 | -166.202248 | -31.316717 | 205.078281 |
| 32.978751 | -165.528751 | -37.569038 | 204.295891 |
| 38.465141 | -164.731074 | -43.815013 | 203.368192 |
| 43.946597 | -163.808343 | -50.052815 | 202.293296 |
| 49.421977 | -162.759207 | -56.280377 | 201.069052 |
| 54.890114 | -161.582273 | -62.495634 | 199.693311 |
| 60.349842 | -160.276145 | -68.696522 | 198.163920 |
| 65.799846 | -158.839351 | -74.880694 | 196.478614 |
| 71.238446 | -157.270235 | -81.044770 | 194.634706 |
| 76.663905 | -155.567108 | -87.185134 | 192.629411 |
| 82.074488 | -153.728285 | -93.298170 | 190.459946 |
| 87.468341 | -151.752026 | -99.380109 | 188.123478 |
| 92.842928 | -149.636273 | -105.425796 | 185.616744 |
| 98.195466 | -147.378857 | -111.429332 | 182.936250 |
| 103.523174 | -144.977610 | -117.384807 | 180.078498 |
| 108.823258 | -142.430359 | -123.286009 | 177.040117 |
| 114.092363 | -139.734835 | -129.125224 | 173.818346 |
| 119.326332 | -136.888633 | -134.894279 | 170.410615 |
| 124.520950 | -133.889334 | -140.584999 | 166.814352 |
| 129.671990 | -130.734524 | -146.188873 | 163.027106 |
| 134.774607 | -127.421982 | -151.695493 | 159.047100 |
| 139.823038 | -123.949772 | -157.093782 | 154.872796 |
| 144.811446 | -120.315983 | -162.372662 | 150.502656 |
| 149.733993 | -116.518702 | -167.520506 | 145.935987 |
| 154.584621 | -112.556064 | -172.524371 | 141.174125 |
| 159.355700 | -108.426535 | -177.371114 | 136.218702 |
| 164.038918 | -104.128725 | -182.047597 | 131.071354 |
| 168.625956 | -99.661247 | -186.540547 | 125.734170 |
| 173.108034 | -95.023188 | -190.835945 | 120.211807 |
| 177.475135 | -90.214904 | -194.919514 | 114.509825 |
| 181.717039 | -85.236957 | -198.776986 | 108.633820 |
| 185.823525 | -80.089913 | -202.394756 | 102.591166 |
| 189.784089 | -74.774698 | -205.760145 | 96.391723 |
| 193.586816 | -69.294028 | -208.860541 | 90.045537 |
| 197.219362 | -63.651172 | -211.683431 | 83.562761 |
| 200.669377 | -57.849405 | -214.218177 | 76.955599 |
| 203.924262 | -51.893056 | -216.455827 | 70.238099 |
| 206.970898 | -45.788633 | -218.387487 | 63.424375 |
| 209.796103 | -39.542910 | -220.005457 | 56.529033 |
| 212.386722 | -33.162766 | -221.305756 | 49.568217 |
| 214.730220 | -26.657228 | -222.285128 | 42.558369 |
| 216.814638 | -20.037350 | -222.940319 | 35.515934 |
| 218.628044 | -13.314266 | -223.269709 | 28.457417 |
| 220.158646 | -6.499245 | -223.276074 | 21.399499 |
| 221.396734 | 0.394465 | -222.962920 | 14.358886 |

What is claimed is:

1. An optical unit, comprising:
a plurality of mirrors configured to guide imaging light along an imaging beam path from an object field located in an object plane to an image field in an image plane,
wherein:
the plurality of mirrors comprises at least three grazing incidence mirrors configured to deflect a chief ray of a central object field point with an angle of incidence of more than 45°;
the optical unit is configured so that, during use of the optical unit, different polarized light beams passing the optical unit from the object field to the image field are rotated in their polarization direction by different angles of rotation due to a geometrical polarization rotation;

the optical unit comprises a first group of mirrors and a second group of mirrors;

the second group of mirrors consists of the final two mirrors of the plurality of mirrors at the image side;

the optical unit is configured so that, during use of the optical unit, a linear portion in a pupil dependence of a total geometrical polarization rotation of the optical unit is less than 20% of a linear portion in a pupil dependence of a geometrical polarization rotation of the second group of mirrors;

the optical unit has an image side numerical aperture that is greater than 0.5; and the optical unit is a microlithography projection optical unit.

2. The optical unit of claim 1, wherein the optical unit is configured so that, during use of the optical unit, the linear portion in the pupil dependence of the total geometrical polarization rotation of the optical unit is less than 15% of the linear portion in the pupil dependence of the geometrical polarization rotation of the second group of mirrors.

3. The optical unit of claim 1, wherein the optical unit is configured so that during use of the optical unit, for all light beams imaging a center of the object field to a center of the image field, an angle of rotation is less than $35°*NA^{4.5}$.

4. The optical unit of claim 1, wherein the image side numerical aperture is greater than 0.6.

5. The optical unit of claim 1, wherein the optical unit is configured so that during use of the optical unit, for all light beams imaging a center of the object field to a center of the image field, the angle of rotation is less than 7°.

6. The optical unit of claim 1, wherein the optical unit is configured so that, during use of the optical unit, an imaging beam path from a center of the object field through a location of a pupil plane having relative pupil coordinates (−1,0) or (1,0) in an exit pupil, respectively, to a center of the image field has a geometrical polarization rotation of less than $5°*NA^{4.5}$.

7. The optical unit of claim 1, wherein the optical unit is configured so that, during use of the optical unit, the geometrical polarization rotation averaged over all imaging beam paths that lie in a pupil plane inside a dipole of 20% pupil fill ratio is less than $5°*NA^{4.5}$.

8. The optical unit of claim 1, wherein the optical unit is configured so that, during use of the optical unit, a circumferential distribution of an angle of rotation in a pupil plane of the optical unit exhibits at least four zero crossings of the value of the angle of rotation.

9. The optical unit of claim 1, wherein the optical unit is an anamorphic microlithography projection optical unit.

10. The optical unit of claim 1, wherein a last mirror in the imaging beam path of the imaging optical unit comprises an opening configured to pass the imaging light.

11. An optical system, comprising:
an optical unit according to claim 1; and
an illumination optical unit configured to illuminate the object field.

12. An apparatus, comprising:
an EUV light source;
a projection optical unit according to claim 1; and
an illumination optical unit configured to illuminate the object field,
wherein the EUV light source is configured to provide the illumination light.

13. A method of using an optical comprising a projection optical unit and an illumination optical unit, the method comprising:

using the illumination optical unit to illuminate a portion of a reticle in an object field of the projection optical unit; and using the projection optical unit to image the illuminated portion of the reticle onto a light sensitive material in the image field, wherein the projection optical unit is an optical unit according to claim 1.

14. An optical unit, comprising:
a plurality of mirrors configured to guide imaging light along an imaging beam path from an object field located in an object plane to an image field in an image plane,
wherein:
the plurality of mirrors comprise at least three grazing incidence mirrors configured to deflect a chief ray of a central object field point with an angle of incidence of more than 45°;

the optical unit is configured so that, during use of the optical unit, different polarized light beams passing the optical unit from the object field to the image field are rotated in their polarization direction by different angles of rotation due to a geometrical polarization rotation;

the optical unit is configured so that, during use of the optical unit, for all light beams imaging a center of the object field to a center of the image field, an angle of rotation is less than $35°*NA^{4.5}$;

the optical unit has an image side numerical aperture that is greater than 0.5; and the optical unit is a microlithography projection optical unit.

15. The optical unit of claim 14, wherein the optical unit is configured so that during use of the optical unit, for all light beams imaging a center of the object field to a center of the image field, the angle of rotation is less than $25°*NA^{45}$.

16. The optical unit of claim 15, wherein the optical unit is configured so that, during use of the optical unit, a circumferential distribution of an angle of rotation in an exit pupil of the optical unit exhibits a zero crossing within 30° of each of a positive x-axis and a negative x-axis.

17. The optical unit of claim 15, wherein the optical unit is configured so that, during use of the optical unit, a circumferential distribution of an angle of rotation in an exit pupil of the optical unit exhibits a zero crossing within 10° of each of a positive y-axis and a negative y-axis.

18. An optical unit, comprising:
a plurality of mirrors configured to guide imaging light along an imaging beam path from an object field in an object plane to an image field in an image plane,
wherein:
the plurality of mirrors comprise at least three grazing incidence mirrors configured to deflect a chief ray of a central object field point with an angle of incidence of more than 45°;

the optical unit is configured so that, during use of the optical unit, different polarized light beams passing the optical unit from the object field to the image field are rotated in their polarization direction by different angles of rotation due to a geometrical polarization rotation;

the optical unit is configured so that, during use of the optical unit, a circumferential distribution of an angle of rotation in a pupil plane of the optical unit exhibits at least four zero crossings of the value of the angle of rotation;

the optical unit has an image side numerical aperture that is greater than 0.5; and the optical unit is a microlithography projection optical unit.

19. The optical unit of claim 18, wherein the optical unit is configured so that, during use of the optical unit, a circumferential distribution of an angle of rotation in an exit pupil of the optical unit exhibits a zero crossing within 30° of each of a positive x-axis and a negative x-axis.

20. The optical unit of claim 18, wherein the optical unit is configured so that, during use of the optical unit, a circumferential distribution of an angle of rotation in an exit pupil of the optical unit exhibits a zero crossing within 10° of each of a positive y-axis and a negative y-axis.

* * * * *

UNITED STATES PATENT AND TRADEMARK OFFICE
CERTIFICATE OF CORRECTION

PATENT NO. : 11,650,510 B2
APPLICATION NO. : 17/552688
DATED : May 16, 2023
INVENTOR(S) : Hans-Juergen Rostalski, Holger Muenz and Christoph Menke It is certified that error appears in the above-identified patent and that said Letters Patent is hereby corrected as shown below:

In the Specification

Column 3, Line 47, delete "z5=y$_2$-x2," insert --"z5=y$^2$-x$^2$, --.

Column 7, Lines 26-27, delete "micro-lithography" insert -- microlithography --.

Column 11, Line 34, delete "o'clock" insert -- o'clock-" --.

Column 11, Line 40, delete "FIG." insert -- FIGS. --.

Column 13, Line 9, delete "FIG." insert -- FIGS. --.

Column 25-26, Line 48 (Table 4-continued), delete "7.1774905594e-47" insert -- -7.1774905594e-47 --.

Column 25-26, Line 49 (Table 4-continued), delete "5.7148856507e-46" insert -- -5.7148856507e-46 --.

Column 25-26, Line 51 (Table 4-continued), delete "2.9648434303e-45" insert -- -2.9648434303e-45 --.

Column 25-26, Line 52 (Table 4-continued), delete "2.1971707475e-45" insert -- -2.1971707475e-45 --.

Column 25-26, Line 53 (Table 4-continued), delete "8.6665502153e-46" insert -- -8.6665502153e-46 --.

Column 55-56, Line 52 (Table 19-continued), delete "5.14322764346e–38" insert -- 5.1432276434e–38 --.
Column 57-58, Line 13 (Table 19-continued), delete "4.24379546576–45" insert Signed and Sealed this
Twenty-fifth Day of July, 2023

Katherine Kelly Vidal
*Director of the United States Patent and Trademark Office*

-- 4.2437954657–45 --.

Column 57-58, Line 25 (Table 19-continued), delete "–4.8222471792e–15" insert -- –4.8222471792e–15 --.

Column 59-60, Line 12 (Table 19-continued), delete "CI35" insert -- C135 --.

Column 59-60, Line 22 (Table 19-continued), delete "5.4416l93526e–43" insert -- 5.4416193526e–43 --.

Column 59-60, Line 35 (Table 19-continued), delete "2.2378507132e–4l" insert -- 2.2378507132e–41 --.

Column 59-60, Line 39 (Table 19-continued), delete "$x^2y$" insert -- $x^2y^{16}$ --.

Column 79-80, Line 22 (Table 24-continued), delete "$x^{14}y11$" insert -- $x^{14} y^{11}$ --.

Column 81-82, Line 18 (Table 29), delete "$x^2y$" insert -- $x^2y^5$ --.

Column 89, Line 35, delete "$y_{1+N/2}$" insert -- $y_{i+N/2}$ --.

Column 92, Line 21, below "11.917218" insert -- 204.645976 15.952990 -204.645976 15.952990 --.

Column 92, Line 35, delete "m&lambda" insert -- $m\lambda$ --.

Column 93-94, Line 18, delete "$x^2 y$" insert -- $x^2 y^5$ --.

Column 95-96, Line 56, (Table 34-continued), delete "$x^2 y$" insert -- $x^2 y^5$ --.

In the Claims

Column 104, Line 37, Claim 15, delete "25°*NA$^{45}$." insert -- 25°*NA$^{4.5}$ --.